US006356555B1

(12) United States Patent
Rakib et al.

(10) Patent No.: US 6,356,555 B1
(45) Date of Patent: Mar. 12, 2002

(54) APPARATUS AND METHOD FOR DIGITAL DATA TRANSMISSION USING ORTHOGONAL CODES

(75) Inventors: Selim Shlomo Rakib; Yehuda Azenkot, both of Cupertino, CA (US)

(73) Assignee: Terayon Communications Systems, Inc., Santa Clara, CA (US)

( * ) Notice: Subject to any disclaimer, the term of this patent is extended or adjusted under 35 U.S.C. 154(b) by 0 days.

(21) Appl. No.: 08/684,243

(22) Filed: Jul. 19, 1996

Related U.S. Application Data

(63) Continuation-in-part of application No. 08/588,650, filed on Jan. 19, 1996, now Pat. No. 5,793,759, which is a continuation-in-part of application No. 08/519,630, filed on Aug. 25, 1995, now Pat. No. 5,768,269.

(51) Int. Cl.[7] .......................... H04B 1/69; H04B 7/216; H04J 13/00
(52) U.S. Cl. ...................... 370/441; 370/442; 370/478; 370/479; 370/480; 370/503
(58) Field of Search ................................. 370/203, 204, 370/208, 441, 479, 442, 478, 480, 486, 487, 503, 270, 280, 329, 335, 336, 337, 341, 342, 345, 347, 350, 206; 375/130, 222–257, 354, 356

(56) References Cited

U.S. PATENT DOCUMENTS

| 4,218,654 A | 8/1980 | Ogawa et al. ................. 370/97 |
| 4,460,992 A | 7/1984 | Gutleber ........................ 370/19 |
| 4,470,138 A | 9/1984 | Gutleber ........................ 370/18 |

(List continued on next page.)

FOREIGN PATENT DOCUMENTS

| EP | 0 767 544 A2 | 4/1997 | ........... H04B/1/707 |
| WO | PCT/US95/04329 | 10/1995 | |
| WO | PCT/US95/10899 | 3/1996 | |

OTHER PUBLICATIONS

"A Wireless Multimedia Network on a Time Division Duplex CDMA/TDMA", Seki K. et al., *IEICE Transactions on Communications*, vol. E78–B, No. 7, Jul. 1, 1995, pp. 1002–1015.
Westlaw Dialog Search.

(List continued on next page.)

*Primary Examiner*—Ricky Ngo
(74) *Attorney, Agent, or Firm*—Ron Fish; Ronald Craig; Fish, A Law Corp.

(57) ABSTRACT

A method and apparatus for carrying out synchronous co-division multiple access (SCDMA) communication of multiple channels of digital data over a shared transmission media such as a cable television system coaxial cable, a fiber optic or copper conductor telephone link, terrestial microwave, satellite link, local or wide area network, wireless including cellur network or some combination of these media using suitable interface circuitry. The system includes modems at remote units and a central unit to receive time division multiplexed digital data arranged into timeslots or channels and uses orthogonal codes to encode each channel of multiple data and spread the energy of each channel data over a frame of data transmitted in the code domain. Spreading the data this way makes the system less susceptible to impulse noise. Frames are synchronized as between remote and central units using a ranging scheme which is also useful in any other system transmitting data by frames in a distributed system where synchronizing the frames as between all units regardless of differences in propagation delays is necessary. Each frame in the SCDMA modulation scheme includes a gap or guardband containing no other data. The ranging process involves training each remote unit to impose enough delay prior to re-transmission of a barker code received from the CU such that a barker code sent by the RU arrives at the CU during the gap. The process of setting the delay in each RU is a trial and error process, and each RU starts the ranging process asynchronously. Contention resolution protocols such that only one RU is aligning to the gap at any particular time are taught.

24 Claims, 45 Drawing Sheets

U.S. PATENT DOCUMENTS

| | | | |
|---|---|---|---|
| 4,475,208 A | 10/1984 | Ricketts | 375/1 |
| 4,553,161 A | 11/1985 | Citta | 358/86 |
| 4,554,579 A | 11/1985 | Citta | 358/86 |
| 4,635,274 A | 1/1987 | Kubota | 375/1 |
| 4,688,210 A | 8/1987 | Eizenhofer et al. | 370/335 |
| 4,723,164 A | 2/1988 | Nienaber | 358/148 |
| 4,748,681 A | 5/1988 | Schmidt | 455/33 |
| 4,757,460 A | 7/1988 | Bione et al. | 364/514 |
| 4,773,066 A | 9/1988 | Kirkman | 370/85 |
| 4,811,365 A | 3/1989 | Manno | 375/107 |
| 4,829,569 A | 5/1989 | Seth-Smith et al. | 380/10 |
| 4,894,789 A | 1/1990 | Yee | 364/521 |
| 4,912,721 A | 3/1990 | Pidgeon, Jr. et al. | 375/1 |
| 4,926,130 A | 5/1990 | Weaver | 328/14 |
| 4,933,930 A | 6/1990 | Lien et al. | 370/18 |
| 5,072,445 A | 12/1991 | Nawata | 370/104 |
| 5,090,024 A | 2/1992 | Vander Mey et al. | 375/1 |
| 5,093,718 A | 3/1992 | Hoarty et al. | 358/84 |
| 5,130,983 A | 7/1992 | Heffner, III | 370/85.8 |
| 5,133,079 A | 7/1992 | Ballantyne et al. | 455/4.1 |
| 5,157,686 A | 10/1992 | Omura et al. | 375/1 |
| 5,164,958 A | 11/1992 | Omura | 375/1 |
| 5,166,952 A | 11/1992 | Omura et al. | 375/1 |
| 5,193,094 A | 3/1993 | Viterbi | 371/43 |
| 5,195,092 A | 3/1993 | Wilson et al. | 370/94.2 |
| 5,200,993 A | 4/1993 | Wheeler et al. | 379/96 |
| 5,224,122 A | 6/1993 | Bruckert | 375/1 |
| 5,231,664 A | 7/1993 | Bestler et al. | 380/20 |
| 5,233,630 A | 8/1993 | Wolf | 375/67 |
| 5,235,615 A | 8/1993 | Omura | 375/1 |
| 5,235,619 A | 8/1993 | Beyers, II et al. | 375/38 |
| 5,239,557 A | 8/1993 | Dent | 371/1 |
| 5,247,347 A | 9/1993 | Litteral et al. | 358/85 |
| 5,253,268 A | 10/1993 | Omura et al. | 375/1 |
| 5,280,472 A | 1/1994 | Gilhousen et al. | 370/18 |
| 5,295,152 A | 3/1994 | Gudmundson et al. | 375/1 |
| 5,297,162 A | 3/1994 | Lee et al. | 375/1 |
| 5,305,308 A | 4/1994 | English et al. | 370/32.1 |
| 5,309,474 A | 5/1994 | Gilhousen et al. | 375/1 |
| 5,313,454 A | 5/1994 | Bustini et al. | 370/13 |
| 5,319,634 A | 6/1994 | Bartholomew et al. | 370/18 |
| 5,325,394 A | 6/1994 | Bruckert | 375/1 |
| 5,327,455 A | 7/1994 | De Gaudenzi et al. | 375/1 |
| 5,345,439 A | 9/1994 | Marston | 370/18 |
| 5,345,472 A | 9/1994 | Lee | 375/1 |
| 5,347,304 A | 9/1994 | Moura et al. | 348/12 |
| 5,353,300 A | 10/1994 | Lee et al. | 375/1 |
| 5,359,624 A | 10/1994 | Lee et al. | 375/1 |
| 5,363,403 A | 11/1994 | Schilling et al. | 375/1 |
| 5,363,404 A | 11/1994 | Kotzin et al. | 370/352 |
| 5,373,288 A | 12/1994 | Blahut | 340/825.08 |
| 5,373,502 A | 12/1994 | Turban | 370/18 |
| 5,390,166 A | 2/1995 | Rohani et al. | 370/335 |
| 5,394,391 A | 2/1995 | Chen et al. | 370/18 |
| 5,398,258 A | 3/1995 | Su et al. | 375/200 |
| 5,404,570 A | 4/1995 | Charas et al. | 455/22 |
| 5,408,465 A | 4/1995 | Gusella etal. | 370/17 |
| 5,414,699 A | 5/1995 | Lee | 370/18 |
| 5,416,797 A | 5/1995 | Gilhousen et al. | 375/705 |
| 5,418,813 A | 5/1995 | Schaffner et al. | 375/205 |
| 5,425,027 A | 6/1995 | Baran | 370/69.1 |
| 5,440,585 A | 8/1995 | Partridge, III | 375/261 |
| 5,442,625 A | 8/1995 | Gitlin et al. | 370/18 |
| 5,442,627 A | 8/1995 | Viterbi et al. | 370/22 |
| 5,442,662 A | 8/1995 | Fukasawa et al. | 375/205 |
| 5,442,700 A | 8/1995 | Snell et al. | 380/15 |
| 5,448,555 A | 9/1995 | Bremer et al. | 370/20 |
| 5,452,328 A | 9/1995 | Rice | 375/210 |
| 5,463,660 A | 10/1995 | Fukasawa et al. | 375/205 |
| 5,467,342 A | 11/1995 | Longston et al. | 370/17 |
| 5,481,533 A | 1/1996 | Honig et al. | 375/206 |
| 5,488,412 A | 1/1996 | Majeti etal. | 348/10 |
| 5,499,236 A | 3/1996 | Giallorenzi et al. | 370/18 |
| 5,511,067 A | 4/1996 | Miller | 370/18 |
| 5,512,935 A | 4/1996 | Majeti et al. | 348/9 |
| 5,533,013 A | 7/1996 | Leppanen | 370/206 |
| 5,534,913 A | 7/1996 | Majeti et al. | 348/7 |
| 5,539,730 A | 7/1996 | Dent | 370/320 |
| 5,550,578 A | 8/1996 | Hoarty et al. | 348/7 |
| 5,557,316 A | 9/1996 | Hoarty et al. | 348/7 |
| 5,572,517 A | 11/1996 | Safadi | 370/50 |
| 5,572,528 A | 11/1996 | Shuen | 370/85.13 |
| 5,583,853 A | 12/1996 | Giallorenzi et al. | 370/441 |
| 5,586,121 A | 12/1996 | Moura et al. | 370/404 |
| 5,594,872 A | 1/1997 | Kawano et al. | 395/200.15 |
| 5,608,446 A | 3/1997 | Carr et al. | 348/6 |
| 5,608,728 A | 3/1997 | Ulm et al. | 370/488 |
| 5,610,911 A | 3/1997 | Ishikawa et al. | 370/503 |
| 5,617,410 A | 4/1997 | Matsumoto | 370/342 |
| 5,619,531 A | 4/1997 | Taylor et al. | 375/222 |
| 5,712,982 A | 1/1998 | Marcel | 395/200.17 |
| RE35,774 E | 4/1998 | Moura et al. | 348/12 |
| 5,737,329 A | 4/1998 | Horiguchi | 370/342 |
| 5,745,484 A | 4/1998 | Scott | 370/347 |
| 5,751,739 A | 5/1998 | Seshadri et al. | 371/43 |
| 5,761,198 A | 6/1998 | Kojima | 370/337 |
| 5,793,759 A * | 8/1998 | Rakib et al. | 370/342 |
| 5,805,583 A * | 9/1998 | Rakib | 370/342 |
| 5,822,359 A | 10/1998 | Bruckert et al. | 375/200 |
| 5,828,655 A | 10/1998 | Moura et al. | 370/236 |
| 5,930,235 A | 7/1999 | Arai | 370/252 |

OTHER PUBLICATIONS

R. De Gaudenzi et al., "Performance Evaluation of Quasi-Synchronous Code Division Multiple Access (QS–CDMA) for Satellite Mobile Systems," Globecom '90: IEEE Global Telecommunications Conference, 1800–1804. (Apr. 1990).

R. Lupas et al., "Linear Multiuser Detectors for Synchronous Code Division Multiple Access Channels," IEEE Transactions on Information Theory, vol. 35, Issue 1, pp. 123–136. (Jan. 1989).

* cited by examiner

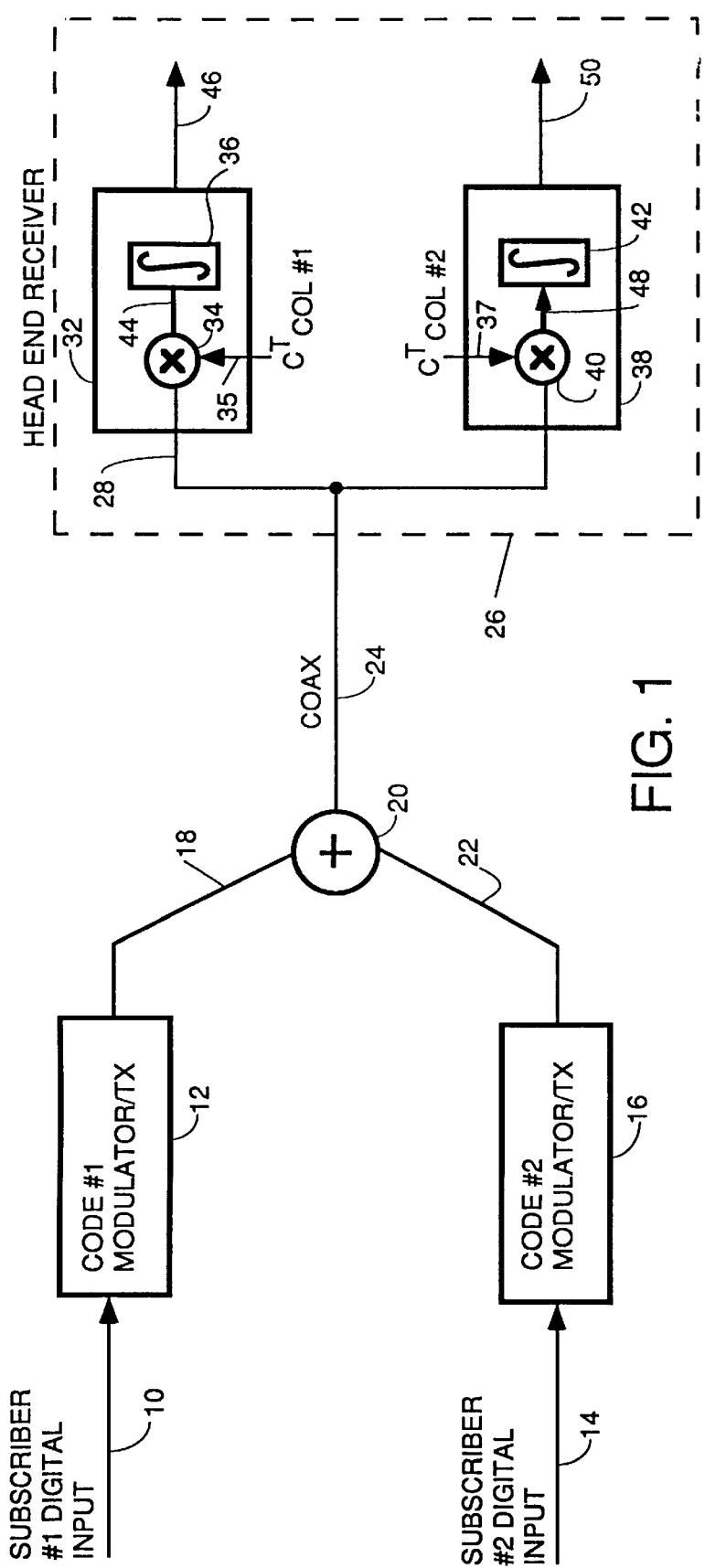

CODE 1 = $[1, 1]$
CODE 2 = $[1, -1]$

FIG. 3B

$$C = \begin{bmatrix} \frac{1}{\sqrt{2}} \\ \frac{1}{\sqrt{2}} \end{bmatrix} \begin{bmatrix} \frac{1}{\sqrt{2}} \\ -\frac{1}{\sqrt{2}} \end{bmatrix}$$

CODE #1, CODE #2

FIG. 3C

USER 1 FIRST FRAME DATA = 1
USER 2 FIRST FRAME DATA = -1

FIG. 3D

INFORMATION VECTOR FOR FIRST FRAME = $\beta$ = $[1, -1]$

FIG. 3E

COMBINED SIGNAL TO TRANSMIT DURING FIRST FRAME $$R = B \cdot C = \begin{bmatrix} 1, -1 \end{bmatrix} \begin{bmatrix} \frac{1}{\sqrt{2}} & \frac{1}{\sqrt{2}} \\ \frac{1}{\sqrt{2}} & \frac{-1}{\sqrt{2}} \end{bmatrix}$$

$$= \begin{bmatrix} \left(\frac{1}{\sqrt{2}} + \frac{-1}{\sqrt{2}}\right), \left(\frac{1}{\sqrt{2}} + \frac{1}{\sqrt{2}}\right) \end{bmatrix} = R$$

$$= \begin{bmatrix} 0, \frac{2}{\sqrt{2}} \end{bmatrix} = R$$

TRANSMIT SIDE MATRIX MULTIPLICATION

FIG. 3F $$R \cdot C^T = \begin{bmatrix} 0, \frac{2}{\sqrt{2}} \end{bmatrix} \cdot \begin{bmatrix} \frac{1}{\sqrt{2}} & \frac{1}{\sqrt{2}} \\ \frac{1}{\sqrt{2}} & \frac{-1}{\sqrt{2}} \end{bmatrix} = \begin{bmatrix} \left(0 + \frac{2}{2}\right), \left(0 + \frac{-2}{2}\right) \end{bmatrix}$$

$$= \begin{bmatrix} 1, -1 \end{bmatrix}$$

RECOVERED [B] AT RECEIVER = [1, -1]

FIG. 3G

GENERAL RANGING PROCESS

DEAD RECKONING RE-SYNC

PRECURSOR EMBODIMENT

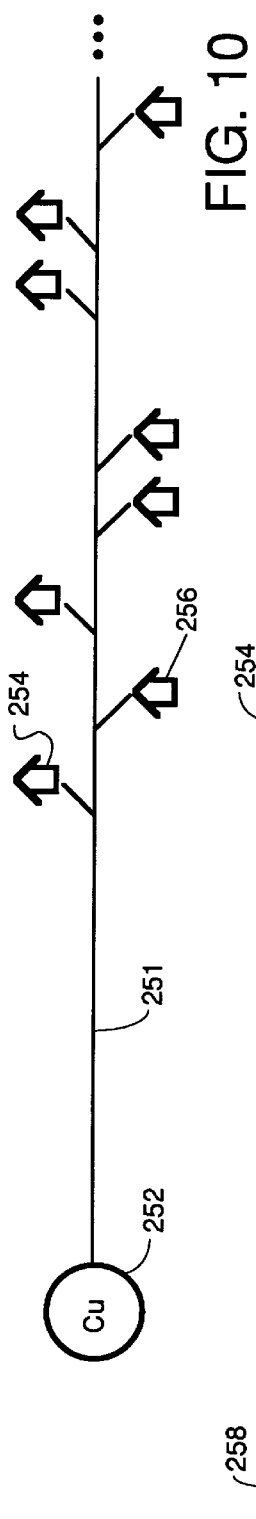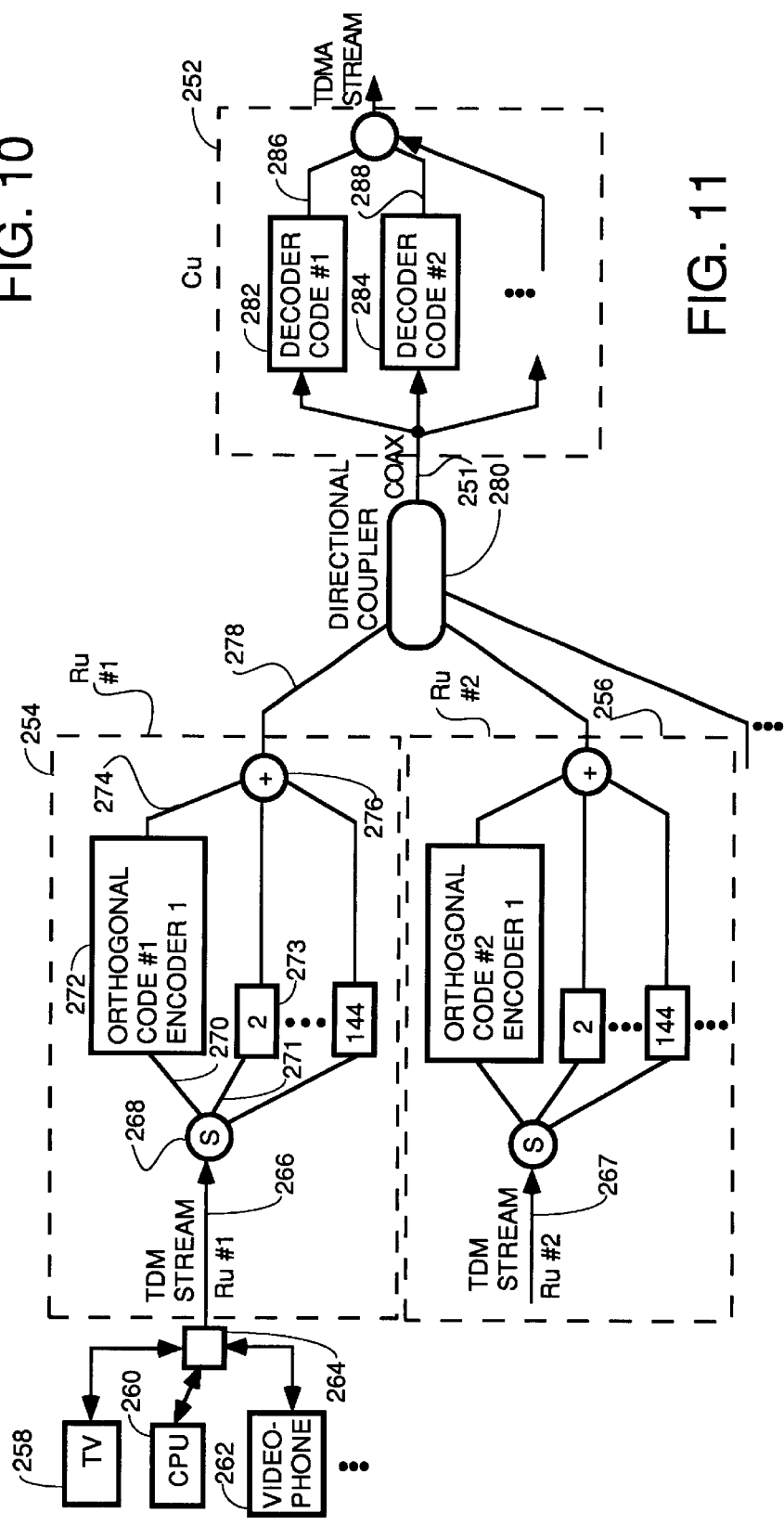

| CODE | INPHASE | QUADRATURE | |
|---|---|---|---|
| 0000 | 111 | 111 | = -1 - j |
| 0001 | 001 | 111 | = 1 - j |
| 0010 | 001 | 001 | = 1 + j |
| 0011 | 111 | 001 | = -1 + j |
| 0100 | 011 | 111 | = 3 - j |
| 0101 | 001 | 011 | = 1 + 3*j |
| 0110 | 101 | 001 | = -3 + j |
| 0111 | 111 | 101 | = -1 - 3*j |
| 1000 | 011 | 011 | =+3 + 3*j |
| 1001 | 101 | 011 | = -3 + 3*j |
| 1010 | 101 | 101 | = -3 - 3*j |
| 1011 | 011 | 101 | = 3 - 3*j |
| 1100 | 111 | 011 | = -1 + 3*j |
| 1101 | 101 | 111 | = -3 - j |
| 1110 | 001 | 101 | = 1 - 3*j |
| 1111 | 011 | 001 | = 3 + j |

INFORMATION
VECTOR [B]
FOR EACH
SYMBOL

ORTHOGONAL
CODE MATRIX $$483 \rightarrow \begin{bmatrix} 0\ 1\ 1\ 0 \\ 1\ 1\ 1\ 1 \\ 1\ 1\ 0\ 1 \\ 0\ 1\ 0\ 0 \\ \vdots \end{bmatrix} \times \begin{bmatrix} c_{1,1} & c_{1,2} & \cdots & c_{1,144} \\ c_{2,1} & c_{2,2} & \cdots & c_{2,144} \\ \vdots & \vdots & & \vdots \end{bmatrix}$$

481 points to row "1 1 0 1"

FIG. 23A

REAL PART OF INFO VECTOR [b] FOR FIRST SYMBOL

REAL PART OF RESULT VECTOR $$405 \rightarrow \begin{bmatrix} +3 \\ -1 \\ -1 \\ +3 \end{bmatrix} \cdot \begin{bmatrix} 1 & 1 & 1 & 1 \\ -1 & -1 & 1 & 1 \\ -1 & 1 & -1 & 1 \\ -1 & 1 & 1 & -1 \end{bmatrix}^{407} = \begin{bmatrix} 4 \\ 0 \\ 0 \\ -8 \end{bmatrix} \leftarrow 409$$

$$\begin{bmatrix} b_{REAL} \end{bmatrix} \times \begin{bmatrix} \text{CODE MATRIX} \end{bmatrix} = \begin{bmatrix} R_{REAL} \end{bmatrix} = \text{"CHIPS OUT" ARRAY-REAL}$$

FIG. 23B

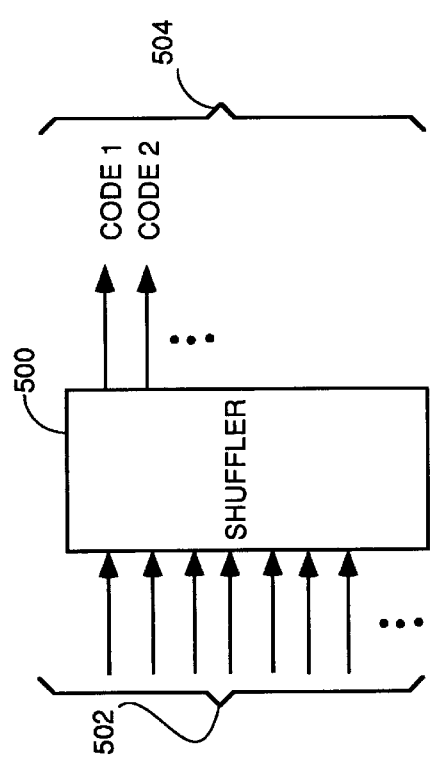
FIG. 27
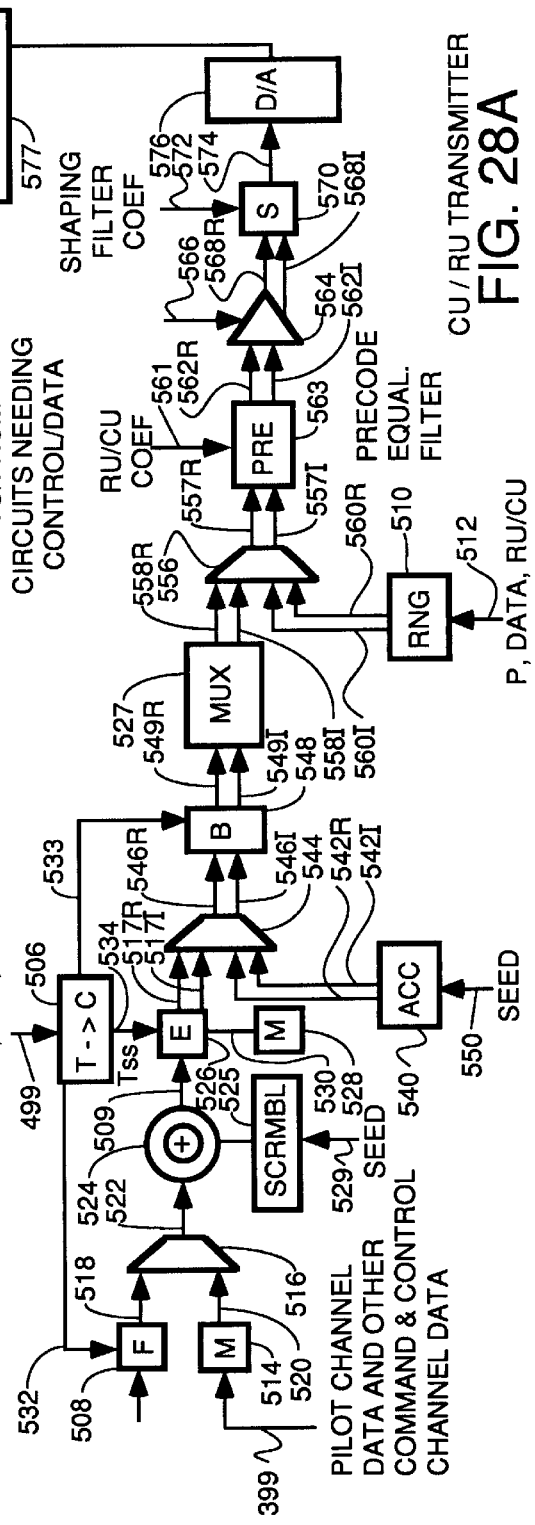
FIG. 28A CU/RU TRANSMITTER

RU RANGING

RANGING AND CONTENTION RESOLUTION
CU SIDE

RANGING - RU SIDE
BINARY TREE
ALGORITHM

CONTENTION RESOLUTION - RU
USING BINARY STACK

EMBODIMENT 1
CARRIER RECOVERY

EMBODIMENT 2 CARRIER RECOVERY

PREFERRED TRELLIS ENCODER

| MSBs y3 y2 | PHASE difference (2nd-1st symbol) | 1+jQ WHEN LSB=00 | 1+jQ WHEN LSB=01 | 1+jQ WHEN LSB=10 | 1+jQ WHEN LSB=11 |
|---|---|---|---|---|---|
| 00 | 0 | 3-j | 1+j3 | -3+j | -1-j3 |
| 01 | 90 | 1+j3 | -3+j | -1-j3 | 3-j |
| 10 | 180 | -3+j | -1-j3 | 3-j | 1+j3 |
| 11 | -90 | -1-j3 | 3-j | 1+j3 | -3+j |

| LSBs y1 y0 | PHASE | 1+jQ |
|---|---|---|
| 00 | 0 | 3-j |
| 01 | 90 | 1+j3 |
| 10 | 180 | -3+j |
| 11 | -90 | -1-j3 |

LSB & MSB FALLBACK MODE MAPPINGS

FIG. 44

SIMPLE Cu SPREAD SPECTRUM RECEIVER

FIG. 51 SIMPLE Ru SPREAD SPECTRUM TRANSMITTER

FRAME DETECTOR
FRAME SYNC/KILOFRAME DETECT

STATE MACHINE

SYNCHRONOUS TDMA SYSTEM

APPARATUS AND METHOD FOR DIGITAL DATA TRANSMISSION USING ORTHOGONAL CODES

This application is a continuation-in-part application of U.S. patent application Ser. No. 08/588,650, filed Jan. 19, 1996, invented by Shlomo Rakib and Yehuda Azenkot, now U.S. Pat. No. 5,793,759, issued Aug. 11, 1998, which was a continuation-in-part application of U.S. patent application Ser. No. 08/519,630, filed Aug. 25, 1995, invented by Shlomo Rakib and Yehuda Azenkot, now U.S. Pat. No. 5,768,269, issued Jun. 16, 1998, the contents of both of which are hereby incorporated by reference.

FIELD OF THE INVENTION

The invention pertains to the field of bidirectional communication of digital data over coaxial cable or other transmission media. More particularly, the invention pertains to the field of provision of multiple channels of digital data including interactive TV services, digital telephony, video teleconferencing, video on demand, internet access at 10 megabit/second or media data rates etc., all provided to home or business establishments over cable TV coax or combinations of coaxial cable, fiber optic links, microwave or satellite links or other wireless systems using synchronous CDMA system technology. These new services delivered over the CATV system will hereafter be called supplemental services.

BACKGROUND OF THE INVENTION

In order to provide bidirectional digital data communication over a cable TV coaxial network to multiple subscribers with multiple digital services including data, digitized video and digitized audio, all made available over a single cable TV hybrid fiber coax (hereafter HFC) network (hereafter called CATV systems), several problems have to be solved. First, video applications such as video teleconferencing and video on demand movies require that a flexible amount of bandwidth be awarded to support the digitized video transmissions and that the amount of bandwidth awarded be guaranteed, i.e., the awarded bandwidth will be made available continuously without interruption until the video service is completed. These requirements force the use in the CATV environment of higher level protocols that have been developed or which are in the process of development for local area networks such as ATM or ISDN that are designed for delivery of digitized video, digitized audio and digital data over point to point LAN connections. Thus, the a major problem exists in adapting these point to point LAN protocols to the point-to-multipoint CATV environment.

Second, there is the problem of bandwidth availability and sharing the available bandwidth among a plurality of users who are physically distributed and all of whom have changing bandwidth needs over time. In CATV systems, typically only 6 mHz of bandwidth is available for communications of digital data downstream from the head end to the subscribers and another 6 mHz elsewhere on the spectrum of the CATV media is made available for upstream communications. These 6 mHz bands must be shared by all the users to carry data for all the services provided. Since video is a high bandwidth demand application which requires continuous availability, the available bandwidth must be fully utilized with maximum efficiency so as to provide bandwidth capacity to as many users as possible.

Third, there is the problem of noise and interference on the CATV system which could degrade the supplemental services to the point of unacceptability if techniques are not employed to lessen the affect of the noise on reception or otherwise deal with the problem. Cable TV media are high noise environments because of numerous reasons which are well known to those skilled in the art.

A fourth major problem, but related to the second problem, is synchronization of data transmission. Synchronization must be maintained between all remote units and the central unit for maximum efficiency use of the available bandwidth. If synchronization is not maintained, the number of users which can simultaneously share the available bandwidth is reduced.

In addition, there is the problem of eliminating the intersymbol interference and partial cross correlation between codes of code division multiple access (herafter CDMA) technology. CDMA technology is used in the genus of the invention to support multiple user with simultaneous pseudo point-to-point connections to the head end. CDMA is known in the prior art and has the advantage of not requiring the bandwidth allocation of frequency-division multiplexing nor the time synchronization of time-division multiplexing. However, it has the problems mention above which must be solved for a system acceptable to a user to exist. In addition, to maximize the number of users supported, frame synchronization is used in the invention and one of the problems solved by the inventors is how to achieve this frame synchronization in a physically distributed system of transmitters.

Of course all nonbaseband CDMA systems require two additional forms of synchronization as well known in the art: first, there must be synchronization in phase and frequency between the transmitting carrier and the local oscillator in the receiver which feeds the demodulator. Also, as is known in the art all CDMA systems require clock recovery synchronization so that the pseudonoise code (hereafter PN code) sequence fed into the despreading circuitry is not only identical to the PN code fed into the spreading circuitry of the transmitter, but also exactly in phase therewith. Further, clock recovery is necessary in CDMA systems so as to know symbol boundaries so as to be able to correctly sample the baseband data stream exiting the despreading circuitry. How to achieve these forms of synchronization in a CATV CDMA system are another set of problems that must be solved.

Further, in CDMA systems with multiple transmitters which are physically distributed each using different spreading codes, it is possible for signals from different transmitters to arrive at the central unit at different power levels. This causes nonzero cross-correlations between the different codes, and gives rise to a problem known as the "near-far" problem. To prevent high error rates from strong signals overwhelming weaker ones, the near-far problem must be solved.

An example of one attempt to transmit digital data bidirectionally over a CATV system is the technology disclosed in U.S. Pat. Nos. 4,912,721 and 5,235,619 assigned to Scientific Atlanta. In these systems, direct sequence spread spectrum technology is used to overcome the noise problem in CATV systems, but no support of multiple users by code division multiple access is sought. The Scientific Atlanta patents are single user direct-sequence spread spectrum systems, and there is no teaching of how to achieve frame synchronization which is necessary to maximize the number of users in a CDMA multiuser system. In the Scientific Atlanta patents, each user sends billing and request data to the head end and the head end sends data related to supplemental services other than the cable TV programming to the remote units at the sites of users during a timeslot assigned to that user. The transmission of data is accomplished on a one user per timeslot basis using a pseudonoise spreading code. No teaching of the use of orthogonal codes is present in U.S. Pat. No. 4,912,721. Therefore, only one user can use the available bandwidth devoted to the supplemental services at any particular time. Accordingly, for all users to share the available bandwidth, a time division multiplexing scheme must be used and the direct-sequence, spread spectrum technology is used only to overcome the noise and other impairments on the CATV channel.

CDMA cellular telephone systems are known. One example is U.S. Pat. No. 5,416,797 assigned to Qualcomm Inc. of San Diego, Calif. In this system multiple users of a cellular telephone systems are supported by a direct-sequence spread spectrum system which minimizes interference between users by providing orthogonal PN codes for spreading and controlling transmit timing such that the code frames from different users are aligned in time with each other at the receivers. Each cell site transmits a pilot carrier signal which is unique to that cell and which is used by the mobile units to obtain initial system synchronization and to provide time, frequency and phase tracking information. Each cell spreads the pilot signal using the same code, but cell uses a unique phase offset thereby allowing mobiles to achieve synchronization by searching all phase possibilities for the single code. The strongest pilot signal is tracked, and then the mobile unit acquires a synchronization channel which transmits system ID cna cell ID information as well as synchronization information which allows the long PN codes, interleaver frames and vocoders to be synchronized. When a call is initiated, a PN code is assigned for the call. During the call, pilot signals are continuously scanned to determined when another pilot signal becomes stronger. An outer PN code is used to spread all signals in the same cell to distinguish signals from other cells and multipath signals. A second inner code is used to distinguish between signals of different users in the same cell. The inner code is a maximal length PN code which is shifted in time for each user to provide discrimination among users. The patent states at Col. 11, lines 6–11, that because of the different propagation times between mobiles to different cells, it is not possible to satisfy a condition of time alignment required for the outer code Walsh function orthogonality for both cells at one time, so the outer code is used to distinguish between signals from different cells. Variable rate is used on the voice channel to prevent transmissions when there is no meaningful data to send. All cells in an area are synchronized to each other to an accuracy of 1 microsecond for easier handoff by tuning to GPS satellite transmissions which themselves are synchronized to Zulu time.

Cable networks typically involve a so-called head end or central unit from which video is transmitted to subscribers coupled to one or more main trunk lines from which extend numerous branch lines which may enter subscriber homes or which may couple to other branch lines. At each junction of a branch line to the trunk line or another branch line there is a directional coupler which is intended to direct transmissions from the head end to the subscribers in one direction and to direct transmissions from the subscribers back to the head end without leaking energy intended for transmission to the head end into branch lines coupled to other subscribers. In order to send digital data over video coax, a modem is necessary at both the head end and at all the subscriber locations to modulate digital data onto the coax as RF signals, and to receive RF signals carrying digital data and derive the digital data therefrom. Because RF signals are propagating along the cables, and because the couplers are not perfect, reflections occur at the directional couplers that cause noise and interference. This is because the reflections are frequently of the opposite polarity depending upon the impedance mismatch and the distances involved. These reflections are therefore sometimes additive and sometimes subtractive, thereby resulting in random variations in the amplitudes of the RF signals. These random variations make discrimination during the demodulation process to derive the digital data more difficult.

Further, because the subscribers are at physically different distances from the head end, the signals from each subscriber's modem arrive at the head end at different times because of different propagation delays. Because digital data is transmitted in frames and because all subscribers must be synchronized to the same frame timing, these different propagation delays for each subscriber cause problems in synchronizing data.

In the typical interactive system, there are bidirectional amplifiers. Each amplifier has two channels, one of which amplifies signals in a high frequency range from 45–750 mHz for transmission of data from the head end to subscribers, and the other of which amplifies signals in a low frequency range from 5–42 mHz for transmission of data from the subscribers to the head end. When the operating frequency is close to the edges of either the high or low band, group delay distortion can result in another impairment to noise free bidirectional communication.

Other forms of linear impairment result from the fact that the bandpass filters in the system do not have perfectly flat amplitude characteristics for their transfer functions across the entire passband, especially at the corner frequencies.

Other forms of impairments are so-called additive impairments resulting from taps on the system which are not properly terminated. These taps act as antennas and pick up broadcast signals from FM stations, CB radios, HF communication etc. Other sources of noise are impulse signals resulting from arcing in electrical appliances near taps. Arcing generates white noise type RF energy that is splattered across all bands and is radiated much like lightening. In addition, the amplifiers in the interactive system can sometimes break into oscillation thereby creating noise. Further the horizontal and vertical oscillators in television sets in the subscriber's household also can radiate RF interference signals. These sources of interference are a major contributor to noise in the system.

The collection of impairments described above are referred to as linear impairments because the system has a linear transfer function so that in the Fourier domain, all the impairment effects are additive.

In addition to the linear impairments, there also exist nonlinear impairments such as second and third order harmonics generated by the nonlinear junctions of transistors in the amplifiers in the system. When multiple sinusoidal signals arrive at the amplifiers, beat frequencies are generated in addition to the harmonics of the arriving signals because the nonlinear junctions act like mixers.

Other forms of nonlinear impairment are hum from saturation of magnetic cores of transformers in the amplifiers resulting from 60 volt, 60 Hertz AC square wave pulses sent to the amplifiers over the coax to supply the amplifiers with power. The amplifiers have rectifiers that rectify this square wave signal to derive power therefrom and this process generates noise in the form of hum. This hum is caused by amplitude modulation of the power supply signal resulting from the placement of the operating point on the hysteresis curve of the rectifier transformers.

Interactive systems typically involve in excess of one hundred different channels on which separate digital data streams can flow in addition to the separate channels on which the video signals are provided for normal cable TV service. To send digital data as RF signals, very complex constellations of separate amplitude and phase combinations are used to encode the digital characters being transmitted. Because of the large number of data points, the differences in phase and amplitude between the different points are not large. Therefore, the impairments described above can cause errors by causing misinterpretation by demodulators of what characters were actually sent.

There is only one conductive path between the head end and the subscribers that must be shared by all the subscribers to send and receive digital data. One approach that has been tried in prior art interactive cable TV systems is time division multiple access sharing (TDMA) with quadrature phase shift keying (QPSK) modulation schemes. In a TDMA system, each subscriber gets a short assigned time slot in which to transmit data to the head end. The TDMA approach has shortcomings in that it causes difficulty and complexity in achieving "alignment". Alignment refers to the proper timing of each subscriber's transmissions so that they arrive during the appropriate time slot at the head end despite the fact that the signals from each subscriber have different propagation times. Alignment in TDMA multiple access schemes is critical, and achieving it is difficult.

Another difficulty with the TDMA approach is the high susceptibility of QPSK modulation to narrowband interference. Narrowband interference results when a signal like Voice of America or a harmonic which has a bandwidth similar to the bandwidth of the channels upon which digital data is being transmitted enters the transmission media. Typically this happens at a tap which is not properly terminated. Narrowband interference adversely affects the receiver circuits and the alignment circuits that achieve synchronization of all the sources.

The use of TDMA schemes also complicates the alignment problem in the presence of narrowband interference and other noise because there is such a short time for synchronization. Synchronization of the head end to all the subscribers is necessary so that the clock signal and other reference signals such as the carrier can be recovered from the transmitted signals without being separately transmitted. These recovered signals are critical to proper operation of the system in demodulating the transmitted data. Narrowband interference also adversely affects the decision making circuits that decipher which characters have been transmitted thereby increasing the error rate. Increased error rate requires more bandwidth to be consumed in retransmitting data and wastes processing power in detecting and correcting errors and retransmitting data with errors that are beyond the correction range of the ECC bits transmitted with the data.

Also, because in TDMA schemes the timeslots are very short, TDMA systems are susceptible to loss of data caused by long bursts of noise. Typical bursts of impulse noise are quite long relative to the length of the TDMA timeslots. Long bursts often wipe out entire groups of timeslots thereby requiring retransmission of all the data in these timeslots. Modulation and multiple access schemes that spread out the energy of transmitted data over longer times, such as FDMA schemes, are less susceptible to this type of burst noise. However, FDMA schemes have other drawbacks.

QPSK modulation used in TDMA schemes is also not the most efficient modulation scheme in terms of spectral efficiency, i.e., speed of transmission in bits/second/Hertz over a given bandwidth. However, QPSK modulation is used because it has a sufficiently large distance between points in the constellation to maintain relatively good noise immunity. Noise immunity refers to the ability of a system to achieve a certain bit error rate that is deemed to be tolerable for a given signal to noise ratio. If the signal to noise ratio decreases for a given noise immunity characteristic, the bit error rate will rise.

Typically, channel bandwidths are 6 mHz, and spectral efficiency of 27 megabits/second/Hertz is desired. Therefore, a data transfer rate of $162 \times 10^{12}$ is achievable over one channel at this typical spectral efficiency and bandwidth. However spectral efficiency for QPSK modulation is on the order of 1 bits/second/Hertz or less so this modulation scheme is too slow for high traffic volume applications such as video on demand, video teleconferencing etc.

Another approach that has been tried in the prior art is frequency division multiple access (FDMA). In FDMA, each subscriber transmits data on a different carrier frequency as opposed to at a different time in TDMA. FDMA schemes suffer from different drawbacks than TDMA schemes. Because there are multiple carriers in FDMA schemes, there are more intermodulation products in the received signals. These intermodulation products can coherently add to each other thereby causing peaks in amplitude which are far greater than the average signal. This causes difficulty in designing analog circuits with adequate ranges of linearity to handle these signals without clipping the peaks. These peaks often penetrate into the nonlinear or saturation range of operation of analog circuits in the system exposed to these signals thereby introducing nonlinearities. Even without these nonlinearities, the intermodulation components tend to cause crosstalk between adjacent channels which increases the error rate.

FDMA schemes are also sensitive to narrowband interference signals that suddenly appear causing unanticipated "jamming" of one or more channels thereby causing long bursts of errors. FDMA channels are narrow, and claims have been made that because of this fact narrowband interference can be avoided. However, narrowband interference is dynamic, because there are multiple sources thereof at different frequencies. As a result, narrowband interference signals can suddenly "pop up" when a subscriber turns on his or her TV or when Voice of America starts broadcasting. This sudden pop-up interference can jam a channel thereby causing error bursts.

Therefore, a need has arisen for a method and apparatus that can support interactive digital systems that eliminates some of these drawbacks.

SUMMARY OF THE INVENTION

According to the teachings of the invention, there is provided a code division multiplexing multiple access (CDMA) scheme using orthogonal codes to encode multiple channels of digital data for simultaneous transmission over a cable television media which is also carrying frequency division multiplexed cable television programming. Further, in the preferred embodiment, alignment of multiple subscriber remote units at diverse locations on the cable television media to the same frame alignment reference is used to substantially reduce crosstalk between adjacent codes and allow multiple users to simultaneously share the same cable TV media for auxiliary services other than cable TV programming delivery. The ranging process described herein is useful for any digital communication system which delivers data from physically distributed transmitters to a central location in frames, but in the context of a CDMA system on a cable TV plant, it provides for synchronous CDMA which greatly increases system payload capacity. The use of synchronous CDMA coupled with frequency division multiplexing of upstream and downstream data on different frequencies than the cable TV programming provides a system whereby the entire bandwidth devoted to the digital auxiliary services may be simultaneously shared by multiple users who share a plurality of channels. Any of the known ways of achieving frame alignment may be used to achieve synchronous code division multiple access data transmission. In the preferred embodiment, frame alignment is achieved by alignment of timing signals transmitted by remote units to guardbands or gaps between frames.

One inventive concept disclosed herein is to achieve high noise immunity by spreading the energy of the transmitted data out over time during transmission, and then compressing the energy again at the receiver to recover the data. Spreading the energy of the transmitted data out over time reduces susceptibility to burst errors and impulse noise. In addition to this spreading concept, the spectral efficiency of the system is enhanced by transmitting multiple separate channels of data over the same media without interference by using separate orthogonal codes to encode the data of each channel so that no interference results when all channels are simultaneously transmitted so long as proper frame alignment is maintained. In this way, the spectral efficiency, i.e., a measure of the amount of data that can be sent from one place to another over a given bandwidth, is enhanced without degradation of the data by crosstalk interference. The orthogonality of the codes used for each data stream minimizes crosstalk between data streams where the system is properly aligned, i.e., synchronized, and, using cyclic, orthogonal codes further enhances noise abatement by providing the ability to perform equalization. Equalization, as that term is used herein, refers to the process of determining the amount of crosstalk between adjacent codes resulting from minor errors of frame timing alignment and then generating signals which can be used to negate the crosstalk. In the preferred embodiment, the orthogonal codes are cyclic codes.

In some species within the genus of the invention, code diversity is used to achieve further noise immunity. It has been found that some orthogonal codes are less immune to narrow band interference and other sources of noise than others. To avoid using such codes to spread the data from the same channel or timeslot all the time, code hopping is used in these preferred species of the inventive genus. Code diversity is achieved in several different ways, but, in the preferred embodiment, each transmitter uses a code shuffler circuit and each receiver uses a code deshuffler circuit. All shuffler and deshuffler circuits receive the same seed and generate the same sequence of pseudorandom numbers therefrom. These pseudorandom numbers are used to generate read pointers to a framer memory and write pointers to a buffer memory. The framer memory is where the information vectors or symbols are stored, and the read pointers generated by the shuffler circuits are used to read the timeslot data, i.e., symbol/information vector elements out in pseudorandom fashion and store them in a buffer in accordance with the write pointers generated by the code hopping shuffler circuit. The information vector elements thus stored in the buffer are used to do the matrix multiplication required by the code division multiplexing scheme. Alternatively, the symbol elements may be read out sequentially from the framer memory and stored pseudorandomly in the buffer.

The effect of this synchronous CDMA scheme is to "whiten" the noise sources such that no matter how complex the noise signals, the noise can be effectively managed using conventional error detection and correction bits. In other words, the digital data providing the interactive or bidirectional data communication is sent using a CDMA scheme, but for purposes of synchronization, the CDMA scheme is mixed with a TDMA scheme. More precisely, a guardband free of data is added to the CDMA signal. Digital data is transmitted in frames, each frame comprising 3 data symbols and a guardband. The guardband is used for non-data usage such as ranging, alignment and equalization.

The synchronous CDMA modulation scheme disclosed herein may be used with any shared transmission media and with any apparatus or method that can get all remote units synchronized to the frame timing of the central unit including the ranging/alignment scheme disclosed herein. Other possible methods of synchronizing to the same frame timing are for all remote units and the central unit to receive the same timing reference signals from some source such as internal atomic clocks or from an external source such as a Global Positioning System satellite from which all remote units and the central unit are effectively equidistant.

Likewise, the ranging/alignment scheme disclosed herein is useful for any other modulation scheme which transmits digital data in frames, requires frame synchronization and can insert a guardband between the frames.

Some species within the inventive genus use M-ary modulation code division multiplexing. Each remote unit receives a time division multiplexed stream of digital data. Each timeslot contains 9 bits of data. Each 9 bits is stored in a framer memory, and is divided into three tribits, each having 3 bits during readout of the memory. Each of the three symbols transmitted each frame is comprised of 144 of these tribits, one for each timeslot or channel. These tribits are encoded with a 4th bit prior to spreading by the code division multiplexing operation. The 4th bit is added to each tribit based upon the three bits of the tribit and based upon the previous state for this timeslot's data during the last frame. This 4th bit adds sufficient redundancy to enable a Viterbi Decoder in the central unit receiver to make a more error free determination of what data was actually sent in the presence of noise. The 4th bit also maps each tribit to a 16 point QAM (quadrature amplitude modulation) constellation by using the first two bits to represent the inphase or I axis amplitude and the last two bits to represent the quadrature or Q axis amplitude. Thus, M-ary modulation is used to achieve greater spectral efficiency.

With the system described herein, full 10 megabit/second traffic volume per each 6 MHz channel can be achieved in both the upstream and downstream direction over HFC. Unlike conventional CDMA, SCDMA transmission from transmitters like that shown in FIG. 28A stays within 6 MHz bands that do not interfere with or effect other adjacent channels. SCDMA has a number of other advantages over pure FDMA and TDMA systems in terms of capacity, scalability and bandwidth allocation. Standard IS-95 asynchronous Code Division Multiple Access spread spectrum systems are hindered by the capacity constraints of the 5–40 MHz upstream channel and the presence of a large amount of noise, and they often require 30 MHz wide channels which creates channel interference problems with neighboring services in the HFC spectrum. The biggest problem with asynchronous CDMA systems is self-generated noise because the RUs are not aligned with each other thereby losing orthogonality and creating a high degree of mutual interference. The higher self-generated noise raises the noise floor and reduces the capacity. SCDMA system insure that the RUs are in frame synchronization with each other and using orthogonal codes to minimize mutual interference as data is sent upstream. Preferably, SCDMA transmitters are also used to send data downstream. With the system described herein, multiple streams of digital data, each having a 64 kbps throughput can be simultaneously sent over a 6 MHz channel with a total 10 Mbps throughput. Each data stream is Trellis encoded, interleaved and spread over the entire 6 MHz using its own individual spreading code. Use of forward error correction and interleaving increases noise immunity to impulse noise, narrowband interference and Gaussian noise. The Trellis coding adds 4.8 dB coding gain, and interleaving enables withstanding long duration impulse noise of up to 100 microseconds without incurring errors. Use of spread spectrum technology adds another 22 dB processing gain. The combination of techniques yield a total 27 dB interference rejection allowing the system to operate in negative Carrier to Noise Plus Interference Ratio. The SCDMA transmitters are combined with TDMA payload data input streams which makes the system extremely scalable.

The high capacity of the SCDMA system disclosed herein is made possible by orthogonality which is made possible by the orthogonality of the spreading codes which is a result of the ranging process and the equalization process. The ranging process assures frame synchronization such that all codes arrive from distributed RUs arrive at the CU at the same time. The ranging process is carried out periodically to account for cable expansion/contraction with changing temperature, but the process is transparent to payload traffic in that it does not slow it down, stop it or cause errors. Re-ranging occurs upons certain error conditions and upon disconnect from the network and each powerup.

Equalization is achieved by measuring the channel response from each user to the CU and adjusting a precoder at the RU transmitter to "invert the channel", i.e., predistort the transmitted signal such that it arrives undistorted at the CU. Power alignment by each RU such that each RU transmission reaches the CU at approximately the same power level also helps to minimize mutual interference.

Dynamic bandwidth allocation allows as many 64 kbps streams or channels as necessary to be allocated to a particular service so that high demand applications such as video teleconferencing or high speed internet access can be supported simultaneously with low demand applications like telephony over the same HFC link. Bandwidth allocation is managed at the CU through an activity status table in each RU and the CU that indicates the status of each timeslot and code assignments. The CU updates the RU tables by downstream messages. Bandwidth can be guaranteed upon request while other services with more bursty traffic may contend for the remainder of the total 10 Mbps payload.

The advantages over TDMA systems include less need for fast acquisition and correspondingly lower sensitivity to narrowband interference. Further, below a certain SNR, TDMA systems may fail altogether. Contention for certain channels and contention affecting adjacent can cause amplifier overload in TDMA systems and can cause severe throughput and performance problems. FDMA systems where each user gets a narrow upstream frequency slice is very susceptible to narrowband noise which can wipe out an entire channel. FDMA systems often try to avoid this problem with frequency reallocation. This complicates and raises the cost of the system by requiring more intelligence. Throughput is also adversely affected as nothing is sent while frequencies are reallocated. Guardbands between channels waste bandwidth, and frequency misalignment degrades FDMA systems.

Any method or apparatus that uses these inventive concepts is within the teachings of the invention and is deemed to be equivalent to the apparatus and methods described herein.

BRIEF DESCRIPTION OF THE DRAWINGS

FIG. 1 is a block diagram of a general system according to the genus of the invention for simultaneous transmission of digital data from multiple subscribers to a head end receiver over a shared coaxial cable using orthogonal codes and for recovery of the separate data streams from each subscriber at the head end receiver.

FIG. 2 is the mathematical relationship that defines the property of orthogonality of the codes used by the modulator/transmitters in FIG. 1.

FIG. 3A is the mathematical relationship that the system of FIG. 1 uses to recover the individual data streams sent by the subscribers at the head end and vice versa, and FIGS. 3B through 3G illustrate a specific working example of how the mathematical relationship of FIG. 3A could be used to transmit two channels of data simultaneously over the same shared media.

FIG. 10 shows a typical cable television system arrangement in which the teachings of the invention find utility in a multi-RU, multichannel environment where the head end at the location of the CU sends FDMA cable television programming to television sets at the locations of the Rus and the Rus and Cus simultaneously communicate multiple channels of digital data over the same CATV coax using a combination of TDMA/CDMA and FDMA in some embodiments.

FIG. 11 is a block diagram of one general multichannel embodiment for the internal structure of each RU modem's transmit channel circuitry for transmitting data to the CU and a general structure for a CU to recover the data and illustrating how multiple external devices send data to each RU in TDMA streams.

FIG. 13 also shows a number of other signals generated by time base generator 350 in FIG. 12.

FIG. 23A illustrates how the information vector [b] for each symbol has its energy spread over time by the process of code division multiplexing implemented using matrix multiplication of the information vector [b] of each symbol times a matrix of orthogonal codes.

FIG. 23B is another illustration of the matrix multiplication process carried out in an orthogonal multiplexer 408 in FIG. 19 to encode the real or I coordinates of each information vector using an orthogonal code matrix to generate the real or I coordinates of a result vector for use by the QAM modulator.

FIG. 27 is a general block diagram illustrating a shuffler circuit useable in some embodiments to achieve code diversity.

FIG. 28A is a block diagram of the preferred embodiment of a transmitter within the inventive genus of the invention using bit parsing from each timeslot, TDMA/CDMA spreading, M-ary QAM modulation, code diversity, encoding of each tribit with redundant bits for forward error correction and to aid Viterbi Decoding in the receiver, scrambling of bits of each tribit for security and signal to noise improvements, ranging according to the preferred species and equalization circuitry.

FIG. 44 shows the mapping for the least significant bits and most significant chips in fallback mode.

DETAILED DESCRIPTION OF PREFERRED EMBODIMENT

Figure 4A:
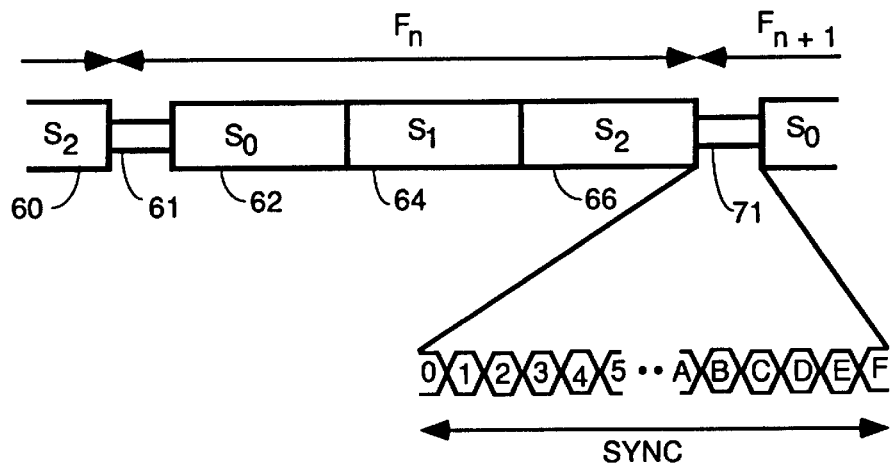
FIG. 4A shows a typical data structure for a frame.

Code Division Multiple Access System for CATV Media

Many of the individual concepts utilized in systems according to the teachings of the invention are known in the prior art and are described in detail in Dixon, *Spread Spectrum Systems with Commercial Applications* (3rd Ed. 1994) Wiley & Sons, ISBN0-471-59342-7, and Haykin, *Communication Systems* (3rd Ed. 1994) Wiley & Sons, ISBN 0-471-57178-8, both of which are hereby incorporated by reference.

Referring to FIG. 1, there is shown a conceptual diagram of a system for multiple access digital communication over a cable TV coaxial conductor distribution system using orthogonal codes for CDMA. The system of FIG. 1 depicts only the circuitry to transmit data from multiple subscribers to a head end receiver. Similar circuitry to transmit data from the head end back to the subscribers exists but is not shown for simplicity. The details of how to design circuits to carry out the various functions described herein are known in the art including the excellant treatise, Dixon, "*Spread Spectrum Systems with Commercial Applications*", Third Edition, 1994 (Wiley & Sons, New York), the entirety of which is hereby incorporated by reference.

FIG. 2 is the mathematical relationship that defines the property of orthogonality of the codes used by the modulator/transmitters in the system. The codes used in modulator/transmitters 12 and 16 are orthogonal if the summation of the product thereof over time from 0 to T is equal to 1 if the codes are the same code, i.e., if i=j where i=code #1 and j=code #2, but is zero if i is not equal to j. In other words, if the codes are different and orthogonal, the summation of the products of the signals modulated by these orthogonal codes is zero, meaning that signals modulated by the different orthogonal codes can travel over the same conductor without interference and without crosstalk. There is more that one set of orthogonal codes, but any orthogonal code will suffice to practice this aspect of the teachings of the invention.

FIG. 3A is the mathematical relationship which the system of FIG. 1 uses to send multiple channels of digital data over the same conductor without interference between channels. [b] in FIG. 3A represents an information vector that contains a symbol to be transmitted on each channel as a vector element. [c] represents a code matrix having the unique orthogonal code for each channel as its columns. $[c^T]$ represents the transpose matrix of the code matrix [c] where each column of [c] becomes a row of $[c^T]$. Finally, [i] represents the identity matrix where all entries are zeroes except for a line of 1's along the diagonal. In FIG. 1 to be described below, the matrix multiplication [b]×[c] is the processing that occurs on the transmit side of each transmission. The processing that occurs on the receiver side of the transmission is a matrix multiplication of the transpose matrix $[c^T]$ times the signals generated on the transmit side by the multiplication of the information vector [b] times the code matrix [c] to yield a matrix representing the product [b]×[i]. Because the identity matrix is known, the product [b]×[i] allows recovery of the information vector [b].

To utilize these mathematical relationships of FIGS. 2 and 3A and convert them into a practical digital data communication system, symbolized by the system of FIG. 1, subscriber #1 provides a digital input stream of symbols or bits using any input device or computer (not shown). This digital data stream to be transmitted to the head end arrives on bus 10 at the data input of a code #1 modulator/transmitter 12. This digital data stream will be divided into individual symbols transmitted at the rate of three symbols/frame in the preferred embodiment. The teachings of the invention can be employed using symbols, data bytes or any other grouping of digital data. The first bit from the stream on bus 10 will be the first vector element in the information vector [b]. For the sake of simplicity, the manner in which symbols are formed from the incoming data stream will not be described here, but will be described in greater depth below herein. In the preferred embodiment, symbols are formed by filling individual address locations in a framer memory (not shown) with 9 bit bytes which arrive one per timeslot. The individual data streams on buses 10 and 14 are TDMA streams divided into multiple successive timeslots. Thus, time increases along one axis of the framer memory. Symbols are formed by reading the memory "across time", i.e., along an axis orthogonal to the axis of increasing time.

In the embodiment shown in FIG. 3A, modulator/transmitter 12 converts the digital data in the data stream arriving on bus 10 into amplitude modulations of a carrier signal using a first orthogonal code, and outputs the modulated carrier signal on feeder link coaxial conductor 18 coupled to an input of a summer 20. To do this, the modulator/transmitter 12 performs a matrix multiplication of the the element of the information vector [b] from the TDMA stream on bus 10 times the appropriate element of the first column of code matrix [c], i.e., code #1 and uses the results to control a modulator which appropriately modulates an RF carrier. All other elements of the information vector [b] representing data from other TDMA streams at other locations are set to zero at the location of modulator/transmitter 12 but are set to the appropriate values at the modulator/transmitters at the locations of their respective TDMA streams. Thus, each modulator/transmitter does only the portion of the matrix multiplication [b]×[c] for data from its TDMA stream. The individual partial products from each modulator are summed by a summer 20 to give a result vector R=[b]×[c] representing the final result of the full matrix multiplication.

Likewise, subscriber #2 provides a digital data input stream on bus 14 to a code #2 modulator/transmitter 16. This digital data stream on bus 14 will be divided into individual symbols or bits to be transmitted. The first bit from the stream on bus 10 will become the second vector element in the information vector [b].

Modulator/transmitter 16 converts the digital data in the data stream arriving on bus 14 into amplitude modulations of a carrier signal by partial matrix multiplication similar to that done by modulator/transmitter 12 using a second code, i.e., another column of the code matrix [c] which is orthogonal to said first code. Modulator/transmitter 16 then outputs the modulated carrier onto a feeder link coaxial cable 22 coupled to another input of summer 20. That is, the modulator/transmitter 16 performs the multiplication of the second element of information vector [b] times the appropriate element of the second column of code matrix [c], i.e., code #2.

The effect of the multiplications by the modulator/transmitters 12 and 16 is to spread the energy of each bit or symbol to be transmitted out over time by multiplication of each bit in the information vector by the multiple code elements in the appropriate column of the code matrix [c].

Further, because the symbols are read from the framer memory "across time", the individual bits in the TDMA streams in the time domain on buses 10 and 14 are not transmitted in contiguous temporal relationship in the symbols used in the matrix multiplications to generate the signals transmitted in the code domain on coaxial/fiber data paths 18, 22 and 24. This form of spread spectrum modulation renders the system less susceptible to burst or impulse noise interference that adversely affects timeslots in the TDMA streams. The use of orthogonal codes provides simultaneous multiple access such that multiple digital channels can be simultaneously transmitted over a shared data path, and minimizes crosstalk between digital channels, especially where proper frame timing alignment among multiple subscribers is utilized. To implement this modulation scheme, each of the modulator/transmitters 12 and 16 uses the partial results of the multiplication [b]×[c], i.e., one element of the [b] vector times the appropriate element of a column of the [c] matrix, to modulate a carrier signal generated therein to generate the RF signals which are summed by summer 20 and transmitted to the head end receiver 26 on coaxial links 18 and 22.

As a specific example to illustrate how the information vector is multiplied by the code matrix in the transmittter/modulators, please refer to the following. In this hypothetical, assume that code #1 for user 1 is [1,1] and that code #2 for user 2 is [1, −1], as depicted on FIG. 3B. Thus, the first column of the code matrix will be $1/\sqrt{2}$, and $1/\sqrt{2}$ from top to bottom and the second column of the code matrix will be $1/\sqrt{2}$, and $-1/\sqrt{2}$ from top to bottom, all as shown in FIG. 3C. Note that each code element in this embodiment is divided by $\sqrt{2}$ for reasons which will be described below.

Also, assume that user 1 asked for and received one channel designated channel #1 from a head end allocation circuit (not shown) and wants to transmit a +1 during a first frame of data on transmission media 24. Also, assume that user 2 asked for and received one channel to transmit data and that channel is designated channel #2, and assume that user 2 wants to transmit a −1 during the first frame. In such a case, the information vector [b] for the first frame of data to be transmitted is [1, −1] with the first element, 1, representing the number the first user wants to send during the first frame on channel 1, and the second element, −1, representing the number the second user wants to send during the first frame on channel #2. These concepts are all represented by FIGS. 3D and 3E.

The multiplication of the information vector [b] times the code matrix [c] results in a result vector R for transmission of $[0,2/\sqrt{2}]$. This multiplication is done by multiplying information vector [1, −1] times the first column of the matrix and summing the two products $1/\sqrt{2}$ and $-1/\sqrt{2}$) to yield 0 as the first element of the result vector. Next, the information vector [1, −1] is multiplied by the second column of the code matrix to yield two partial product results of $1/\sqrt{2}$ and $1/\sqrt{2}$. These two partial product results are summed by the summer 20 to yield the second element in the result matrix, $2/\sqrt{2}$, all as shown in FIG. 3F. Therefore, the modulator/transmitter 12 will modulate the carrier to an amplitude or frequency representing the level 0 of the first element of the result vector $R=[0,2/\sqrt{2}]$ during a first time and drive the carrier so modulated onto coaxial link 18 during the first time. Likewise, the modulator/transmitter 16 will modulate the carrier to an amplitude or frequency representing the level $2/\sqrt{2}$ of the second element of the result vector R during a second time and drives the carrier so modulated onto coaxial link 22 as the combined signal carrying the data from both channels #1 and #2 simultaneously across the shared transmission media 24.

Shared transmission media 24 can be any metallic or fiber optic media, terrestial microwave link or satellite/cellular link. Appropriate interface circuitry to place the result signal represented by the vector $[0,2/\sqrt{2}]$ onto the particular transmission media are known and are not critical to the invention.

The multiplication [b]×[c] is carried out by the two code modulator/transmitters 12 and 16, each doing a part of the multiplication. Modulator 12 multiplies the first element of the information vector [b] from subscriber #1 times the elements in the first row of the code matrix and outputs the resulting partial products during two successive intervals on line 18 coupled to the input of the summer 20. Likewise, the code #2 modulator 16 multiplies the second element of the information vector [b] from subscriber #2 times the two elements in the second row of the code matrix [c] and outputs the resulting two partial products on line 22 to the summer 20 during the same two successive intervals used by modulator 12. The signals output by the modulator/transmitters 12 and 16 during the first of the two successive intervals are summed by summer 20 and output on coaxial cable 24 as the first component, 0, of the result vector $R=[0,2/\sqrt{2}]$. The signals output by the modulator/transmitters 12 and 16 during the second of the two successive intervals are summed by summer 20 and output on coaxial cable 24 as the second component, $2/\sqrt{2}$, of the result vector $[0,2/\sqrt{2}]$.

Not shown in FIG. 1 for simplicity is a modulator that takes the result vector and uses it to modulate the amplitude, phase or frequency (or some combination of these) of a radio frequency carrier, which is then input to the shared transmission media 24 for transmission to the head end.

To recover the original information vector [b], on the receiver side of the transaction, the receivers multiply the received signals times the transpose code matrix $[c^T]$ in a manner to reverse the encoding process. To derive the transpose matrix, the columns of the code matrix [c] become the rows of the transpose matrix $[c^T]$. In the hypothetical example at hand, the transpose matrix will have $[1/\sqrt{2}, 1/\sqrt{2}]$ as its first row corresponding to the first column of the code matrix [c]. The second row of the transpose matrix will be $[1/\sqrt{2}, -1/\sqrt{2}]$ corresponding to the second column of the code matrix [c], as shown in FIG. 3G. Thus, in the example at hand, the transpose matrix $[c^T]$ is actually identical to the code matrix [c]. The result of multiplication of the result vector $R=[0,2/\sqrt{2}]$, representing the signal on coaxial cable 24, times the first column of the transpose matrix is $0+2/2=1$ for the first element of the recovered information vector [b]. The result of multiplication of the result vector $[0,2/\sqrt{2}]$ times the second column of the transpose matrix is $0+(-2/2)=-1$ for the second element of the recovered information vector [b]. The resulting recovered information vector [b] is $[1, -1]$.

In the preferred embodiment, a normalization factor, equal to the square root of the number of separate codes in use, is used on both the transmit and receive sides as a denominator for each code matrix element and as a denominator for each transpose matrix element. This enables recovery by the receivers of an information vector [b] which has elements which are equal to the original data generated by the users. In the example of FIGS. 3B through 3G, each of the elements in the code matrix [c] (and, consequently, its transpose matrix $[c^T]$) are divided by this normalization factor $\sqrt{2}$.

Returning to the discussion of FIG. 1, coaxial cable 24 is coupled to a head end receiver 26. At the head end receiver, the signal on cable 24 is split onto separate coaxial cable links 28 and 30, each of which is coupled to a receiver of which receivers 32 and 38 are typical. The function of the receivers is to demodulate the received signals to derive the elements of the result vector which were used as modulation factors, and to multiply these result vector elements times the columns of the transpose matrix $[c^T]$ to recover the information vector [b] originally transmitted. To accomplish this function, link 28 is coupled to the analog input of a receiver 32 which is comprised of a multiplier 34 and an integrator 36.

Not shown, for the sake of simplicity, is a demodulator/discriminator which converts the amplitude, phase or frequency variations (or some combination of the two) of the incoming RF signals received from coaxial cable/fiber optic data path 24 into analog signals representing the result vector elements which are coupled to the analog inputs of the multipliers 34 and 40.

The multiplier 34 receives as one input the demodulated analog signal on link 28 and as another input on line 35 an analog signal representing the elements in column 1 of the transpose matrix $[c^T]$.

Likewise, link 30 and the demodulator/discriminator (not shown) is coupled to a receiver 38 which is comprised of a multiplier 40 and an integrator 42. The multiplier 40 has as one input, the analog demodulated signal from link 30 and has as another input a signal on line 37 representing the elements of column 2 of the transpose matrix $[c^T]$.

Multiplier 34 multiplies the signals on link 28 during a first time interval times the first column element of the first column of the transpose matrix and outputs the result on line 44 to the summation input of integrator 36. During the second time interval when the second element of the result vector $[0,2/\sqrt{2}]$ is arriving, the multiplier 34 multiplies the second element thereof, $2/\sqrt{2}$, times the second element in the first column of the transpose matrix $[c^T]$ and outputs the partial product result on line 44 to the summation input of the integrator 36. The integrator 36 sums the two partial products from the first and second time intervals, and outputs the sum on line 46 as the first element, 1, of the recovered information vector [b].

Likewise, multiplier 40 multiplies the signals on line 30 during a first time interval when the first element, 0, of the result vector $[0,2/\sqrt{2}]$ is arriving times the first element of the second column of the transpose matrix $[c^T]$ arriving on line 37. The resulting partial product is output on line 48 to the input of the integrator 42. During the second time interval, when the second element $2/\sqrt{2}$ of the result vector $[0,2/\sqrt{2}]$ is arriving on coaxial link 30, multiplier 40 multiplies this second element times the second element of second column of the transpose matrix. The resulting partial product during the second time interval is output on line 48 to the integrator 42. The integrator sums the two partial product results on line 48 over time, and outputs the result on line 50 as the second element, $-1$, of the recovered information vector [b]. The information vector [b] can then be disassembled into its components such that the TDMA data streams from which data was taken to compose the information vector can be re-created at the receiver end of the transaction.

Those skilled in the art will appreciate that the first and second conductors could also be assigned to carrying two different data streams sent on different channels both of which were originated by the same subscriber.

Throughout this example, the conductors of the distribution system have been referred to as coaxial cable. Those skilled in the art will appreciate that with suitable adjustments of the frequencies of operation and addition of appropriate transmit and receive circuitry, one or more of the various coaxial cable links described herein could be fiber optic cable, microwave links, radio frequency links, etc. since the medium of transmission is not critical to the invention.

Use of Cyclic Codes in Code Division Multiple Access for Better Performance

In the preferred embodiment, the orthogonal codes used in the modulator/transmitters are cyclic codes. In cyclic orthogonal codes, all codes used are the same sequence of numbers, but each code is shifted by one or more bit positions from the preceding code. Although any set of orthogonal codes will work to implement the invention, the cyclic orthogonal codes simplify implementation issues by reducing the amount of storage needed to store the codes.

Those skilled in the art will appreciate that each subscriber transmitter may transmit multiple channels of digital data, and that the matrix multiplication and summation operations described above may be performed with digital circuitry such as suitably programmed microprocessors.

In an alternative embodiment, the separate streams of digital data are transmitted using spread spectrum frequency hopping techniques. In this embodiment, a first stream of digital data will be transmitted from one end to the other using a carrier that hops in frequency in accordance with a first predetermined coded sequence. Likewise, the second stream of digital data is transmitted on a carrier that hops in frequency in accordance with a second predetermined sequence. In this embodiment, the transmitter/modulators receive code sequence inputs that control the frequency of an oscillator that generates a carrier frequency. The codes that control the frequency of the transmitters for the various channels are orthogonal. The receiver for channel 1 receives the same code sequence that was fed to the transmitter for channel 1. This code sequence controls the frequency of a local beat frequency oscillator for receiver 1 and is synchronized with the code sequence fed to the transmitter for channel 1. Likewise, the receiver for channel 2 receives a code sequence that is orthogonal to the receiver for channel 1 code sequence and controls the beat frequency oscillator of the receiver for channel 2 to synchronously generate hops in the local oscillator frequency that track the hops in the frequency of the carrier for the transmitter for channel 2.

Synchronous CDMA: The Alignment/Ranging Process to Achieve Frame Synchronization Alignment is an important issue for optimal operation of the system of the genus represented by FIG. 1 with minimal cross talk between channels. In the system of FIG. 1, the time slots in the TDMA streams on lines 10 and 14 are the channels. The digital data in each time slot in the TDMA streams on lines 10 and 14 is data transmitted on that channel. The digital data in the TDMA streams is re-arranged into symbols, as described briefly above, and is transmitted in frames, with three symbols plus one guard band or gap per frame. The guardband or gap is reserved for transmission of alignment barker codes, and no other data is supposed to be transmitted during the gaps.

The concept in alignment is to adjust variable delays imposed at the site of each transmitter prior to transmission of a barker code so as to compensate for different propagation delays from each transmitter site such that the barker code from each subscriber transmitter trying to align arrives at the head end receiver during the same gap. When the variable delays at each subscriber transmitter are adjusted properly, each subscriber will be said to be in alignment so that the signals encoding the symbols that are simultaneously transmitted on the shared data path 24 will all be transmitted with the same frame timing.

Alignment is important to obtain pure orthogonality so as to obtain zero cross talk. If the transmitters are not perfectly aligned, the signals transmitted can still be recovered, but there is some cross talk between channels which will limit the capacity of the system to carry information.

This process of aligning all the delay circuits in the transmitters is sometimes alternatively called ranging herein and is broadly applicable to other types of multiple access digital data transmission systems also which suffer from different propagation times from different transmitter sites such as time division multiple access systems that form part of the prior art discussed above.

Referring to FIG. 4A, there is shown a diagram of the typical frame structure. In the preferred embodiment, each frame is composed of three symbols of 144 chips each and a gap or guardband comprised of 16 chips for a total of 448 chips each having 278 nanoseconds duration. The chip is the basic unit of time in the "code domain", where code domain refers to the signals propagating across the shared media. In the preferred embodiment, each chip is a QAM modulated element of a result vector where the result vector is comprised of a number of elements equal to the number of timeslots and is the result of code division spreading of the elements of an information vector constructed from the bits of each channel or timeslot. In the preferred embodiment, each receiver receives a TDMA serial bit stream comprised of 144 individual timeslots or channels each of which contains 8 bits. To these 8 bits there is added a 9th bit in the preferred embodiment which can be used for side channel conversations with the CU unrelated to the data received from the external device. These 9 bits are divided into three tribits of 3 bits apiece. A collection of 144 of these tribits is stored in a framer memory and, in some species within the inventive genus, these 144 tribits will be the information vector which is multiplied by the code matrix to generate a result vector having 144 elements. These 144 result vector elements will be QAM modulated to generate the 144 chips that are transmitted as a symbol. This process is repeated for each of the three tribits of each timeslot thereby resulting in the transmission of three symbols in each frame. In the preferred embodiment however, each tribit is encoded with one or more redundant bits based upon the three bits and the state of these same three bits of the same timeslot during the last frame. The redundant bit(s) is calculated to aid a Viterbi Decoder in a receiver in the central unit to ascertain with a higher degree of accuracy from the received signals which have been corrupted by media impairments what bits were originally present as each tribit. Some species within the inventive genus may omit the addition of the redundant bits and the Viterbi Decoder and many advantages within the genus of the invention will still be present although a higher bit error rate will result.

One skilled in the art will appreciate that the construction of the information vector which will be used to generate each symbol by taking only some of the bits from each timeslot spreads the data from each timeslot out over time. This renders the data less susceptible to burst noise. The code division multiplexing allows multiple channels of digital data to be simultaneously transmitted in a 6 mHz channel without interference between channels. In addition, frequency division multiplexing may be utilized to transmit even more channels of digital data above and beyond the 144 channels transmitted in the first 6 mHz channel. In other words, another 144 different TDMA digital channels may be code division multiplexed and transmitted simultaneously with the first 144 digital channels but on a second 6 mHz channel. This second 6 mHz channel has a different center frequency than the first 6 mHz channel which is separated from the center frequency of the first 6 mHz channel sufficiently to not interfere therewith. Both the first and second 6 mHz channels have center frequencies which are separated sufficiently from the center frequencies of the cable television programming sharing the same media so as to not interfere therewith. In alternative embodiments, this scheme can be replicated with any number of symbols greater than 1, or with only one symbol if immunity to burst noise is not important.

In FIG. 4A, the three symbols of frame $F_n$ are symbolized by blocks 62, 64, and 66. The gap or guardband is symbolized by blocks 60 and 71. There is one guardband associated with each frame. The guardband 71 (sometimes also referred to herein as the gap) is used for synchronization and equalization purposes for the frame comprised of symbols 62, 64, 66 and guardband 71. The symbols carry the information for the various channels of digital data provided to the subscribers. The frame period is 125 microseconds. The frame data payload is 128 channels times 72 kilobits per second per channel plus 16 control and management channels each of which has a data rate of 72 kilobits per second for management and control information.

Hereafter, each subscriber transmitter will be referred to as a remote unit or RU, and the central unit or head end will be referred to as the CU.

The process of synchronization is the process wherein each RU is "trained", i.e., has a variable delay in its transmitter set using feedback from the CU on one of the management and control channels such that the transmitted frame from each RU arrives at the CU at the same time. Alignment of all frames from all RUs results in the beginning of the gap 60 for each frame from each RU occurring at the same time at the location of the CU regardless of differences in propagation delays from the various RUs to the CU. In FIG. 4A, time increases to the right. Therefore the beginning of the guardband 60 is located at point 61.

Figure 4B:
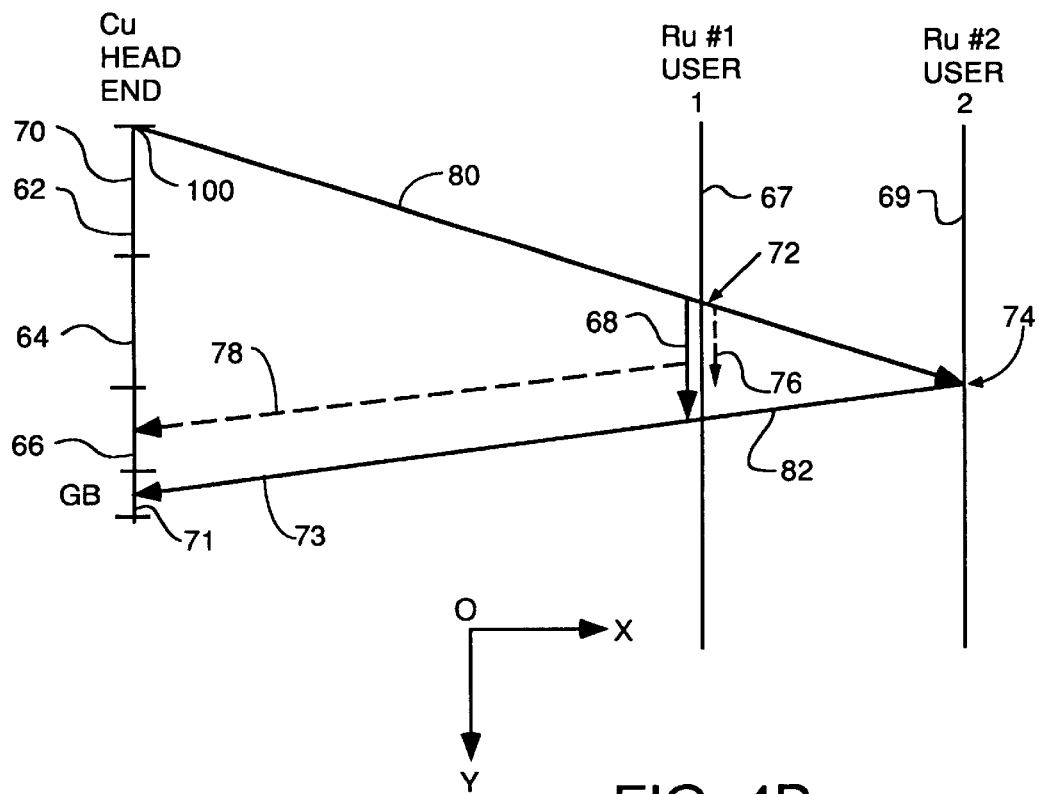
FIG. 4B is a symbolic diagram illustrating the concepts involved in alignment to achieve frame synchronization, also called ranging herein, for the preferred species within the genus of the invention.

Alignment of any Digital Data System that Sends Data Bits Collected as Frames Referring to FIG. 4B, there is shown a symbolic diagram illustrating the concepts involved in alignment. In FIG. 4B points having increasing positive coordinates along the y-axis starting from the origin at 100 represent increasing time. Points along the x-axis to the right of origin represent increasing distance from the central unit which is designated at position 70. Time 100 represents the beginning of symbol 62 in FIG. 4A at the CU. The gap 71 at the end of the three symbols will be used for alignment, and the end of gap 71 will be deemed the end of the frame.

The alignment process is started asynchronously by any RU that needs to align. The central unit transmits a barker code during each frame at the same time in the frame. This barker code is received by each remote unit at a different time because of different propagation delays, but as to any particular RU, the barker code is always received at the same time during every frame until the CU changes its delay (a concept to be discussed more fully below). The barker code represents a trigger to any RU attempting to align and marks the receive frame timing reference for that RU. The time of receipt of the barker code represents the start of the variable delay interval being adjusted by the RU during the alignment process.

The CU's "every frame" barker code transmission during the frame shown in FIG. 4B is represented by line 80. The barker code is received by RU #1 at position 67 at time 72. The barker code is received by RU #2 at position 69 at time 74. The alignment process is a trial and error process of adjusting a delay from the time of receipt of the barker code to the time of transmission of the same barker code by each RU back toward the central unit 70 until the delay is properly adjusted such that the re-transmitted barker code arrives at the CU during the gap. Vector 68 represents correct delay timing for RU #1 at position 67 such that its barker code transmission 73 arrives in the middle of the gap 71. Dashed vector 76 represents an incorrect delay resulting in a barker code transmission, represented by dashed line 78, from RU #1 which arrives sometime during the middle of symbol 66 thereby missing the gap 71. This condition represents an incorrect alignment and may result in crosstalk.

Likewise, the RU #2 at position 69 uses zero delay and emits a barker code transmission 82 immediately upon receipt of the barker code trigger transmission 80 from the CU 70. This barker code transmission 82 from RU #2 also arrives during the middle of gap 71 thereby indicating that RU #1 and RU #2 are correctly aligned.

The alignment barker code transmissions are typically short bursts having energy levels which are sufficient to make detection during gap 71 easy even though gap 71 also includes random noise energy.

The alignment barker code transmissions are detected during the gap by performing a correlation mathematical operation in the CU receiver between the barker code that was transmitted and the received signal. If the received signal was the same barker code that was transmitted by the CU, the correlation operation will output a signal that peaks at the time of maximum overlap between the barker code transmitted by the CU and the received signal. The timing of this peak indicates the alignment state of the RU that transmitted the barker code which resulted in the peak. Because the barker code transmissions are relatively short in duration and their amplitudes are not excessive, arrival of a barker code transmission during the middle of a symbol will generally not cause errors in the interpretation of symbol 66 by the CU receiver. Each symbol encoded in the code domain includes error detection and correction bits (ECC bits) such that any errors that occur can usually be detected and corrected when the symbols are re-constituted by the framer circuitry in the receiver. Therefore, if the barker code alignment transmission does result in an error, that error will usually be within the detection and correction range of the ECC bits of each symbol.

Figure 5:
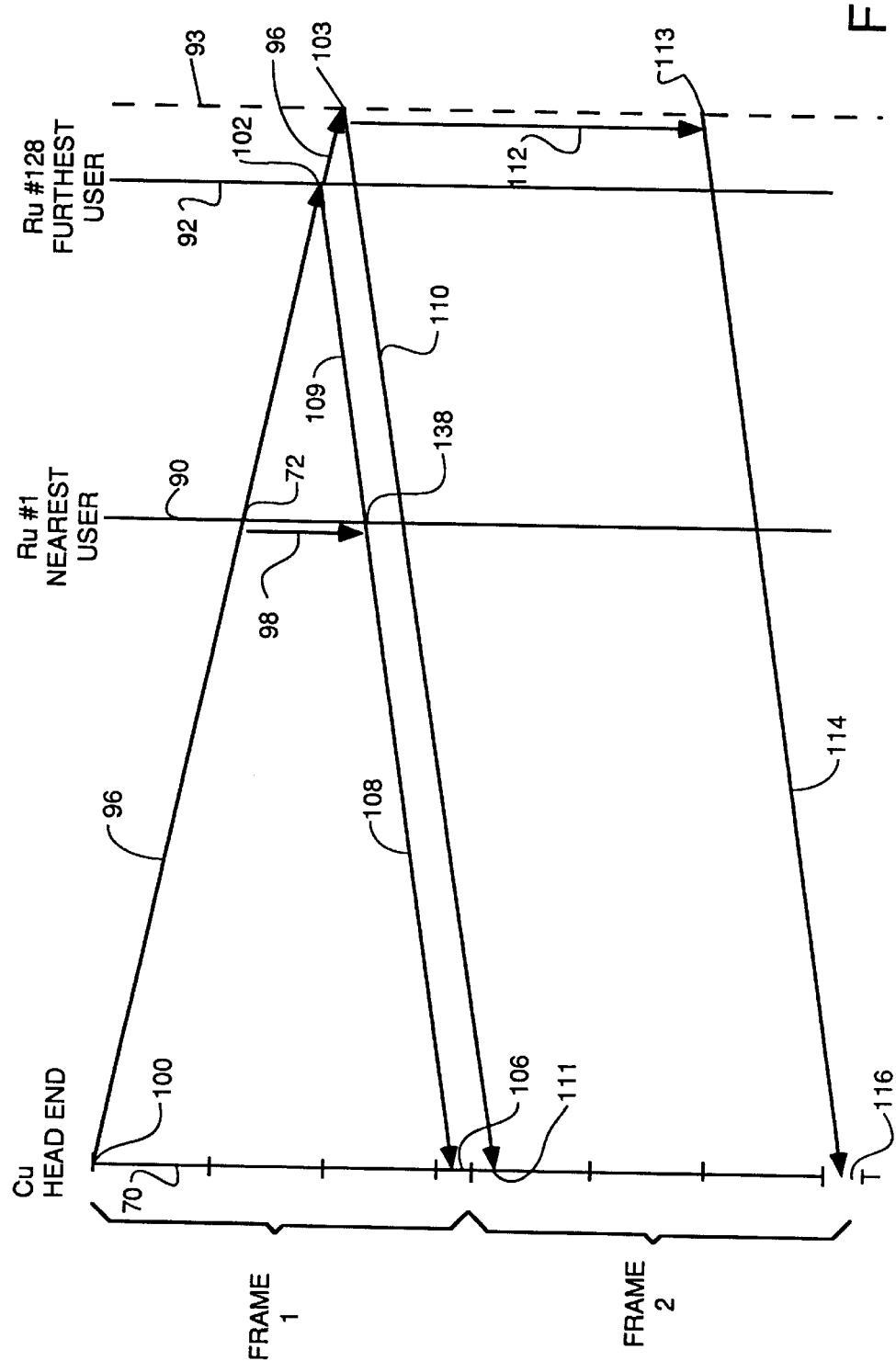
FIG. 5 is a diagram like that of FIG. 4B which illustrates a problem requiring re-alignment which occurs when the network physically expands.

Referring to FIG. 5, there is shown a diagram like that of FIG. 4B which illustrates a problem which occurs when the network physically expands. This can occur under certain circumstances such as during the heat of a summer afternoon when the physical media thermally expands thereby altering the propagation times of barker code signals from the CU to the RUs and from the RUs back to the CU. In the example shown, the CU 70 transmits barker code 96 at time 100. This barker code reaches the nearest RU, RU #1, at position 90 at time 72. The same barker code reaches the furthest RU, RU #128, located at position 92 at time 102. RU #1 uses a delay symbolized by vector 98 and re-transmits the barker code 108 at time 138. This alignment transmission hits gap 106 in frame #1 indicating that RU #1 is properly aligned.

The RU #128, when located at position 92 uses no delay and immediately retransmits barker code transmission 109 at time 102. Transmission 109 also arrives during gap 106 indicating that, at least at position 92, RU #128 is properly aligned.

Now suppose that the network physically expands such that RU #128 finds itself physically at position 93. In this position, RU #128 receives barker code transmission 96 from the CU at time 103, and, because RU #128 is already using the minimum possible delay for retransmission of an alignment code, alignment transmission 110 is also transmitted at time 103. However, because of the physical expansion of the network, alignment transmission 110 reaches the CU at time 111 which is after the end of the gap 106 and sometime in the middle of the first symbol of frame #2.

When an RU properly hits the gap, it is authenticated, i.e., identified, and the CU tells it that alignment has been achieved thereby causing the RU to stop adjusting its delay by trial and error. Because RU #128 does not receive any acknowledgement from the CU that it is properly aligned, its starts incrementing its delay vector in a trial and error process. After several incrementations, the delay vector finally reaches the delay represented by vector 112. With this delay vector, an alignment transmission 114 is transmitted from RU #128 at time 113 which reaches gap 116 located at the end of frame 2. However, this means that RU #128 is synchronized with the wrong frame. It is required for proper operation of the system to have all RUs synchronized to the gap at the end of the same frame in which the barker code transmission from the CU which triggered the RUs alignment transmissions occurred. If one or more RU aligns to the gap at the end of another frame, the results can be disastrous in terms of errors generated in the CU receiver in interpreting data transmitted by the RUs.

Figure 6:
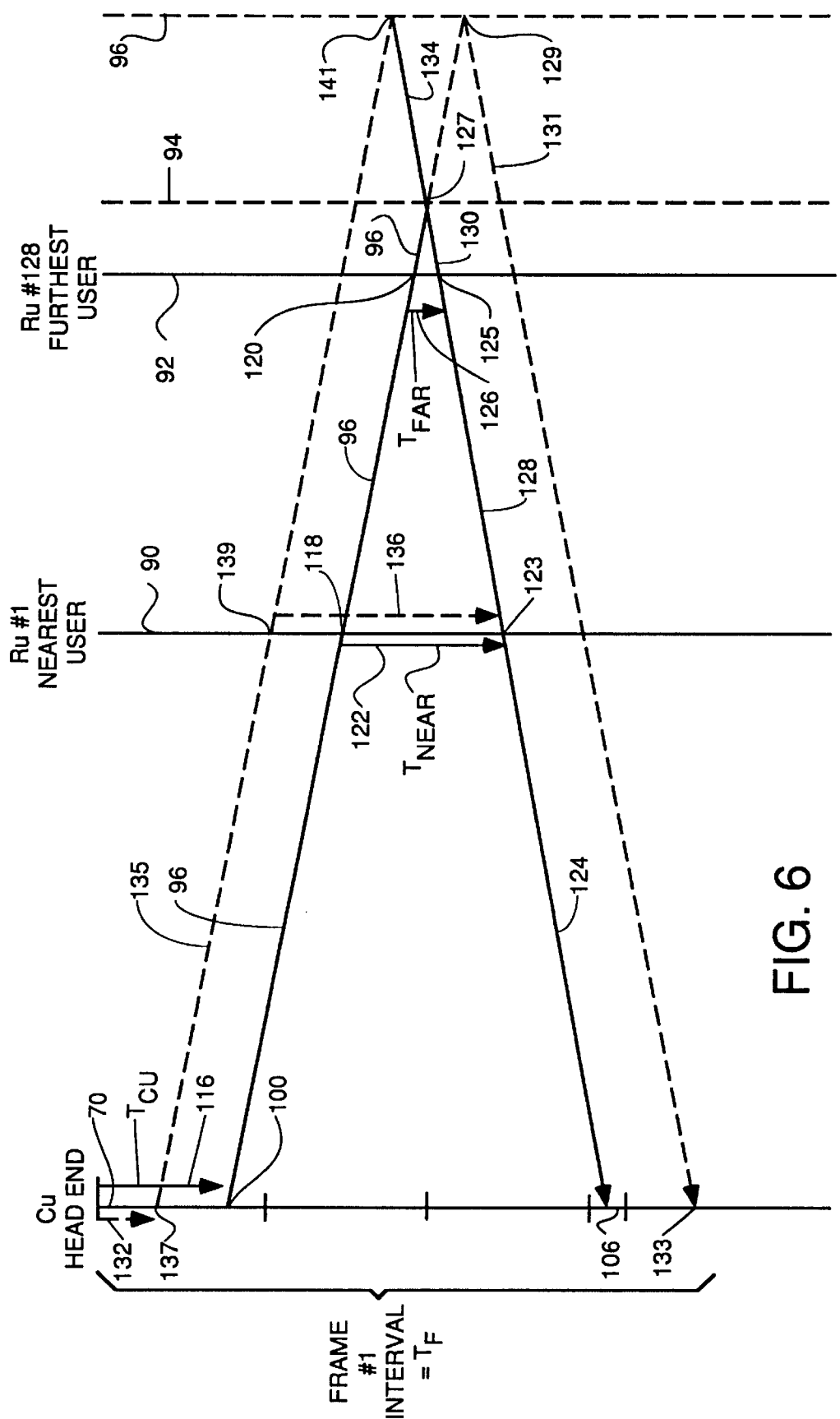
FIG. 6 is a diagram like that of FIG. 5 which illustrates the solution to the misalignment problem outlined in the discussion of FIG. 5.

Referring to FIG. 6, there is shown a diagram like that of FIG. 5 which illustrates the solution to this misalignment problem outlined in the discussion of FIG. 5. In the diagram of FIG. 6, CU 70 imposes a delay, represented by vector 116, prior to transmitting the alignment triggering transmission 96 at time 100. The barker code transmission 96 arrives at the nearest RU, RU #1, at position 90 at time 118. Time 118 establishes the receive frame timing for RU #1. RU #1 then imposes a delay represented by vector 122 and transmits the same barker code alignment transmission 124 at time 123. Time 123 establishes the transmit frame timing reference for RU #1. The time delay between times 118 and time 123 is predictable since the CU will transmit its barker code transmission 96 at the same time during every frame until such time as it is necessary to alter the timing of transmission 96 to keep all RUs in alignment. In other words, the time of reception of the barker code transmission 96 for all RUs is predictable and will be a periodic signal which happens once during each fame. The alignment transmission 124 from RU #1 reaches gap 106 at the end of frame #1.

The alignment transmission 96 from the CU reaches RU #128, the furthest RU, at time 120. Time 120 establishes the receive frame timing reference for RU #128 while at position 92. Thereafter, at time 125, the RU #128 transmits alignment transmission 128. This transmission arrives during the gap 106 at the end of the first frame thereby indicating that RU #128 is properly aligned at this position.

As in the case of RU #1, the delay between times 120 and 125 for RU #128 is predictable.

Now suppose that the network expands, and RU #128 finds itself at position 94. In this position, the CU alignment triggering transmission 96 arrives at time 127. In order to stay aligned, RU #128 will reduce its delay vector 126 to zero and immediately retransmit an alignment transmission 130 comprising the same barker code which it received. The transmission 130 arrives during gap 106 thereby indicating that RU #128 is still aligned at its new position by cutting its delay vector to zero.

Now assume that the network further expands such that RU #128 finds itself at position 96. In this new position, alignment transmission 96 from the CU would arrive at time 129. With a zero delay by RU #128, the resulting alignment transmission 131 would arrive at time 133 just after the end of the gap 106 thereby indicating the RU #128 had been taken out of alignment by the expansion of the network. RU #128 would then continue to adjust its delay vector until it aligned to the next gap following the end of frame #2 thereby causing errors.

To prevent this from happening, when the CU finds that an RU which was previously in alignment has gone out of alignment because of network expansion, the CU will reduce its initial delay from the delay represented by vector 116 to the delay represented by vector 132. With this new delay vector, a barker code alignment triggering transmission 135 will be transmitted at time 137. This alignment triggering transmission 135 will arrive at the position of RU #1 at time 139 and will establish a new receive frame timing reference. If RU #1 has not adjusted its delay vector 122 in advance by one of the mechanisms to be described below, it will go out of alignment. It may then enter a realignment phase and will ultimately, by trial and error, adjust its delay vector to that represented by dashed vector 136. After so adjusting its delay, RU #1 will transmit an alignment transmission 124 at time 123 so as to again hit gap 106 thereby re-entering alignment.

The alignment triggering transmission 135 from the CU arrives at the position 96 of RU #128 at time 141. Using a zero delay vector, RU #128 transmits its alignment transmission 134. This alignment transmission 134 arrives during gap 106 thereby placing RU #128 again in alignment.

FIG. 6 shows an alignment process where the alignment is to the gap at the end of the first frame in which the alignment trigger signal 96 is transmitted. In real life systems, this may not be practical, so the alignment process is carried out to the gap following some integer number of frames in the future. The mathematical expression which defines this relationship is given in equation (1) below:

$$TTA = T_{cu} + T_{ru} + 2 \times T_p = \text{constant} = n \times T_F \quad (1)$$

where

TTA=the total turnaround time from the CU to the farthest RU;

$T_{cu}$=the delay imposed by the CU illustrated by vector 116 in FIG. 6;

$T_{ru}$=the delay imposed by the farthest RU illustrated by vector 126 in FIG. 6 (also called $T_{far}$);

$2 \times T_p$=two times the propagation delay $T_p$ from the CU to the farthest RU; and $n \times T_F$=an integer multiple of the frame interval $T_F$.

Of course, when the network expands, there is a certain additional delay in the propagation delays which will be called $T_u$ for the uncertainty of this additional propagation delay. Therefore, three additional requirements are imposed with respect to how much delay the CU and the RUs must be able to impose. Those additional requirements are given below in equations (2), (3) and (4):

$$T_{cu} = [T_d + T_u] \text{ modulo } T_F \quad (2)$$

where $T_d$=the span of the network, i.e., equal to the quantity $[TTA_2 - TTA_1]$ where $TTA_2$ equals the total turnaround propagation time for a signal to propagate from the CU to the farthest RU and back, and $TTA_1$ equals the total turnaround propagation time for a signal to propagate from the CU to the nearest RU and back; and modulo $T_F$=the remainder of $[T_d + T_u]$ divided by $T_F$.

$$T_{far} > T_u \quad (3)$$

where $T_{far}$=the smallest possible $T_{ru}$ of the farthest RU and is equal to the smallest RU delay which can be imposed by the farthest RU;

$$T_{near} < T_F - T_u \quad (4)$$

where $T_{near}$=the maximum possible $T_{ru}$ of the nearest RU.

What all this means in a practical sense is that to set up the delays in the network so that all RUs are aligned, the following steps are taken and the limitations on possible delays imposed by the CU and RUs given in equations (1) through (3) are imposed so that all RUs align to the same gap. The practical network to be aligned by the following procedure has a CU coupled by a fiber optic trunk line to an optical node. The optical node is located out in the area to be served and can be coupled to as many as 2000 homes by 2000 individual coaxial links. To align such a network, step 1 would be to bring an RU to the position of the optical node and fix its delay at $T_{near}=T_F-T_u$. With this delay, the nearest RU would not hit any gap except by shear luck. Assuming the nearest RU does not hit the gap with this delay, the second step would be to adjust the delay of the CU until the nearest RU hits a gap. When this occurs, the condition $T_{cu}=[T_d+T_u]$ modulo $T_F$ would be true meaning that the CU would have adequately compensated for the uncertainty of the propagation delay increment to $T_d$ caused by network expansion.

Ranging Process

Figure 7A:
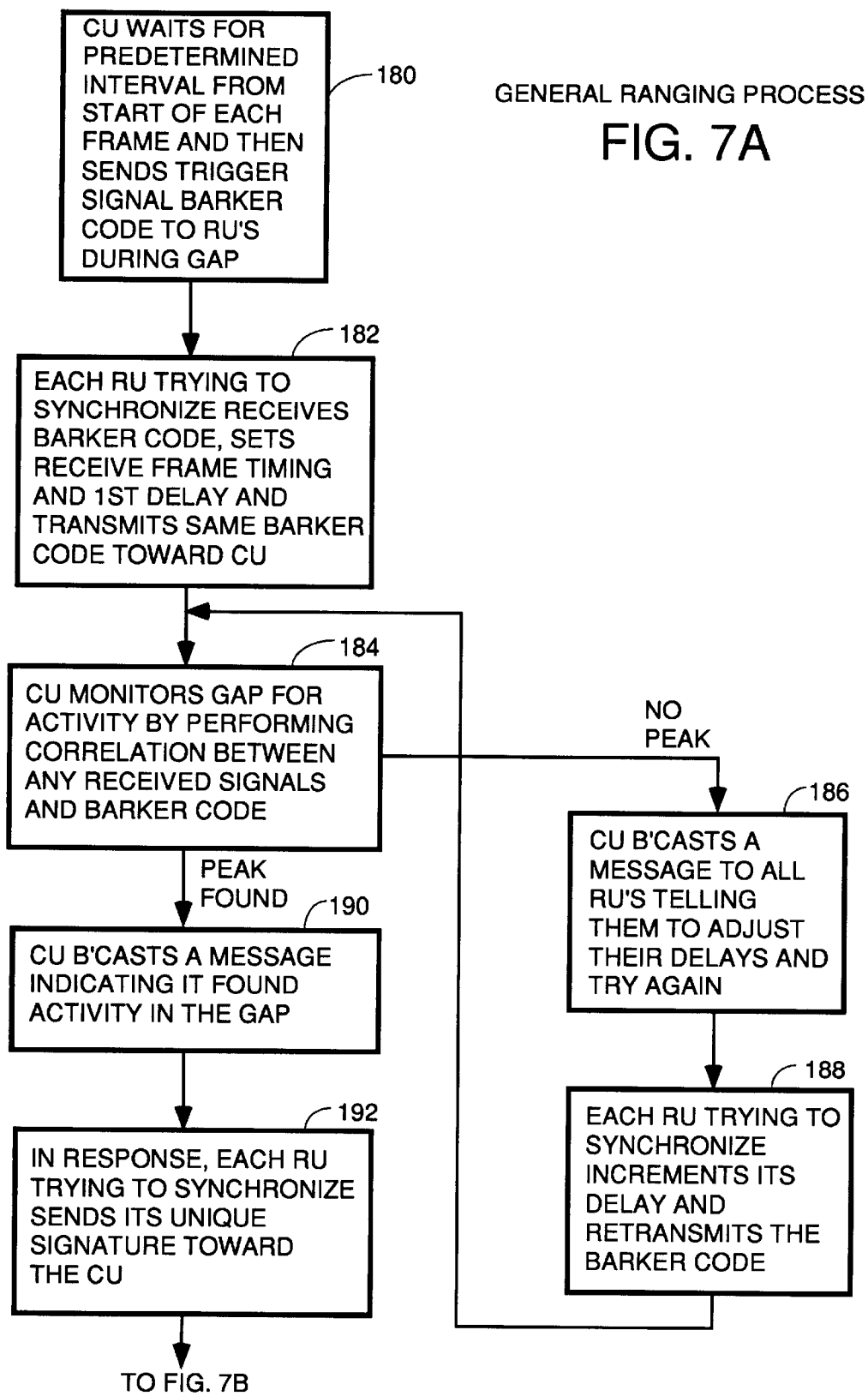
FIG. 7, which is comprised of FIGS. 7A, 7B, and 7C, is a flow chart for the general alignment process which is used in ranging processes carried out in all remote units (RUs) to set their delay vectors properly so as to be in alignment within the same frame.
Figure 7B:
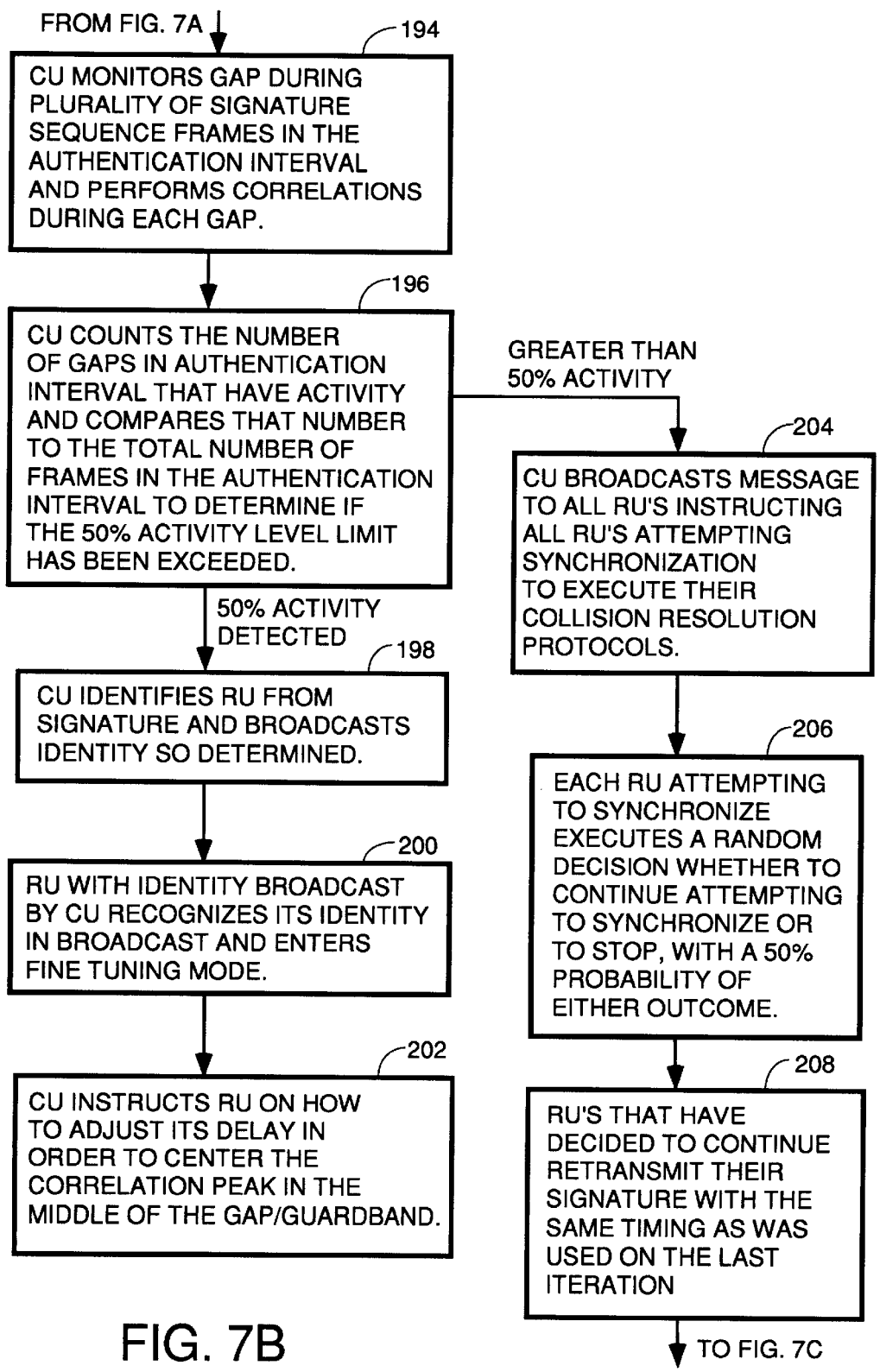
Figure 7C:
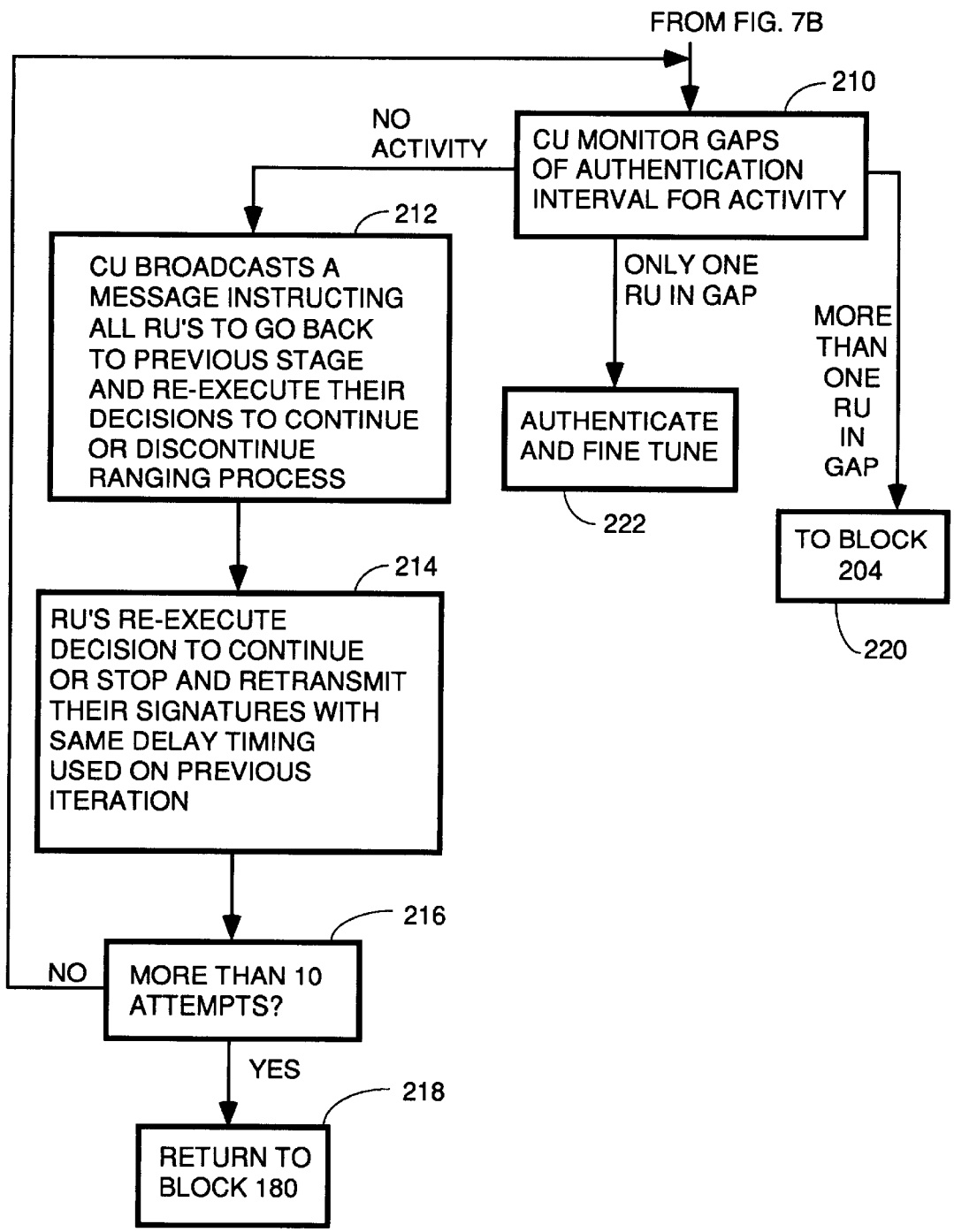

Referring to FIG. 7, which is comprised of FIGS. 7A, 7B, and 7C, there is shown a flow chart for the general alignment/ranging process which is used in training all RUs to set their transmit frame timing delays $T_d$ properly such that each frame transmitted by an RU will arrive at the CU at the same time as all other frames transmitted from other RUs despite differing propagation times. One of the unique characteristics of the ranging processes described herein is that the RU does the ranging process and the CU is more or less passive which is in contrast with the prior art.

Generally at the time of powerup of an RU, the RU first adjusts its AGC level to make full use of its analog to digital converter dynamic range. Next, the RU does frame detection to determine when the gaps in the CU broadcasts are by performing correlations in the RU receiver frame detector looking for the known barker code which the CU transmits during every gap. Once the gap is located, the frame detector sets the time base generator to synchronize on that receive frame timing reference. Next, the RU performs chip clock synchronization and carrier recovery in the manner described below in the discussion of FIG. 19. Carrier recovery is done by examining slicer error on a known BPSK pilot carrier or pilot channel signal transmitted during a predetermined timeslot using a predetermined code (CU local oscillator signal samples in timeslot 0 spread with all is CDMA code and transmitted using BPSK). The pilot channel also carries the frame number data. The slicer error is used to synchronize the RU local oscillator to the phase of the CU local oscillator. Chip clock synchronization is performed by the fine tuning circuitry of the frame detector from the chip clock embedded in the barker code sent by the CU during every gap. This is all the RU needs to do to set itself up for reception of CU data and messages.

The RU then starts listening to CU messages to determine if it tuned to the right CU and to determine when the CU solicits ranging activity by a message on one of the command and control channel. In some embodiments, the "clear to range" message can be eliminated, and the CU can watch for ranging barker codes all the time, but it is preferred to allow the CU to throttle ranging activity. The RU then performs a ranging process described below and registers itself with the CU by sending an authentication sequence of barker codes after frame synchronization has been achieved (discussed below). This is done by the CPU when it receives a message via C3 circuit 860 from the CU saying "I found one barker code in the gap, please send your authentication code". The CPU then sends data on bus 512 to ranging circuit 510 in FIG. 28A telling it what authentication barker code sequence to send. The CU will then transmit a message indicating what authentication code it found and how many chips off center of the gap the barker code is. The CPU 405 in the RU that is ranging then properly adjusts the transmit frame timing delay reference $T_d$ on bus 499 to center the barker code in the gap. Other items of data the CPU 405 sends to the ranging circuit 510 is data labelled P indicating the power level to use for the ranging barker codes and an RU/CU signal indicating to the ranging circuit 510 whether it should follow the rules of ranging for an RU or CU.

The CU next instructs the RU to entering an equalization training interval to determine the coefficients to set into the RU transmitter's precode filter such as filter 563 in FIG. 28A to predistort the RU signals to eliminate channel distortion and test the quality of the ranging result. The training algorithm is discussed below in connection with the discusssion of FIG. 45.

The ranging process starts as symbolized at block 180 with the CU waiting for a predetermined interval from the start of each frame and then sending a trigger signal barker code transmission to the RUs during the gap. Usually this trigger signal is sent during the gaps between frames even when the CU adds additional delay for reasons discussed below. The RUs monitor these gaps for these barker codes using their frame detector circuits such as circuit 513 in FIG. 19 and circuit 882 in FIG. 34.

Block 182 symbolizes the process wherein each RU trying to synchronize (the terms "synchronize", "ranging" and "alignment" all are used synonymously to mean the process of training an RU to set its delay vector properly to get its frame boundaries aligned with the CU frame boundaries) receives the barker code trigger signal transmission from the CU and sets its receive frame timing and then sets a first delay for its delay vector. Thereafter, the RU transmits, during the RU's interframe gap, the same barker code it received from the CU towards the CU as an alignment transmission.

In block 184, the CU monitors the gap for activity by performing a correlation mathematical function between any received signal during the gap and the barker code that was transmitted as the trigger signal. If a barker code identical to the trigger signal is received during the gap, the correlation calculation will result in a correlation peak being found in the gap. If the correlation calculation results in a peak being found, processing proceeds to the process symbolized by block 190. There, the CU broadcasts a message to all RUs indicating that it found activity in the middle 8 chips of the gap (or anywhere in the gap in some embodiments). Then the process of block 192 is performed where each RU trying to synchronize sends its "signature", i.e., its RU identification code in the form of a barker code transmission sequence. That is, in response to the broadcasts from the CU, each RU trying to synchronize sends its unique signature towards the CU in order to determine if that RU's barker code is the barker code the CU found in the gap and whether it is the only RU in the gap. This process is called authentication.

The process of block 192 symbolizes the start of the authentication process. Each RU has a unique signature which comprises the transmission and nontransmission of barker codes during the gaps of a multiple frame authentication period. Specifically, the unique signature of each RU will involve transmitting the barker code during some gaps of the authentication period but not during others in a sort of "Morse code". Each barker code transmission results in a correlation peak during one of the 8 chips in the middle of the gap. Each RU has a uniquie 16 bit RU ID, each bit being either the presence or absence of a barker code correlation peak somewhere in the middle 8 chips of the gap (or anywhere in the gap in some embodiments). Therefore, it takes 16 frames or 4 suprerframes to transmit the RU ID. The number of gaps during which the barker code is transmitted compared to the number of gaps during which the barker code is not transmitted during the authentication period is such that if only one RU is aligned to the gap and is transmitting its authentication signature, activity will be found in the gaps of the authentication interval only 50% of the time. This scheme for authentication is chosen so that the CU can detect contentions, i.e., more than one RU in the same gap, in the manner described below.

After performing the process of block 192, the process of block 194 on FIG. 7B is performed. This process involves the CU monitoring each of the gaps during the plurality of signature sequence frames in the authentication interval and performing correlations between the signals received in each of the gaps and the barker code that the CU transmitted. Correlation peaks are found comparing the correlator output to a threshold value. The threshold value is set by detecting a noise threshold when the gap is empty and setting the threshold at a fixed delta above the empty gap base noise value.

Next, the process of block 196 is performed. In this process, the CU counts the number of gaps in the authentication interval that have had activity detected therein, and then compares that number to the total number frames in the authentication interval to determine if the 50% activity level limit has been exceeded indicating that more than one RU is hitting the gap. The advantage of this method is that activity detection, contention detection and authentication are all combined into a single process thereby speeding up the process by more efficiency.

Returning to the consideration of the process of block 184, if the CU, while monitoring the alignment gap for activity, finds no peak resulted from the correlation calculation, then the process of block 186 is performed. In the process of block 186, the CU broadcasts a message to all RUs telling them to adjust their delays and to try again to hit the gap with their barker code transmissions. Then, the process of block 188 is performed wherein each RU trying to synchronize increments its delay vector and retransmits the same barker code as was received from the CU. Thereafter, the process of block 184 is performed again wherein the CU monitors the gap for activity. The loop comprising blocks 184, 186 and 188, taken together, comprise the trial and error process which causes all RUs trying to align themselves to continually increment their delay vectors until at least one of them hits the gap.

Returning to the consideration of block 196, if 50% activity level is detected during the authentication interval, it means that only one RU is in the gap. In such a case, the process of block 198 is performed. In this process, the CU identifies the RU whose barker code transmissions are found in the gap from the unique signature sequence transmitted during the authentication interval. In other words, the CU examines exactly which gaps had correlation peaks therein and the sequence of these gaps and looks up this sequence in a lookup table listing the unique signature sequence for each RU in order to identify the particular RU that has successfully aligned itself. Block 198 is reached only if activity is detected in exactly 50% of the gaps.

After the CU identifies the RU, it broadcasts the identity so determined to all RUs as the last step of block 198.

Next, the process of block 200 is performed. In this process, the RU with the identity broadcast by the CU recognizes its identity in the broadcast message and enters a fine tuning mode.

The fine tuning mode is represented by the process of block 202. In this process, the CU instructs the RU which has aligned itself in the gap on how to adjust its delay vector in order to center the correlation peak calculated by the CU to the exact middle of the gap. In the preferred embodiment, the gap is comprised of 16 chips which comprise 8 chips in the middle of the gap and then 4 chips on either side of this middle group of 8. It is desirable during the fine tuning mode to get the correlation peak centered in the middle of the middle 8 chips. As mentioned above, a chip is a small interval of time equal to the frame period of 125 microseconds divided by the 448 chips which comprise each frame. In other words, each chip is 279 nanoseconds in duration. The fine tuning process of block 202 involves sending messages back and forth between the CU and the RU which has been identified as having aligned itself in the gap. These messages are sent over the management and control channels. Usually the exchange involves only one instruction from the CU to the RU saying, for example, "Increase your delay vector by 2 chips" or, "Decrease your delay vector by 3 chips". The RU then makes the instructed adjustment and retransmits the barker code. The CU agains calculates a correlation peak and examines where the peak occurs in the gap. If the peak occurs in a suitable position, the CU sends a message to the RU telling it to stop adjusting its delay vector as satisfactory alignment has been achieved.

Returning to the consideration of the process of block 196, if the CU determines that greater than 50% of the gaps during the authentication interval had correlation peaks therein, i.e., greater than 50% activity is detected, then the process of block 204 is reached. This process is only reached if more than one RU has aligned itself to the same gap. If this case, because each RU is transmitting its unique signature, and because each signature is a unique sequence with only 50% activity level, the result of two RU's being in the same gap will be that during more than 50% of the gaps of the authentication interval, correlation peaks will occur. It is impossible to find tune the RUs if more than one RU is trying to fine tune during the same gap. Therefore, the CU has to reduce the number of RUs that are in the gap to one, and it starts this process by performing the process of block 204. In this process, the CU broadcasts a message to all RUs instructing only the RUs attempting to synchronize to execute their collision resolution protocols.

Next, the process of block 206 is performed, to start the collision resolution protocol, wherein each RU attempting to synchronize executes a random decision whether to continue attempting to synchronize or to stop attempting to synchronize. Each RU will make this decision with a 50% probability of either outcome.

After all RUs make their random decisions whether to continue, the process of block 208 is performed. In this process, the RUs that have decided to continue to align retransmit their signature sequences without changing their timing, i.e., with the same timing as was used on the last iteration of the trial and error process. In other words, each RU that has decided to continue transmits its unique signature sequence (sometimes hereafter called a "dotted sequence") over another authentication interval using the same delay vectors that are currently set.

Next, the process of block 210 on FIG. 7C is performed wherein the CU again monitors the gaps of the authentication interval for activity.

If the random decisions whether to continue or not result in no RUs transmitting their signatures, then no activity will be found in the gaps of the authentication interval. In this event, the process of block 212 will be performed wherein the CU broadcasts a message instructing all RUs to go back to the previous stage and to reexecute their decisions to continue or discontinue the ranging process.

The RUs then re-execute their decisions whether to continue or stop attempting to align themselves and retransmit their signatures during the authentication interval with the same delay timing used on the previous iteration, as symbolized by block 214.

Following the process of block 214, the process of block 216 is performed to determine if more than 10 attempts to get one RU in the gap have occurred. If so, the process of block 218 is performed to return to block 180 and restart the ranging process from the top. If fewer than 10 attempts have been made, processing returns to the process of block 210 wherein the CU again monitors the gaps of the authentication interval for activity.

If the process of block 210 finds only one RU in the gap, i.e., 50% activity level is detected during the authentication interval, then the process of block 222 is performed. The process of block 222 authenticates the RU by broadcasting the identity of the RU found in the gap and then the RU is fine tuned in the manner previously described with reference to block 202.

If the CU finds in the process of block 210 more than one RU is still in the gap, processing returns to block 204 where the CU broadcasts a message to all RUs instructing them to execute their collision resolutions protocols. This process is symbolized by block 220.

There are several alternative embodiments to the ranging process described in FIGS. 7A–7C. They generally fall into two classes. The first class of embodiments represented by FIGS. 7A–7C involve the RU measuring propagation time of its signals to the CU by the trial and error process of adjusting its transmit frame timing delay $T_d$ until a verification management and control message is received from the CU saying "you hit the gap". There are alternative species within this class wherein the CU sends some kind of an easily detectable marker which triggers the RUs to send some kind of an easily detectable echo signals with good strong correlation peak qualities back to the CU and carrying out the trial and error process to adjust the timing of the echo signals until only one RU is in the gap and a verification message is received from the CU to that effect. In other words, instead of the RU echoing back the same barker code that the CU sent, the RU could send a chirp or a long, low power sequence that extends over multiple gaps, over an entire frame or over multiple frames. The RU could also send back a very narrow, e.g., one chip wide, high power pulse which is easily detectable over the upstream noise. The CU receiver, during ranging, would perform a correlation on the known chirp, long, low-power sequence, or short, high power pulse to develop correlation peaks. Multiple correlation peaks detected by the CU indicate a contention, and the CU would instruct all RUs that were ranging to "flip the coin" and try again. Once only one RU was ranging and had hit the gap, the identification process would proceed by sending a sequence of whatever signal was sent for initial ranging (or some other easily detectable signal with strong correlation peak characteristics) in a predetermined unique sequence of sequential gaps as in FIGS. 7A–7C. Another alternative species is to perform the trial and error ranging process but eliminating the need for the identification sequence by sending ranging signals which are both easily detectable and unique to each RU. This complicates the CU receiver gap monitor circuit however since it must perform as many different correlations as there are different RUs. This can be done in parallel with a single correlator for each RU or in serial with a single fast correlator that performs multiple correlations on a buffer of samples of the signals received during each (or over whatever is the length of the sequence sent by the RU). Contention would be detected as multiple correlation peaks. Contention resolution would be by a message from the CU to the RUs to flip the coin. Once a single RU was ranging, it would adjust its transmit frame timing delay until it received a message from the CU that its correlation peak had a relative timing relationship to the start of the CU frames such that if the RU transmitter were to transmit with that transmit frame timing delay, its frames would arrive at the CU coincident with the CU frames and all frames of corresponding number from other RUs that were already in frame synchronization.

Another alternative embodiment within the class where the RU determines the proper transmit frame timing delay by trial and error generally comprises the following steps. The RU precomputes an 8 of 16 temporary RU ID which is randomly selected. The CU solicits for ranging transmissions. Each RU which wishes to range, transmits its temporary RU ID as 8 barker code transmissions in 8 gaps of the next 16 RU frames (selected to match the temporary RU ID sequence) with a first iteration of transmit frame timing delay value. The CU generates a ranging status data comprised of 16 bytes, each bit of each byte representing whether a correlation peak occurred during a corresponding chip of the middle 8 chips of a corresponding gap. The CU reorders the 16 bytes into eight 16 bit fields, and transmits this data to all RUs over 4 consecutive frames as a ranging status message which includes data regarding which superframe the ranging status data applies to and the superframe during which the next ranging transmissions are to be made. Each RU receives the status message and stores it in memory and informs the RU computer 405 of the presence of the message. The RU computer parses and scans the ranging status message and interprets the data therein according to the ranging protocol as follows. If all entries are zero, then all ranging RU conclude they have missed the gap and set a new value for their transmit frame timing delays and retransmit their temporary IDs in the next iteration of 16 frames at an activation time specified in the downstream ranging status message. The new transmissions arrive at the CU, and one byte of raw ranging status data is stored in a FIFO memory in the CU. The CU controller initiates a DMA transfer of the FIFO data, and processes the raw ranging data into a new ranging status message and submits valid RU IDs to a training input queue. If the ranging status message analyzed by the RU controller indicates more than one pulse in some gaps, a collision has occurred. If an RU does not find its temporary ID in the status message, it assumes it was involved in the collision, and performs its contention resolution algorithm as described elsewhere herein. If an RU finds its temporary ID in the ranging status data, it is authenticated and in the gap. By looking at the positions of the pulses of its temporary ID in the gap, the RU determines how far off center it is from the middle of the middle 8 chips, and calculates its own offset and applies it to its transmit frame timing delay. The RU is now ready for equalization training. A variation of the above protocol is demand ranging where, after a power failure that would result in all RUs attempting to recover simultaneously thereby swamping the contention resolution mechanism, each RU is addressed individually by its RU ID and asked to begin ranging.

The other class of ranging embodiments involves the CU calculating the total turnaround time to each RU and instructing each RU as to how much transmit frame timing delay to use. In this class, the CU sends a marker signal which can be easily detectable by the RU receivers. Each RU trying to range, then immediately transmits back the same easily identifiable signal which can be detected by the CU receiver even if it arrives during the middle of a frame of payload data. Such a signal can be a chirp, a high-power, narrow pulse or a long sequence of chips that spreads out over one or more frames. The CU detects the correlation peak of the signal and compares it to the time of transmission of the original marker signal. The difference is the total turnaround time or TTA. The CU then sends a message to the RU to identify itself which can be done by the "Morse code" authentication sequence, or in one of the other ways identified above for the first class of ranging embodiments. Once the CU knows the RU's identity and its TTA, the CU can send a message to the RU instructing it as to how much transmit frame timing delay to use to achieve frame synchronization, and the RU sets this amount of delay for transmission of every frame.

Note that in these alternative embodiments of both classes where the ranging signal transmitted by the RU can be detected over the noise of payload data where it arrives at the CU during a frame such as in the embodiments using a large-amplitude, easily detectable pulse or a long sequence which stretches out over one or more frames and which can be detected by a correlator, there is no need for a gap in every frame. The only requirement in high, throughput SCDMA systems is that the RU frames arrive synchronously with correspondingly numbered frames from other RU. If that timing relationship can be achieved without a gap, then there is no need for a gap. For example, in the case of a narrow, large amplitude pulse, when the RU transmit frame timing delay is set so that this pulse arrives at the beginning of the correspondingly numbered frames from other RUs, then the RU has achieved frame synchronization. In the case of a long sequence that spreads out over, for example, two frames, where the correlation peak is found at the end of the second CU frame, this would means that if the RU starts a frame transmission at the time it started transmission of the long sequence, that frame will arrive coincident with the CU frame boundaries and therefore, will also be coincident with the frame boundaries of other correspondingly numbered RU frames. Any methodology to achieve this frame synchronization is within the teachings of the invention.

The process of adjusting the delay vector used by the CU in transmitting its trigger signal barker code can result in loss of synchronization by all RUs in the system unless something is done to prevent this before the CU changes its delay. That is, when the CU shortens its delay vector, the RUs closer to the CU than the furthest RU will all go out of alignment unless certain measures are taken to forewarn them of the coming change. There are 3 different embodiments of processes for realigning all of the RUs when the CU changes its delay vector. The preferred one of these embodiments is symbolized by the flow chart of FIG. 9 and involves activity prior to the CU changing its delay vector to prevent loss of synchronization by all RUs when the CU changes its delay.

Figure 8:
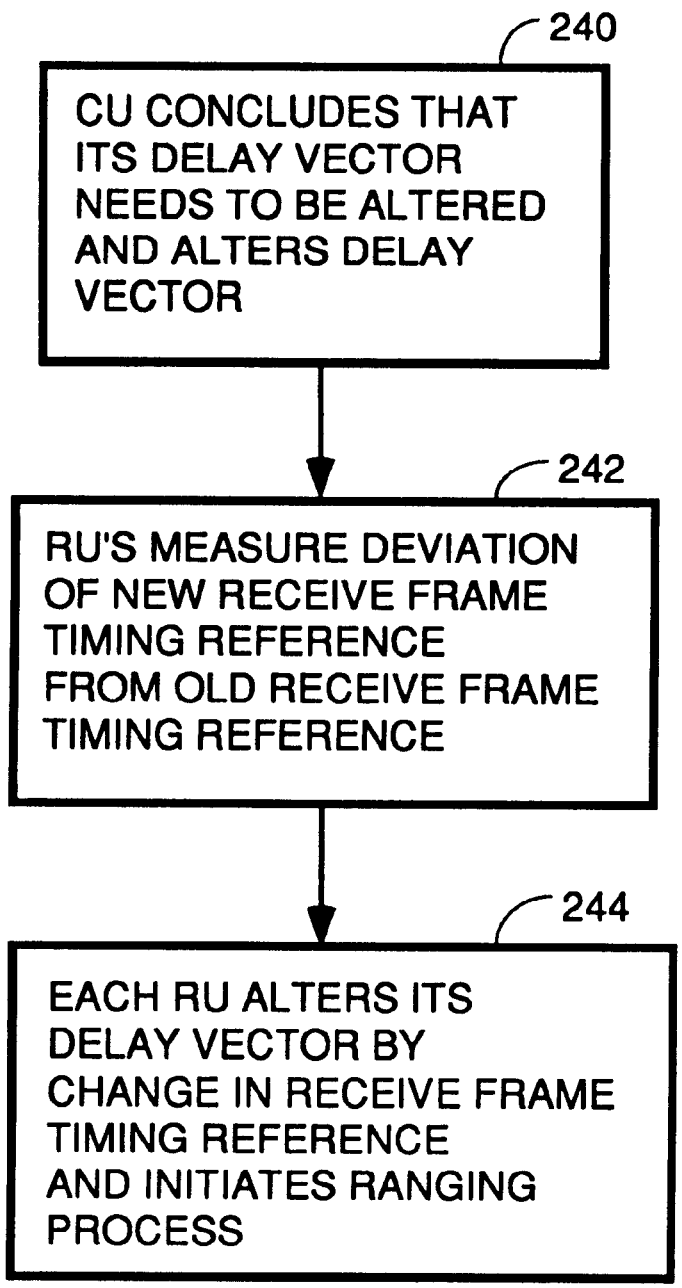
FIG. 8 is a flow chart of one embodiment of a process to resynchronize all RUs after the central unit (CU) has changed its delay vector called the dead reckoning process.

The first of these processes is shown in the flow chart of FIG. 8. This process will be called the dead reckoning resynchronization process for lack of a better term. In this process, the CU concludes, in block 240, that its delay vector needs to be altered in order to keep the farthest RUs in alignment. This conclusion can be drawn in any one of a number of different ways such as by monitoring the farthest RU for continued alignment after the farthest RU tells the CU that it is aligned with the shortest possible delay vector in use. Or, alternatively, the CU can send out a message to the farthest RU periodically inquiring as to whether it is still aligned. This message can take the form of a request for that RU to transmit its authentication signature and then monitoring the next few frames of an authentication interval to determine if that farthest RUs authentication signature shows up in the authentication interval gaps. If the CU concludes in block 240 that it needs to alter its delay vector it then alters the delay vector.

As noted previously, because the CU uses the same delay vector during every frame in transmitting its barker code trigger signal, the RUs have a predictable periodic signal from the CU upon which they can rely to measure the timing change made by the CU. In other words, the time of arrival of the barker code from the CU during each frame is predictable to each RU, and when it changes, the RUs can measure by how much it changed. When the barker code from the CU does not arrive at the predicted time, the RUs know that the CU has just altered its delay vector. The RUs then measure the deviation of the new receive frame timing reference, i.e., the time of arrival of the barker code trigger signal from the CU, by measuring the difference between the old receive frame timing reference and the new receive frame timing reference. This process is symbolized by block 242.

Finally, each RU realigns itself in the process of block 244. In this process, each RU alters its delay vector by an amount equal to the change in the receive frame timing reference. Then each RU initiates a ranging process. The CU monitors the gap at the end of every frame so any RU can initiate ranging at any time.

Figure 9:
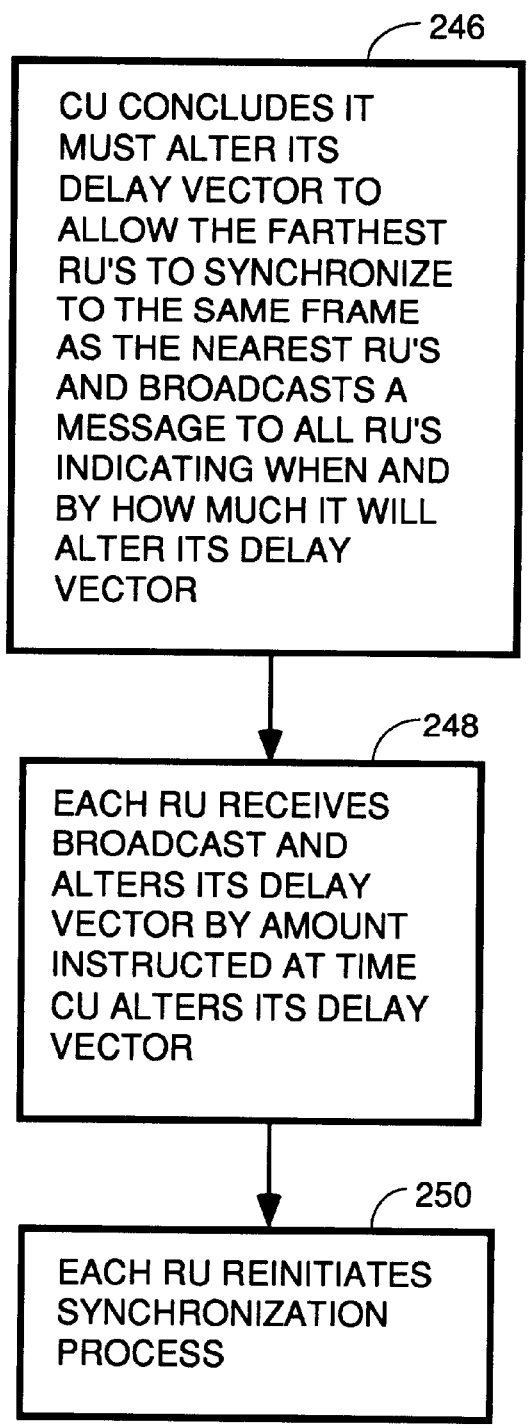
FIG. 9 represents the preferred process for resychronizing all RUs after the CU has changed its delay vector called the precursor process.

FIG. 9 represents the preferred process for resychronizing all RUs after the CU has changed its delay vector. This process will be called the precursor embodiment herein. This process starts with block 246 wherein the CU concludes that it must alter its delay vector to allow the farthest RUs to synchronize to the same frame as the nearest RUs. The CU, after reaching the conclusion that a change in its delay vector must be made, broadcasts a message to all RUs indicating when and by how much it will alter its delay vector.

Next the process of block 248 is performed wherein each RU receives the broadcast and alters its delay vector by an amount equal to the amount that the CU will be changing its delay vector at the specified time. That is, each RU alters its delay vector by the amount instructed by the CU at the time indicated in the message from the CU that the CU will alter its delay vector.

Finally, the process of block 250 is performed wherein each RU reinitiates a synchronization process.

Both of the embodiments of FIGS. 8 and 9 will result in little or no loss of data because each RU resynchronizes very rapidly. This result follows because each RU's delay vector is immediately set at the delay needed for synchronization at the time the CU alters its delay vector thereby eliminating the delay of the trial and error incrementation of the delay vectors.

The final embodiment for resynchronizing after the CU changes its delay vector is for the CU simply to broadcast the message to all RUs saying, "You must all now realign as I have just changed my delay vector. " Each RU then re-enters the alignment process symbolized by FIGS. 7A, 7B, and 7C. This process is repeated by each RU until all RUs are aligned.

Note that in the ranging process described above, it is the RUs that determine how far they are from the CU rather than the CU determining how far each RU is from it. The advantage of having the RUs doing the ranging is that the CU does not have to stop traffic on the various channels to perform ranging functions each time a new RU enters the system or an existing RU loses synchronization. In a system where the traffic may frequently include high demand applications such as real time video, stopping traffic flow for ranging is not a viable possibility because it would interrupt the flow of video information and disrupt the subscriber's video conference, movie etc. In the ranging system described herein in its various embodiments, there is no need to stop traffic since the ranging process is done out of band, i.e., in the gaps. Further, because the transmitted power of the barker codes is low and correlation processes are used, the process can start blind with any trial and error timing value without interfering with channel traffic. That is, even if the barker code transmitted back toward the CU by the RU has improper timing and lands somewhere outside the gap, its power level is low enough to not cause substantial interference, and even if some small amount of interference is caused, the chips of the symbols transmitted during the frame have enough redundancy with the trellis encoded modulation to recover from the interference without an error. Because correlation to a known barker code pattern (the same barker code pattern the CU transmitted to the RUs during the previous gap) is used by the CU to determine whether it has or has not detected a barker code from an RU in the gap, the RUs can transmit their barker codes at very low power levels so as to avoid interfering with traffic and causing errors in the data of the various payload channels during the trial and error process of setting their transmit frame timing delay values $T_d$ so as to hit the gap.

The advantage of having the RUs do the ranging and using gaps between frames of data to do the ranging process is that the payload data traffic does not have to be stopped while the ranging process is occurring. Of course for embodiments where the ranging signals do can be detected even when they arrive in the middle of the frame and do not interfere with payload data reception, traffic does not have to be stopped during ranging. In embodiments using gaps, the CU transmits barker codes during the gaps between frames and the RUs echo those barker codes in a trial and error process of adjusting their transmit frame timing until they hit the gap. Misalignment does not cause errors because low power levels are used for the barker code transmissions by the RUs and correlation is performed by the CU to find the barker code. Thus, even if a barker code transmitted by an RU lands in the data portion of a frame, it does not cause appreciable errors. Therefore, another advantage of the ranging process described herein is that it can be started in the blind by each RU with any value for the transmit frame timing delay. There is no need to preset an approximation of the correct transmit frame timing delay into the RUs before they start and then fine tune the delay since even a gross misalignment will not cause any appreciable errors in the payload data. Since trellis coded modulation and a redundant bit are used in each tribit of payload data, any errors caused by misalignment can be detected and corrected by forward error correction without the need for retransmission. In other embodiments however, conventional ranging techniques could be used where the CU measures the range to the RUs to establish synchronous CDMA.

In the high power pulse embodiments described above, the RUs act like transponders by sending a narrow, high amplitude pulse upon receipt of a trigger signal from the CU. The trigger signal from the CU could be a special pulse, a barker code, etc. If the RU was misaligned, and the large amplitude pulse landed in the middle of the upstream payload data, the CU would ignore the particular chip which was "stepped on" by the high amplitude pulse. The payload data could still be recovered because the bandwidth of the payload data has been spread so widely using direct sequencey CDMA spreading. Trellis code modulation is not needed for this scheme to work. After detecting the RU's pulse and comparing its timing with the position of the frame timing reference, the CU would ask the RU for its identity and the RU would send it by any conventional manner such as pulse position modulation, amplitude shift keying etc. The CU would then send a message to the RU instructing it to change its transmit frame timing delay in a direction to put the pulse closer to the fixed timing reference, and this process would continue until the RU hit the timing reference. Note in this method, that a gap or guardband is not needed in each frame.

Note that in the ranging embodiments described above, it is assumed that the "span" of the system, i.e., the difference between the TTA of the farthest RU and the TTA of the nearest RU, is smaller than one frame time. When this is true, all RUs can align to the same gap. When all the RUs are aligned to the same gap, and the CU knows the total turnaround time, dynamic code assignment can be used where the CU informs the RUs by downstream management and control messages what codes each is supposed to use. The CU will then know what codes to use and when to use them in decoding signals from each RU.

In very large systems, the span may exceed the frame time, and to force the span to be less than the frame interval would unreasonably constrain the system size. When the span of the system is greater than the frame time, an accounting problem arises because not all the RUs can align to the same gap. This means that the CU will not know which codes each RU used to spread the spectrum of its payload data, unless it knows the total turnaround time to each RU. In other words, each frame transmitted by the CU downstream to the RUs is numbered by virtue of a kiloframe marker signal encoded in the pilot channel carrier tone. The RU receivers detect this kiloframe marker and count individual received frames and thus know what frame number each received frame from the CU is. If the span of the system is less than one frame interval and each RU is aligned to the same gap, each RU will know that when, for example, CU frame 99 is received, the next set of frames transmitted by the RUs all will arrive at the CU at the same time, i.e., the beginning of the next frame at the CU and all those RU frames will have frame number 100 assigned to them by the CU and will be despread and decoded together. In this situation, downstream instructions to RU #1927 to use codes #55 and 57 during frame 100 and to RU #3 to use code #3 during frame 100 make sense, and the CU can properly decode the data from each of these RUs because it knows which codes each used during frame 100. Suppose however that RU #1927 is aligned to the next sequential gap following the gap to which RU #3 is aligned. This means that when frame #99 is received from the CU, the frame transmitted by RU #3 in response to frame #99 (the downstream data of frame 99 if offloaded, new upstream data is loaded, and the frame is "retransmitted" back toward the CU) will be numbered 100 when it arrives at the CU. However, the frame transmitted by RU #1927 in response to receipt of frame #99 will arrive at the beginning of CU frame #101 and will be treated by the CU and RU frame #101. If the CU does not know that RU #1927 is not aligned to the same gap as RU #3, it will assume that RU #1927 and RU #3 are both using the codes assigned to them for frame 100, when RU #1927 is actually using the codes assigned to it for frame #101.

The remedy for this accounting problem is for the CU to know the TTA or total turnaround propagation time for each RU and transmitted by the CU to each RU. Each RU then uses its TTA time plus the kiloframe marker encoded in the pilot channel (or transmitted downstream in any other way) to keep track of what frame number each received CU frame is and what frame number will be assigned by the CU to the next RU frame transmitted in response to receipt of the CU frame. This allows the RU to use the proper assigned orthogonal, pseudorandom spreading codes assigned by the CU for each frame since the RU will know what frame number will be assigned by the CU to each of the RU's frames and knows that the code assignment messages from the CU are based upon the frame numbers assigned to RU frames by the CU.

The actual algorithm carried out in the CU to calculate TTA for each RU to support boundless ranging is quite simple. This algorithm happens after the RU whose TTA is being calculated has successfully completed the ranging process and is aligned with some gap. The CU sends a frame to the RU. The frame itself has no frame tag number, but the kiloframe markers in the pilot channel data allow the RU's to count received CU frames using a local counter. Meanwhile, as the CU sends frames, its frame count continues to rise. In response to the received frame, the RU sends a frame back to the CU along with a TTA_service_request which includes the RU frame tag number for the transmitted frame which is equal to the local counter value. In other words, the RU frame tag number sent back with the TTA_service_request matches the CU frame number of the frame just received as determined by the local counter value. When the RU's frame reaches the CU, the CU subtracts the RU frame tag number from the CU's current frame tag count. This difference times the frame interval is equal to the TTA for that RU. The multiplication times the frame interval is not acually necessary since the RU only needs to know how many complete frames behind the current CU frame count each one of the RU's transmitted frames will be in order to use the proper codes for each frame.

Referring to FIG. 10, there is shown a typical cable television system arrangement in which the teachings of the invention find utility in a multi-RU, multichannel environment. The central unit or CU 252 is coupled via a coaxial cable, satellite link, microwave link, fiber optic link or some combination of these media 251 to a plurality of subscribers of which subscribers 254 and 256 are typical. The CU sends and receives digital information bidirectionally with each subscriber's RU. Each subscriber has a remote unit or RU which acts as the interface between the subscriber's television, computer, telephone and other devices and the transmission media 251. The CU has a modem therein including circuitry in a transmit channel that assembles frames of data symbols from a TDMA digital data input stream, and encodes and transmits these frames of symbols to the RUs using orthogonal codes. The modem also includes a receive channel which receives the encoded frames of symbols, decodes the symbols using the transpose of the code matrix of the orthogonal codes used by the RU's to transmit the frames, reassembles the TDMA digital data stream from the decoded results and outputs the TDMA stream for use by other equipment providing various services to the subscribers.

Each frame is comprised of symbols that are composed from digital payload data in 128 timeslots in the TDMA stream. Each time slot in the TDMA stream can carry 8 bits in some embodiments, but in the preferred embodiment, each timeslot carries 9 bits for reasons to be described below. Each timeslot is a channel which can carry digital data encoding some service such as video on demand, video teleconferencing, internet access, etc. The timeslots/channels are assigned on an as-needed basis to the various subscriber RUs to transmit/receive data implementing the service in bidirectional communication with the CU. The CU's clocking reference is the TDMA bus 266 that comes from a MAC layer circuit. The TDMA bus derives its timing signals from the T1/E1 span to which the system is connected. Although peripheral devices are shown connected to the TDM bus 266, in reality, these are not located at the CU but are located elsewhere and coupled to the CU by a T1/E1 span (hereafter T1 span). In case of clock faults caused by failure of the T1 span, the CU and RUs must stay internally synchronized and the be able to resynchronize with the TDMA bus when signal is restored. The TDMA bus clock and framing signals consist of transmit clock, transmit frame and transmit superframe signals. The CU uses a PLL to track and regenerate the TDMA bus transmit clock signal at 8.192 MHz. This first PLL will continue to produce a transmit clock signal even if the TDMA bus transmit clock signal fails. The CU modem also includes another second PLL that tracks the signal from the first PLL and generates a 57 MHz high speed clock synchronized thereto. The transmit framing signal from the TDMA bus is the systemwide framing reference and is used by the modems as the basis for timing the SCDMA data frames. So as to not be dependent upon the external TDMA bus transmit framing signal, the CU modem time base synchronizes a local source to that signal and continues to generate framing reference signals in the event of TDMA bus or T1 span failure so there is no loss of synchronization. The timebase includes circuitry to re-synchronize to the new framing reference upon return to service. A system-wide frame shift occurs after restoration of TDM bus service with a new frame reference that is offset from the original frame reference. The CU monitors the TDMA bus for restoration of the TDMA framing signals and waiting 5 ms to insure they are stable. The CU then determines the frame offset, and sends a Frame Shift message downstream ordering the required frame shift at the same frame number in the chip counters of both the transmitters and receivers of both the CU and all RUs. To avoid loss of synchronization, the PLLs in the system must be frozen before the shift, the shift made, and the PLLs unfrozen. The single frame shift messages causes the RUs to automatically carry out this process of freezing the PLLs, making the shift and unfreezing the PLLs. Active timeslots are permissible during frame shifts, but no activations of new links or other upstream activity should be taking place such as access requests and re-equalization of the downstream. Any RUs that miss the frame shift, have to re-acquire frame synchronization.

Each of the CU modem transmitters and receivers has its own independent time base in the preferred embodiment.

The choice of 128 payload timeslots per frame is not coincidental. In telephony, a frame of data also comprises 128 timeslots, each carrying 8 bits of data. Each RU is in synchronization with the CU and knows when the beginning and end of each frame of data occurs. Each RU also knows which timeslot(s) has/have been assigned to it by virtue of side conversations each RU has with the channel assignment circuitry in the CU on the command and control channels (the remaining 16 channels of the 144 total channels).

Referring to FIG. 11, there is shown a block diagram of the system of FIG. 10 which shows more detail about one multichannel embodiment for the internal structure of each RU modems transmit channel circuitry for transmitting data to the CU. Dashed box 254 represents RU#1 while dashed box 256 represents RU#2. Each RU receives a time division multiplexed (TDMA) stream of digital data from the various devices that share the communication capability of coaxial cable/transmission media 251. For example, RU#1 is coupled to an interactive television 258, and is also connected to a personal computer 260 and a videophone 262. An interactive television is a modified conventional TV wherein a user can send digital signals to the CU in response to things he or she sees on the television or as requests for specific video selections. Each of these devices has a digital data input/output port which is coupled to a time division multiplexer switch 264. The switch 264 combines data coming in from devices by placing bytes of data from each device into timeslots in a time division multiplexed (TDMA) stream of digital data on line 266. The TDMA stream for RU#2 is on line 267.

Each timeslot/channel can contain 9 bits of which 8 bits are devoted to encoding the data for that channel and 1 bit is used for management and control purposes. The 9th bit can be used as a tiny side channel for side conversations over and above the main data traffic for the channel. In alternative embodiments, any other number of bits per timeslot may also be used.

The 9 bit groups of bits in each timeslot are divided into three 3-bit groups called triple bits or tribits herein. These three triple bits from the time domain are a very short burst of data which get spread out in time in the code domain. The triple bits are spread out over time by selecting three different triple bit columns from an array in a framer memory described below for each incrementation of the read pointer and multiplexing these linear arrays of triple bits through the transmitter circuitry. The three columns of triple bits of each frame each span all 144 time slots of the TDMA input streams.

All symbols generated for the first frame for all active channels are encoded using orthogonal codes, and the results are combined for simultaneous transmission over the shared transmission media using a synchronous CDMA modulation scheme.

Each RU is capable of receiving data in up to 144 of the timeslots in the input TDMA stream and is capable of getting all that data to the CU. However, only 144 total channels are available for all RUs to share, so rarely does one RU use all 144 channels. Each RU requests the number of timeslots or channels it needs to provide services requested by the subscriber via an access request. This request is sent via a message on a randomly selected one of 8 of the 16 command and control channels devoted to access requests and downstream messages. The 8 access request channels are constantly monitored by the CU. The CU then sends a reply message telling the requesting RU which channels have been assigned to it. The CU will not assign the same channel to multiple RU's. The other 8 management and control channels are dedicated to downstream management and control traffic.

Each RU then uses the appropriate orthogonal codes in the encoders coupled to receive the data from the timeslots to which it has been assigned. For example, if RU#1 is assigned channels 1 and 2, and RU#2 is assigned to channel 3, RU#1 will use orthogonal codes #1 and #2 in the encoder coupled to receive the data in timeslots 1 and 2, and RU#2 will set orthogonal code #3 into the encoder coupled to receive the data from timeslot 3. That is, one orthogonal code is assigned to each payload channel and each command and control channel in the embodiment shown in FIG. 11. The transmit channel of each RU of the embodiment shown in FIG. 11 has a splitter like splitter 268. The purpose of this splitter in transmitting data to the CU 252 is to split out the data in each time slot of the time division multiplexed incoming data stream and apply the data from each time slot to one of a plurality of orthogonal code encoders for encoding using one orthogonal code from the code set used on the system. For example, in the hypothetical given above, the data from time slot #1 is output from the splitter on line 270 which is coupled to the data input port of orthogonal code #1 encoder 1, block 272, and the data from time slot 2 is sent via line 271 to encoder #2, block 273. The encoder 272 encodes the channel 1 data from time slot 1 using code #1 of the orthogonal code set in use in the system (actually, one row of the code matrix that defines the entire code set), and outputs the resulting modulated signal on line 274 which is coupled to one summing input of a summer node 276. Encoder #2, block 273, encodes the data from channel 2 in time slot 2 using code #2 from the orthogonal code set (a different row of the code matrix—rows or columns of the code matrix may be used interchangeably in the matrix multiplication of the transmit process so long as the matrix multiplication of the received signal vector times the transpose matrix is the opposite, i.e., if rows are used on the transmit side, columns are used on the receive side).

A controller circuit (not shown) in each RU which is coupled to communicate with the CU over a management and control channel and which is also coupled to each of the orthogonal code encoders, receives the channel assignments for the RU and selects the unique orthogonal code for the channel assigned. The controller circuit then controls each encoder to use the appropriate orthogonal code assigned to the channel when encoding data for that channel. Each encoder in the RUs which is active must use a different, unique, orthogonal code. No encoder will use the same code as another "active" encoder. An "active" encoder is an encoder which has been assigned to encode a particular channel for its RU.

After the data from the appropriate timeslot is parsed out of the TDMA stream by the splitter 268 and guided to the proper encoder and the proper orthogonal code is selected for use in the encoder, the data in the assigned timeslots/ channels for each RU is encoded. This is done using the appropriate orthogonal codes assigned to those channels. The results are then transmitted to the CU simultaneously from all RUs over the shared transmission media 251. More precisely, the energy representing the data from the various timeslots/channels is spread out over the entire 125 microsecond duration of the frame by the action of the encoders. Because the data from the various timeslots is encoded using orthogonal codes, no interference between the data occurs during transmission of the encoded symbols in the code domain.

There is one encoder for each timeslot in each RU in the embodiment shown in FIG. 11. Each encoder spreads out the energy from its assigned channel over all the chips in the frame. Each encoder in each RU has its encoded output signal coupled to a summing input of a summer like summer 276. The function of the summer in each RU is to sum all the encoded signals and output them on a subscriber branch coaxial cable or other transmission media like branch cable 278. The transmission media like branch 278 are coupled through a directional coupler like coupler 280 to the main coaxial cable/transmission media 251. The combined output signals from each RU are added to the composite signal on the main coaxial cable by one or more directional couplers symbolized by coupler 280.

At the CU, the code domain signals on shared transmission media 251 are decoded by the decoders 282, 284 etc., and the resulting data is put back into the appropriate timeslots in the time domain TDMA data streams for output to the various equipment that is providing the requested services.

At the CU 252, the composite signal received from transmission media 251 is distributed to each of a plurality of decoders. A decoder for channel 1 is represented by block 282. This decoder uses the transpose of the code matrix which was used to encode the channel 1 data to extract any channel 1 information encoded into the composite signal by RU#1 (or whatever RU was assigned to channel 1). This decoding is done in the manner described previously in the discussion of FIGS. 1–3.

Likewise, the decoder for channel 2, represented by block 284, using the transpose code matrix to decodes any channel 2 information encoded into the composite signal by RU#2. In the embodiment of FIG. 11, there is one decoder in the CU for each channel in use, and each decoder uses the appropriate column of the transpose matrix $[c^T]$ corresponding to the code used by the corresponding RU to encode the channel being decoded. The resulting decoded digital signals are output on lines 286 and 288 to a switch which reassembles these digital signals to reproduce a composite of the time division multiplexed data streams which entered the RUs on lines 266, 267 etc.

In the embodiment shown in FIG. 11, only the transmit channels are shown and individual encoders are shown for each channel. In a more practical embodiment, only a single encoder is used in each transmit channel in each modem. This encoder is time shared to encode the data from the various timeslots. Usually, the single encoder is a suitably programmed microprocessor. Each RU modem also has a receive channel (not shown) which is structured similarly to the receive channel circuitry in the CU shown in FIG. 11. In some embodiments, the decoding in the receive channel and the encoding in the transmit channels are both done using a single microprocessor which has been suitably programmed. The choice of whether to use a shared microprocessor or multiple individual channels of hardware is largely dependent on data rate and cost considerations. If the data rates are high, multiple individual channels may be required. If data rates are low enough to use a shared microprocessor and cost is to be minimized, the shared microprocessor is preferred.

Typically, one RU will use less than all the 128 payload channels, but if one RU or a handful are using all 128 channels, no other RU can be awarded any bandwidth since only one RU can be on any particular channel at any particular time. Obviously, the orthogonal code set selected must have at least 128 codes. However, n the preferred embodiment, there are 128 data channels plus 16 management and control channels, for a total of 144 channels. Of the 16 management and control channels, 4 are access channels which carry traffic from the RUs to the CU requesting bandwidth and relinquishing awarded channels after the RU is finished using the channels awarded by the CU. Because there are 144 separate channels, an orthogonal code set having at least 144 unique, orthogonal codes must be used. Each channel has a maximum 72 kilobits per second data capacity in the preferred embodiment.

Channel allocation by the CU can take any one of a number of different forms. For example, the RUs could have a fixed allocation of channels or channels could be awarded in any number to any RU based upon need where the CU polls the individual RUs for their needs or the RUs transmit their needs asynchronously to the CU and the CU arbitrates between the requests to allocate the available channels. Likewise, one RU may have security considerations the require one channel to be dedicated to it at all times and no other RU is allowed to be on that channel as controlled by channel awards by the CU given in messages to the individual RU's. Alternatively, some channels can be made available for all RUs to use with the RUs themselves resolving contentions. In the preferred embodiment, there are four channel allocation schemes which are implemented either individually or in any combination in the CU channel allocation circuitry: (1) a reservation scheme where the RUs bid for bandwidth and the CU reserves certain channels to each of the RU's; (2) a contention mechanism where the RUs are notified by the CU of what channels are available to all RUs for traffic, and where the RUs transmit on those channels at will with contentions detected by the CU and contention notification messages to the RUs in contention to enter contention resolution procedures; (3) polling where the CU inquires of each RU sequentially whether it needs bandwidth and awards bandwidth as needed as determined from the polling with arbitration when not enough channels are available to meet all requests; (4) fixed allocation of the available channels to specific RU's. In the preferred embodiment, all four schemes can be used individually at times or any combination of the schemes can be used at times. Which channel allocation schemes are in use at particular times is established by the configuration data set up by the user. For example, one fourth of the channels may be put on a reservation scheme, one fourth of the channels may be left for contention, one fourth of the channels may have fixed allocation and the last fourth of the channels may be reserved for polling allocation. Each of these different mechanisms for allocation of bandwidth is believed to be known, standing alone. However, the applicant's believe it is new to provide a CU that can use any one of these methods or any user programmable combination of all four methods for user programmable groups of channels, all as established by entry of configuration data by a user during a configuration process.

Since the channel allocation mechanism is centralized in the embodiment of FIG. 11, the RUs have no burden other than to ask for the bandwidth they need. However, in alternative embodiments, the RUs may "bid" for channel allocations and some arbitration process carried out locally in the RUs may resolve any contentions.

By using spread spectrum modulation on the main coaxial cable 251, all the problems associated with pure time division multiplexing or pure frequency division multiplexing on such shared transmission media are avoided. In addition, use of the synchronous CDMA multiplexing and modulation technique with channels assigned on a non-fixed, flexible as-needed basis according to the teachings of the invention eliminates the waste of the so-called synchronous time division multiplexing schemes. In synchronous time division multiplexing schemes, each RU would have a fixed assignment of time slots, and those time slots would be transmitted even if they were empty, i.e., the RU had no traffic to send or receive during some or all of its time slots. Synchronous TDMA multiplexing schemes are described in "Data and Computer Communications" by Dr. William Stallings, at page 211–213, Macmillan Publishing Co., New York (4th Ed. 1994) ISBN0-02-415441-5 which is incorporated by reference herein.

A Code Division Multiple Access Transceiver

The genus of the invention contemplates a synchronous code division multiple access system for use on a CATV system to provide supplemental digital services wherein all the bandwidth dedicated to the supplemental services is continuously completely used and may be shared simultaneously by multiple users. Specifically, a plurality of orthogonally encoded, pseudo point-to-point channels are provided which may be shared by all users. The data on each channel is sent in frames. The users and RU transceivers are physically distributed along the CATV system thereby causing differing propagation times to the CU for each user both by virtue of physically different paths to the CU as well as by network thermal expansion and contraction. A training interval is used wherein each RU performs a trial and error process to set its transmit frame timing delay value $T_d$ to a delay which results in frames from that RU arriving simultaneously at the CU with frames transmitted by all the other RUs. This frame synchronization maximizes the number of users which can share the available bandwidth by reducing crosstalk between codes. In species within this genus, trellis encoded modulation and Viterbi decoding is used to lower the error rate in the face of the channel impairments. Quadrature amplitude modulation is also used in the trellis encoded modulation species and other species within the genus of the invention to maximize bandwidth efficiency. In other species within the genus, a training period is used to learn channel impairments then existing for each RU, and these channel impairments are converted to coefficients that are fed to precode filters so as to set the transfer functions thereof so as to predistort the outgoing signals so that they arrive relatively free of distortions caused by channel impairments.

Figure 19:
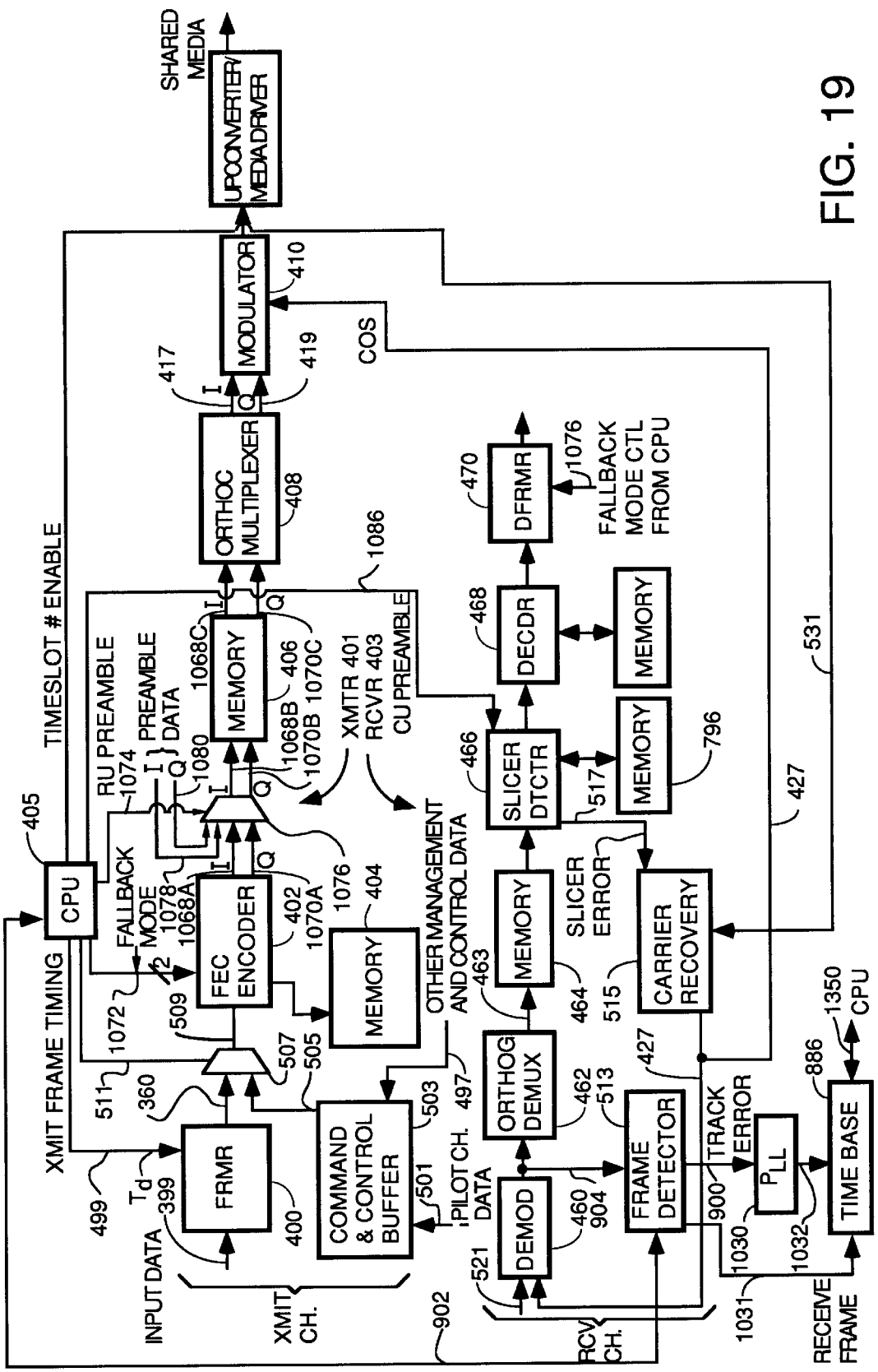
FIG. 19 is a general block diagram of the preferred embodiment of the transceiver circuitry included in each RU and CU.

Referring to FIG. 19, there is shown a high level block diagram of the preferred species of a transceiver for use in the modem of each RU and CU. The transmit channel of the transceiver uses a framer circuit 400. The function of the framer is to receive one or more streams of digital data via data path 399 from one or more sources and to organize this data into a plurality of frames, each frame comprised of one or more symbols. In the preferred embodiment, the framer circuit 400 composes the frames of data from a TDMA data stream on bus 399 where each timeslot corresponds to one channel. There are 128 payload data channels to share and 16 management and control channels some of which are also shared for a total of 144 channels or timeslots. Each RU may be assigned one or more channels or timeslots depending upon the amount of bandwidth it has been awarded by the CU in response to requests for bandwidth from the RU. In addition, bandwidth may be reserved to the various RUs on a permanent basis in some embodiments, and in these embodiments, the channels or timeslots may be permanently assigned or the reserved number of channels may be assigned on a guaranteed basis each time the RU requests bandwidth.

It is not critical to the invention that the incoming data streams arrive in a TDMA stream on bus 399. The streams of data from peripheral devices or networks could, in alternative embodiments, arrive via FDMA on bus 399 or each source of data could be connected to the framer circuit 400 by a separate input bus.

The framer circuit 400 and its associated circuitry implement the variable delay that sets the transmit frame timing reference for each RU and CU. This transmit frame timing reference establishes the timing of transmission of the orthogonally CDMA encoded chips of each frame such that all frames arrive from the each of the physically distributed RUs at the CU at the same time. Although, the invention still works even if frame synchronization is not maintained because of the orthogonality of the CDMA codes which are used, it does not work as well since the maximum number of users which can be simultaneously sharing the available payload channels is limited. This is because there are higher levels of crosstalk between CDMA codes when frame timing synchronization between all RUs and the CU is not maintained. Therefore, each RU undergoes a training interval after first powerup and from time to time thereafter to set its transmit frame timing delay. The training interval comprises a trial and error ranging process such as the process described above wherein the transmit frame timing delay $T_d$ is learned by cooperation between the transmitter 401, the receiver 403 and the CPU 405 in the RU which is ranging and the counterpart devices in the CU. The CPU changes the value of $T_d$ on line 499 until frame synchronization is achieved and thereafter maintains whatever value of $T_d$ which resulted in frame synchronization having been achieved.

The particular manner in which frame synchronization is achieved is not critical to the invention, and other processes can be used such as by trial and error correlation of a selected data string spread by a selected CDMA code transmitted at differing values of $T_d$ with the signal from another RU which is known to be in frame synchronization which comprises the same data string spread by the same selected CDMA code.

The framer circuit 400, in the preferred TDMA input bus embodiment, bridges the two time domains between the TDMA input data and the chip clock code domain (reading of the framer circuit is done at the chip clock rate and writing is done at the byte clock rate at which timeslots of data are written one 9-bit byte at a time). The output data stream from the framer circuit 400 comprises three arrays of tribits per frame, each array of tribits representing an information vector which, after encoding by the orthogonal multiplexer 408, is transformed into one symbol of chips. In the preferred embodiment, the orthogonal multiplexer 408 is a code division multiplexer which uses a plurality of orthogonal codes, each code being used to encode the data from a different channel. This is a so-called direct sequence type spread spectrum operation wherein the bandwidth of the baseband signals on buses 1068C and 1070C are spread across a broad spectrum by the CDMA codes using orthogonal code multiplexer 527 in FIG. 28A and orthogonal code multiplexer 408 in FIG. 19. This is because of the much higher clock rate of the chip clock used to drive the multiplication of the individual information vector elements times the code elements.

In an important class of alternative embodiments, the orthogonal encoding multiplexer 408 (and orthogonal multiplexer 527 in FIG. 28A) could be any encoder which encodes each channel with a different orthogonal waveform. For example, these orthogonal multiplexer could store digital samples that define a plurality of orthogonal sine and cosine waveforms, each at a different frequency. Any other set of orthogonal waveforms of different frequencies other than sines and cosines would also work to encode the various channel data samples. Each channel's data would then be multiplied by a different waveform's samples to generate new digital samples which define orthogonally encoded data on buses 417 and 419 for modulation onto the RF carrier frequencies. In such embodiments, the bandwith of each channel's data is not spread as wide as in a CDMA system. In fact, each channel's data would be dumped into a narrow bandwidth frequency bin. In such systems, the orthogonal demultiplexers 462 in FIG. 19 and 766 in FIG. 34 would perform the inverse transformation on the received samples to bring them back to baseband signals on bus 463 in FIG. 19 and bus 776 in FIG. 34. For example, each of orthogonal code multiplexer 527 in FIG. 28A and orthogonal code multiplexer 408 in FIG. 19 could be an inverse Fourier transform processor. The Fourier transform process determines from any waveform in the time domain, the magnitude, frequency and phase of an infinite number of sinusoidal signals in the frequency domain, which when added together, would yield a composite waveform identical to the time domain waveform that was input to the transform calculating process. The inverse Fourier transform process performs exactly the opposite process. The inputs to the inverse Fourier transform processors 408 in FIG. 19 and 527 in FIG. 28A in this alternative embodiment would be the information vector elements on buses 1068C and 1070C in FIG. 19 and buses 549R and 549I in FIG. 28A. Each of these information vector elements would define the magnitude of one frequency component in the Fourier spectrum of the output signal to be generated. The inverse Fourier transform processor would then calculate the time domain waveform that would have that Fourier spectrum and output digital samples that define that time domain waveform on buses 558R and 558I in FIG. 28A and buses 417 and 419 in FIG. 19. These samples would be used to modulate one or more RF carriers in accordance with whatever modulation scheme was being used. The receiver's demultiplexers (462 in FIG. 19 and 766 in FIG. 34) then perform a Fourier transform on the incoming signal samples to output the individual frequency component magnitudes that define the original information vector components.

Note that each information vector element in this embodiment always defines the magnitude of the same frequency component. In an alternative multitone system, the information vector elements can be pseudorandomly scrambled in the transmitters so that they define different frequency component magnitudes in each frame and then pseudorandomly descrambled in the same order in the receivers.

In SCDMA direct sequence spread spectrum transmitters of the preferred embodiment, the three information vectors output during each frame are converted by CDMA spreading to the three symbols that are transmitted during that frame. The data in each information vector spans the entire 144 timeslots in the sense that three bits from each timeslot or channel are present as the elements of the information vector as a tribit. This interleaving of data from each timeslot into each information vector is preferred but not critical to the invention. Likewise, the transmission of three symbols per frame is not critical to the invention and fewer or greater numbers of symbols could be transmitted.

In the preferred embodiment, the circuitry of the transceiver is virtually all digital, so the arrays of tribits are true arrays, the elements of which are used sequentially in the matrix multiplication to perform the CDMA spreading.

In analog embodiments, the arrays of tribits will be streams of tribits, with three separate streams per frame.

Before finishing the description of the rest of the transceiver circuitry in FIG. 19, the framer circuit 400 will be described in more detail. The RU's and CU all utilize framer circuitry to implement the delays needed to transmit data in synchronization to each other. The framer is comprised of a FIFO memory and supporting circuitry that stores incoming digital data from the time division multiplexed data stream received by each RU and CU. The symbols of each frame are composed by outputting the data from the FIFO memory in a different way than it was loaded during each frame. The basic idea is to pass the 9 bit groups of data from each time slot through the analog of a FIFO delay line implemented by a memory so as to simultaneously implement the delay imposed by each RU and CU needed for frame synchronization while providing a convenient way to compose the symbols of each frame from the data in the TDMA data stream.

Figure 12:
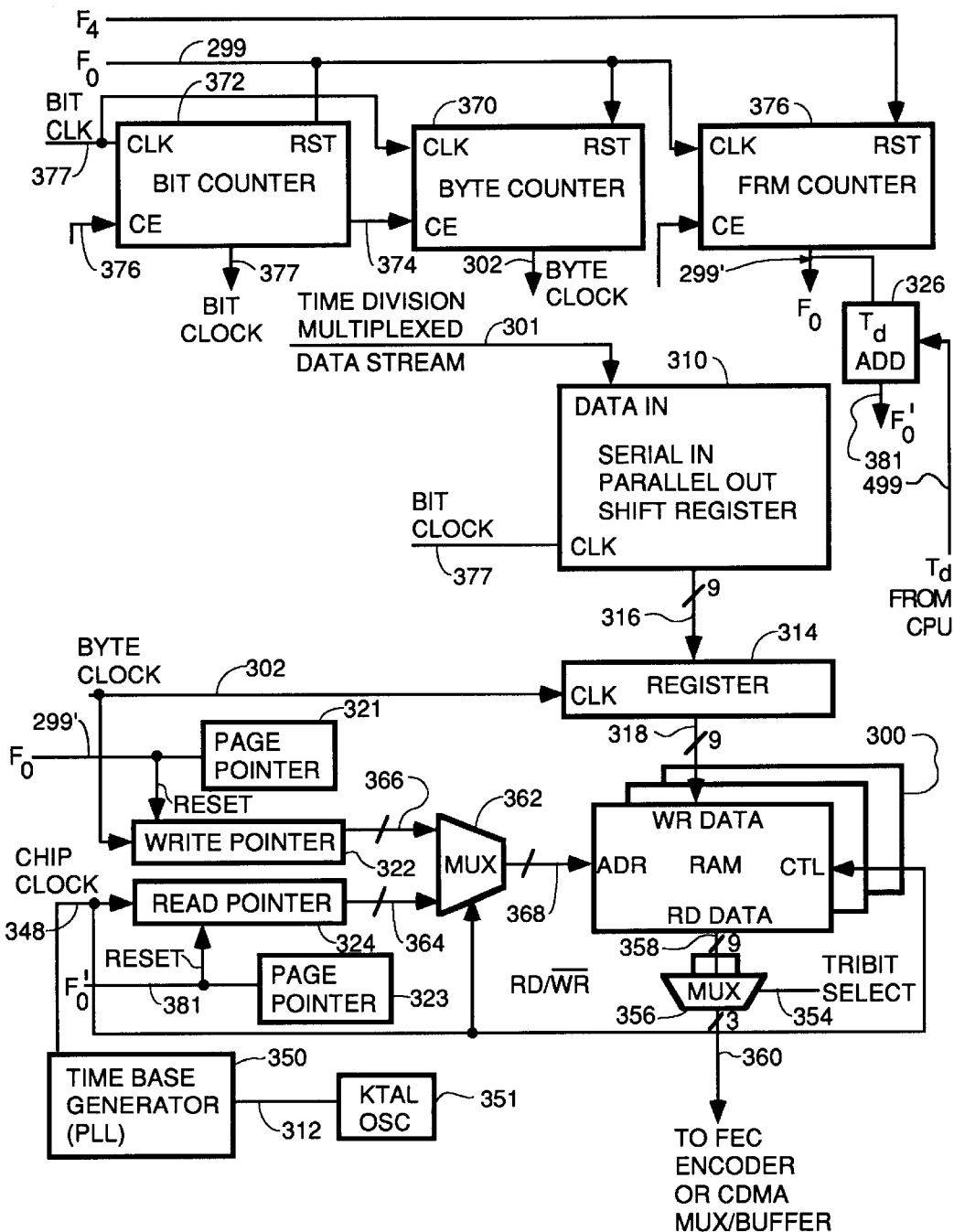
FIG. 12 shows the circuitry that implements the framer memory in the preferred embodiment which converts the TDMA input data streams into three columns of tribits for encoding and conversion by other circuitry into the three symbols of 144 chips apiece that are transmitted during every frame.
Figure 13:
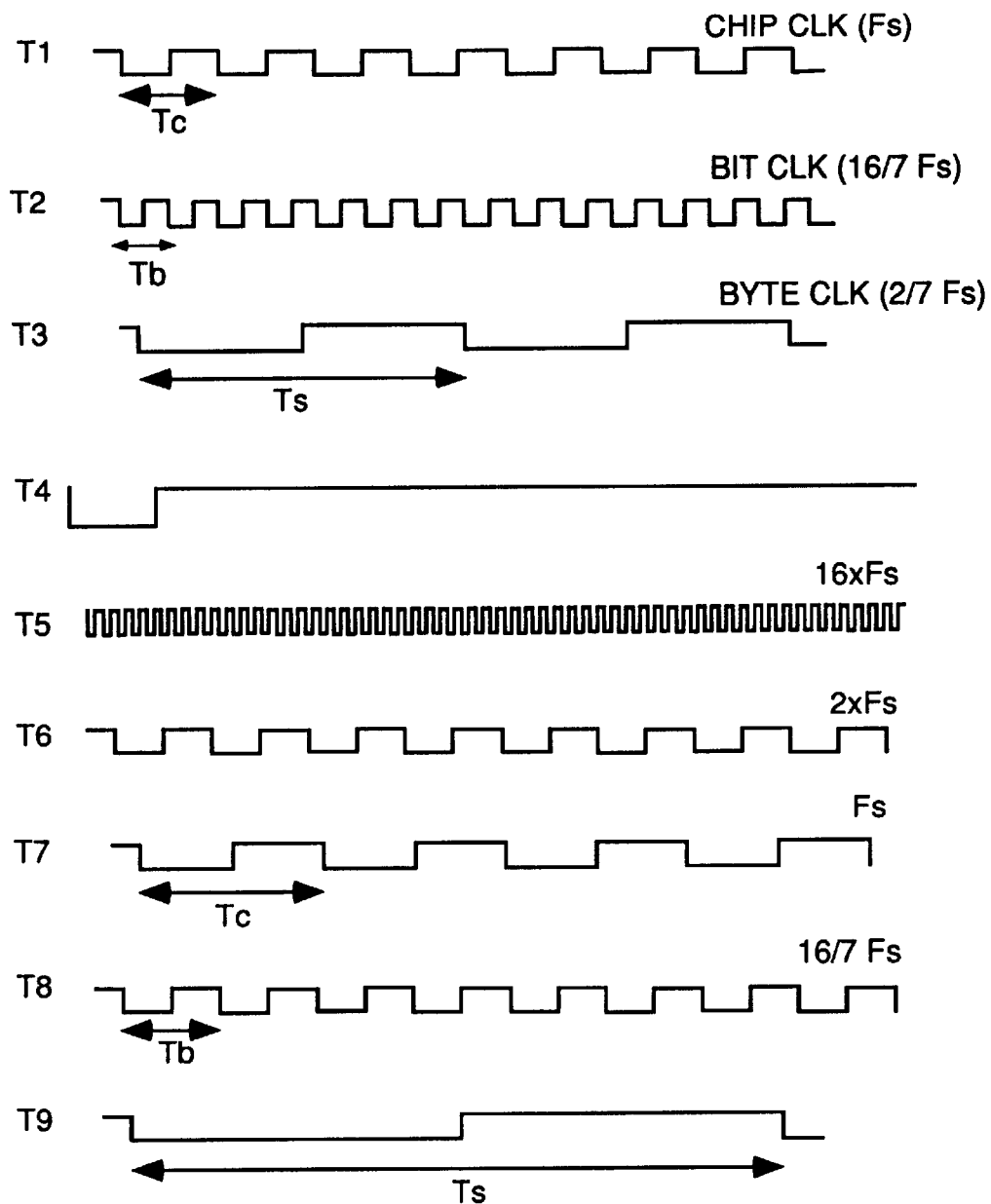
FIG. 13 shows the timing relationships between the chip clock signal which sets timing in the code domain and the bit and byte clocks which set timing in the time domain.

FIG. 12 shows the circuitry that implements the framer in the preferred embodiment, and FIG. 13 shows the timing relationships between the chip clock signal which sets timing in the code domain and the bit and byte clocks which set timing in the time domain. FIG. 13 also shows a number of other signals generated by time base generator 886. The basic period from which all other signals are generated is the chip clock signal shown on time line T1 of FIG. 13. The relationships between the periods of the various signals in FIG. 13 is shown in parentheses at the right edge of each signal. For example, for the bit clock signal shown on time line T2 of FIG. 13, for every 7 periods of the chip clock signal, there are 16 periods of the bit clock signal. For every 7 periods in the chip clock signal, there are two periods in the byte clock signal shown on time line T3 in FIG. 13. Handling of the TDMA stream is synchronized to the bit clock and byte clock signals.

Figure 18:
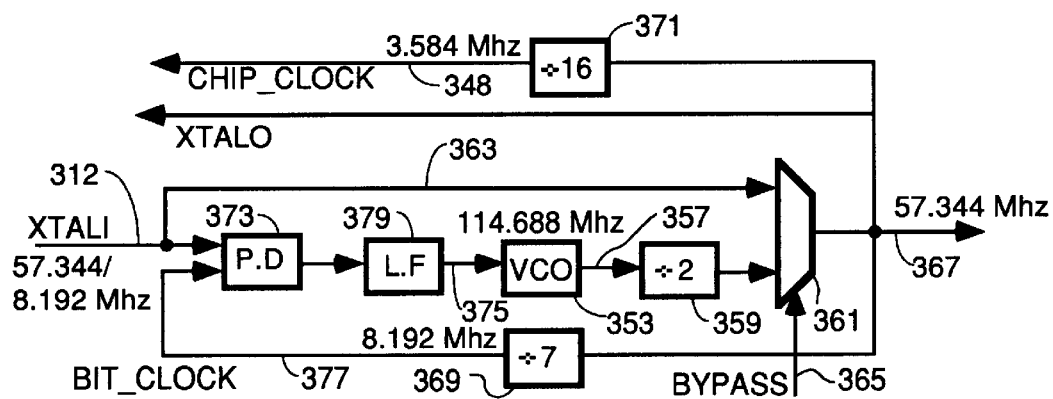
FIG. 18 is a block diagram of the time base generator.

The chip clock signal on line 348 of FIG. 12 is generated by a time base generator PLL 886 and is synchronized with the TDMA data stream by the action of the PLL in keeping both the chip clock and bit clock signals synchronized with the crystal oscillator reference signal. A block diagram of the time base generator 886 is shown in FIG. 18. A voltage controlled oscillator 353 operating at a frequency of 114.688 Mhz sets the basic operating frequency. The output frequency of the VCO on line 357 is divided by two by a divide-by-two counter 359. The result is coupled to one input of a multiplexer 361. The multiplexer has as its other input the crystal controlled oscillator frequency on line 363. The multiplexer switching is controlled by a bypass signal on line 365 so as to normally select the output of the counter 359 and couple it to output line 367. The PLL time base generator generates the bit clock signal on line 377 by dividing the frequency of the signal on line 367 by a factor of 7 in a divide-by-seven counter 369 to generate a bit clock signal on line 377 having a frequency of 8.192 Mhz. The chip clock signal on line 348 is generated by dividing the frequency on line 367 by a factor of 16 in a divide-by-16 counter 371 to generate a chip clock signal having a frequency of 3.548 Mhz. The bit clock and chip clock signals are kept synchronized to the crystal frequency by a phase detector 373 which compares the phase of the crystal signal to the phase of the bit clock signal and outputs a signal which is coupled to the frequency control input 375 of the VCO through a low pass filter 397. The bit clock signal and phase detector causes the PLL to force the transitions of the chip clock signal to line up properly with the bit clock transitions in the relationship of 16 periods of bit clock for every 7 periods of chip clock.

The relationships between timing in the time domain and timing in the code domain are as follows:

There are 144 total time slots or channels in the TDMA stream, of which 128 are payload time slots and 16 are management and control time slots;

Each time slot or channel in the TDMA streams carries 9 bits of digital data synchronized with the bit clock;

One time slot worth of data or 9 bits is stored in the framer for each cycle of the byte clock;

1 frame=144 times slots, each with 9 bits plus 16 chips for the alignment gap;

1 frame also equals 3 symbols plus the 16 chip periods of the alignment gap=448 chip periods;

1 symbol=144 chip periods;

1 gap=16 chip periods;

For every 16 bit clock periods, there are 7 chip clock periods, and for every byte clock period, there are 9 bit clock periods.

To implement the delay necessary in each RU and CU transmit channel circuitry to maintain frame synchronization, consider the following with reference to FIG. 12. The data stream coming into the framer circuitry during each time slot is stored in a different address in memory 300 in FIG. 12 at the data rate of the byte clock signal on line 302. The byte clock signal on line 302 is generated by a byte counter 370 shown at the top of FIG. 12 which generates a byte clock signal transition on line 302 every 9 cycles of the bit clock signal on line 377 from the time base generator 350. Memory 300 is a three page memory and the addressing circuitry of FIG. 12 controls the address and data ports such that data is written into and read from the two pages by alternating the use of these buses. Data from the time slots/channels in the time division multiplexed stream of serial data on line 301 is shifted serially into a serial-in, parallel-out shift register 310 at the bit clock rate of the signal on line 377. The byte clock signal on line 302 causes a register 314 to store the current 9-bit, parallel format output of the shift register on bus 316 after each 9 new bits are shifted into shift register 310.

The 9 bit parallel format output of the register 314 is presented on 9-bit bus 318 to the write data input port of memory 300. Thus, a new 9-bit group of data from the TDMA stream is presented for storage on each cycle of the byte clock signal. Each 9-bit group of data from the TDMA stream is stored in a different memory location of memory 300 as will become clear from the discussion of the address generation circuitry described below.

Data is read out of memory 300 at the same rate at which it was stored, but starting at some programmable time after the data is stored, thereby implementing the variable delay needed to maintain frame synchronization with the CU frame timing. This programmable delay $T_d$ is set by the difference in addresses between the address stored in a receive frame counter (read pointer) and the address stored in a transmit frame counter 324 in FIG. 15 (write pointer).

Figure 16:
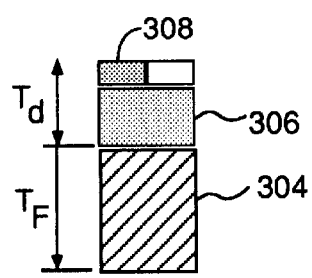
FIG. 16 represents portions of the framer memory 300 with the stippled portion representing the number of addresses difference between the position of the read pointer and the position of the write pointer to implement the transmit frame timing reference delay.

To illustrate this concept, FIG. 16 represents portions of memory 300 with the stippled portion representing the number of addresses difference between the position of the read pointer and the position of the write pointer to implement the delay $T_d$. The cross hatched portion 304 represents one frame of 9-bit bytes while the stippled portions 306 and 308 represent the amount of the delay $T_d$, where portion 306 represents a portion of the delay $T_d$ expressed in full 9-bit bytes, and portion 308 represents the remainder of the delay $T_d$ expressed as part of a byte. In other words, the delay $T_d$ may be some fraction of the number of bit clocks making up an entire 9-bit byte. This is because the delay needed to maintain frame synchronization may not work out to be an integer number of byte clocks.

Figure 15:
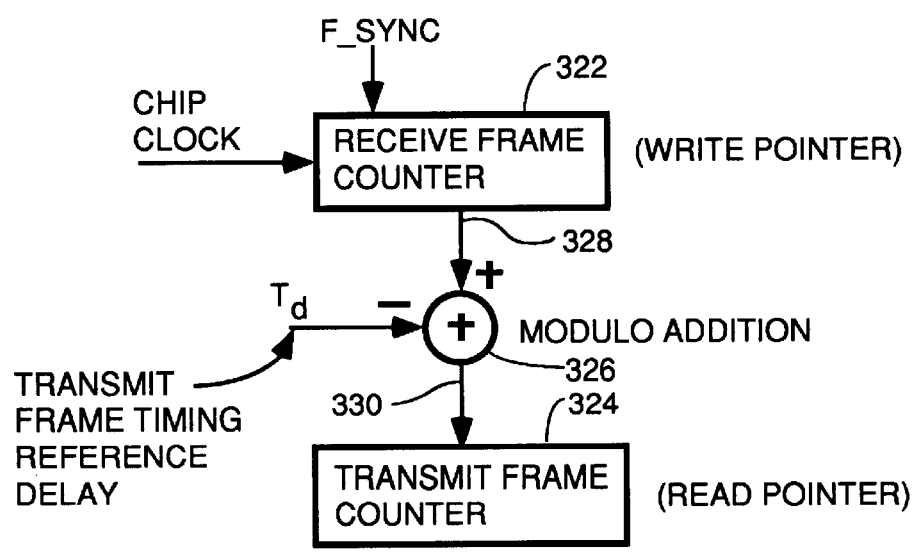
FIG. 15 is a diagram illustrating in block diagram form how the delay necessary in each RU and CU to maintain frame synchronization system-wide is achieved.

FIG. 15 shows how the time delay $T_d$ is implemented using a receive frame counter 322 that generates the write pointer address controlling where incoming data is stored in the memory 300 and a transmit frame counter 324 that generates a read address pointer that controls the read address from which data is read for transmission. The F_sync signal on line 326 resets the write pointer in counter 322 to zero at the beginning of each new frame. A modulo adder 326 adds the number of chip clocks based upon the desired time delay $T_d$ to the output write pointer on bus 328 and inputs the result into the transmit frame counter 324 as the read pointer. The value of $T_d$ is varied on a trial and error basis during the synchronization process until the gap is hit and the CU sends a message to whatever RU is synchronizing telling it to freeze $T_d$ at the value that caused the gap to be hit by the barker code.

Figure 14:
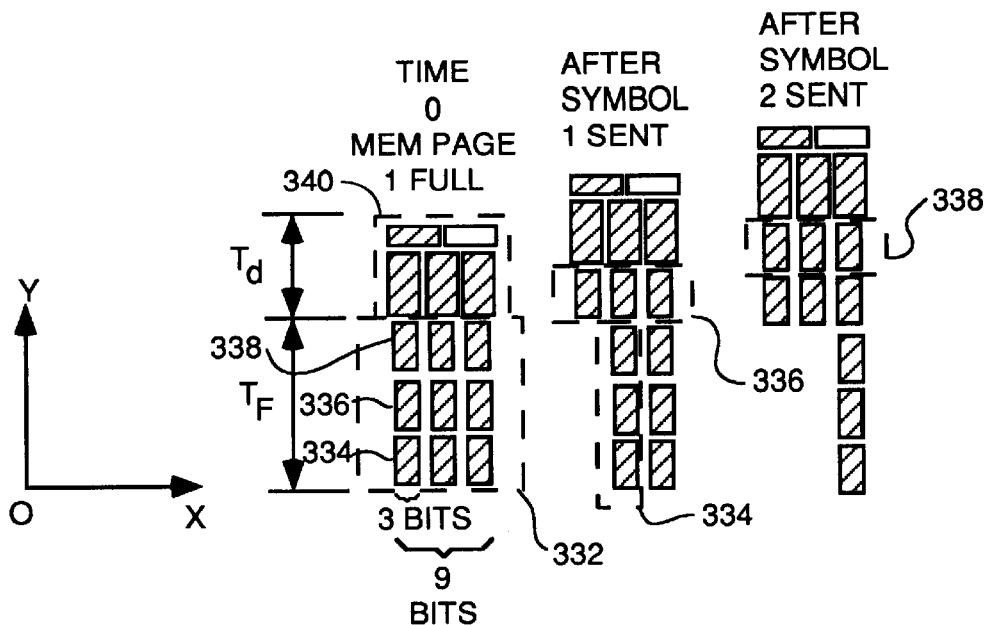
FIG. 14 is a memory filling diagram that illustrates how entire 9-bit bytes are received continuously from the timeslots of the TDMA stream, but 3 bit tribits for each of 128 data channels and 16 command and control channels are sent out simultaneously to circuitry which composes the symbols of each frame.

FIG. 14 is a memory filling diagram that illustrates how entire 9-bit bytes are received continuously, while 3-bit tribits for each of 144 channels are sent out simultaneously to compose the symbols of each frame. FIG. 14 graphically illustrates how the frame memory 300 fills and is emptied during this process. Frame memory 300 has 144 memory locations corresponding to the 144 channels of the system on each of three pages. While one page is being filled, another page is being simultaneously emptied at the same rate. Each memory address on each page can store the 9 bits of data from one of the 144 time slots in the TDMA stream. 16 memory locations on each page are reserved for the storage of management and control data to be sent across the 16 management and control channels. In FIG. 14, address numbers increase with an increasing Y coordinate.

At time (0) in FIG. 14 (the leftmost column), page one of the memory is shown as completely full with one frame of data comprised of three vertical columns of three crosshatched blocks apiece. Each column of three blocks, such as blocks 334, 336 and 338 represent one symbol, each symbol having 48 tribits therein. The middle column of FIG. 14 represents the state of fill of the memory after transmission of the first symbol comprised of blocks 334, 366 and 338. The rightmost column of FIG. 14 represents the state of fill of the memory after transmission of symbol 2 comprised of blocks encircled by dashed line 334.

The width along the X axis of each individual crosshatched block in FIG. 14 is equal to the 3 bits of a tribit, and the entire width of a column of blocks is equal to the 9 bits of a time slot. The positive x direction represents increasing time in the time domain. In other words, the first 9-bit byte that is stored is stored in the lowest row of the lowest three blocks in the left column with increasing time in the TDMA stream extending from left to right.

The blocks surrounded by dashed line 332 in the leftmost column represent 144 memory locations, each storing the 9 bits from one of the 144 time slots in one frame of data. The three crosshatched blocks 334, 366 and 338 represent the first symbol of the first frame, each symbol storing 48 tribits. Note in the middle column, after transmission of the first symbol in the frame, these three blocks are gone. Note also that the data of symbol 1 is read out of the memory "across time", i.e., along the y axis, thereby interleaving the data from the first tribits of individual channels in the time domain into different temporal relationships in the code domain and spreading out the energy of the time slot data over the entire frame interval. This is part of the teaching of code division, multiple access or CDMA modulation schemes.

The three blocks within dashed box 334 in the middle column of FIG. 14 represent the second symbol of data that is to be transmitted in the first frame. Note that these three blocks are gone in the rightmost column representing the state of page one of the memory fill after transmission of the second symbol.

While the first and second symbols are being transmitted, another page of the memory 300 continues to fill up as the data from new timeslots is received. For example, while symbol 1 from page 1 of the memory is being transmitted during the first frame, the data in the three blocks encircled by dashed line 366 in the middle column is received in page 2 of the memory and stored. Thus, while one third of the data from page 1 is read and transmitted, one third of page 2 of the memory is filled with new data. Likewise, while the second symbol of page 1 is being transmitted, the data represented by the three blocks encircled by dashed line 338 in the right column is received and stored in page 2 of the memory.

The blocks encircled by dashed box 340 represents the delay $T_d$ implemented by modulo adder 326 in FIG. 15 and the 16 chip alignment gap.

Figure 17:
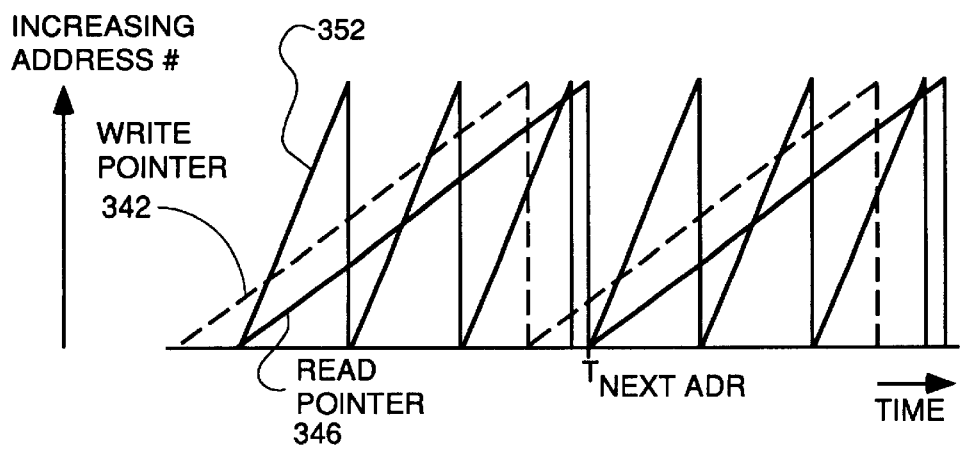
FIG. 17 is a timing diagram showing the relative rates of incrementation of the read and write pointers in the framer.

FIG. 17 is a diagram of the relative rates of address incrementation of the read and write pointers used to manage the framer buffer memory 300 including the relative timing of address incrementation for reading the tribits. Dashed line 342 represents the rate of address incrementation of the write pointer generated by counter 322 in FIGS. 12 and 15. This counter counts transitions in the byte clock signal on line 302 in FIG. 12, with the byte clock signal shown on time line T3 in FIG. 13. Every cycle of the byte clock signal causes register 314 in FIG. 12 to latch a new 9-bit byte therein and present it on bus 318 to the write data port of two-port memory 300. Every cycle of the byte counter also causes write pointer counter 322 to present a new write pointer address on bus 366 for use in controlling where the data on bus 318 is stored. A multiplexer 362 having its output coupled to the address port of memory 300 and having as its inputs the write pointer on bus 366 and the read pointer on bus 364 is suitably switched so that the write pointer and read pointer addresses are presented at the appropriate times at the address port to implement the memory filling and memory reading operations described herein.

The bit clock signal on line 377 in FIG. 12 is used to clock the serial-in, parallel out shift register 310. The bit clock signal is generated by the time base generator shown in FIG. 18 and is counted by a modulo 9 bit counter 372 shown at the top of FIG. 12 for purposes of helping generate the byte clock signal on line 302 in FIG. 12. This counter 372 counts the bit clock signal on line 377 from time base generator 350 modulo 9 and outputs a transition to logic 0 on line 374 after every 9th bit period. The transition on line 374 acts as a count enable signal to byte counter 370 to enable incrementation of the byte counter 370 by the next bit clock cycle. This generates the byte counter signal on line 302. The bit counter 372 is always enabled by the hard wired count enable signal on line 376. Both the bit counter and the byte counter are reset to 0 by asserting the $F_0$ signal on line 299 for fast resetting/resynchronization of the system. The $F_0$ signal occurs at the end of each frame. The $F_0$ signal is generated by a portion of the time base generator not shown in FIG. 18, and is counted as a clock signal by frame counter 376 which outputs a synchronized $F_0$ signal on line 299'. The frame counter 376 is reset every 4th frame by a super frame signal $F_4$.

The time delay $T_d$ necessary for hitting the alignment gap with a barker code transmission is added to the $F_0$ signal on line 299' by the modulo adder 326 to generate the $F_0$' signal on line 381. The value of $T_d$ is received from the CPU via bus 499 and changes by trial and error during ranging but is frozen at whatever delay centers the transmitter barker code in the gap at the CU. The $F_0$ signal on line 299' also increments the page pointer 321 for the write pointer and simultaneously resets the write pointer 322 to zero at the end of each frame so as to cause a page swap and begin writing again at address 0 of the next page.

The delayed $F_0$' signal on line 381 increments the page pointer 323 of the read address circuitry to cause a page swap and simultaneously resets the read pointer counter 324 to zero so as to begin reading at address 0 of the next page at the end of the frame.

Returning to the consideration of FIG. 17, solid line 346 represents the rate of emptying the frame memory 300 in FIG. 12. This rate of emptying is based upon incrementation of the read pointer counter which counts the chip clock signal on line 348 from time base generator 350. Since each symbol stores 144 tribits from 144 different channels and since there are three symbols and a 16 chip gap in each frame, the total number of chips in a frame is 448. Since all the 432 tribits of all three symbols of the frame must be read out while the byte counter is counting to 144 to store a frame's worth of 9-bit bytes of data from 144 channels or time slots, the read pointer is incremented on the chip clock signal. This causes all 432 tribits from all three symbols of a frame to be read out while the next frame of data is being stored thereby preventing overflow of memory 300. This is why the read pointer line 346 in FIG. 17 is shown as emptying the memory at the same rate as the write pointer fills it.

Line 352 in FIG. 17 represents the rate of incrementation of the read pointer counter 324 in FIG. 12. The read pointer counter increments on each cycle of the chip clock signal such that it increments from 0 to 143 during the time to read all the tribits from the first symbol. This has the effect of causing the 9 bits of data from each of the 144 timeslots or channels to appear sequentially at the read data output bus 358. However, it is desired to only unload all 144 tribits from a single symbol during one symbol time, so some switching on the output bus is needed, as described below.

A tribit select counter which is not shown in FIG. 12 coupled with a multiplexer 356 does this switching. This tribit select counter generates a tribit select signal on line 354 in FIG. 12 which controls switching by a multiplexer 356. This multiplexer has an input coupled to the 9-bit read data output port 358 of the memory 300. The tribit select counter counts at a rate to generate the select signal on line 354 in such a way as to cause only tribits from the first symbol to be output from the multiplexer 356 on bus 360 during the time that first symbol is being transmitted.

Figure 20:
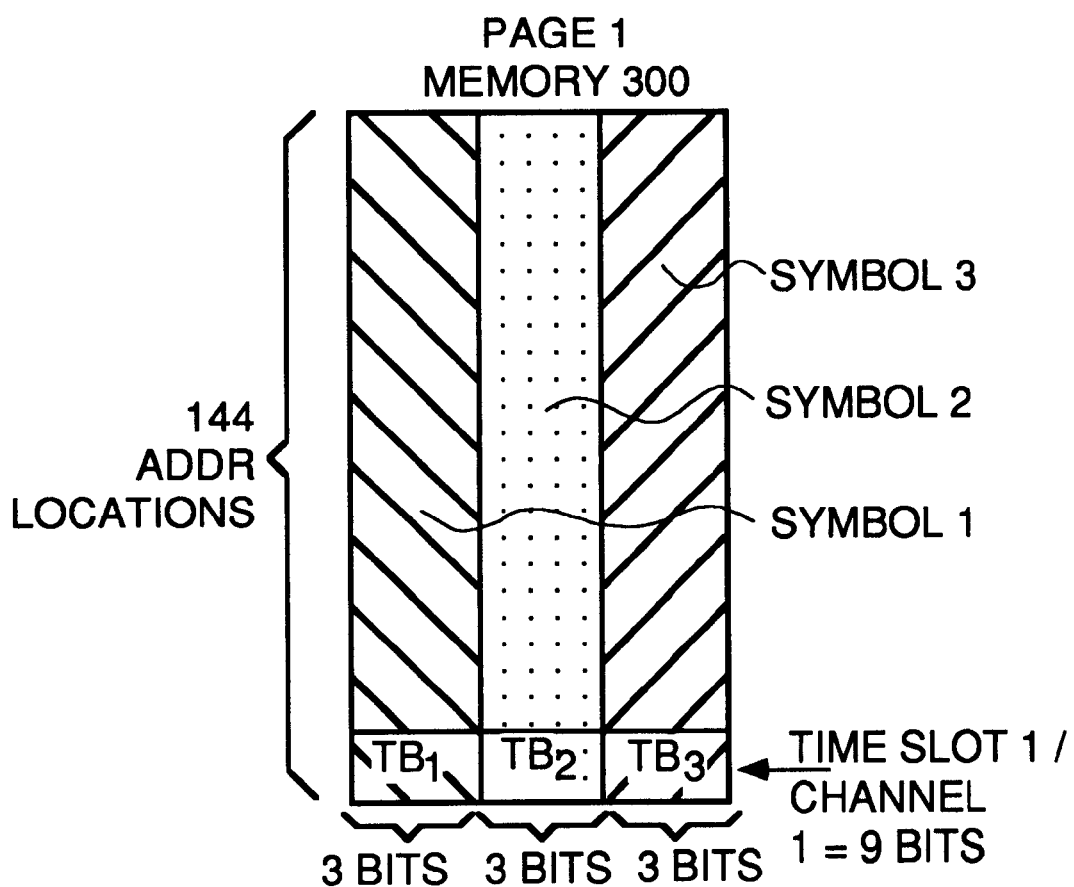
FIG. 20 is a diagram which helps illustrate the manner in which framer memory 300 is emptied for transmission.

FIG. 20 is a diagram which helps illustrate the manner in which framer memory 300 is emptied for transmission. FIG. 20 shows a completely filled page 1 of memory 300 in FIG. 12 comprising 144 memory addresses, each filled with one 9-bit byte, and divided into three columns of 3-bit tribits. Each column, marked by the legends symbol 1, symbol 2 and symbol 3, is comprised of 144 tribits and represents one symbol of a frame. To send this frame of data, the read pointer will increment 144 times during the time the first symbol is being encoded. The state of the tribit select counter during this first 144 cycles is such that only the 144 tribits of symbol 1 will be output on bus 360 to the forward error correction (FEC) encoder 402 in FIG. 19.

After the 144th incrementation, the read pointer counter 324 rolls over to zero and begins to count up to 143 again. At the 144th incrementation, the tribit select counter increments which causes the multiplexer 356 to select the middle column of tribits from symbol 2 in FIG. 20 for output on bus 360 in FIG. 12 to the forward error correction encoder 402 in FIG. 19. A similar process unloads the 144 tribits of symbol 3.

Bus 360 in FIG. 12 is, in the embodiment shown in FIG. 19, coupled to a forward error correction encoder 402 the function of which will be explained in more detail below. In FIG. 12, a multiplexer 362 having its output coupled to the address input of the framer memory 300 has two inputs: one is coupled to the output of the read pointer counter 324 and the other is coupled to the output of the write pointer counter 322. This multiplexer alternately couples the read pointer on bus 364 and the write pointer 366 to the address port 368 of the memory 300 on every cycle of the chip clock signal on line 348. The chip clock signal is also coupled to the control input of thememory 300 to serve as the RD/WR* control signal controlling whether the memory uses the address at port 368 in a read or a write transaction.

Returning to the consideration of the transceiver block diagram of FIG. 19, the output data streams from the framer on bus 360 in FIG. 12 may optionally be passed through a forward error correction encoder 402. The forward error correction encoder 402 can be eliminated in some embodiments or an ARQ encoder may be substituted. The embodiment of FIG. 19 symbolizes a class of species which use systematic codes where the bits of the tribits are not scrambled and the FEC encoder is a convolutional encoder. In alternative embodiments, the tribits on bus 360 can be pseudorandomly scrambled prior to being received by the FEC encoder 402. In other alternative embodiments, the FEC encoder can use block codes. In the preferred embodiment, FEC encoder 402 is used for trellis encoding.

The purpose of the forward error correction encoder 402 is to add one or more redundant bits to each tribit so as to improve the error rate for the energy per bit-to-noise power density ratio resulting from the chosen modulation scheme. In the preferred embodiment, the FEC encoder 402 is a trellis encoder for a 16-QAM, Rate 3/4 trellis code having 16 states, a pi/4 rotational invariant, no parallel paths and an effective code length of 2. In yet another alternative embodiment, the forward error correction encoder 402 could be a Reed-Solomon Encoder which generates a first set of code words which are then further encoded in a trellis encoder. An advantage of using trellis encoded modulation either with or without Reed-Solomon coding is that it allows redundancy to be added to the payload data so as to enable forward error correction without increasing the symbol rate and the consumed bandwidth. Trellis encoded modulation uses redundant bits to map the payload data into a larger constellation of possible points (called signal space coding). The bandwidth required for transmission is not increased, nor is total noise admitted by the receive filter. Basically, trellis encoding uses a channel coder to receive each k payload bits and convert them into n bits where n is greater than k and includes some redundant bits which contain information about the k payload bits. The n bit group is then processed by a modified line coder to produce symbols for transmission from a constellation having size $2^n$. Significant coding gains can be achieved in this way. For example, assuming a particular additive white Gaussian noise channel produces an acceptable probability of error without coding at some signal to noise ratio using a constellation of size M, using trellis encoded modulation, the error probalility can be reduced at the same signal to noise ratio or the signal to noise ratio can be reduced at the same error probability, and, per Ungerboeck, most of this theoretical reduction can be achieved using a constellation of 2M plus a channel coding scheme. As an example of the type of coding gain that can be achieved using trellis coded modulation, consider the following. If only tribits were used without coding with redundant bits, and an 8-AM constellation were used, according to Ungerboeck transmission with $10^{-5}$ error probability with an SNR of 26 transmitting and 3 bits per symbol could be done. However, by the use of trellis encoded modulation using a 16-AM constellation, it is possible to send 3 bits error free down to 18 db SNR. Therefore, using trellis encoding, it possible to achieve a coding plus shaping gain of 26−18=8 db. In the invention, a coding gain of approximately 4 db is obtained. The main advantage of using trellis coded modulation is the ability to reduce the error rate or increase the number of payload bits without increasing the symbol rate and bandwidth consumed. This can be done using a constellation no greater than 2M. More details about trellis encoded modulation are contained in Lee and Messerschmit, *Digital Communication*, 2d Ed., 1994 (Kluwer Academic Publishers, Boston), ISBN 0 7923 9391 0, which is hereby incorporated by reference. Trellis encoded modulation is not required however to practice the invention, and, therefore, the encoders 402 and 526 in FIGS. 19 and 28A, respectively, could be eliminated or replaced with simple encoders using any known error detection or correction encoding scheme and a mapper to map the resulting encoded symbols into points in a constellation.

Figure 42:
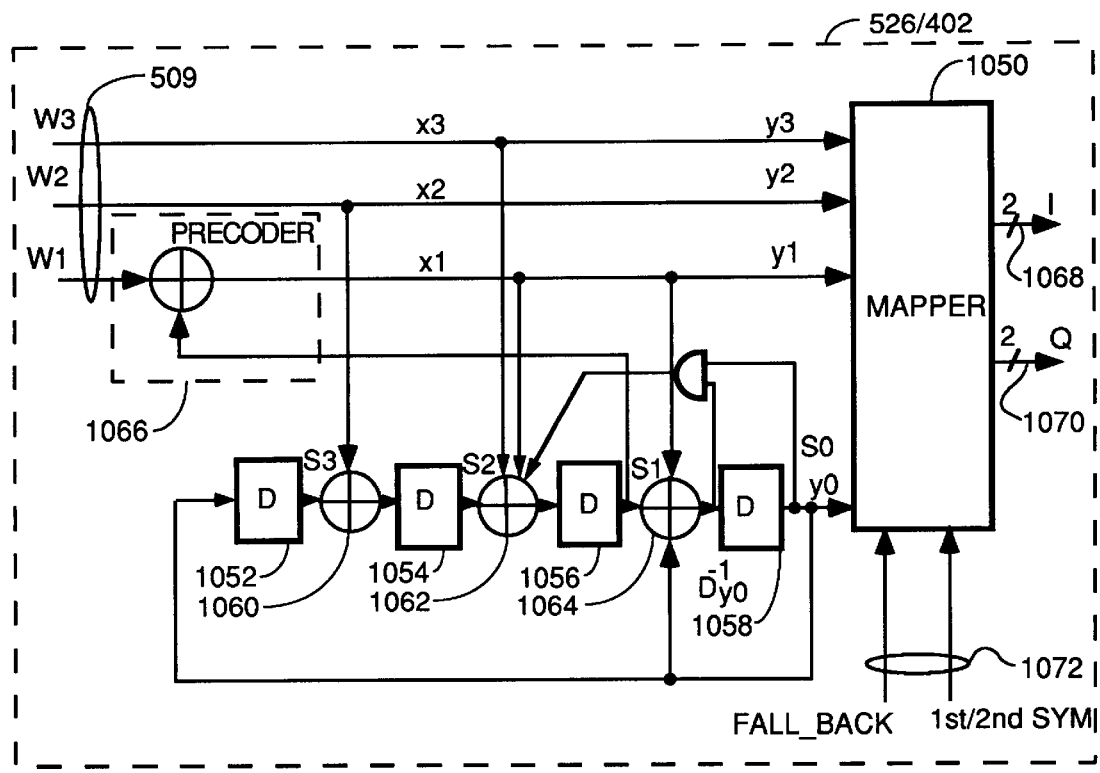
FIG. 42 is the preferred form of the trellis encoder in embodiments using trellis encoders.

In the preferred embodiment, the encoders 402 and 526 in FIGS. 19 and 28A, respectively, take the form of the trellis encoder shown in FIG. 42. The input to the encoder is comprised of three payload bits of a tribit on lines W1, W2 and W3 of bus 509. Bits W3 and W2 pass through the convolutional encoder section unchanged and arrive at mapper 1050 unchanged as bits y3 and y2, respectively. Bit y0 at the input of the mapper is generated by an encoder section comprised of D flip flops 1052, 1054, 1056 and 1058 coupled by exclusive-OR gates 1060, 1062 and 1064. These exclusive-OR gates combine the outputs of the flip flops with various combinations of the W3, W2 and W1 bits and two feedback bits. The output of flip flop 1058 is the y0 bit and is a factor in the generation of the two feedback bits. The y1 bit is the W1 bit after an exclusive-OR operation in a precoder 1066 with the output of flip flop 1056.

Mapper 1050 has a normal mode and several other modes including a fallback mode. In normal mode, the mapper takes the 16 combinations of the y0 through y3 bits and maps them to the 16-QAM constellation of FIG. 21. The mapper outputs 2 bits on an I bus 1068 and 2 bits on a Q bus 1070. For input combination of 4 bits, the two bits on the I bus define the coordinate along the I axis in FIG. 21 of the resulting constellation point, and the two bits on the Q bus define the coordinate along the Q axis. The mapping is nonlinear, and is defined by the table of FIG. 22. For example, an input code of 0101 for bits y0–y3, maps to a 1+3*j constellation point having an I coordinate of 1 and a Q axis coordinate of +3. This trellis encoder has a code gain of approximately 4 db SNR.

The I and Q bits on buses 1068 and 1070 are then stored as separate real and imaginary arrays for the information vector [b] in memory 406 in FIG. 19. These real and imaginary arrays then have their bandwidths spread individually by CDMA multiplexer 408 in the manner illustrated by FIG. 23B to generate real and imaginary array components of a result vector. The elements of each result vector define the individual chips of one symbol in a frame.

Figure 43:
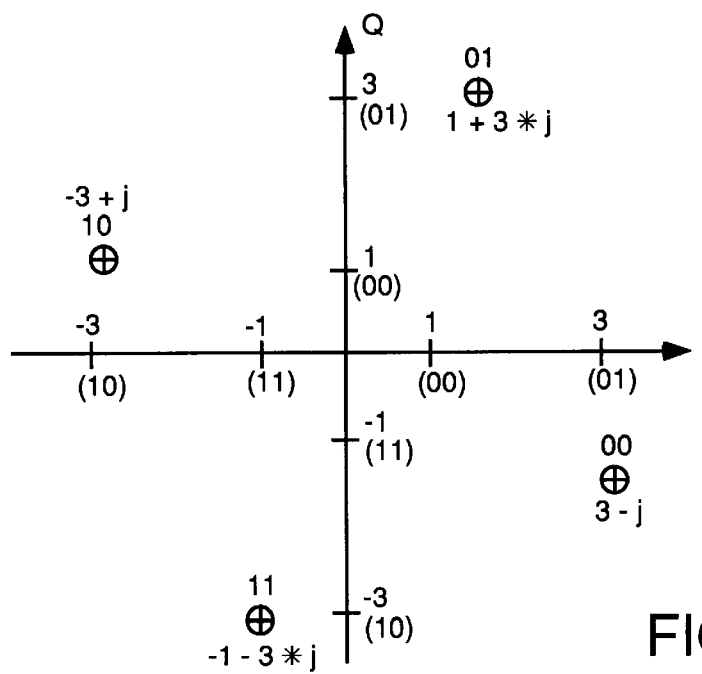
FIG. 43 shows the mapping for the LSB and MSB chips in fallback mode.

Fallback mode and the other available modes are implemented in the trellis encoder of FIG. 42 through control signals on bus 1072 from CPU 405 in FIG. 19. The mapper has normal mode, fallback mode, access channel mode, training channel mode and no code mode in some embodiments. In fallback mode, the encoder output in divided into two symbols and transmitted separately. The 2 LSBs (y0, y1) are transmitted as the first symbol and the 2 MSBs (y3, y2) are transmitted in the second symbol. The 2 LSBs are transmitted QPSK with a 4 point constellation. The two MSBs are transmitted DQPSK. To avoid changing the output power during fallback mode, the 4 point constellation of FIG. 43 was chosen for fallback mode. FIG. 44 shows the mapping for the LSB and MSB chips in fallback mode. The receiver needs to be synchronized between the first and second symbols to know which symbol carries the information of the LSBs and MSBs. In other words, when the transmitter goes into fallback mode, the 144 tribits that were encoded and then mapped into the 144 chips of the first symbol in the first frame in normal mode are now split into LSB and MSB components where are mapped into the first and second symbols of the first frame in fallback mode. Likewise, the 144 tribits that were encoded and mapped into the second symbol of the first frame in normal mode are split and mapped into the third symbol of the first frame and the first symbol of the second frame. Since the receiver is synchronized and knows which symbol of which frame it is receiving at all times, the CPU 405 controls the deframer circuit 470 so as to properly reassemble the original data stream via signals on bus 1076 in FIG. 19. Constant link quality monitoring for noise, crosstalk and signal quality is performed in background cycling constantly through all codes and timeslots. When a fallback mode threshold is exceeded, fallback mode is initiated and maintained until conditions return below threshold. Monitored values are stored by a diversity management function in the CU computer that controls code diversity and fallback operations.

In still other embodiments, forward error correction is not used, and the encoder 402 is an ARQ encoder which simply adds enough ECC bits to allow the receiver to detect an error and request a retransmission. The retransmission request is made on one of the command and control channels. In some block code embodiments, the forward error correction encoder 402 uses cyclic codes where the sum of any two code words is a code word and any cyclic shift of a code word is also a code word. Note that the Viterbi decoder 468 discussed below in the description of the receiver is used only when the forward error correction encoder 402 is a convolutional or trellis encoder.

Although the discussion of the forward error correction encoder 402 has not heretofore included any discussion of the modulation process carried out by modulator 410, Trellis-Coded Modulation (hereafter referred to as TCM) is preferred because of its lower error rate in the face of channel impairments. TCM modulation combines the forward error correction and modulation process by redefining the coding as the process of imposing certain patterns on the transmitted signal. This provide more effective utilization of band-limited channels as is the case for multiple access on HFC cable TV plants. Trellis-Coded Modulation is characterized by three basic features:

(1) the number of signal points in the constellation used is larger than what is required for the modulation format of interest with the same data rate wherein the additional points allow redundancy for forward error control coding without sacrificing bandwidth;

(2) convolutional encoding of the message data is used to introduce a certain dependency between successive signal points such that only certain patterns or sequences of signal points are permitted; and (3) soft-decision decoding is performed in the receiver, in which the permissible sequence of signals is modelled as a trellis code.

The preferred form of the encoder 402 is the 16 state trellis encoder shown in FIG. 42. This encoder is characterized by parity check polynomials given in octal form as follows: h3=04, h2=10, h1=06, h0=23, d^2_free=5.0, Nfree=1.68. The nonlinear term is given by D^2[y0(S).AND.D^(−1)y0(D)]. More details are given in Pietrobon, Ungerboeck et al., "Rotationally Invariant Nonlinear Trellis Codes for Two Dimensional Modulation," IEEE Transactions on Information Theory, Vol. 40, No. 6, November 1994, pp. 1773–1791.

In the preferred embodiment, the forward error correction encoder 402 has multiple modes: which add different numbers of redundant bits while always maintaining the code word length at 4 bits. In a normal mode, one redundant bit is added per tribit. In a fallback mode when channel impairments are high, fewer payload bits are sent and more redundant bits are sent in each 4 bit code word.

The encoder 402 in the transmitter is a state machine which, in conjunction with state memory 404, receives the stream of tribits for each symbol and calculates a 4th redundancy bit for each tribit. This 4th bit provides redundancy for error detection and correction and for use by a Viterbi Decoder 468 in the receiver in ascertaining with greater accuracy the data that was actually sent despite the presence of noise. The 4th bit in each tribit is part of the trellis modulation scheme and is generated by the convolutional encoder 402. A three bit constellation would normally have only 8 points. However, trellis modulation adds redundant bits interspersed in the information stream of tribits and increases the size of the constellation to enable more spacing between constellation points thereby enabling better discrimination between points by the receiver and lowering the bit error rate without increasing the bandwidth. In noisy environments like CATV media, trellis modulation is preferred, but some species of the invention will work without the redundant 4th bits and using a smaller constellation. In the preferred embodiment, the encoder is used to provide greater accuracy and better noise immunity. The encoder, in the preferred embodiment, is a state machine but it could also be a lookup table implemented in RAM or ROM etc. The implementation of the state machine is not critical as long as the implementation is fast enough to keep up with the chip clock data rate. For purposes of this discussion, it will be assumed that the convolutional encoder 402 is present.

M-ary Modulation in Code Division Multiple Access System

Figures 21, 22:
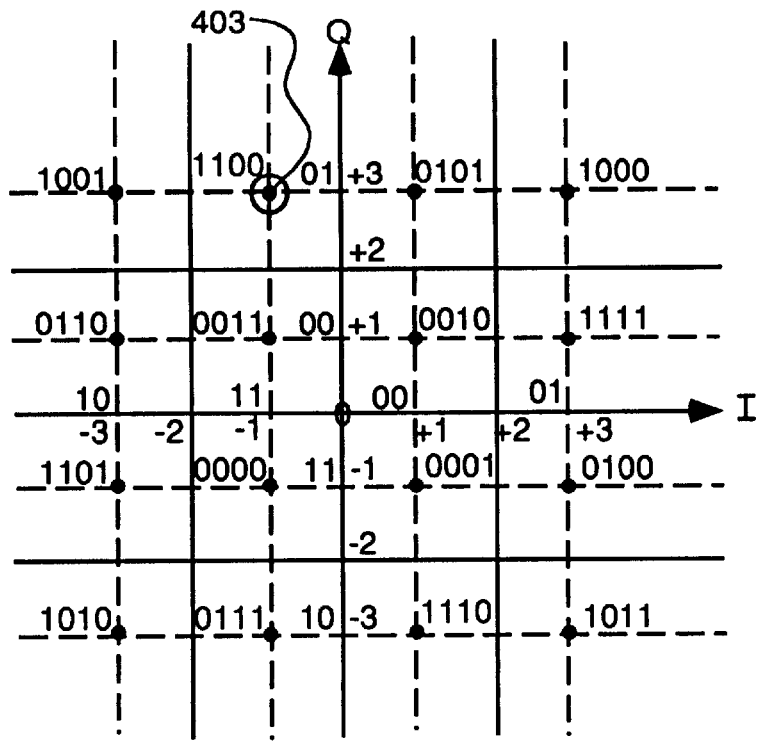
FIG. 21 maps each of 16 possible input points, i.e., permutations of the 4 bit "chips" in each symbol array, to a point in space defined by the in-phase or I axis for the real part and the quadrature or Q axis for the imaginary part of each point to implements M-ary QAM modulation.
FIG. 22 is a table listing all the possible input points of FIG. 21, I. e., the 16 combinations of 4 bit chips in the Code column and the corresponding 2's complement digital representation of the I and Q coordinates for each combination in the Inphase and Quadrature columns, respectively.

The output of the convolutional encoder 402 is an array of 4-bit digital numbers for each of symbols 1, 2 and 3 shown in FIG. 20. Each of these 4-bit numbers has two bits representing a real part and two bits representing an imaginary part. Thus, the information vector [b] shown at 481 for use in the matrix multiplication for CDMA spreading of each symbol is comprised of 144 4-bit elements, each element comprising one tribit plus the additional 4th bit calculated by the convolutional encoder 402 as shown in FIG. 23A. Each 4-bit symbol element in FIG. 23A, such as element 483 represents one third of the information bits from the corresponding timeslot in the TDMA stream input received by the transceiver plus the redundant bit calculated by the convolutional encoder 402. FIG. 23A illustrates how the information vector [b] for each symbol has its energy spread over time by the process of code division multiplexing implemented using matrix multiplication of the information vector [b] of each symbol times a matrix of orthogonal codes. The first two bits of each 4-bit symbol element are used to define the amplitude of either the I or Q coordinate, and the last two bits are used to define the amplitude of the other coordinate. The constellation of input point mappings of all possible points defined by a 4 bit symbol element or "chip" is shown in FIG. 21. FIG. 21 maps each of 16 possible input points, i.e., permutations of the 4 bits of each chip in each symbol array to a point in space defined by the in-phase or I axis for the real part and the quadrature or Q axis for the imaginary part of each point. The I coordinate of each point represents the amplitude for that point imposed upon the sine wave carrier fed to the modulator 410 in FIG. 19 to modulate that point. The Q coordinate of each point in the constellation represents the amplitude imposed by modulator 410 on the cosine wave carrier fed to it in order to modulate the point in QAM trellis modulation. FIG. 22 is a table listing all the possible 16 combinations of 4 bits in the Code column and the corresponding 2's complement digital representation of the real and imaginary coordinates for each combination in the Inphase and Quadrature columns, respectively. For example, the input point 1100 maps to a point having a +3 imaginary coordinate and a −1 real coordinate on the constellation of FIG. 21. The mapping of FIG. 21 was selected to give maximum separation between points in the constellation for best noise immunity, but any other mapping would also work. Likewise, 2's complement representation is not required for the coordinates as they can be represented in other number systems as well. In the preferred embodiment, the encoder 402 is a trellis encoder coupled to a state memory 404. The function of the trellis encoder 402 is to select the bit to append to each tribit to put it at a place in the 16 point constellation of FIG. 21 which gives maximum noise immunity. This selection is made according to known trellis modulation principles based upon the previous states. In other words, trellis encoder 402 and state memory 404 comprise a state machine which transitions to one of the 16 states or points in the constellation based during each chip time based upon the incoming tribit data and the previous states. The memory 404, in the preferred embodiment, is large enough to record the last state for each of the time slots, so as each tribit arrives, the last state for the time slot from which the tribit was generated is looked up in memory 404, and the tribit is encoded based upon that channel's prior state The stream of 4-bit symbol elements that are output from the encoder 402 are stored in memory 406 as three different linear arrays corresponding to symbols 1, 2 and 3 in FIG. 20. Each 4-bit symbol element is a complex number comprised of 2 bits which define the I or inphase coordinate of a constellation point and 2 bits which define the Q or quadrature coordinate of the same constellation point. These two I and Q values are output on buses 1068 and 1070.

After passing the tribit stream from the framer 400 through the encoder, the resulting 4-bit data streams are stored as separate I and Q information vector arrays for each symbol in memory 406. Each symbol is comprised of two linear arrays of 2 bit numbers: one array contains multiple 2-bit elements defining the real or inphase "I" coordinates for all the elements of the symbol and the other array stores the 2-bit elements which define the imaginary or quadrature "Q" coordinate of each symbol element. The 144 array elements of each symbol define an information vector b for each symbol. The code division multiplexer 408 then spreads each information vector separately with a separate orthogonal code for each channel and combines the spread data into a single orthogonally coded data stream.

FIG. 23 shows the matrix multiplication process which is performed within code division multiplexer 408 in FIG. 19 to multiply each of the two linear arrays that define each symbol times the orthogonal code matrix [c] identified as matrix 407 in FIG. 23. In the preferred embodiment, the matrix multiplication is performed by a microprocessor, but any machine that can do the matrix multiplication will suffice to practice the invention.

The encoding in CDMA MUX 408 spreads the energy of the symbols over time using orthogonal codes or orthogonal, cyclic codes. This is done in two steps. First, a linear array information vector of just real parts, i.e., inphase coordinates of the symbol to be transmitted, symbolized by array 405 in FIG. 23, is multiplied by the code matrix 407. This operation generates another linear array of real or inphase coordinates along the R axis of a result space in a results constellation similar to the constellation of all possible input points shown in FIG. 21. This first linear array 409 defines the real axis coordinates in the result constellation for a plurality of chips from the first symbol to be transmitted.

Second, the same process is repeated for the imaginary coordinate linear array (not shown) for the same symbol the real coordinates of which were just processed. This results in another linear array comprising the imaginary or quadrature coordinates of the chips in the results array. This imaginary component array of the results array also is not shown in FIG. 23.

The real component array, represented by linear array 409, is part of an overall result or "chips out" array which contains both the real and imaginary coordinates of a plurality of chips to be transmitted. These chips map to points in the result space, and the points in the result space map to whatever points in the input point space that are defined by the real and imaginary components in the information vector array b, of which array 405 is the real part. The mapping between the input point space and the results space is defined by the contents of the code matrix and the orthogonal codes.

Before performing the matrix multiplication, the 2's complement values of the real and imaginary components of the information vector b input array are converted to their decimal equivalents as shown in FIG. 23 in some embodiments. FIG. 23 is a simplified version of the system in which there are only 4 channels resulting in 4 elements of each symbol. The 4 real components of the information vector b shown in array 405 after conversion to their decimal equivalents, are, respectively from top to bottom, +3 (first three bits of channel 1), −1 (first three bits of channel 2), −1 (first three bits of channel 3) and +3 (first three bits of channel 4). This column of numbers is multiplied by the first row in the code matrix to yield the result 4 as the first real component in array 409 of the results array. This result is derived from summing the partial products as follows [(3× 1)+(−1×1)+(−1×1)+(3×1)]=4. The next component down in the real part array 409, i.e., 0, is derived by multiplying the next real component down in the array 405 (−1) times the second row of the code matrix in a similar manner yielding [(−1×−1)+(−1×−1)+(−1×1)+(−1×1)]=0. In the preferred embodiment, arrays 405 and 409 would be 144 elements long, and the code matrix 407 would have 144 elements in each row and would have 144 rows. The orthogonal codes are actually the columns of the array. Note that the channel 1 element always gets multiplied by an element of the first column and so on for all the elements of array 405 as array 405 is multipled by each of the 4 rows in array 407. Thus, the first column in array 407 is the orthogonal code used to spread out the bandwidth of the data from the channel 1 timeslot. For ease of generation, the set of orthogonal pseudorandom codes in matrix 407 is also cyclic.

Because each orthogonal code used in array 407 is also pseudorandom, and the rate of generation of the chips in the result vector (the chip rate) is much higher than the bandwidth of the input data represented by the information vector 405, the bandwidth of the resulting signals defined by the result vectors generated by this process is spread into an extremely broad spectrum. In fact, the bandwidth of the result vectors generated by this process extends to plus and minus infinity. The spread signal consists of replicas of the same power spectrum repeated end to end, so the signal can be recovered by the receiver even though only the portion within the passband of the amplifiers on the hybrid fiber coax channel and the transmitter and receiver filters is processed by the demodulation and despreading circuitry in the receiver.

The CDMA MUX 408 in FIG. 19 that does the matrix multiplication can be a programmed microprocessor or a dedicated custom logic circuit, etc. Any design which can perform the multiplication of the information vector times the code elements for all the active channels will suffice. Since the code matrix is comprised of purely 1's and −1's, the multiplication is made simpler. If the codes in the code matrix are Hadamard codes, the matrix multiplication can be made using the Fast Hadamard Transform algorithm in a digital signal processor or microprocessor. If the code matrix is comprised of sin and cosine terms, the Fast Fourier Transform can be used. Although any orthogonal or any cyclic code can be used to practice the invention, cyclic codes are preferred because they are easier to generate.

Figure 24:
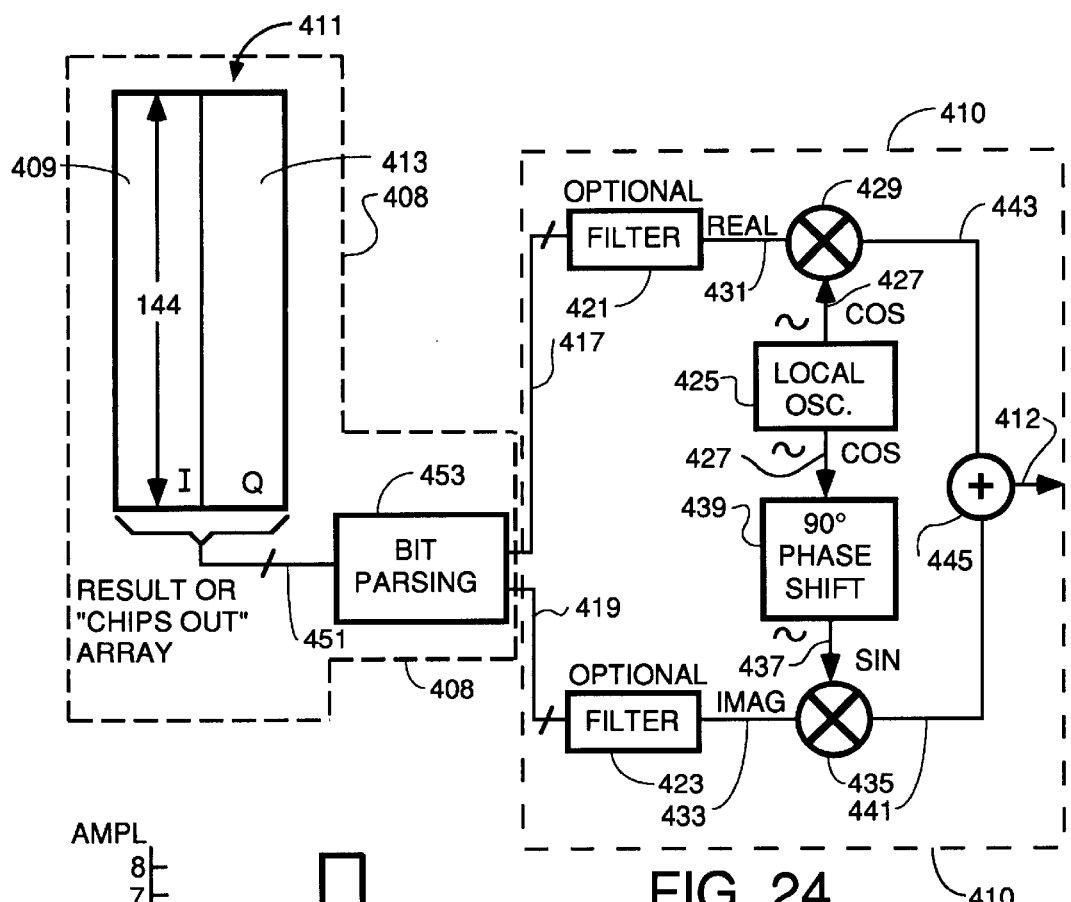
FIG. 24 is a block diagram illustrating more details of the components and operation of the multiplexer 408 and the QAM modulator 410 used in the preferred species within the inventive genus.

The resulting real and imaginary component linear arrays of the results or chips out array are stored in a memory within the CDMA Mux 408 which is not separately shown. The components of these two arrays are then output on separate I and Q buses to a modulator 410 where they are used to amplitude modulate the amplitudes of two RF carriers that are 90 degrees out of phase using a trellis modulation scheme. The constellation of possible data points is shown in FIG. 21. The resulting two AM carriers are summed and output on the transmission media 412. This is done as illustrated in FIG. 24. Not shown in an up conversion or down conversion frequency translator to move the resulting signal in frequency to the band designated for use. The frequency band designated for use depends upon whether the transmission media 12 is a cable TV system, satellite system etc. and further depends upon whether the signals are travelling in the upstream or downstream direction.

Referring to FIG. 24, more details of the coordination of the multiplexer 408 and the modulator 410 and the internal details of the modulator 410 in FIG. 19 are illustrated for the transmitter modulators in either the RU or CU. Although there are slight differences between the RU and CU transceivers, they are generally the same, with some differences discussed elsewhere herein. The result or chips out array is stored in memory 411 which is part of the CDMA MUX, and comprises the real or inphase array 409 and the imaginary or quadrature array 413 of the 144 result points or chips in the result space. On every chip clock, one result point or chip comprising a real component and an imaginary component is output on bus 451 to a bit parsing unit or bit splitter 453. The bit parsing unit 453 splits off the real component and outputs those bits on bus 417. The imaginary component will be parsed out, and those bits will be output on bus 419.

Figure 25:
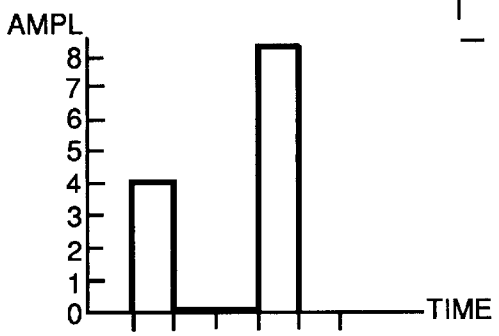
FIG. 25 is a plot of the changes in amplitude over time of the real components of the results vector for the array 409 illustrating the need for bandwidth limiting filters.

Because the RF signals that carry the information from the 144 channels must share the transmission media with other RF signals having adjacent frequencies, two optional digital passband Nyquist filters 421 and 423 are used to limit the bandwidth of the signals on buses 417 and 419 to 6 Mhz to avoid interference with signals on neighboring frequencies. The digital signals on buses 417 and 419, when converted to their decimal equivalents usually have rapid transitions between levels in adjacent intervals. This is illustrated in FIG. 25 which is a plot of the changes in amplitude over time of the real components of the results vector for the array 409. These filters 421 and 423 are Nyquist passband filters having center frequencies at the carrier frequency and having 6 dB bandwidth points which are each separated in frequency from the center frequency by a frequency gap $1/(2T_c)$ where $T_c$ is the chip rate period, i.e., the time between transitions from one chip level to the other. The Nyquist filters 421 and 423 remove high frequency Fourier components caused by sharp edges in such signals. This filtering effectively rounds off corners of the waveform defined by the transitions between successive chip levels in the "chips out" array and limits most of the power density in the Fourier spectrum of such signals to a 6 Mhz band centered around the frequency of the RF carrier generated by local oscillator 425. This local oscillator 425 generates a sine wave, RF carrier at a frequency selected to be compatible with the switching rate of CDMA multiplexer 408 and to not interfere with existing cable TV service signals on adjacent frequencies. Since the local oscillators in the RUs and CU that are used for the modulators and demodulators all run synchronously locked in phase to each other and are kept in phase in the RUs by the carrier recovery circuits described elsewhere herein, all the local oscillators that generate carriers will all be designated 425 even though they are separate circuits one of which is in the CU and some of which are in the RUs.

The local oscillator COS wave is applied to the carrier input 427 of an amplitude modulator 429 which also receives the filtered real component of each chip on bus 431. The modulator 429 modifies the amplitude of the carrier signal on line 427 in accordance with the amplitude of the decimal equivalent the real component on bus 431 and outputs the result on bus 443.

The imaginary or quadrature component of each chip, after filtering, is input on bus 433 to another amplitude modulator 435. This modulator receives at a carrier input 437 a sine wave of the same frequency as the cosine wave on line 427, but shifted in phase by 90 degrees by phase shifter 439. These local oscillator SIN and COS signals on lines 427 and 437 are actually generated in the carrier recovery circuit 515 in FIG. 19 and are locked in frequency and phase to the pilot channel tone sent downstream from the CU during timeslot 0. Modulator 435 modifies the amplitude of the sine wave in accordance with the amplitude of the imaginary component on bus 433, and outputs the result on line 441. Lines 441 and 443 are coupled to a summer 445 which sums the two waveforms and outputs them on the shared transmission media via line 412.

In some embodiments, the line 412 may be coupled to suitable interface circuitry to drive the signal on line 412 into a wireless or cellular system, a terrestial microwave link, a coaxial cable of a cable TV, telephone or other system, a fiber optic link of a cable TV, telephone or other system, a local area or wide area network or any other media developed in the future for real time communication of data. Such interface circuitry is known and will not be described further herein.

In the preferred embodiment for purposes of carrier recovery by the RUs for downstream data, the signal from the local oscillator 425 in the CU transmitter modulator is also provided as pilot channel data on line 501 to a command and control buffer 503 in FIG. 19. The command and control buffer stores data to be transmitted on the command and control channels for system management, contention resolution, ranging etc by either the RU or CU transceiver. This data is received from the CPU 405 via bus 497. Bus 505 couples this data to an input of a switch 507 which has a second input coupled to receive the payload data on bus 360 from the framer. The switch selects one of these buses as the source of data which is output on bus 509 to the forward error correction encoder 402 for trellis encoding. Switching of switch 507 is controlled by CPU 405 by a control signal on line 511.

Pilot Channel data bus 501 is shown in phantom in FIG. 19 to represent the fact that this pilot channel data is, in the preferred embodiment, only input to the command and control buffer 503 if the transceiver of FIG. 19 is in the CU.

If the transceiver of FIG. 19 is in the RU, then no pilot channel data is input to the command and control buffer. Instead the local oscillators in the receiver and transmitter are synchronized to the frequency and phase of the pilot channel. Carrier recovery, i.e., carrier synchronization of the frequency and phase of the RU local oscillator 425 to the pilot channel signal broadcast in timeslot 0 from the CU is the function of carrier recovery circuit 515 in FIG. 19. Specifically, a local oscillator carrier signal is provided by a carrier recovery circuit 515 to demodulator 460 as the COS signal on line 427. The local oscillator COS signal on line 427 is synchronized in frequency and phase with the CU local oscillator carrier signal which was used to modulate the signals received at input 521. Likewise, in the RU transmitter 401 of FIG. 19 the carrier recovery circuit 515 transmits a local oscillator signal on line 427 which is synchronized in frequency and phase to the pilot channel signal. This signal is input to the RU transmitter modulator 410 so that its signals will be coherent to the CU receiver. However, preamble data must be inserted into every timeslot's data for use by the CU receiver to acquire the phase and amplitude of the signals for that timeslot. This is because every RU is at a different distance from the CU so even though the RU transmitter modulators use the same frequency and phase local oscillators as the CU, the differing propagation times and channel impairments cause phase and amplitude ambiguity which the CU must resolve separately for each timeslot. The manner in which this is done will be described further below after completing the description of the carrier recovery circuit 515.

Figure 35:
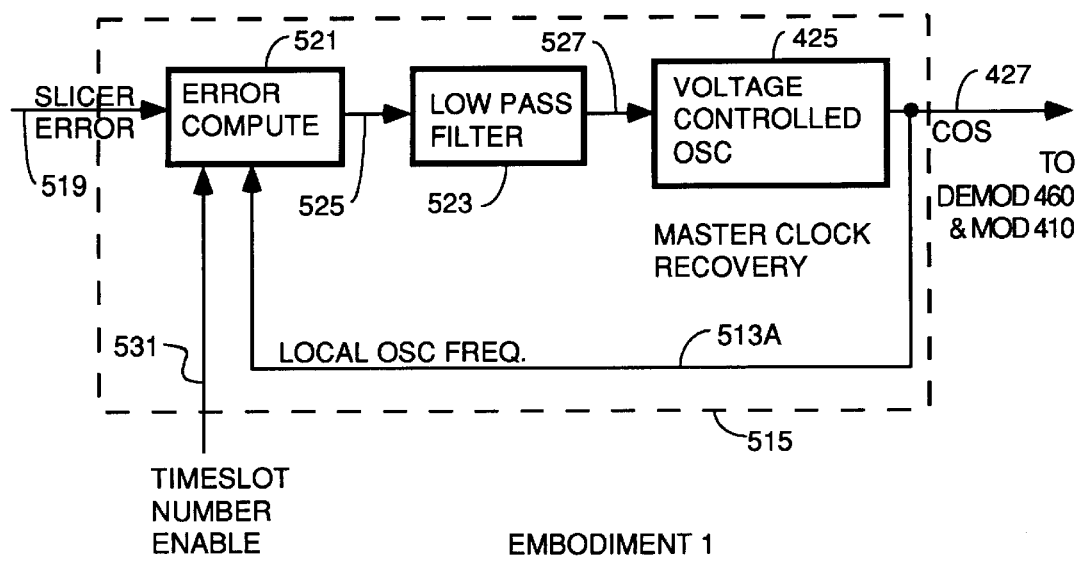
FIG. 35 is a block diagram of one embodiment for the master clock recovery circuit 515 in FIG. 19.

The carrier recovery circuit 515 can be any conventional phase-locked loop clock recovery circuit, Mth power loop, Costas loop, suppressed carrier-tracking loop, etc. In the preferred embodiment, the carrier recovery circuit in the RU receivers takes the form shown in FIG. 35. The circuit of FIG. 35 is basically a phase lock loop that compares a slicer error signal during timeslot 0 to the local oscillator frequency and phase. The circuit then generates an error signal based upon the comparison to adjust the frequency and phase of a voltage controlled oscillator 425 to the frequency and phase of the pilot channel signal transmitted during timeslot 0. The voltage controlled oscillator 425 serves as the local oscillator for the demodulator 460 and the modulator 410. Specifically, the slicer detector 466 generates a slicer error signal on bus 519 which indicates at least the phase error between the received signal and a legitimate point in the constellation. During timeslot 0, the signal on 519 (which has been demodulated using the local oscillator signal on line 427) will indicate the phase error between the local oscillator signal on line 427 and the pilot channel. This phase error may be caused by a phase error between the local oscillator signal on line 427 and the pilot channel signal, or because of impairments on the channel such as noise, or it may be a combination of the two. Because the effect of noise is random but a phase error between the pilot channel and the local oscillator is constant until corrected, the phase error component caused by noise is removed by averaging in a low pass filter 523. This slicer error signal on line 519 is coupled to an error computing circuit 521 which also receives the local oscillator signal on line 427. The phase error is calculated and output on bus 525 to low pass filter 523 which averages the phase error over time thereby removing the noise component. The resulting average error signal is coupled on bus 527 to the error signal input of a voltage controlled oscillator 425 serving as the RU's local oscillator (note that the local oscillator 425 could also be located in modulator 410 as shown in FIG. 24 or could be located in the demodulator 460. The error signal corrects the phase of the local oscillator output signal on lines 427 which is coupled to the demodulator 460 and the modulator 410. The error computing circuit 521 also receives a timeslot number enable signal on line 531 from the CPU 405. This signal indicates when timeslot 0 data is being received at slicer 466, and causes the error computing circuit 521 to activate only when timeslot 0 pilot channel data is being received.

Figure 36:
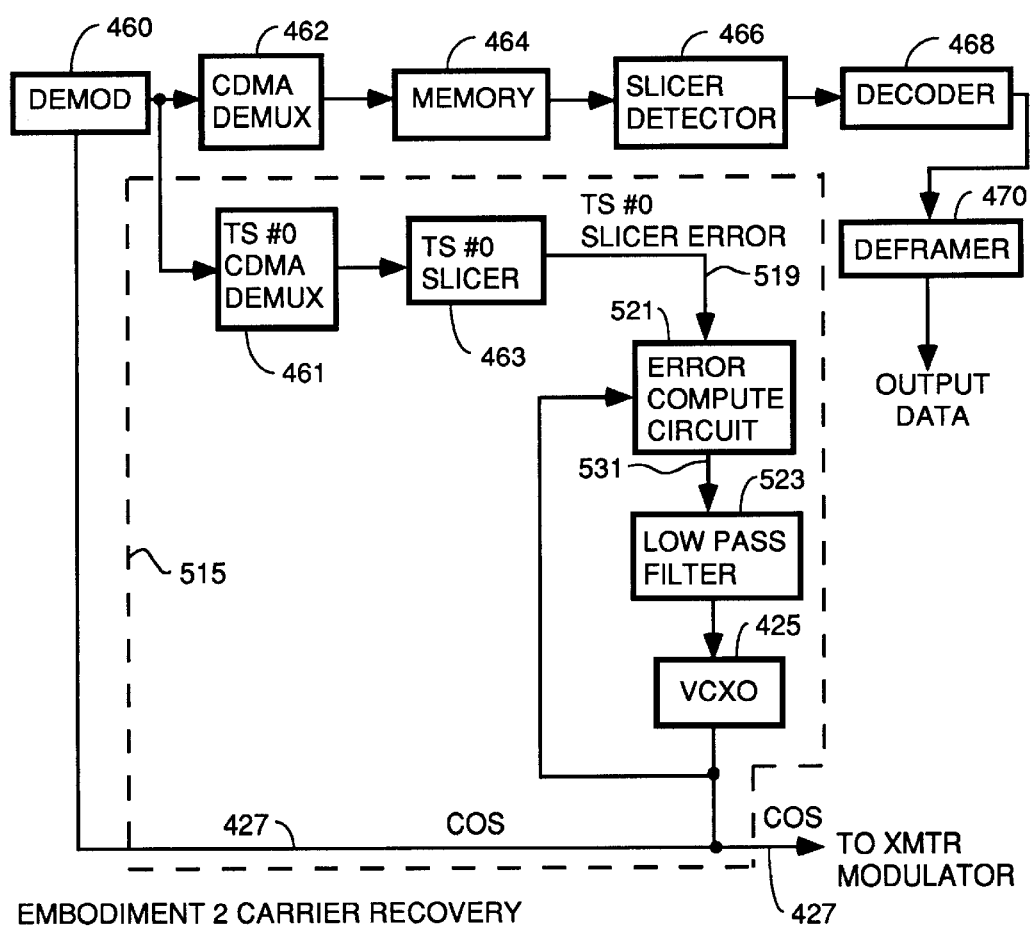
FIG. 36 is a block diagram of the preferred embodiment for a master clock recovery circuit which may be used to generate local oscillator signals in the RUs which are synchronous in frequency and phase with a pilot channel signal sent on channel 0 from the CU to all RUs.

An alternative carrier recovery arrangement is shown in FIG. 36 where elements that have like reference numbers to elements in FIG. 19 serve the same purpose in the combination and will not be discussed here. The embodiment of FIG. 36 uses an additional CDMA demultiplexer 461 which recovers only the pilot channel data on timeslot 0 by reversing the CDMA spreading process via a transpose matrix for the dedicated CDMA code used to spread timeslot 0. The received timeslot 0 data is output on bus 465 to another slicer 463 in addition to the slicer 466 which compares the pilot channel data to a known point in the BPSK constellation used to transmit the pilot channel signal and develops a timeslot 0 slicer error signal which is output on line 519. The slicer error signal is compared to the local oscillator signal on line 427 by an error compute circuit 521 and a phase error signal is output on line 531. This phase error signal is averaged by low pass filter 523, and the resulting error signal is coupled to the error signal input of the voltaged controlled oscillator 425. The output signal from the VCXO 425 is coupled via line 427 as the COS signal to the demodulator 460 and the modulator 410. A 90 degree phase shift is applied to the COS signal in each one of these units to generate the SIN signal on line 437. The SIN and COS signals can be in either digital or analog form in various species within the genus of the invention.

Referring again to FIG. 19, the apparatus and method by which upstream carrier recovery, gain control and symbol synchronization is achieved will be described. Even though all RU local oscillators are synchronized in frequency and phase with the pilot tone from the CU, the differing distances from each RU to the CU cause two different problems. The QAM signal demodulation used in the preferred embodiment depends for its accuracy on the ability to accurately distinguish between the amplitudes and phases of each received point. The differing propagation times and differing channel impairments experienced by each RU's signal, cause both amplitude and phase errors in the received data that must be determined and corrected for to obtain accurate QAM demodulation at the CU receiver. The way this is done is for each RU to send known preamble data to the CU in the timeslots currently assigned to that RU before the block of payload data is sent. The CPU in the CU assigns the timeslots to the various RUs and so informs them in management and control messages on the management and control channels. In the embodiment shown in FIG. 19, the CPUs in the RUs keeps track of and help control the process of breaking the payload data from their peripherals/user devices into 8 bit bytes, adding a 9th bit to support the higher level protocol and sending the 9-bit bytes during the assigned timeslots. Before the payload data is sent however, the CPU in the RU activates a Preamble signal on line 1094 which controls switching by a multiplexer 1076. This multiplexer receives the encoded I and a information vector data on buses 1068A and 1070A at one input and predetermined, fixed I and Q values for preamble data on buses 1078 and 1080 at another input. When the switching control signal on line 1074 is activated, multiplexer selects the data on buses 1078 and 1080 for coupling to buses 1068B and 1070B for storage in memory 406. The data on buses 1078 and 1080 define a known point 3-j in the QAM constellation.

Line 1074, buses 1078 and 1080 and multiplexer 1076 are only present in the RU transmitters since the technique described here is used only in the upstream data to achieve proper synchronization.

In the CU receiver, the slicer detector 466 is responsible for comparing the received data to the known preamble constellation point during preamble reception to determine the gain and phase errors. The received signal takes the form:

$$a * e^{j\phi} * s(t)$$

where s(t) is the desired signal;

a=the amplitude error caused by channel impairments and the near-far problem; and $e^{j\phi}$=the phase error caused by channel impairments and the near-far problem.

Figure 34:
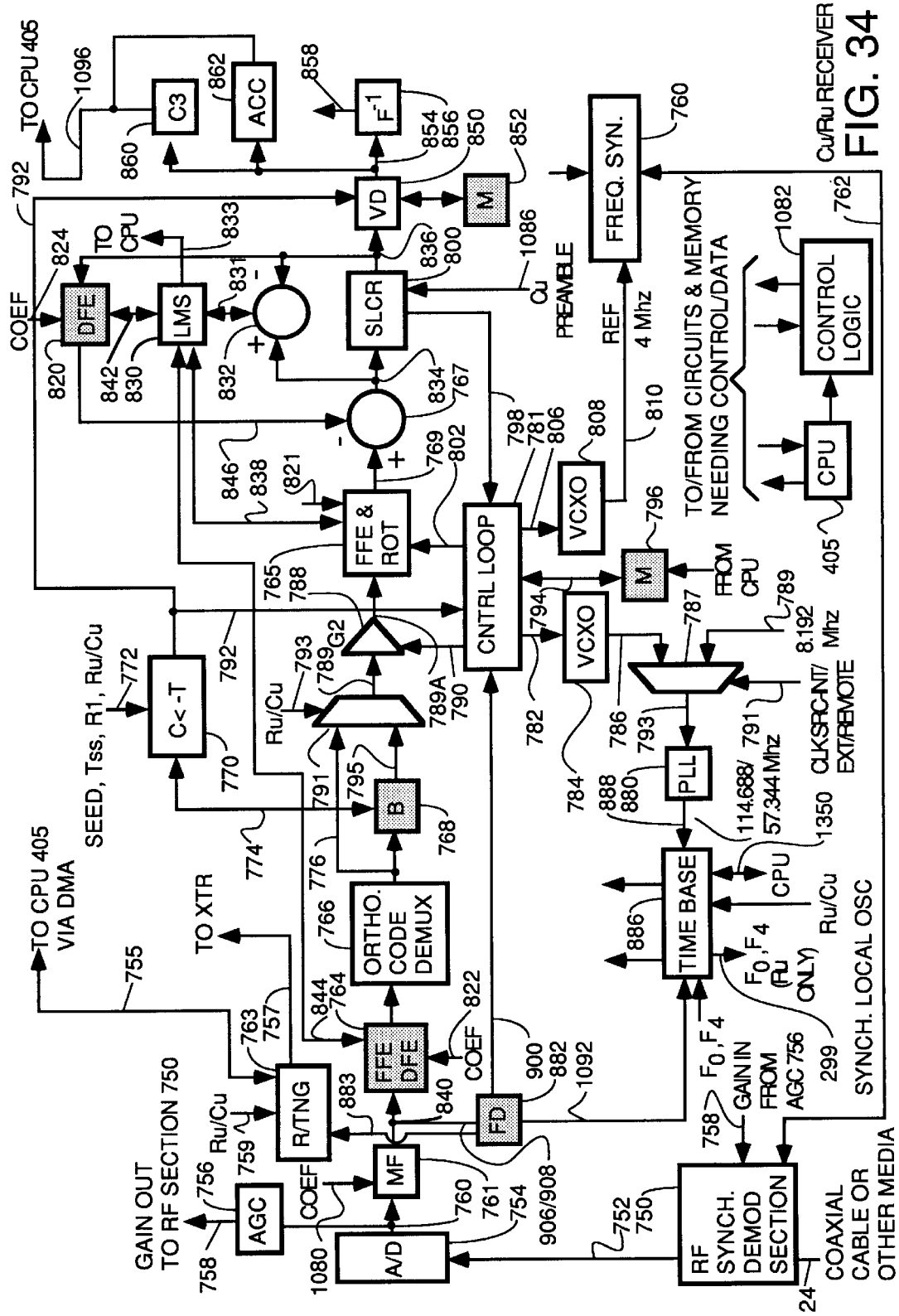
FIG. 34 is a block diagram of the preferred species of a receiver within the inventive genus which can receive data transmitted by the transmitter of FIG. 28A and supports TDMA/CDMA spreading, code deshuffling supporting code diversity, forward error correction, equalization, and Viterbi Decoding.

The slicer detector 466 in FIG. 19 encompasses several circuits shown in FIG. 34. The slicer detector 466 operates to derive a multiplication factor to multiply times the received signal so as to cancel the amplitude and phase error such that s(t) is detected as the constellation point 3-j without any slicer error. The amplitude and phase error coefficients in the multiplication factor which reduce the slicer error to 0 are then stored in memory 796 for use by the slicer in receiving the payload data for that timeslot(s) assigned to the RU for which the multiplication factor was stored.

Upstream Carrier Recovery Error Correction Factor per Timeslot

Specifically, the job of the CU receiver slicer detector 466 is to determine the correct 1/a and $e^{-j\phi}$ coefficients in a multiplication factor of the form:

$$(1/a) * e^{-j\phi} \quad (5)$$

where

1/a is the gain correction coefficient to solve the near-far problem and correct for channel impairments; and $e^{-j\phi}$ is the phase error correction coefficient to solve the near-far problem and correct for channel impairments.

The near-far problem involves interference with reception of weak signals transmitted from a remote transceiver by strong signals transmitted by a near receiver. In the prior art, this is often solved by time division multiplexing so that the two transmitters are never transmitting at the same time. In the environment of the invention, this solution will not work since all RUs have to be able to transmit whenever they need to transmit if bandwidth is available. Therefore, in the invention, the amplitude levels of the signals transmitted by the RUs are controlled so that all signals arriving from the RUs at the CU should arrive at approximately the same amplitudes, and channel impairment effects are corrected by gain level adjustments in the CU receiver at a point before the baseband signal enters the slicer so as to minimize interpretation errors caused by amplitude errors. Likewise, a rotational amplifier in the slicer detector corrects for phase errors caused by the differing propagation delays and channel impairments prior to the baseband signal entering the slicer to minimize this source of errors. For a discussion of the iterative process carried out by this circuitry during the preamble for each timeslot to establish the values for the amplitude and phase error correction coefficients for use in receiving the payload data for that timeslot, see the discussion of the cooperation of G2 amplifier 788, rotational amplifier 765, slicer 800, control loop 781 and memory 796 in FIG. 34.

Thus coherent modulation and detection is used for both upstream and downstream transmissions. For quadrature modulation schemes, the modulator 410 and the demodulator 460 includes phase shift circuitry to shift the phase of the signals on line 427 by 90 degrees so that both sine and cosine local carrier waveforms which are synchronized in phase and frequency to sine and cosine waveforms used in the CU modulator are available for the modulation and demodulation tasks in the RU.

The pilot channel data on timeslot 0 is spread with a dedicated CDMA code in CDMA multiplexer 408 for transmission on the timeslot 0 management and control channel as the pilot channel data which encodes the CU master clock. Each RU receiver includes carrier recovery circuitry 515 which monitors this pilot channel signal and generates the synchronization information on line 427. Use of a pilot channel signal on one of the command and control channels is only one of the possibilities for distributing carrier frequency and phase information. Other possibilities are transmission of any modulated waveform which can be detected by the RU receivers in which the CU carrier frequency and phase information is encoded in the modulation.

The form of carrier recovery described above is preferred for coherent detection. In althernative embodiments, incoherent detection could also be used using any of the well known incoherent detection apparatus. Such incoherent receiver technology is described in Haykin, *Communication Systems*, at page 503–505 and is hereby specifically incorporated by reference herein.

Another form of synchronization that is symbol synchronization. The receiver must know the instants in time when the modulation can change its states. That is, the RU and CU receivers must know the start time and finish time of each chip in order to decipher what that chip was. This allows the receiver to determine when to sample and when to quench its product integrator or other chip state detection circuitry for purposes of starting the chip decoding process. Symbol synchronization in the context of the invention is recovery of the CU chip clock in each RU. In the preferred embodiment, recovery of the CU chip clock is done by correlating in each RU a known barker code transmitted during every gap by the CU, with the barker code encoding the chip clock therein. Each RU uses a correlator with an early-late gate to detect the barker code and get the RU's chip clock synchronized with the CU chip clock encoded in the barker code. This process of chip clock synchronization is carried out by the frame detector 513 in FIG. 19 and frame detector 882 in FIG. 34. The frame detector 513 and the frame detector 882 each includes both coarse and fine tuning circuitry. The coarse tuning circuitry performs downstream frame synchronization by locating the gap in each CU frame transmission by finding a known barker code transmitted by the CU in the gap. Once the gap is located, the time base circuit 886 in FIG. 19 is synchronized to this receive frame timing reference by a signal on bus 1031, and time base 886 in FIG. 34 is synchronized by frame detector 882 to the receive frame timing reference by a signal on line 1092. The time base circuit 886 is comprised of a series of cascaded counter stages that receive a high speed input clock that is phased locked by the clock steering signal from the frame detector (line 900 in FIG. 19, line 192 in FIG. 34). The cascaded counters generate the chip clock, frame clock, superframe clock and kiloframe clock signals. The timebase in both the receiver and transmitter of each modem includes a chip counter and a frame counter as well as sampling registers which are used to correctly align the timebase with external signals. Once the time base is aligned to these external signals, all internal timing needs of the modems are served by the time bases so that they do not depend upon external signals for operation, but the external signals are monitored for loss or shift. In the case of the CU, the external signals to which the time base is aligned are the time division multiplexed inputs to the transmitter. In the case of the RU, the external signals are the gap detect Frame and Kiloframe signals derived from the downstream data.

The time base circuit 886 provides these signals which include receive frame timing reference information to any circuit in the receiver or transmitter that needs this information such as the receiver's orthogonal demultiplexer 462 in FIG. 19 and the orthogonal code demultiplexer 766 in the receiver of FIG. 34. The time base circuit also continually checks the position of the gap by sampling a gap detect signal from the frame detector over multiple frames so as maintain frame synchronization and know when frame synchronization has been lost. When the gap position is lost, the modem immediatly attempts to resynchronize to the gap.

The orthogonal code multiplexers in the RU and CU transmitters also get frame timing reference signals, but these frame timing reference signals establish the boundaries of the CU's frame timing reference since each RU transmitter times its transmissions and other processing so that frames transmitted therefrom arrive at the CU coincident with the CU frame boundaries. And of course the CU transmitter needs to transmit its frames in synchronism with the CU frame boundaries. To that end, the receive frame timing reference signal generated by the frame detector 882 in FIG. 34 and 513 in FIG. 19 is sent to the modem's local CPU or other control circuit 405 via bidirectional bus 902 in FIG. 19 and via bus 883 and DMA memory 763 in FIG. 34. The CPU or other control circuit 405 then uses this frame timing reference to set the timing of the transmit frame timing delay $T_d$ on line 499 to the transmitter frame circuits 400 and 508 in FIGS. 19 and 28A, respectively.

The fine tuning circuitry in the frame detectors 513 and 882, in FIGS. 19 and 34, respectively, performs clock recovery for symbol synchronization by using early-late gating techiques in conjunction with correlation to generate a clock steering tracking error signal on bus 900. This signal corrects the phase of a voltage controlled oscillator 784 in FIG. 34 which is used by time base generator 886 in the RU to generate a local chip clock signal which is synchronous with the chip clock in the CU. This recovered master chip clock signal and other timing signals generated from it are distributed to various circuits in the RU modem transmitter and receiver that need it to keep processing synchronous with processing in the CU.

The coarse tuning circuitry in the frame detectors 513 and 882 cooperates with a software process running in CPU 405 to locate the CU frame gaps. This is done using control and timing signals on bus 902 on the CPU and the real and imaginary data components on bus 904 output by the demodulator 460 in FIG. 19 and the matched filter 761 in FIG. 34 (see FIG. 38 for more details of frame detector). This gap location process is accomplished by continually moving the boundary of a sliding correlation window until a correlation peak appears at the same time at least twice consecutively. How this works will be explained in more detail with reference to FIG. 38.

Figure 38:
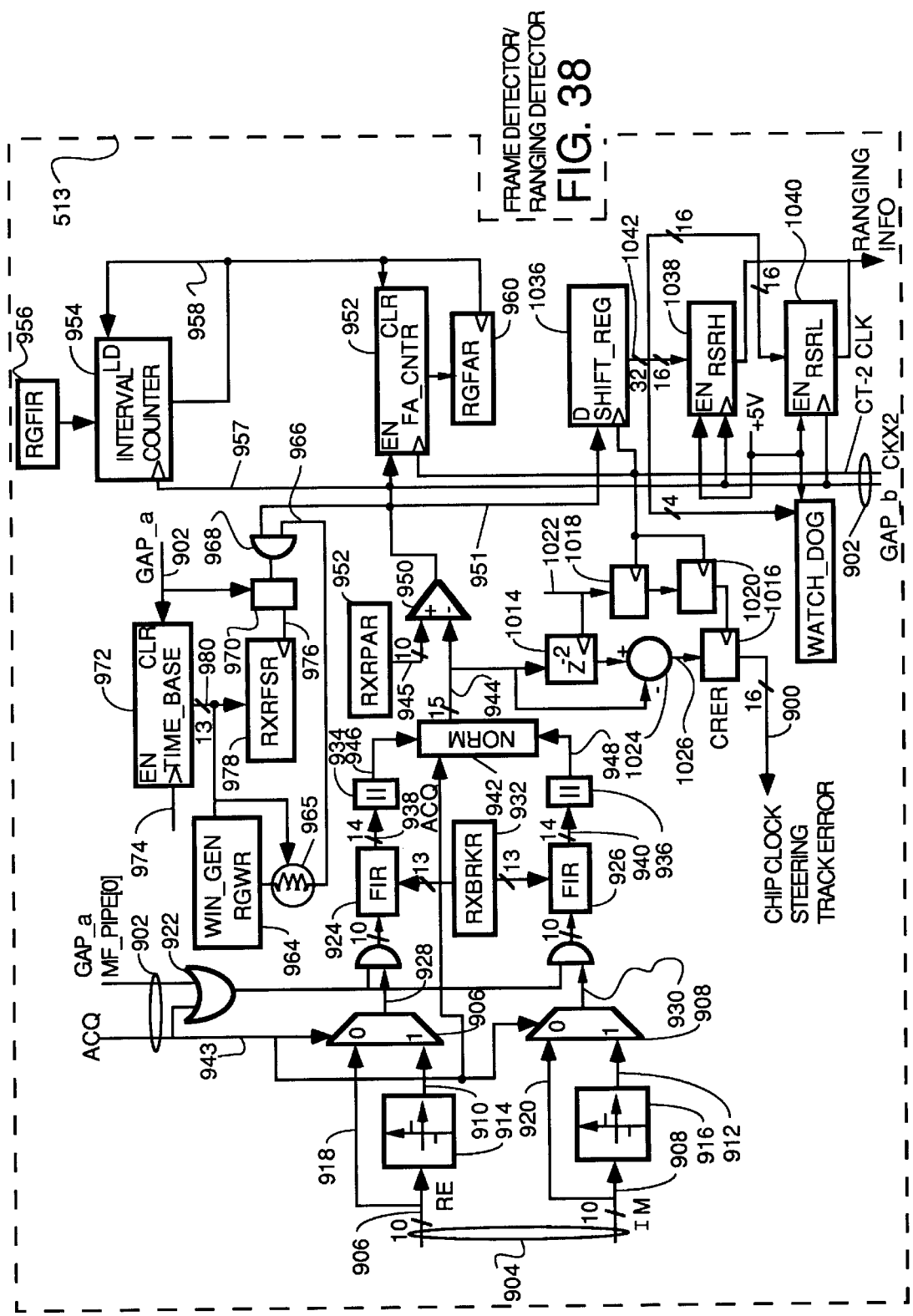
FIG. 38 is a block diagram of the preferred form of frame detector 882 in the transmitter of FIG. 34 for achieving receive frame synchronization and chip clock synchronization.

Referring to FIG. 38, there is shown a block diagram of the preferred form of a ranging detector which forms the heart of frame detector 513 in each RU and is used in the CU for ranging detection of barker codes. Hereafter, the circuit of FIG. 38 will be referred to as the ranging detector even though it has frame detection and chip clock synchronization functions as well.

The ranging detector has an acquisition mode and a tracking mode. In acquisition mode, it is simply trying to rapidly find a known barker code arriving in the collection of signals on bus 904. In the preferred embodiment, where the transmit data is passed through a raised squared cosine filter, bus 904 is coupled to the output of a matched filter like matched filter 761 in FIG. 34 having a transfer function which is the inverse of a raised squared cosine function, but in other embodiments, these two filters may be eliminated. Bus 904 carries data defining the real part of the received signal on lines 906 and the imaginary or quadrature part of the received signal on lines 908.

In acquisition mode, the interest is in quickly finding the gap by correlating the incoming signals with the known barker code, but this can be done by simply looking at the sequence of signs of signals received since the known barker code is a known, unique sequence of chips of differing signs but constant amplitude. The barker code can be located effectively in tracking mode by looking at only the sequence of differing signs in the received data. Therefore, in tracking mode, the CPU sends selection control signal acq on bus 902 to control the state of switches 906 and 908 so as to select the signals on buses 910 and 912. The signals on buses 910 and 912 are the outputs of circuits 914 and 916 which serve to compare the incoming signals on bus 904 to zero and ouput a first number if the sign of the incoming chip is + and output a second number if the sign of the incoming chip is −. When acq is not asserted, the raw data on buses 918 and 920 is selected for passing through switches 906 and 908. The acq signal also passes through OR gate 922 to gate the output signals from switches 906 and 908 through to finite impulse response filters 924 and 926 in acquisition mode for correlation. The OR gate 922 also receives a GAP_a signal which is asserted by the CPU via bus 902 when the CPU thinks it is in the gap by virtue of signals from the frame detector. Therefore, the signals on buses 928 and 930 from switches 906 and 908 will be correlated by FIR filters all the time when the ranging detector is in acquisition mode and, while in tracking mode, only during the gap.

The FIR filters 924 and 926 have impulse response functions which are programmable and are set by the CPU 405 to match the barker sequence which the receiver is looking for. The barker sequence being sought is defined by data written by CPU 405 into register 932. When this exact sequence of + and − chips resides in either one of the FIR filters, the filter output will peak. Absolute value circuits 934 and 936 are coupled to the outputs of the FIR filters, and output the absolute values of the FIR output signals on buses 938 and 940. Circuit 942 has two different modes which are selected by the acq signal on line 943. In acquisition mode when the receiver is trying to initially locate the gap, circuit 942 selects the greater of the signals on buses 946 or 948 for output on bus 944. In tracking mdoe, the sum of the signals on buses 946 and 948 is output on bus 944.

Comparator 950 acts to set a minimum threshold above which the FIR output peaks must rise before they are counted as possible reception of the CU barker code. Comparator 950 compares the signals on bus 944 to a threshold level on bus 945, and, if the threshold is exceeded, outputs a logic 1 on bus 951 during the interval when the threshold is exceeded. The threshold level is set by data written into register 952 by CPU 405 via bus 902. The number of peaks is counted by a false alarm counter 952 the output of which is stored in register 960 which is periodically read by the CPU in a process of monitoring and controlling the ranging detector. A process in CPU 405 which monitors the number of false alarms, sets the number of frames over which false alarms will be counted by writing a number of frames into register 956. This number is loaded into interval counter 954 which counts down from that number by counting the GAP_b signals on line 957 which occur one per frame. When the count reaches zero, line 958 is activated which clears the false alarm counter 952, strobes the count before clearing into register 960 and reloads counter 954 from register 956. When the CPU determines that the number of false peaks is too large according to the number in register 960, it raises the threshold by writing new data to register 952 to raise the threshold.

Course tuning to find the gap is accomplished by the ranging detector as follows. The CPU starts with an estimate of when it thinks the gap will start. At that time, signal GAP_a on bus 902 is asserted during each frame interval. The CPU only wants to look at peaks during the gap in each frame interval, so it uses a sliding window to restrict the time during which it is looking for peaks. The sliding window is symbolized by bracket 962 in FIG. 39. The boundaries of this window are established by data written by CPU 405 to register 964 in a manner to be described below.

Circuit 970 passes only the first peak on the output of the AND gate 968 which occurs after the GAP_a signal indicates the gap is thought to have started. A time base counter 972 counts chip clock signals on line 974 and is cleared by the GAP_a signal every frame. When circuit 970 passes a peak (actually a logic 1 level) through on bus 976, the current count of the time base counter 972 output on bus 980 is sampled and stored in register 978. The count value on bus 980 is also coupled to a comparison input of a greater than or equal to comparator 965, the other input of which is coupled to receive the output of the register 964. The output of the comparator 965 is the gating signal on line 966. Since the count of time base counter 972 will be reset to 0 at the moment the CPU thinks the gap is starting, the count stored in register 978 represents an offset error indicating how much later the gap may have actually started compared to the time the CPU thought the gap was starting.

Figure 39:
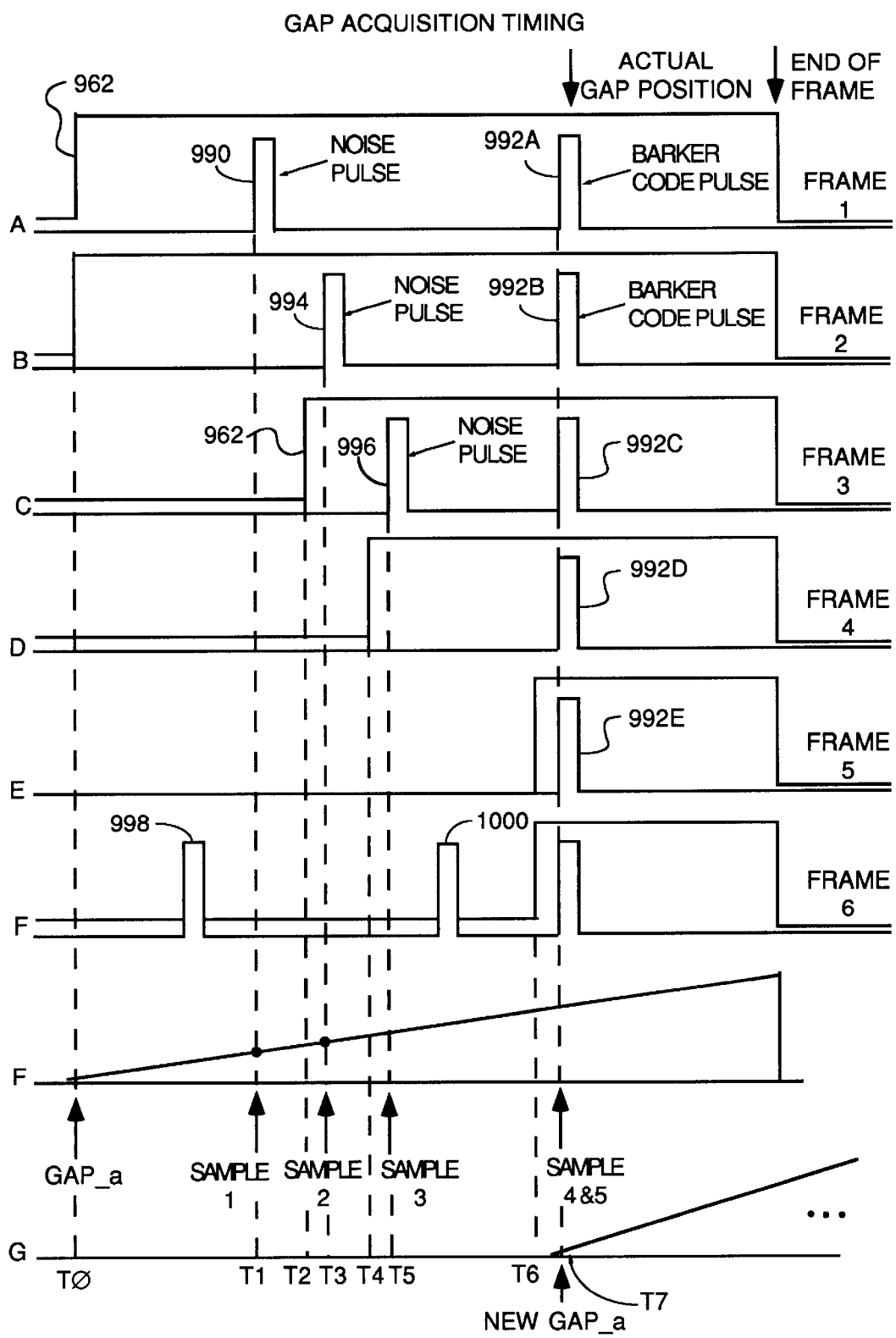
FIG. 39 is a timing diagram showing how the frame/ranging detector 880 does coarse tuning to find the gap in the frames transmitted by the CU.

FIG. 39 is a timing diagram that helps explain the course tuning process to find the time the CU frame gap occurs which is carried out by the RU receivers. Timeline A of FIG. 39 represents the initial sliding window position 962 set by the CPU during a first frame before it is sure where the gap is and shows the times of two peaks observed during frame 1. Timeline B represents the position of the sliding window and the peaks observed during frame 2. Initially, the CPU does not know where the gap is, so the software process decides to watch for peaks on line 976 for the whole frame. Accordingly, the CPU writes a 0 into register 964 at time T0 and simultaneously activates the GAP_a signal. Activation of the GAP_a signal resets the timebase counter 972 and drives a logic 0 onto bus 980. The 0 in register 964 is compared to the 0 on bus 980 by greater than or equal to comparator 965 which finds an equality and sets line 966 to logic 1 thereby gating pulses on bus 951 from the threshold comparator through to the first pulse selection circuit 970. Comparator 965 drives line 966 to logic 1 anytime the number on bus 980 is greater than or equal to the output of register 964. This action opens sliding pulse observation window 962 in FIG. 39 at time T0. The window will remain open until the end of the frame.

During frame 1, shown on timeline A of FIG. 39, a noise pulse 990 is gated through circuit 970 at time T1, and the actual barker code pulse 992A which occurs at time T7 is blocked by circuit 970. The occurrence of noise pulse 990 causes sampling of the count on bus 980 by the register 978, which is indicated in FIG. 39 as sample 1at time T1. This value is read by the gap acquisition process executing on CPU 405 and stored for later comparison.

Because the noise pulse 990 was random, it does not occur again at time T1 in the second frame shown on timeline B of FIG. 39. Instead, another noise pulse 994 occurs at time T3, later than T1, and another barker code pulse 992B occurs at time T7. First pulse selection circuit again gates pulse 994 through and blocks pulse 992B. This causes the taking of sample 2 of the count on bus 980 during frame 2. The coarse tuning gap acquisition process reads the value stored in register 978 and compares this value to the value previously read from this register during frame 1. The CPU concludes pulse 990 occurred at a different time than pulse 994, and, therefore, pulse 990 was noise and cannot be attributed to the barker code because if it were the barker code, it would not be random and would have occurred at the same time. Accordingly, the gap acquisition process moves the position of the window 962 for frame 3 to open at a time just before the occurrence of pulse 994 so as to eliminate any pulses before that time from consideration but so as to analyze pulse 994 to see if it is attributable to the barker code. The CPU gap acquisition process moves the position of window 962 by taking the sample 2 number from register 978, subtracting a fixed amount from it, and writing the result to register 964.

The situation for frame 3 is shown on timeline C of FIG. 39. The window 962 opens at time T2, but because pulse 994 in frame 2 was noise, it does not occur again in frame 3 at time T3. Instead, noise pulse 996 occurs at time T5, and is gated through by circuit 970 while the actual barker code pulse 992C is blocked. Pulse 996 causes sample 3 to be taken. The gap acquisition process compares sample 3 to sample 2 and concludes that pulse 994 was noise because pulse 996 did not occur at the same relative time (relative to the occurrence of GAP_a). Accordingly, the gap acquisition process concludes that the window 962 can be moved again. This time, the window is moved to open at a time T4 just before the time of occurrence of pulse 996 at time T5.

During frame 4, window 962 opens at time T4, but no pulse occurs again at relative time T5, but the barker code pulse 992D occurs again at time T7. This barker code pulse is gated through by circuit 970 and causes sample 4 to be taken. The gap acquisition process reads sample 4 and compares it to sample 3, and decides that pulse 996 was noise because pulse 992D did not occur at the same relative time. Accordingly, the gap acquisition process moves the position of window 962 again so as to open at a time T6 just before the occurrence of pulse 992D.

The situation during frame 5 is shown on timeline E of FIG. 39. The window opens at time T6 thereby precluding consideration of any pulses occuring before T6. Another barker code pulse 992E occurs again at relative time T7 which is gated through as the first pulse in this frame after the window opened by circuit 970. This causes the taking of sample 5 which the gap acquisition process compares to sample 4 and concludes that the relative times of occurrence of pulses 992D and 992E were the same. The gap acquisition process then concludes that pulses 992D and 992E were barker code pulses and that it has found the gap.

Accordingly, the gap acquisition process leaves the window 962 set to open at time T6 in frame 6 shown on timeline F of FIG. 39 thereby ignoring noise pulses 998 and 1000 which occur before T6. The gap acquisition process then moves the time of activation of GAP_a to time T7, as shown on timeline G in FIG. 39, and switches the ranging detector to go into tracking mode for the chip clock recovery process by deasserting the acq signal on bus 902.

Figure 40:
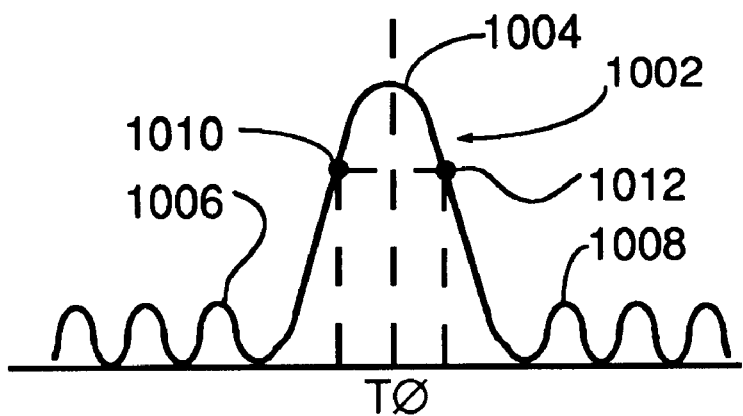
FIG. 40 is a diagram illustrating how the early late gating sampling is used to find chip clock synchronization (showing the situation when chip clock synchronization has been achieved.

The chip clock recovery process is carried out by early-late gate sampling circuitry in FIG. 38 and, in the preferred embodiment, begins after the gap acquisition process. The basic concept is illustrated in FIG. 40 which is a diagram of the sampling by the early-late gating circuitry of the output of the FIR filters (correlator output) when phase lock with the chip clock has been achieved. Curve 1002 represents the output signal on bus 944 from the correlation process that occurs in the FIR filters 924 and 926 between the known barker code (defined by coefficients in register 932) and the incoming signal. The major peak 1004 centered on time T0 (a different T0 than in FIG. 39) represents the correlator output when the barker code sent in the gap by the CU arrives and is perfectly aligned in the FIR filters 924 and 926 with the data in the register 932. This register contains data defining the + and − polarity sequence of the individual elements of the barker code sent by the CU. Every CT-2 chip clock (8 chip clocks), a new digital sample of the received signal enters the FIR filters. The FIR filters do a summation of the results of each stage every CT-2 chip clock. When all the samples of the barker code have entered the FIR and are aligned with the + and − polarity sequence that defines the barker code the receiver is looking for, the summation on the CT-2 chip clock that results in the alignment causes the peak 1004 at the output on line 944. Peaks 1006 and 1008 are examples of the summation results in the FIR filter before and after perfect alignment occurs. Points 1010 and 1012 represent sample points each of which is spaced apart from time T0 by one CT-2 chip clock. When the local oscillator 425 in the embodiments of either FIG. 35 or FIG. 36 is exactly aligned in phase with the phase of the local oscillator signal generated by the CU local carrier oscillator 425, the amplitudes of sample points at 1010 and 1012 will be the same. When there is some phase error, the two sample point 1010 and 1012 will have unequal amplitudes because pulse 1004 will not be symmetrically centered on T0. This generates the track error signal on line 900 in FIG. 38 which causes the phase of a chip clock voltage controlled oscillator in a phase locked loop (not shown) to shift in such a manner as to alter the timing in which the data samples are fed into the FIR filters 924 and 926 so as to get the correlator main pulse 1004 to center on time T0.

The manner in which this clock recovery process is carried out by the circuitry of FIG. 38 is as follows. Circuits 1014 and 1016 are the digital equivalents of sample and hold circuits. Circuits 1018 and 1020 are each delay circuits that each impose a CT-2 chip clock delay on a sample signal on line 1022. This sample signal is generated by the CPU 405 once per frame at a predetermined time in the gap after the GAP_a signal is activated. The sample signal cause circuit 1014 to sample the magnitude of the pulse 1004 on line 944 so as to take sample 1010 in FIG. 38. This sample value is coupled to one input of a subtractor 1024, the other input of which is the magnitude of the signal on bus 944 (all processing is digital in the preferred embodiment). The subtractor 1024 constantly subtracts the first sample value 1010 stored in register 1014 from the changing values on bus 944 and presents the difference on bus 1026. Two CT-2 chip clocks later, the sample signal on line 1022 reaches register 1016 and causes it to store the difference value at that time on bus 1026. The value stored in register 1016 is the difference in amplitude between samples 1010 and 1012 in FIG. 40. This value is the track error signal on bus 900. The track error signal is digitally integrated in phase lock loop 1030 in FIG. 19 and the result is used as an error signal to correct the phase of a voltage controlled oscillator in PLL 1030 which serves to generate the local chip clock reference signal. This chip clock reference signal is coupled on bus 1032 to time base 886 which generates the timing signals needed to synchronize operations of the receiver and transmitter in FIG. 19.

In alternative embodiments, the chip clock could be recovered by transmitting the chip clock with the data bearing signal in multiplexed form and then using appropriate filtering or demultiplexing at the RU to extract the chip clock. Another possibility is to use a noncoherent detector to extract the chip clock taking advantage of the fact that the chip clock timing is more stable than the carrier phase. The carrier is then recovered by processing the detector output during every clocked interval. Another possibility where clock recovery follows carrier recovery, as is done in the preferred embodiment, is to extract the chip clock from demodulated baseband output from the CDMA demultiplexer.

In addition, all the RUs may possibly synchronize to a single common external time source such as GPS satellite time information although synchronization to within 1 microsecond may not be adequate accuracy. Any conventional methodology for achieving synchronization of the RU chip clocks and local oscillator signals to the corresponding signals in the CU will suffice for purposes of practicing the invention.

Figure 41:
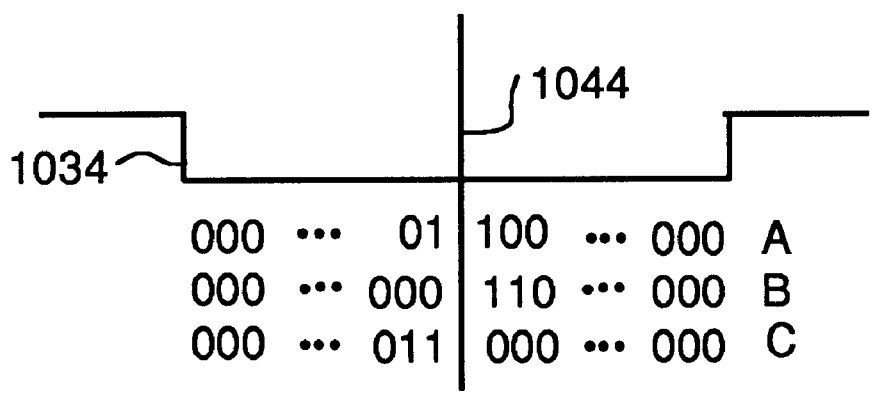
FIG. 41 illustrates the 3 permissible patterns of data at the output of comparator 950 for a centered barker code condition to be declared.

The ranging detector of FIG. 38 also includes circuitry to determine when a barker code is exactly centered in the gap. This capability is used in the CU version of the ranging detector during the fine tuning process at the end of the ranging process where the CU sends instructions to the RU on how to adjust its transmit frame timing delay to exactly center its barker code in the gap. How this is done will be explained with reference to FIG. 41 which illustrates the 3 permissible patterns of data at the output of comparator 950 for a centered barker code condition to be declared. Basically, the gap is 32 chip clocks wide, and is represented by window 1034. Comparator 950 will output 32 logic 0s or 1s during the gap interval, and these are shifted into shift register 1036. Two latches 1038 and 1040, each 16 bits wide, have their inputs coupled to the 32 bit parallel output bus 1042 of the shift register. These two registers 1038 and 1040 are constantly enabled, and are loaded with the contents on bus 1042 at the end of the gap with one taking the lower 16 bits and the other taking the upper 16 bits. For the barker code to be centered only the three bit patterns shown in FIG. 41 are permissible. The first bit pattern on line A indicates two logic 1s on either side of the gap centerline 1044 and represents the data pattern that will be present in latches 1038 and 1040 when the RU's transmitted barker code has been exactly centered. The bit patterns on lines B and C represent acceptable conditions where the barker code is not exactly centered. The data patterns in registers 1038 and 1040 are read by the ranging process in execution on CPU 405 during the fine tuning process to deduce what instructions to give the RU to change its transmit frame timing delay $T_d$ so as to move its barker code toward the center of the gap.

Returning to the consideration of FIG. 19, the remaining receiver side circuitry of the transceiver will be described in more detail. As is the case with the transmit channel, the processing performed in the receiver may be performed using analog or digital or some combination of analog and digital circuitry. The receiver will be described as if all processing was digital as it is in the preferred embodiment. The signal received from the shared transmission media is passed through an analog-to-digital converter (not shown) and the resulting digital data stream is passed to a demodulator 460.

Figure 26:
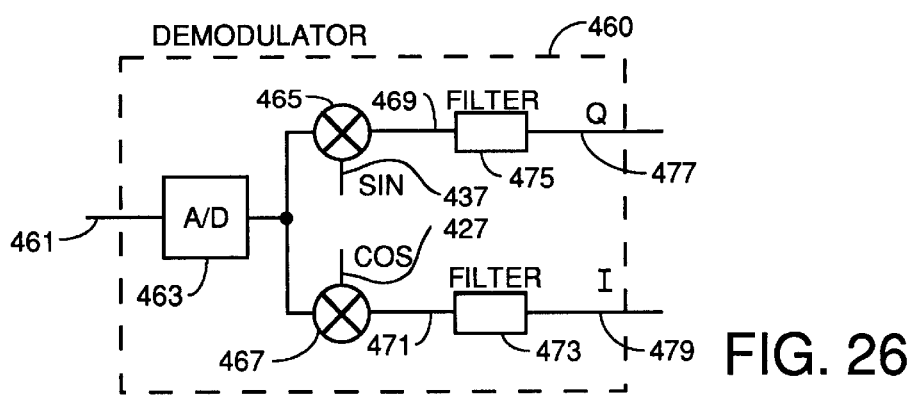
FIG. 26 is a more detailed block diagram of the structure of the demodulator in the receive channel.

FIG. 26 is a more detailed diagram of the structure of the demodulator 460 in the receiver. The received analog signal from the shared transmission media is coupled on line 461 to the analog input of an A/D converter 463. The stream of digital data resulting from the analog-to-digital conversion is simultaneously fed to two multipliers 465 and 467. Multiplier 465 receives as its other input on line 481, a stream of digital values that define a local carrier sine wave having the same frequency and synchronous in phase with the RF carrier sine wave on line 437 in FIG. 24. Multiplier 467 receives as its other input on line 427, a cosine signal generated by local oscillator 425 having the same frequency and synchronous in phase with the CU's broadcasted pilot channel broadcast in timeslot 0 which is the RF carrier cosine wave on line 427 in FIG. 24. The inputs labelled SIN and COS in FIG. 26 are generated by local oscillator 425 which is synchronized in frequency and phase with the pilot channel by the carrier recovery circuit 515 in FIG. 19. A 90 degrees phase shift is applied to the local oscillator COS output to generate the SIN signal. The pilot channel signal is broadcast on one of the management and control channels (timeslot 0), and one of the CDMA codes is dedicated solely to this channel. This dedicated code is used to spread the pilot channel signal using conventional spread spectrum techniques. Each receiver decodes the pilot channel using this same code to recover the pilot channel carrier signal and applies the recovered signal to a phase detector in a phase lock loop which is used as a local oscillator source for the demodulator in each RU receiver section and the modulator in the RU transmitter section.

The results output from the demodulator on lines 469 and 471 are digital data streams which basically defines the mix products comprised of a fundamental carrier frequency and upper and lower sidebands. Digital filters 473 and 475 filter out the desired sidebands that contain the real and imaginary parts of each chip or result point that was transmitted. The stream of quadrature or imaginary components of the received chips are output on bus 477. The stream of inphase or real components of the received chips are output on bus 479. The receiver of FIG. 19 also includes conventional phase lock loop circuitry for clock recovery and carrier recovery. In other words, the receiver recovers the bit clock timing used by the CU and synchronizes to it using conventional phase lock loop circuitry and also recovers and synchronizes to the sine and cosine carriers used by the CU to transmit the symbol data. These clock and carrier signals are then used for transmissions by the RU to the CU so that the CU can coherently communicate with the RU's without having to synchronize to different clock and carrier signals used by the RU's. In alternative embodiments, the RUs can use their own clock and carrier signals which are unrelated to the CU's versions and the CU can contain its own phase lock loop circuitry to recover these signals and synchronize to them in order to demodulate and interpret the data transmitted by the RUs.

In some embodiments, the streams of real and imaginary components of the 144 chips of each symbol on buses 477 and 479 are stored in two linear arrays in CDMA Demultiplexer 462 in FIG. 19. The CDMA Demultiplexer 462 multiplies each of the real and imaginary component arrays times the transpose of the code matrix used by the CDMA MUX 408 of whatever RU or CU that transmitted the data to reverse the orthogonal code encoding process. This matrix multiplication process results in two linear arrays of decoded chip real and imaginary parts for each symbol. These arrays are stored by the CDMA Demultiplexer 462 in memory 464. In alternative embodiments, the CDMA Demultiplexer processes the two streams of real and imaginary components "on the fly" such that they do not have to be first stored as input arrays in a memory in the CDMA Demultiplexer 462.

After the linear arrays of real and imaginary components for a symbol are stored in memory 464, the result for each symbol is an array of received chip points in a received chip space having a real axis and an imaginary axis. The mapping by orthogonal code transformation from the constellation of possible input points shown in FIG. 21 leads to a constellation of possible points in a received chip space. A detector 466 examines the points in each of the arrays and compares the received chip points they define against the legitimate possible points in the received chip space. The detector, otherwise known as a slicer, is a known type of circuit and no further details are necessary herein. The function of the detector is to restore the gain and phase of the received signal, recover the chip clock therefrom and lock onto it so as to be in synchronization with the transmitter, determine the boundaries of each chip and determine the values for the I and Q coordinates of each received chip and compare the I and Q coordinates of each received chip point against the closest points in the constellation of legitimate possible points in the received chip space that could have been transmitted. The detector also locks the frequency of its local oscillators in the detector generating the sine and cosine signals used for demodulation to the phase and frequency of the sine and cosine carriers encoded in the data. The detector then makes a preliminary decision as to which of the possible legitimate points in the received chip constellation each received chip is likely to be.

The detector 466 then outputs its preliminary determinations to a Viterbi Decoder 468 which performs the prior art Viterbi algorithm. The Viterbi Decoder uses the 4th bit in each chip of each symbol to detect and correct errors. This is done by performing the Viterbi algorithm to derive the most probable tribit path defined by the points actually sent from the path in the received chip space defined by the 4-bit components of the symbols actually received, after they have been processed by the detector. The addition of the 4th bit to each tribit converts the input constellation from an 8 point to a 16 point constellation by addition of redundancy. The addition of this redundant 4th bit increases the distance between the path through a space defined by successive input constellations, one for each symbol time. In other words, each channel or timeslot has one tribit per symbol. The fourth bit is added to each tribit in each symbol based upon the three bits of the tribit for that symbol and the state of the same channel's 4 bit chip in the last symbol transmitted. These sequences of chips map a path through the space previously defined which is farther from the same type path mapped through a group of successive 8 point constellations if only the tribits during each symbol time were plotted with no redundant bit added to each tribit. The fact that the chip path is farther from the 3 bit path makes it easier for the receiver to divine from the noise corrupted received data what the actual tribits transmitted were. Viterbi Decoders are well known in the art of digital communications, and no further details will be given here. This Viterbi algorithm could be carried out by a programmed digital computer if slow speed is enough or by a dedicated hardware circuit if speed is important. Viterbi Decoder based systems are used by Qualcomm, Inc. in San Diego in cellular phone systems to combat noise in digital cellular phone transmissions, and the details of their patents and products are hereby incorporated by reference.

The output data points from the Viterbi Decoder are a stream of tribits. These tribits are stored in a memory in a deframer circuit 470 which functions to reassemble a replica of the TDMA data stream in the time domain from the incoming stream of chips or tribits comprising each symbol. This process is done by reversing the reading and writing processes described above in filling and emptying the framer memory 300 of FIG. 14.

Fallback Mode

The transmitters in the RU and CU have a fallback mode wherein less data is placed in each symbol for each channel and more redundancy is added when noise power gets too high. The noise power is detected by the CU, and when it reaches a predetermined threshold, the CU commands all RU modems to reduce the amount of payload in each symbol and add more redundancy. Fallback mode is implemented by a mode control signal on line 530 in FIG. 28A to the encoder circuit 526. This mode control signal can command three modes: idle mode where the encoder pass the tribits adding only zeroes as the 4th bit; normal mode where 4th bits are added based upon the previous state for that timeslot during the last symbol time; and fallback mode where more redundant bits are added to each 4-bit group and correspondingly less payload data in included in each 4 bit group.

Code Diversity in CDMA to Improve Performance

Referring to FIG. 27, there is shown a diagram of a machine to achieve code diversity in CDMA systems so as to improve the performance thereof. It has been found by the applicants that in CDMA systems, some codes are more sensitive than others to misalignment and narrow band interference and will have higher bit error rates. In most systems, the higher bit error rate caused by one code would be unacceptable and the codes which are more sensitive to noise could not be used. In some systems with large numbers of channels of digital data to send, there are only one or a few code sets which have enough codes which are orthogonal to accommodate all the channels. For example, with 144 different timeslots/channels, there is only one code set with 144 orthogonal codes. Rather than omit the codes which are too sensitive and possibly not have enough codes to accomodate all channels, the codes are shuffled between channels randomly thereby spreading usage of the weaker codes around among the different channels. Code diversity requires coordination between code diversity tables in the RU transmitter and the CU receiver so that both are using the same codes during the same frames to encode and decode specific timeslot data. There are also restricted code lists that list codes that are not to be used. RUs that implement code diversity must maintain their code diversity and restricted code tables up to date with CU downstream messages to remain operational. The RU computer must download a checksum verified copy of the current tables and activate the tables before the modem can initiate or receive connection requests. Downstream messages updating the code diversity and restricted code list tables are sent from the CU with a superframe tag number which defines when the update is effective. Every downstream message includes a table checksum against which the RU modem can check its own checksum to insure validity of its tables. The CU broadcasts its checksum each superframe, and each RU maintains an independent checksum.

This concept can be used in any CDMA system. In CDMA systems where all the timeslot data is collected in one physical location, code diversity can be implemented using a shuffler 500 shown in FIG. 27. In this application, the shuffler is a crossbar switch which receives a plurality of inputs 502 and has a plurality of outputs 504. The inputs 502 each carry the digital data from one timeslot. The outputs 504 each carry the digital data from a randomly assigned one of the inputs, which changes periodically, and are coupled to matrix multiplication circuitry such that each timeslot's data gets multiplied by a different code during different periods. The inputs 502 are coupled to the inputs of a crossbar switch within shuffler 502 which periodically or randomly shuffles each of the inputs to a different output line for coupling to a multiplier for multiplication by a CDMA spreading code assigned to that output line. The crossbar switch can take the form of the high speed crossbar switch disclosed in U.S. Pat. No. 5,355,035 which is hereby incorporated by reference.

In systems like the CDMA CATV system disclosed herein where at each RU not all the timeslot data for all 144 timeslots is present at each location, the shuffler takes a different form and is located in the CU. In this embodiment, the inputs 502 represent requests for bandwidth relayed to the CU by all the RU's, and the outputs 504 represent code assignment transmissions to the RU's over the command and control channels where the code assignments could change every frame or even after transmission of each symbol. At the CU however, all the timeslot data of channels to be transmitted to the RU's is located in one place, so the shuffler can take the physical crossbar switch form previously discussed in the paragraph next above. The shuffler 500 can also take the form of a suitably programmed computer to shuffle the timeslots to different codes as well as perform the matrix multiplication.

The use of this shuffling technique spreads the weak codes around but the weak codes still cause errors. If the level of errors generated by this technique cannot be tolerated, forward error correction is used in conjunction with the code diversity to eliminate the errors. Forward error correction means sufficient redundant bits are inserted into the data stream to allow any errors to be corrected without the need for a transmission back to the RU's from the CU's requesting retransmission of frames with errors. In the specific embodiments disclosed herein, Trellis modulation is used with a convolutional encoder in each RU and CU transmitter to calculate and add to each tribit a redundant 4th bit. These 4th bits are used by the receivers and Viterbi Decoders therein to correct errors by making judgments from the received data which points from the constellation of possible points were actually sent.

In the preferred embodiment for a transmitter described below with reference to FIG. 28A, a diversity shuffler 506 implements code diversity by coordinating the shuffling of timeslot data to different, randomly selected CDMA spreading codes by the signals on buses 532 to the framer 508 and the signals on bus 533 to the buffer 533. This will be described in more detail below.

Preferred RU Transmitter Block Diagram

Referring to FIG. 28A, there is shown a block diagram of the preferred species of transmitter circuitry within the genus of the invention. The transmitter of FIG. 28A is used in the transceivers of the RU modems. The CU transmitters are identical except there is no need for the access control circuitry 540 or the multiplexer 544.

In FIG. 28A, block 506 is the diversity code shuffler that implements the time to code transformation. The code shuffler receives a pseudorandom seed number on bus 499 which controls the pseudorandom order of shuffling of codes such that the various timeslots or channels are not always encoded with the same CDMA codes. Bus 499 also carries Tss data which defines which timeslots are assigned to this RU transmitter and an RU/CU signal which tells the code shuffler whether it is operating in an RU or CU. The R1 data on bus 499 defines reserved codes which cannot be used, and the $T_d$ data is received from the CPU and receiver frame detector circuitry to set the transmit frame timing delay value for this RU so as to hit the gap with its barker code thereby achieving frame synchronization.

Block 508 is the framer circuitry that implements the variable transmit frame timing delays needed to implement the ranging process to achieve the necessary frame synchronization and time alignment of the CDMA spread channel data for synchronous CDMA. The framer circuitry 508 is described in more detail in FIG. 12. Block 548 is a buffer that stores the shuffled 4 bit groups of symbol elements which serve as the information vector [b] for the matrix multiplication performed by the CDMA Multiplexer 527. Code diversity is implemented by block 506 by controlling the order of tribits read for each symbol from framer memory 508 via read pointers sent to the framer on bus 532. The tribits exit the framer on bus 518 in the order dictated by the addresses on bus 532. They are pseudorandomly scrambled by scrambler 524 in the manner described below (in the preferred embodiment) and redundant bits are added by encoder 526 if operating in normal or fallback mode. Encoder 526 adds at least one bit to every tribit in the preferred embodiment to implement Trellis modulation. Some embodiments have no encoder, and some embodiments have an encoder which has no idle and/or no fallback mode.

The encoded bits are divided into real (or inphase) and imaginary groups by dividing each encoded tribit in half and outputting the first 2 bits as the real bits on bus 517r and the last two bits on bus 517i. Buses 517r and 517i are coupled to a switching circuit 544 which also receives as inputs real and imaginary components of access channel information on buses 542r and 542i. During normal payload transmission operations, switching circuit 544 selects the data on buses 517r and 517i for coupling on buses 546r and 546i to buffer memory 548. During access channel operations, switching circuit 544, under control of microprocessor 405, selects the data on buses 542r and 542i for coupling on buses 546r and 546i, respectively. The real and imaginary components in each tribit on buses 546r and 546i are written into buffer 548 in the order dictated by write addresses on bus 533. Elswhere herein, the manner in which the multiplexer 544 is operated to overlay media access control data on buses 542r and 542i with payload data on buses 517r and 517i in buffer 548 is described. Buffer 548, when fully written, during each symbol time has 144 4-bit elements comprising an information vector the order of which is randomly scrambled anew each symbol time in the preferred embodiment. In other embodiments, the codes may be assigned sequentially during each symbol for all active timeslots, or a rolling sequential assignment of codes to all active timeslots may be used.

Figure 28B:
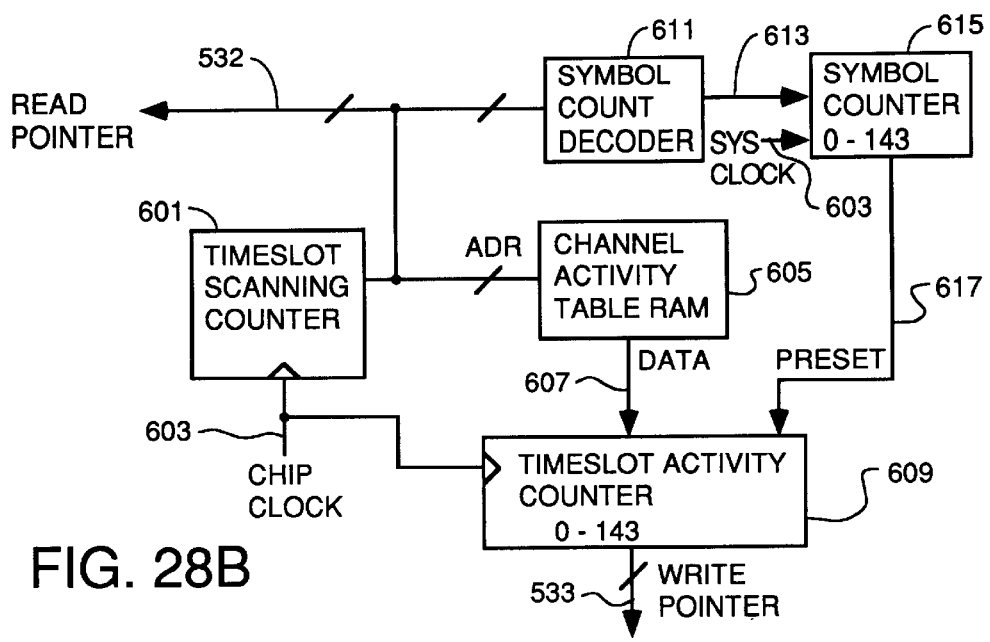
FIG. 28B is a block diagram of one embodiment for achieving code diversity using rolling sequential code assignment.

Referring to FIG. 28B, there is shown a block diagram of a simple embodiment for the code diversity shuffler 506. This embodiment does not do random shuffling but does a rolling shuffle in the following manner. Each RU and the CU has a code diversity shuffler of the same type and all shufflers operate synchronously to shuffle the same timeslots to the same codes simultaneously. A timeslot scanning counter 601 increments from 0 to 143 in synchronism with a system clock on line 603. This count is output on bus 532 as an address to a random access memory 605 which stores a copy of the channel activity table. The channel activity table is a table which stores data indicating which of the 144 timeslots are currently being used. The CU broadcasts data to all RUs indicating which channels are currently assigned, and each RU updates its activity table using circuitry not shown in FIG. 28B. Bus 532 carrying the timeslot scanning counter output is also coupled to the framer 508, and the count on bus 532 acts as a read pointer controlling which tribit from the current symbol being read is output from the framer on bus 518. The count on bus 532 is also coupled to an address input of RAM 605 and causes data to be output on bus 607 indicating whether the channel corresponding to the current count is currently assigned. This data is, for example, a logic 1 if the timeslot is assigned and logic 0 if not. The bus 607 is coupled to the increment input of a timeslot activity counter 609 which has its clock input coupled to the system clock on line 603. When a logic 1 is output on bus 607, the timeslot activity counter 609 increments on the next upward clock transition. Counter 609 counts sequentially from 0 to 143 and then rolls back over to zero. The output of the counter 609 on bus 533 is coupled as a write pointer to the address input of buffer memory 548 in FIG. 28A and controls where the tribit output by the framer 508 is written, after encoding by encoder 526, in the information vector [b] stored in buffer memory 548. The read pointer on bus 532 is also coupled to a symbol count decoder 611 which generates an incrementation signal on line 613 each time the count on bus 532 reaches 143 thereby indicating the first tribit of a new symbol will be read on the next upward system clock transition. A symbol counter 615 then increments on the next upward clock transition to generate a new symbol count on bus 617. This symbol count is coupled to a preset input of the timeslot activity counter 609 and causes the timeslot activity counter to be preset to whatever symbol count exists on bus 617 and to continue to increment from there as active timeslots are found. When symbol counter reaches 143, it rolls over to 0. Thus, for each new symbol, the timeslot activity counter starts incrementing from a new number. This causes a rolling shuffle of the positions in which the 4-bit groups are placed in buffer memory 548 thereby causing each active timeslot to be spread using a different code during each new symbol to achieve code diversity.

Figure 28C:
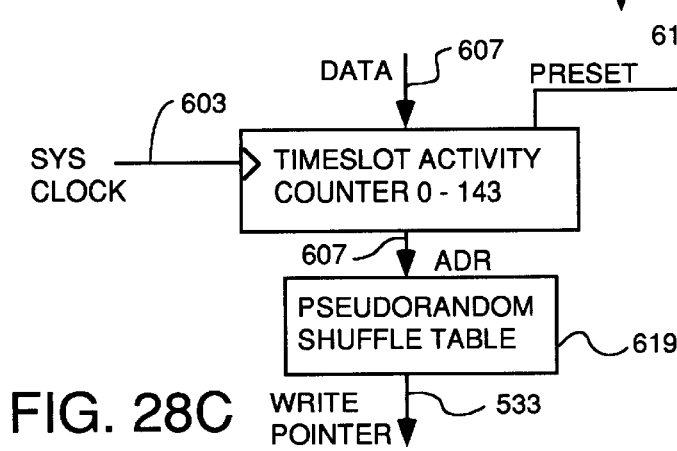
FIG. 28C is a partial block diagram of the modifications to the block diagram of FIG. 28B to achieve code diversity with pseudorandom code assignment.

FIG. 28C is a block diagram of another embodiment for a code diversity shuffler that can be substituted for diversity shuffler 506 in FIG. 28A. This embodiment does a pseudorandom shuffle of codes using a shuffling table filled with pseudorandomly distributed write pointers. In FIG. 28C, all elements are the same as in FIG. 28B, except that the output on bus 533 from the timeslot activity counter 609 is coupled as an address input to a memory 619 which can be either a RAM, ROM, PROM, EEPROM or EPROM. Memory 619 stores a collection of 144 write pointers which are pseudorandomly distributed relative to the sequential address inputs. Each count on bus 607 from the timeslot activity counter causes whatever pseudorandom write pointer is stored in that address in memory 619 to be output as the write pointer on bus 533 to buffer memory 548 in FIG. 28A. All RUs and CUs have an identical copy of the pseudorandom shuffle table stored in memory 619, and all RU's and the CU synchronously scan the activity table and synchronously, pseudorandomly assign the same CDMA spreading codes to the active timeslots.

Figure 28D:
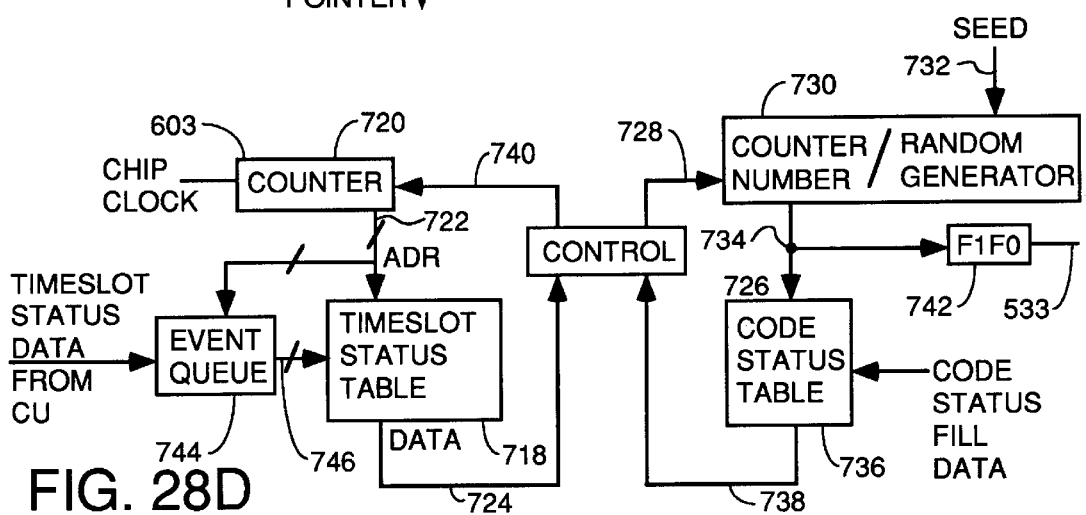
FIG. 28D is a block diagram of the preferred embodiment of a code shuffler to achieve code diversity using pseudorandom code assignment.

FIG. 28D shows a block diagram of a preferred code diversity shuffler that may also be used for shuffler 506 in FIG. 28A. A timeslot status table in memory 718 stores a current map shared by all RUs and the CU of which timeslots/channels are currently active. In the preferred embodiment, the data stored in this table for each timeslot includes its present mode, its next mode and local/remote information. Permissible modes include: idle where no code is assigned, normal where a code is assigned, fallback #1 where more than one code is assigned to a timeslot and fallback #2 where even more codes are assigned to an active timeslot than in fallback #1 mode. The addresses in table 718 are sequentially scanned using addresses generated on a bus 722 by a counter 720 driven by the chip clock on bus 603. The data regarding the status of each sequentially scanned timeslot is output on bus 724 to control logic 726. The status data on bus 724 tells the control logic whether or not a CDMA code needs to be assigned. If control logic 726 sees data indicating a timeslot is active on bus 724, it generates a signal on bus 728 causing counter/random number generator 730 to generate a pseudorandom number on bus 734 to act as a write pointer for purposes of guiding the encoded 4-bit group from encoder 526 in FIG. 28A into the storage location in buffer memory 548 which will be multiplied by the code pointed to by the number on bus 734. The code number on bus 734 is generated from a seed number on bus 732. All RU and CU code diversity shufflers receive this same seed and all RUs having active timeslots and the CU operate synchronously to assign the same CDMA code to the active timeslots so that the CU can recover the CDMA spread data transmitted by the RU using the same CDMA code(s) that were used to spread it. The pseudorandom number generated in this manner is output on bus 734 as an address into a code status table stored in random access memory 736, and is also stored in FIFO memory 742 for later output as a writer pointer on bus 533. The code status table stores information shared by all RUs and CUs regarding which codes are eligible for use. Some codes may be block from usage because they either do not have sufficient noise immunity or for some other reason are not to be used. The data regarding whether use of the code pointed to by the address on bus 734 is permissible is output to the control logic via bus 738. If the data on bus 738 indicates the code pointed to by the address on bus 734 is permissible for use, the control logic generates a signal on bus 740 telling counter 720 that it should now generate an address to read the contents of the next address in sequence in the timeslot status table. All active timeslots are assigned a code once per symbol.

It is important in the embodiment of FIG. 28D that the contents of the timeslot status table and the code status table be constantly updated by all the RUs and CU so that they all share the same information. Updates of code status and timeslot status are broadcast by the CU on a broadcast channel using message protocol with CRC and ECC bits appended. The messages about timeslot status are stored in event queue 744 which also receives the address pointer on bus 722. As the address of each timeslot appears on bus 722, the event queue searches for update messages regarding that timeslot and updates the contents of the timeslot status table via bus 746.

Returning to the consideration of FIG. 28A, the buffer memory 548 outputs two information vectors on buses 549r and 549i. The elements in these information vectors are, respectively, the first two bits in every Trellis encoded tribit as the real information vector and the last two bits of every Trellis encoded tribit as the imaginary information vector.

In FIG. 28A, block 510 generates the ranging barker codes needed for the ranging process to achieve frame synchronization. Preferably, this ranging barker code generator 510 is a state machine. Rules for creating this state machine in the preferred embodiment are: any activity in the gap indicated by the ranging status message that does not indicate the RU's temporary ID indicates a collision; a simple binary stack contention resolution algorithm is used where once an RU starts ranging, any subsequent collision push it deeper on the stack and any empty gap pops it closer to the top of the stack as in a LIFO mechanism. The ranging state machine 510 receives as its input on bus 512 from CPU 405 a P parameter which sets the power of the ranging pulse and data which defines the barker code of the ranging pulse. Circuit 510 also receives on bus 512 RU/CU information which tells the circuit 510 whether it is in an RU or CU. The data on line 512 also controls whether a single barker code is transmitted or a specific sequence of barker codes during successive gaps to make up the authentication or signature sequence. The data on bus 512 also controls the position of a barker code pulse relative to the center of the gap. Since this data comes from the CPU 405, the CPU knows when the transmitter is ranging and can properly interpret ranging status messages broadcast by the CU and received by the CPU via bus 1096 and command, communication and control circuit 860 in FIG. 34. Circuit 510 carries out the ranging process including contention resolution, pulse position modulation, steering and signature transmission described elsewhere herein in some embodiments, and in other embodiments, these processes are carried out by the CPU 405 and circuit 510 in cooperation with each other.

In some embodiments, circuit 510 in FIG. 28A also plays a role in the upstream equalization process. Upstream equalization is the process of reducing or diminishing undesired noise in the desired upstream data caused by, for example, reflections from impedance discontinuities in the coax or other media, misalignment of frames etc. Equalization is implemented in part by circuit 510 in placing a particular, predetermined pattern of signals in one or more gaps between frames so that the CU and RU receivers can determine the noise characteristics then present in the channel and take steps to "equalize" or reduce the noise. In some embodiments, this is done by the RU adjusting coefficients of an adaptive filter so that it has a transfer function which is the inverse of the transfer function of the channel, i.e., the transfer function of the equivalent circuit representing the media connecting each RU to the CU. Performing equalization increase the overall system throughput capacity, but it is not absolutely essential to practice the invention if lower capacity can be tolerated. Likewise, the ranging process can be eliminated, but this also reduces the payload carrying capacity of the system.

Block 514 on the left side of FIG. 28A is a register or memory storing command and control data such as the pilot channel signal to be transmitted on the 16 access and command and control channels. This data arrives on bus 399 the CPU 405. Block 516 is a multiplexer which selects between the payload data for the 128 payload channels from the framer 508 on bus 518 or command and control data on bus 520. The selected data stream is then output on bus 522. Typical command and control data includes data messages exchanged between the RU and CU and CU regarding ranging such as "I want to start ranging", "I found more than one barker code in the gap, please perform your contention resolution procedure" etc. some of which are described in more detail in the discussion of ranging and contention resolution in FIGS. 29–33.

Bus 522 is coupled to a randomizer machine 524. The purpose of the randomizer is to pseudorandomly scramble the incoming data so as to make it look more like white noise. This reduces the dynamic range at the output of the transmitter. The randomizer receives its scrambling instructions from a scramble register 525 which receives and stores a seed code on bus 529. In some embodiments, the randomizer 524 can be omitted.

Convolutional Trellis encoder 526 serves to receive the stream of tribits on bus 509 and add a redundant 4th bit to each in normal operation mode. Because the 4th bit to be added to each tribit depends upon the state of the tribit from this channel during the last symbol, a memory 528 is used to keep a record of the state of each channel's 4 bit chip state during the last symbol transmission. This information is supplied to the convolutional encoder via bus 530 as each channel's tribit is encoded during each symbol. The encoder has three modes previously described, and the diversity shuffler 506 controls the mode by a signal on bus 534.

Media Access Control

Block 540 represents circuitry to acquire an access channel and carry out media access control communications to implement ISO MAC layer protocols. Since there are only 4 access channels across which all message traffic requesting channel bandwidth and awarding same, contentions will occur when more than one RU simultaneously requests bandwidth on the same access channel. Therefore, access channels are acquired according to the following protocol. Each RU transmitter receives a seed number on bus 550 and pseudorandomly selects which access channel to attempt to use and pseudorandomly selects which 6 symbols of a superframe comprised of 12 symbols to send. The RU then sends an authentication code identifying itself in the form of the unique sequence of 6 of the 12 symbols of a superframe of 4 frames, said unique sequence pseudorandomly selected using the seed. All RUs use the same seed, so the likelihood of more than one picking the same authentication code is small. The 6 symbols sent can contain the RU's message telling the CU how many channels it needs, or a separate message can be sent after access is achieved. The CU listens on all access channels, and during each superframe determines if more than 6 symbols were sent. If so, the CU broadcasts a message on the control channel indicating there is a contention on a particular access channel. The RUs trying to gain access then do the contention resolution protocol described elsewhere herein used for ranging. If only 6 symbols are detected during the superframe, the CU broadcasts a message on the control channel indicating which 6 symbols were found. The CU can include in the broadcast message code assignments for the requested channels in reservation embodiments or, in another embodiment, can simply transmit updates to the timeslot activity table indicating which timeslots or channels have been awarded to the RU which gained access. The RU that sent these six symbols then knows that it has been awarded access, and updates its timeslot activity table which is maintained in the diversity shuffler 506. All RUs hear the timeslot activity update message and similarly update their timeslot activity tables.

Once an access channel is acquired, circuit 540 may, in some embodiments, present data on buses 542*r* and 542*i* to multiplexer 544 which comprise access control messages that are sent on the 4 access channels of the 144 total channels. Multiplexer 544 either selects these media access messages on buses 542*r* and 542*i* or the encoded chips from the convolutional Trellis encoder 526 to the code division multiplexer 527 via buses 546*r* and 546*i* and buffer 548. The multiplexer 544 is controlled by switching control signals from the CPU 405 to edit the contents of the buffer 548 to overlay the 4-bit groups of the access control symbols with the payload data on bus 507 so that the media access control 4-bit groups go into the right addresses of the buffer 548 so as to get spread by the CDMA codes assigned to the access channels.

The media access control messages constitute requests from RUs for bandwidth and awards of specific channels to the RUs by the CU in some embodiments. The awards of specific channels to specific RUs implement a reservations scheme and the awards can take many forms such as broadcasts on the control channel of timeslot activity table update messages or specific messages on the access channels in other embodiments. Also, other media access protocols other than the reservation scheme which are described elsewhere herein are also possible through various protocols some of which may require message traffic on the access channels. In an important alternative embodiment, all the different schemes for allocating channels to specific timeslots may be used or combinations of schemes for various groups of channels may be used. In this embodiment, the type of scheme used is programmable by the user, and in a variation of this embodiment, may be changed by the CU computer based upon traffic conditions and the number of contentions and efficiency considerations.

Because a reservation scheme is implemented in the preferred embodiment, no contentions occur on the 140 non media access control payload channels so no contention resolution protocols are carried out for these channels since there will be no contentions. However, contentions are expected to occur on the 4 access control channels shared between all the RUs so contention resolution will have to be carried out in the manner described elsewhere herein.

Spreading of the chips from the convolutional encoder is done by orthogonal code multiplexer 527. This circuit or software routine performs code division multiplexing or orthogonal encoding of the data on each channel by matrix multiplication. It sets the amplitude of the output chips on buses 558*r* and 558*i* based upon matrix multiplication of the orthogonal codes times the elements of the input information vectors on buses 549*r* and 549*i* from buffer 548. Each of the information vectors on buses 549*r* and 549*i* is individually spread by the orthogonal code multiplexer to generate individual real or inphase and quadrature or imaginary result vectors 409 and 413 in FIG. 46 on buses 558*r* and 558*i*.

There is only one orthogonal, cyclic code that has 144 different codes. That code is used and is, in hexadecimal representation: 0218 A503 BA4E 889 F 1D92 C1F3AB29 8DF6 ADEF. Although cyclic codes are used in the preferred embodiment for ease of implementation, any other orthogonal, noncyclic code set can also be used in alternative embodiments, or other orthogonal, cyclic codes can be used where fewer channels/timeslots are required. The cyclic code given above uses the convention that all logic 0's represent −1s and all logic 1s represent +1 in the orthogonal code spreading matrix. The first code of the 144 different codes in the code set will be all 1s regardless of the contents of the code given above. The second code in the code set is the code given above: 0218 A503 BA4E 889F 1D92 C1F3 AB29 8DF6ADEF. The third code is obtained by shifting the code one binary place and taking the overflow bit that "falls off" the most significant bit position edge of the code in the second least significant bit position. The fourth code is obtained by repeating process done to obtain the 3rd code on the 3rd code.

The results of the matrix multiplication performed in the orthogonal code multiplexer 527 are coupled via buses 558r and 558i to one input of a switching circuit 556 switching of which is controlled by the CPU 405. The other input of the switching circuit 556 is coupled to buses 558i and 558r to receive the ranging data from ranging circuit 510. The switch 556 selects the data on buses 558r and 558i for coupling via buses 557r and 557i, respectively, to a precode FFE/DFE filter 563 during the three symbol transmission times of each frame when payload data is being sent. The switch 556 selects the ranging pulse data on bus 560 during the gap following transmission of the last symbol in each frame.

Equalization, as that term is used herein, is the process of compensating for distortions and noise that occur caused by noise in the channel between each RU and the CU. The precode filter 563 performs a measured predistortion at each RU transmitter so that the data arrives at the CU undistorted despite the channel impairments between that particular RU and the CU. The amount of the predistortion is calculated by each RU to substantially or exactly compensate for the current distortion conditions existing in the channel between it and the CU. The predistortion characteristic is implemented by setting the transfer function of the precode equalization filter 563. This transfer function is controlled by the RU/CU Coefficient data input to the filter on bus 561. Each RU uses its own unique, measured RU/CU Coefficient data to establish a predistortion which is appropriate to its own signals for its position on the network so as to cause its signal to reach the CU with little or no distortion. More details on both upstream and downstream equalization are given in connection with the discussion of FIG. 45.

The output of the precode filter on buses 562r and 562i is applied to a scaler amplifier 564 which scales the amplitude level of the digital numbers on buses 562r and 562i in accordance with a signal on bus 566 which indicates the activity level of the modem, i.e., how many timeslots are currently in use by this modem. The purpose of this scaling is to enhance performance by taking advantage of the full precision of a digital to analog converter 576 at the output of the transmitter. A digital to analog (D/A) converter has a dynamic range for its analog output. When few timeslots are active, the summation of the CDMA spreading matrix multiplication partial products does not lead to chip amplitudes which extend to the full limits of the D/A converter's dynamic range. As a result, the full precision of the D/A converter is not used, and the inherent noise of the D/A conversion process affects the transmitted signal more. To make use of the full precision of the D/A converter, scaler 564 "amplifies" the incoming signal based on the activity level such that the resulting swing in digital values going into the D/A converter 576 causes output analog signals which swing between the limits of the dynamic range of the D/A converter. These signals are later reduced in amplitude by a circuit (not shown) which limits the amplitude swings to prevent interfering with other signals sharing the media.

The output of the scaling circuit on buses 568r and 568i are coupled to shaping filter 570 which doubles to perform carrierless amplitude and phase modulation. There are two filters ins the shaping filter which have transfer functions which are the Hilbert transform of each other and which have rolloff characteristics set to digitally filter the data on buses 568r and 568i to limit the bandwidth of the signal on each bus to the width and center frequency of the 6 mHz channel devoted to digital data communication on the coaxial cable or other media 24. The shaping filter has a squared raised cosine filter characteristic suitable to shape the outgoing chip pulses so as to satisfy Nyquist criteria in a known manner so as to provide optimal signal-to-noise enhancement and so as to minimize intersymbol interference. The filters in shaping filter/modulator 570 can have other transfer functions also which shape the chips to be transmitted such that the spectrum of the outgoing signals satisfy the Nyquist criteria. Any of these other pulse shapes will suffice to practice the invention. The coefficient data on bus 572 provide ability to set and change the filter characteristics of shaping filter/modulator 570. More details on the operation of the shaping filter/modulator 570 are given in connection with the discussion of FIGS. 46, 47 and 48.

The output of the filter/modulator is coupled on bus 574 (the filter/modulator 570 sums the orthogonal real and imaginary signals after filtering to generate a single signal on bus 574) is coupled to the input of the digital to analog converter 576 for conversion to an analog signal for application to the input of an up/down frequency converter 577. The purpose of the up/down frequency converter is to convert the frequency of the transmitted signal to the frequency allocated for upstream or downstream transmissions as the case may be in accordance with the frequency plan for the shared transmission media. The up/down converter outputs its signal on the transmission media 24 such as coaxial cable, cellular system, satellite uplink etc.

Figure 29:
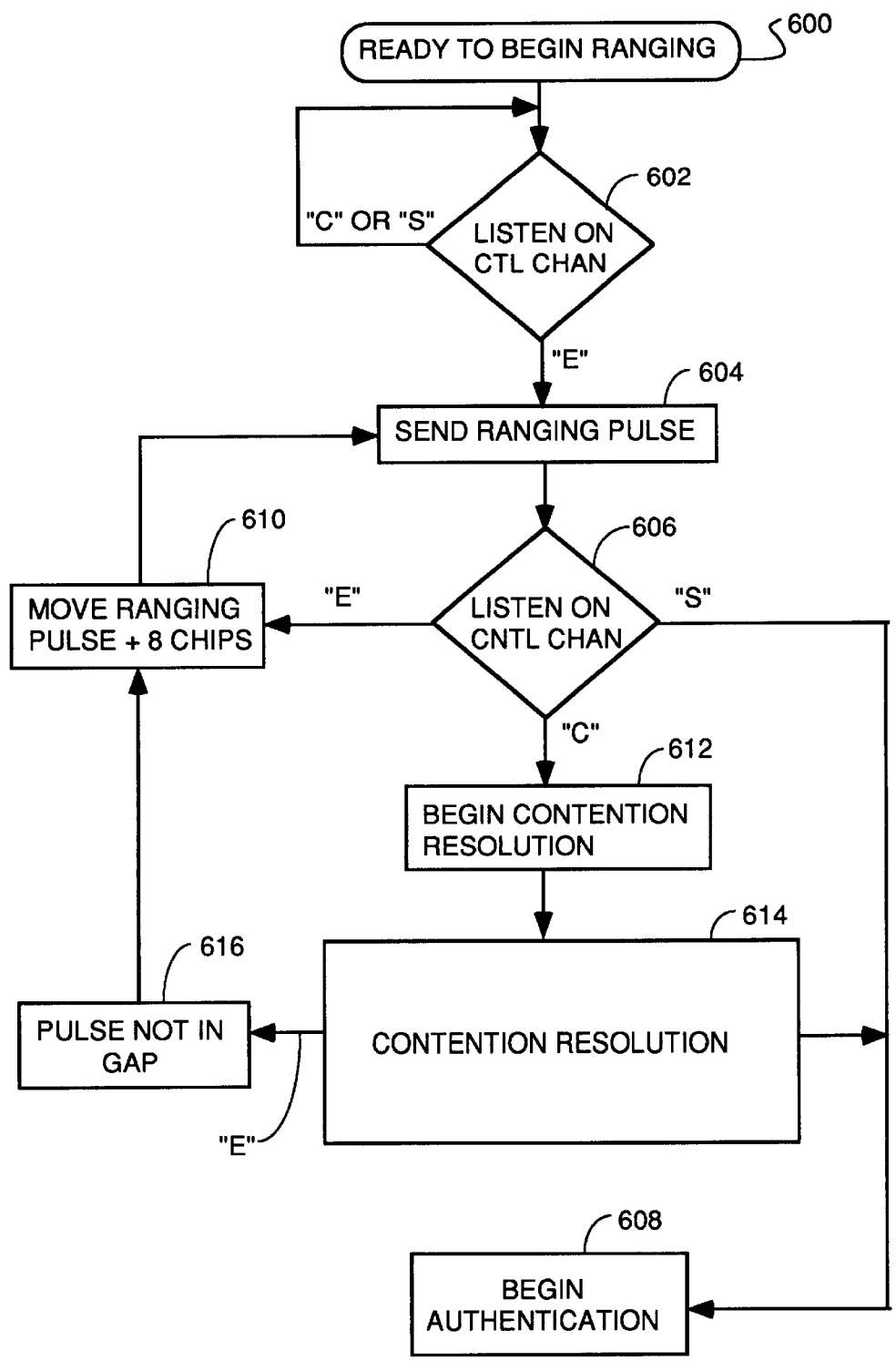
FIG. 29 is a flow chart for the process of preferred method of ranging using contention resolution carried out by the circuit/programmed microprocessor 510 of FIG. 28A in an RU modem transmitter.

Alternative Ranging, Contention Resolution and Authentication Processes Carried Out by RUs and CU Referring to FIG. 29, there is shown a flow chart for a method of ranging using contention resolution. In the preferred embodiment, the ranging, contention resolution and authentication processes of FIGS. 29–33 are carried out through cooperation of the receiver of FIG. 34 including the C3 circuit 860, frame detector 882 and the R/Tng circuit 763, CPU 405 and the transmitter of FIG. 28A including Rng circuit 510 cooperating with microprocessor 405.

The starting point of the ranging process is block 600 in the RU ranging process shown in FIG. 29. Block 600 is reached after an RU has powered up and performed a self test and found itself to be operable. Next, tes 602 is performed to listen on the control channel to wait until it is clear for transmission ("E"). 602. If test 602 determines that a collision ("C") is occurring on the control channel or a single RU is transmitting ("S") on the control channel. Test 602 vector processing to block 604 when the control channel is free. Block 604 represents the process carried out by circuit 510 in FIG. 28A of transmission of a ranging pulse (typically a copy of the barker code transmitted in every frame by the CU). The multiplexer 556 is switched to select input bus 560 before transmission of the ranging pulse.

After the ranging pulse is transmitted, the CU receiver listens in the gap to determine if it finds a ranging pulse in the gap, and, if so, if only one ranging pulse is present. Block 604 vectors to test 606 after transmission of the ranging pulse in order to listen on the control channel. The CU will transmit an S on the control channel if a single pulse is found in the gap, and will transmit an E on the control channel if the gap is found to be empty. If test 606 hears an S on the control channel, processing is vectored to block 608 to start the authentication process. If block 606 hears an E on the control channel indicating the gap is empty, processing vectors to block 610 to move the ranging pulse plus 8 chips, and processing vectors back to block 604 to send a new ranging pulse. Processing then vectors back to test 606 to listen on the control channel again. This loop continues until either an S for single pulse is heard on the control channel or a C for collision is heard. The CU sends a C when it hears more than one ranging pulse in the gap.

When test 606 hears a C, processing is vectored to block 612 to start the contention resolution process which is then performed as symbolized by block 614. Contention resolution continues until only one pulse is found in the gap or no pulse is found in the gap. If, as a result of contention resolution, no pulse is found in the gap, the CU sends an E on the control channel, which vectors processing to block 616. Processing then vectors to block 610 to move the ranging pulse 8 chips forward, and the process repeats itself.

Preferred Authentication Process

Figure 30:
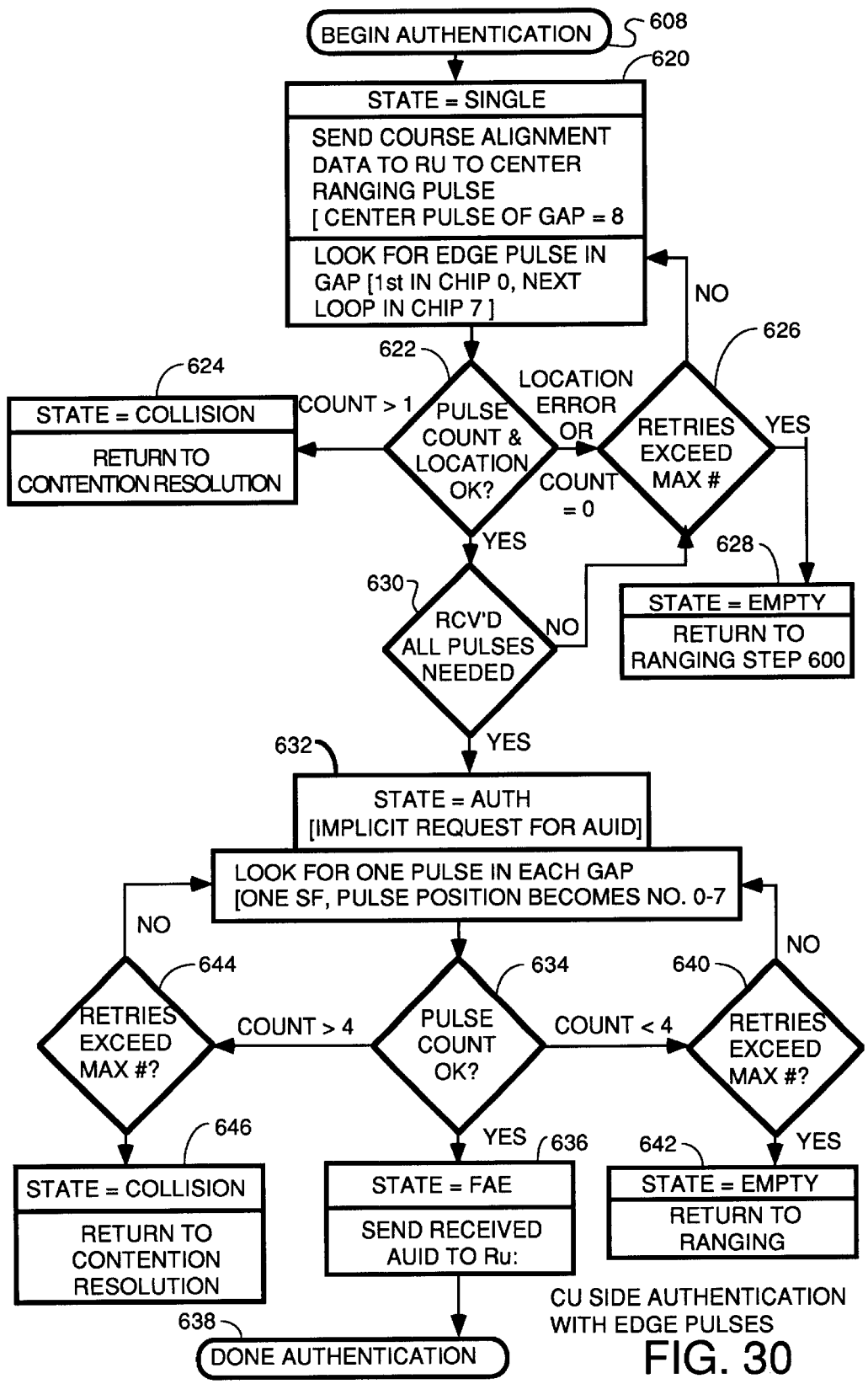
FIG. 30 represents one embodiment for an authentication process in support of the preferred ranging process which uses pulse position modulation to send the authentication code. In this embodiment, each RU that has been attempting to establish synchronization sends one ranging pulse during the gaps of each of 8 frames but varying the position of the pulse in the gap during each gap.

Authentication is started when the CU sends a message on the control channel that it has found a ranging pulse from a single RU in the gap. In both embodiments, the gaps of multiple frames are used to send an authentication code. Each RU that has been attempting to synchronize hears the "S" on the control channel in step 606 in FIG. 29 indicating the CU has detected the ranging pulse from a single RU in the gap, and vectors processing to the authentication process represented by block 608. There are several possibilities for how authentication is performed. The flow chart of FIG. 30 represents one embodiment which uses pulse position modulation to send the authentication code. In this embodiment, each RU that has been attempting to establish synchronization sends one ranging pulse during the gaps of each of 8 frames but varying the position of the pulse in the gap during each gap. In another embodiment previously described, the RU sends an authentication barker code sequence comprised of sending the barker code during some gaps of the 8 frame authentication sequence but not during others in a predetermined sequence. Each RU has a unique sequence, but all RUs send pulses during only half the authentication sequence gaps.

Preferred Contention Resolution Process

Referring to FIG. 30, there is shown a flow chart of the preferred process for contention resolution performed in the RU modems by the circuit represented by block 510 in FIG. 28A when more than one RUs ranging pulse is found in the gap. The authentication process begins at block 608 and immediately proceeds to block 620. There, the CU sends out an S on the control channel indicating that it has found a single RUs ranging pulse in the gap. Which RU it is is not clear at this point, and the purpose of the authentication process is to determine which RU has hit the gap and so notify that RU so it can freeze its delay at the delay that hit the gap. Before starting the process of determining the RU identity, the CU sends out a command on the control channel for all RUs who are ranging to move their ranging pulses plus or minus the number of chips separating the ranging pulse the CU saw from the middle of the middle 8 chips of the gap. In block 620, this process is signified by the phrase send course alignment data to RU to center ranging pulse. Because ranging pulses from other RUs may also be in the gap, but at an edge, when they also move the position of their ranging pulses, their pulses may also land somewhere in the middle 8 chips of the gap. Since authentication requires that only one ranging pulse be in the gap, block 620 looks for a so-called "edge pulse" or neighbor in the gap in addition to the single pulse previously found so as to make sure there is truly only one ranging pulse in the gap so as to avoid ambiguity. That is, the CU looks to find out if another RUs pulse which was originally in the gap but outside the middle 8 chips has landed in the middle 8 chips after the position of the pulse which was originally found in the middle 8 chips has been moved to the center of the gap. The CU looks for these extraneous pulses first by commanding a shift in the ranging pulse originally found in the gap which led to the broadcast of the S on the control channel to move sufficiently to land in chip 0 of the middle 8 chips. Then test 622 looks for more than one pulse as described in the next paragraph. Then, the CU commands a move of the original ranging pulse to the other extrement, i.e., to move to chip 7 of the middle 8 chips, and the process of test 622 is repeated.

The determination of whether more than one ranging pulse is in the middle 8 chips is performed by test 622 which counts the ranging pulses in the middle 8 chips of the gap and determines their locations. If the count of the number of ranging pulses found in the middle 8 chips is greater than one, the CU broadcasts a C on the control channel indicating a collision state, which causes all RUs to vector processing to their contention resolution protocols, as symbolized by block 624. If test 622 determines that the pulse count is 0 or their is a position error in the position of the single pulse found in the middle 8 chips, test 626 is performed to determine if the number of retries exceeds the maximum allowable number. If not, the process of block 620 is performed again to send new course alignment data to the RUs on the control channel. If the number of retries found by test 626 is found to exceed the maximum, the process of block 628 is performed where the CU broadcasts an E on the control channel indicating the gap is empty. This causes all RUs trying to synchronize to return to their ranging processes and start over at block 600 in FIG. 29.

Once test 622 determines that there is only a single Rus ranging pulses in the gap and it is within the middle 8 chips, processing is vectored to test 630 which determines if noise has caused detection of what was thought to be a ranging pulse but which was only noise. This test is performed by determining if at least two out of three ranging pulses were received when the ranging pulse was commanded to move to the extreme left edge, the extreme right edge and the center of the middle 8 chips of the gap. If ranging pulses were detected at at least two of these three positions, no false alarm exists, and processing is vectored to block 632. If a false alarm is detected, processing is vectored back to test 626 to start over in positioning the ranging pulse.

The process symbolized by block 632 is the process of the CU broadcasting an A on the control channel which signals all RUs that are attempting to synchronize to send their authentication codes. Therefore block 632 states State=Auth which means that the CU is broadcasting an implicit request for the authentication ID (AUID) of the RU whose pulse is in the gap. In response, all the RUs trying to synchronize send their AUIDs in the form of four ranging pulses during the gaps of each of the next four frames of a superframe, each ranging pulse being located in a specific one of the 8 chips positions of the middle 8 chips in the gap. The positions and sequence during these four gaps of the authentication superframe tell the CU which RU has hit the gap. This is the meaning of the language in block 632 "Look for one pulse in each gap [one SF, Pulse Position Becomes No. 1-7]" The steps following block 632 just check for errors in this process. Specifically, test 634 is performed after each frame to increment a pulse counter and determine if the pulse count has reached 4 by the end of the superframe. If the pulse count is 4 at the end of the authentication superframe, test 634 vectors processing to block 636 where the CU broadcasts an FAE message on the control channel indicating authentication is finished and sends the AUID code out on the control channel for recognition by the RU that sent it. The AUID will be a sequence of 4 numbers from 0–7 which indicate in which chip of the middle 8 of the gaps of the authentication superframe each ranging pulse was found. Each RU that is attempting to synchronize will compare this sequence of 4 numbers to the 4 numbers of its AUID. If there is a match, that RU will know that it successfully hit the gap and will freeze its transmit delay timing at the number that puts its ranging pulse in the center of the 8 middle chips of the gap. Step 638 is then reached indicating that authentication is complete.

If test 634 determines that the pulse count is less than 4 after any gap in the authentication superframe is complete, processing is vectored to test 640 to determine if the number of retries exceeds the maximum allowable number. Test 640 sends processing back to block 632 to look for pulses in the authentication superframe gaps and record their positions until the superframe is over and the pulse count is less than 4. Some number of superframes with the RUs sending their AUIDs can be allowed in some embodiments. Eventually, the number of retries exceeds the maximum, and processing is vectored by test 640 to block 642. In block 642, the CU broadcasts an E on the control channel and, in response, all the RUs attempting to synchronize will return to the ranging process.

Likewise, if at any time, the count determined by test 634 exceeds 4 during the authentication superframe or at the conclusion thereof, an error has occurred or another RU has moved its ranging pulse into the gap. If this happens, test 644 is performed to determine if the maximum number of retries has been exceeded. If not, processing returns to block 632. Typically, more than one authentication superframe will be permitted with the RUs sending their AUIDs during each superframe. Eventually, after several superframes, if block 636 is not reached, test 644 will trigger vectoring of processing to block 646 where the CU broadcasts a C on the control channel indicating a collision has occurred thereby causing the RUs to return to their contention resolution protocols.

Figure 31:
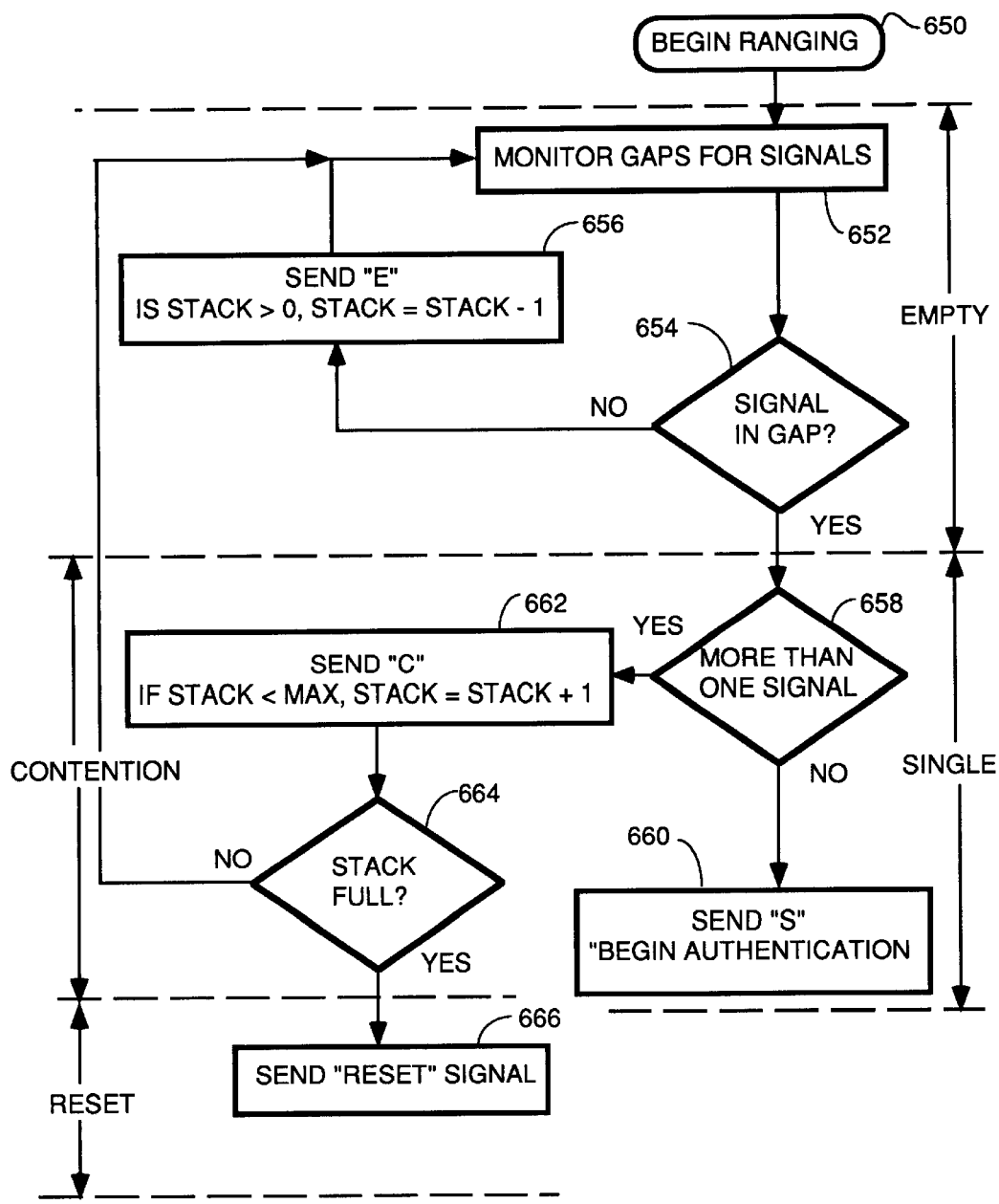
FIG. 31 is a flow chart representing the preferred ranging and contention resolution carried out on the CU side.

Referring to FIG. 31, the ranging and contention resolution protocol performed on the CU side is detailed in flow chart form. Ranging starts with block 650 where the CU sends out a unique barker code. This barker code is a unique pattern of data, which, when received by the RUs is echoed by them back toward the CU after imposing a programmable delay. It is this programmable delay that is being adjusted during the ranging process until the echoed barker code in the form of a ranging "pulse" hits the gap. Block 652 represents the process carried out by the CU of monitoring the gap to determine if any RUs ranging pulse has hit it. This monitoring is typically done by performing a correlation calculation between any signal received in the gap and the barker code originally transmitted, but in other embodiments, it can be any other form of monitoring such as threshold comparison etc. which is effective given the noisy environment. Threshold monitoring of sharp or high power pulses is less desirable however, because sharp pulses tend to splatter the band with a broad range of Fourier components, while high power ranging pulses that will rise above the noise can, before alignment is achieved, arrive coincidently with payload data from other RUs and interfere therewith. Test 654 represents the examination of the results of the correlation calculation or other monitoring activity to determine if any pulse was found in the gap. If not, step 656 is performed where the CU broadcasts an E on the control channel indicating the gap is empty, thereby causing the RUs to adjust their delays and resend their barker codes or ranging pulses during the next frame. Step 656 also subtracts one from an iteration stack which counts the number of iterations or attempts to range. Then the monitoring step 652 is performed again.

If test 654 determines that there is a ranging pulse in the gap, processing vectors to test 658 where the CU determines if there is more than one ranging pulse in the gap. If there is only one ranging pulse in the gap, step 660 is performed where the CU broadcasts an S on the control channel indicating to all RUs that are ranging to begin their authentication processes.

If more than one ranging pulse is found in the gap, step 662 is performed to broadcast a C on the control channel indicating to the RUs that there is a contention and forcing them to carry out their contention resolution protocols. The CU then checks the status of an iteration stack to see if it is full. The iteration stack is used to keep track of the rounds of ranging for purposes of contention resolution and more rapid ranging of all RUs attempting to synchronize in some embodiments. The stack is incremented by one, and tested in test 664 to determine if the maximum number of iterations has been reached. If not, processing returns to block 652 to again monitor the gap for ranging pulses transmitted during the next frame. If the maximum number of iterations has been reached, step 666 is performed to broadcast an R on the control channel thereby causing all RUs to reset and start the ranging process again.

Figure 32:
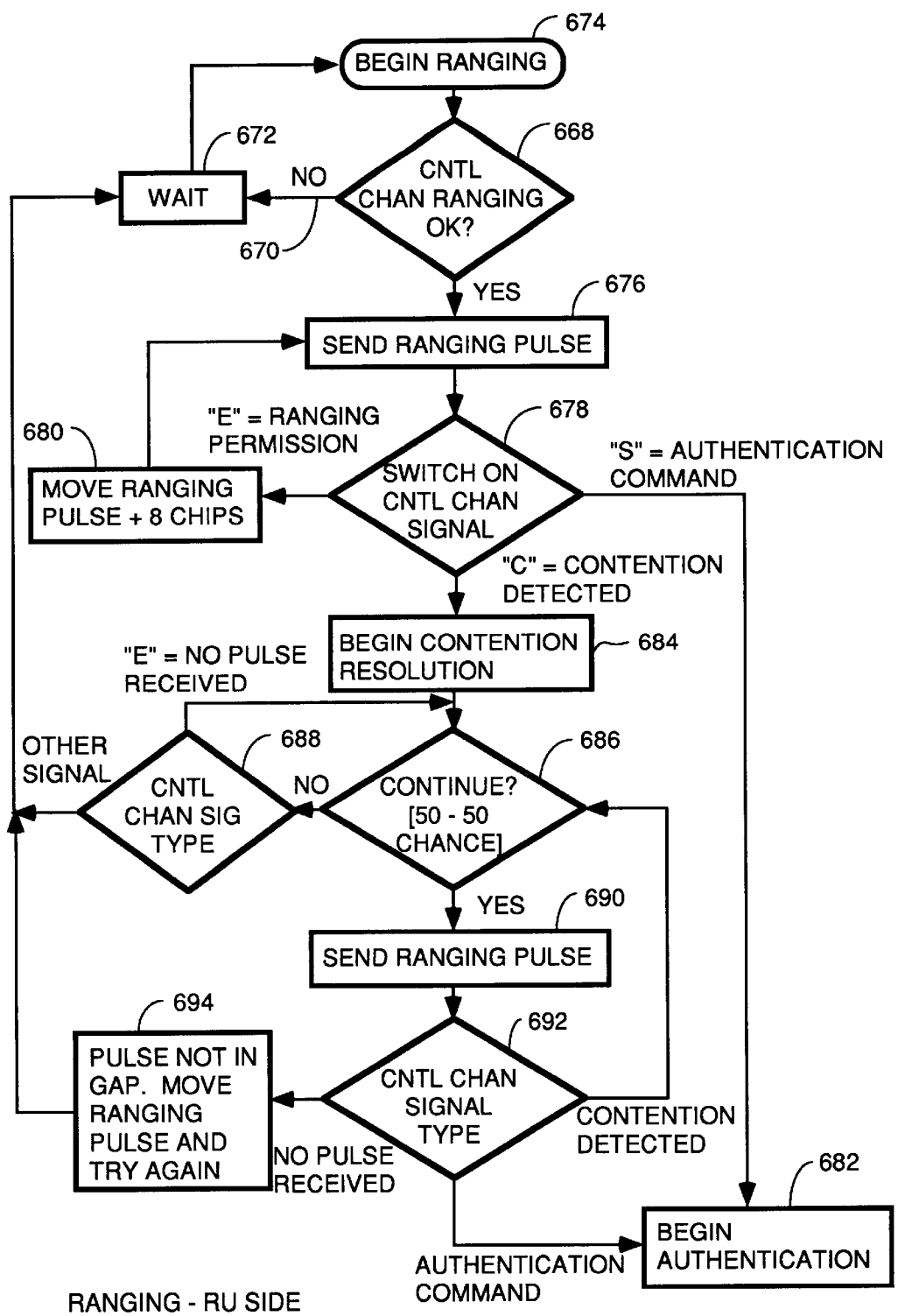
FIG. 32 is a flow chart representing one embodiment of the ranging or alignment and contention resolution process to achieve frame synchronization carried out by the RUs using a binary tree algorithm.

Referring to FIG. 32, there is shown a flow chart for a ranging process carried out by the RUs using a binary tree algorithm. The process starts with one or more RUs that are not in frame synchronization but which wish to achieve frame synchronization so as to be able to send data to the CU. These RUs first must synchronize their receivers to broadcasts on the control channel from the CU so that they can receive status commands from the CU which control their activities during the ranging process. The RUs can synchronize to the CU broadcasts themselves without assistance from or the need to send anything to the CU by recovering the system clock signal from the periodic broadcasts of the barker code signals every frame from the CU. Once this has happened, test 668 determines that control channel signals can be received and ranging can start. Until this happens, path 670 is taken to wait state 672 and block 674 to idle until the RU receiver synchronizes to the CU and can receive its broadcasts.

When RU receiver synchronization has been achieved, step 676 is performed to pick some arbitrary delay and send a ranging pulse using that delay. Test 678 is then performed to switch on the control channel signal and determine the state of the CU. If the CU did not find any ranging pulse in the gap, it broadcasts an E on the control channel. Each RU then changes its delay by adding 8 chip times, as symbolized by block 680, and transitions to step 676 to send another ranging pulse. This process continues until one or more RUs set their delays such that their ranging pulses arrive in the gap. If the CU detects a single pulse in the gap, it broadcasts an S on the control channel which the RUs interpret as an authentication command. Each RU then transitions to step 682 to begin the authentication process, which has been previously described. Basically, the authentication process involves the RU sending its identification code as either a unique sequence of ranging pulse positions in the middle 8 chips of the gaps of multiple frames or as a unique sequence of the presence and absence of ranging pulses in the gaps of multiple frames.

If multiple RUs hit the same gap, test 678 finds that the CU is broadcasting a C on the control channel indicating that the RUs need to perform their contention resolution protocols, as symbolized by block 684. As symbolized by test 686, each RU then "flips a coin" to determine if it should continue and examines the outcome. If an RU decides not to continue, processing in that RU transitions to test 688 where the RU determines the control channel signal type. If an E is being broadcast, it means that all RUs that were ranging decided to stop, and processing returns to step 686 to "flip the coin" again. If test 688 determines that any other signal is being received, processing returns to block 672 and the ranging process starts over for that RU.

If the coin toss results in the RU deciding to continue ranging, step 690 is performed to send another ranging pulse. Then test 692 is performed to listen to the control channel and determine what the CU state is. If the CU found no pulse in the gap, step 694 is performed to move the ranging pulse, i.e., adjust the transmit frame timing delay, and try again. Accordingly, processing transitions back to test 668 through step 672. If the CU is broadcasting a C, more than one pulse has been detected in the gap, and processing returns to step 686 to flip the coin again to decide whether to continue ranging. If test 692 determines that the CU is broadcasting the S or authentication command, processing transitions to step 682 to begin authentication. After authentication, the CU sends fine tuning commands over the control channel to the RU which just authenticated itself to adjust the position of its ranging pulse to the center of the gap.

Figure 33:
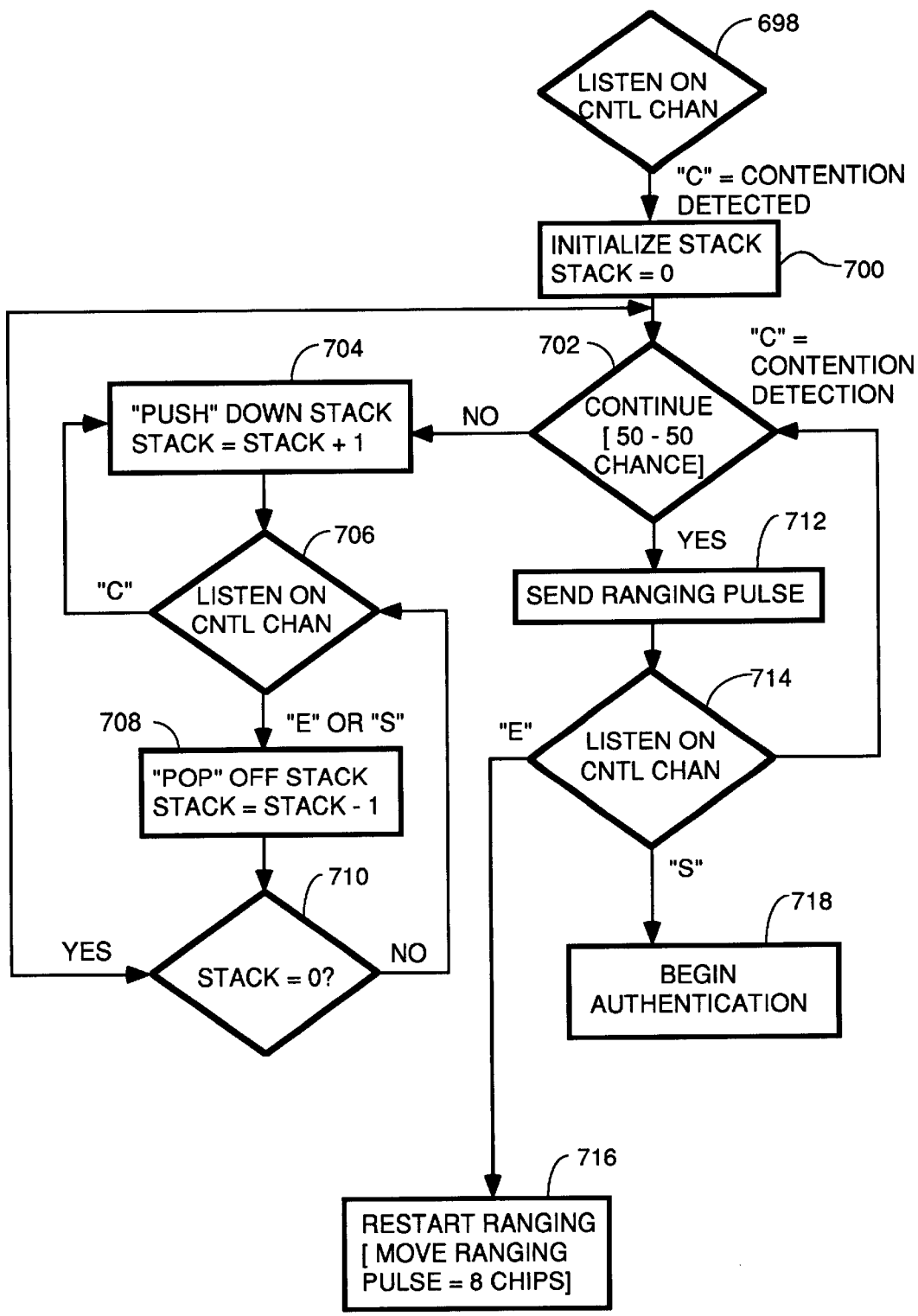
FIG. 33 is a flow chart representing another embodiment for a ranging and contention resolution process carried out by the RUs using a binary stack.

Referring to FIG. 33, there is shown a flow chart of the preferred process of ranging and contention resolution using a binary stack. This process is slightly faster than the binary tree algorithm in achieving alignment because in this process, the RU remembers upon which iteration it "failed", i.e., the coin toss after a contention caused the RU to stop attempting ranging. The process starts with step 698 to listen on the control channel. When a C is broadcast by the CU, step 700 is performed to initialize a binary stack to 0. This stack is used to keep track of the iteration number when the coin toss resulted in a decision to discontinue ranging. Next, step 702 "flips the coin" to make the decision as to whether to continue. If the decision is to not continue, step 704 is performed to push down the stack by setting the value on the stack to stack +1. Then test 706 is performed to listen again on the control channel and determine the CU state. If there is still a contention, step 704 is performed to increment the stack again. If test 706 determines that the CU says the gap is empty or only a single ranging pulse is in the gap, step 708 is performed to pop the stack, i.e., to set the stack value to stack −1 in step 708. Next, test 710 is performed to determine if the stack value has reached 0. If it has, processing returns to step 702 to flip the coin again to decide whether to resume ranging. If test 710 determines that the stack has not reached zero, test 706 is performed again to listen on the control channel.

Returning to the consideration of step 702, if the original coin toss caused the RU to decide to continue ranging, step 712 is performed to send a ranging pulse. Then test 714 is performed to listen on the control channel to determine the CU status. If a C is being broadcast, more than one RU is in the gap, and processing returns to step 702 to flip the coin again. If an E is being broadcast, the gap is empty and the delay for the next ranging pulse is adjusted by moving the pulse +8 chips and restarting the ranging process in step 716 by transitioning to step 600 on FIG. 29. If test 714 determines that the CU is broadcasting an S meaning a single pulse has been found in the gap, processing vectors to step 718 to begin the authentication process.

Preferred RU Receiver Block Diagram

Referring to FIG. 34, there is shown a block diagram of the preferred organization for a receiver for the RU and CU modems. The quadrature amplitude modulated combined carrier arrives at the receiver on coaxial cable 24 or other media. An RF synchronous demodulator section 750 synchronously detects the QAM modulation using a detector like that shown in FIG. 26 and a local oscillator signal on line 762 which is synchronized in phase and frequency to the pilot tone from the CU in the case of an RU receiver and which is synchronized to the preamble data sent in each timeslot in the case of the CU. The RF demodulator 750 outputs an analog signal on line 752 carrying the chip amplitude information for all time slots. The RF section 750 also includes a passband filter having a center frequency centered on the frequency of the 6 mHz wide band carrying the chip data and having a 6 mHz bandwidth. The RF section also includes a variable gain amplifier that has a gain control input coupled to line 758 coupled to automatic gain control circuit 756. The AGC circuit works over a fixed interval and counts the number of times the input signal is above a preset threshold and the number of times it is below it. A counter is preset to a negative value at the start of the interval. Each time the threshold is exceeded, the counter in incremented. If the counter has counted up to zero at the end of the interval, the AGC gain is set correctly. Positive values call for decreased gain, and negative values call for increased gain.

The signal on line 752 is converted to digital information by A/D converter 754 which performs IF sampling as is known in the prior art was first described by Colinberg, whose papers are hereby incorporated by reference. The sampling rate is 4 times the symbol period. The advantage of using IF sampling is that it allows the use of one A/D converter to sample both the sine and cosine carriers. In alternative embodiments, two A/D converters may be used, each having a sample rate substantially greater than the symbol period.

The gain of the signal represented by the digital data output by the A/D converter 754 is examined by automatic gain control (AGC) 756, and if the amplitude is not high enough, the AGC circuit generates a signal on line 758 to increase the gain of the variable gain amplifier in the RF section. The RF section is coupled to the local oscillator carrier frequency synthesizer 760 by line 762 so as to receive local sine and cosine carrier signals which match the frequency and phase of the sine and cosine carriers used by the transmitters to QAM modulate the chips onto RF signals carried by the media.

Phase separation of the sine and cosine components of the QAM modulated data represented digitally on bus 760 is performed by matched filter 761. The matched filter has two filters which have filter characteristics that are the mirror image of the squared raised cosine filter characteristics of the filters 1134 and 1136 in the shaping filter/modulator 570 shown in FIG. 46. The matched filters separate the orthogonal real and imaginary components in the received signals and transmit them to the frame detector via buses 906 and 908 in FIGS. 34 and 38. The filter characteristic of the matched filter is established by data from the CPU 405 on bus 1090. In the preferred embodiment, the output of of the matched filter 762 on bus 840 is filtered by an FFE/DFE filter 764 which functions to cut down on precursor and postcursor intersymbol interference. The FFE/DFE filter 764 has the structure of FIG. 37, and each of the FFE and DFE equalizers is an adaptive FIR filter. Adaptive FIR filters and many of the other digital signal processing components of the circuitry disclosed herein are known and are discussed in detail in Elliott, *Handbook of Digital Signal Processing: Engineering Applications*, (Academic Press, Inc. San Diego, 1987), ISBN 0-12-237075-9, which is hereby incorporated by reference. In the preferred embodiment, the FFE filter 764 is placed between circuits 765 and 767 to filter the data on bus 769.

Next, despreading of the data and reassembly of the appropriate data into the corresponding timeslots to undo the code shuffling that happened in the transmitters is performed. The first step in this process is accomplished by CDMA MUX 766. This multiplexer multiplies the incoming data by the transpose code matrix $C^T$ of the code matrix used by CDMA MUX 527 in the transmitters represented by FIG. 28A. The resulting despread data is stored in buffer memory 768 sequentially in the order of the individual code multiplications. The CDMA MUX 766 or control logic 1082 generates suitable read/write control signals to cause buffer 768 to sequentially store the despread data on bus 776 output by the CDMA MUX 766. A deshuffler circuit 770 receives the same seed number on bus 772 as was received by code diversity shufflers 506 in the transmitters. The seed number is sent on the control channel, and is relayed to circuit 770 by the CPU 405. The deshuffler uses the seed number to generate the same pseudorandom numbers as were generated from this seed during every symbol time by the transmitter (the receiver chip clocks are synchronized to the transmitter chip clocks by a process carried out by the frame detector 882 and the control loop 781). These pseudorandom numbers are used to generate read address pointers on address bus 774 which are coupled to the address port of buffer 768 along with suitable read/write control signals. The data stored at the addresses indicated by the read pointers is then output by the buffer on bus 795. This bus is coupled to one of two inputs of a switch/multiplexer 791. Because the address pointers are generated in the same sequence as in the transmitters when shuffling data, the data read out of the buffer 768 is read out in the correct sequence to put the despread data back into the sequential order of the timeslots.

Other data received by the code shuffling circuit 770 on bus 772 are the Tss data indicating which timeslots are assigned to the RU, and RI indicating which codes are reserved and cannot be used by this RU or CU.

This deshuffling operation is not necessary if the receiver is located in an RU because the CU does not use code hopping for data it sends to the RUs. Therefore, in some embodiments of RU receivers buffer 768 and deshuffler 770 do not exist. In other embodiments, they do exist, but are not used and a switch 791 guides the despread data on bus 776 from the CDMA MUX 766 around buffer 768 and directly into the input of the amplifier 788. An RU/CU signal on line 793 controls the state of switch 791 such that either the data output bus 795 of buffer 768 or the bus 776 is coupled to input 789 of the amplifier 788. If the receiver is in a CU, bus 795is coupled to bus 789, while if the receiver is in an RU, bus 776 is coupled to bus 789.

In some embodiments, the despread data on bus 776 is simultaneously read by a crosstalk detector which functions to determine the amount of interference between adjacent codes and also plays a role in clock recovery so that all RU and CU receivers and transmitters can be synchronized to the same clock. Crosstalk between channels encoded with adjacent cyclic, orthogonal codes always comes from adjacent channels and happens when the data encoded with adjacent cyclic CDMA codes do not arrive precisely aligned in time. In other words, to have zero crosstalk, the clock time at which the first chip of a symbol transmitted on one channel spread with a cyclic CDMA code arrives at the receiver must be exactly the same time as the clock time at which the first chip of a symbol transmitted on an adjacent channel spread with an adjacent cyclic code. A slippage of one chip clock means complete overlap and total crosstalk since adjacent cyclic codes are generated by shifting the code by one place to the right. A slippage or misalignment of less than one complete chip clock will mean that some crosstalk exists. The crosstalk detector detects the amount of crosstalk affecting each chip of each channel by subtracting the amplitude of the chip of the channel currently being processed from the amplitude of the corresponding chip encoded on the immediately preceding channel.

In these alternative embodiments, the amount of crosstalk is sent as a clock tracking error to a control loop logic 781 which outputs a clock phase/frequency correction voltage on line 782. This signal is coupled to the phase/frequency control input of a voltage controlled crystal oscillator 784 which generates a chip clock reference signal on line 786. This chip clock reference signal is fed to one input of a switch 787, the other input of which is coupled to receive an external clock reference signal at 8.192 Mhz. A switching control signal on line 791 from the CPU 405 controls whether switch 787 selects which of the chip clock reference signals on lines 786 or 789 for output on bus 793 to phase lock loop (PLL) 880. This PLL 880 multiplies the clock reference signal on line 793 to generate two output signals at 114.688 Mhz and 57.344 Mhz which are supplied on bus 888 to a time base generator 886. The time base generator generates the various clock signals needed for synchronization of the system.

In the preferred embodiment however, clock recovery is performed in the RUs by frame detector 882 using the fine tuning circuitry shown in FIG. 38. This circuitry generates a clock steering tracking error signal on line 900 in FIG. 34. This clock steering signal is input to the digital equivalent of an integrator in control loop 781 which serves as a loop filter for a phase lock loop including vcxo 784. The averaging process of integration eliminates the random noise. The integrated error signal is output as a clock phase steering signal on line 782 to the error signal input of vcxo 784 to generate the clock reference signal on line 786.

Although a global automatic gain control adjustment was made by AGC 756, data is being received from many different RUs located at many different positions on the network. To minimize errors in interpretation of the upstream received data caused by amplitude variance caused by differing path length losses from the various RUs and channel impairments, a separate gain control adjustment is desirable for each RU. This is done by transmitting from each RU a preamble of known data before the payload data for each timeslot assigned to that particular RU as mentioned above. Therefore, a variable gain amplifier 788 is employed to amplify each timeslot's data individually. The control loop logic 781 assists in this process by sending a desired gain signal on line 790 to amplifier 788 based upon inputs received on buses 792 and 794. The input on bus 792 is data identifying which particular timeslot's data is currently at the input 789 of the amplifier 788 and is generated by deshuffling circuit 770. The control loop 781 also receives an input from control logic 1082 and CPU 405 which indicates when preamble data for a particular timeslot is being received. The input on bus 794 is generated by a memory 796 which stores individual gain control and phase error correction numbers for each of the 128 payload channels (or all 144 channels in some embodiments).

During reception of preamble data, the control loop 781 cooperates with the slicer 800, the G2 amplifier 788 and the rotational amplifier 765 to carry out an iterative process to reduce the slicer error to as low a value as possible by adjusting the amplitude error and phase error coefficients in the Upstream Carrier Recovery Error Correction Factor equation (equation (5)) given above. Specifically, the CPU 405 and control logic 1082 will signal the control loop 781 and slicer 800 when preamble data is being received. Notification to the slicer 800 in FIG. 34 and slicer/detector 466 in FIG. 19 takes the form of activation of the CU Preamble signal on line 1086. When preamble data is being received, the control loop will set initial values for the 1/a and $e^{-j\phi}$ amplitude and phase error correction factors of equation (5) and transmit these on buses 790 and 802, respectively, to the G2 amplifier 788 and rotational amplifier 765. These circuits will operate on the received data samples to make amplitude and phase error corrections, and the slicer will compare the received signal to the 3-j constellation point it knows it is supposed to be receiving during the preamble. The amplitude and phase errors between the actual received data and the 3-j point are output on bus 798 to the control loop 781. The control loop 781 examines these error values, and adjusts the 1/a and $e^{31\ j\phi}$ amplitude and phase error correction factors in an appropriate direction to tend to minimize the slicer error. The process repeats itself for the next preamble 3-j constellation point. Eventually, the control loop finds values for the 1/a and $e^{-j\phi}$ amplitude and phase error correction factors that minimize the amplitude and phase error values on bus 798. These values are then recorded in memory 796 in FIGS. 34 and 19 as the 1/a and $e^{-j\phi}$ amplitude and phase error correction factors to use in receiving data for the timeslot(s) assigned to this particular RU. The process is repeated each time the RU is reassigned to a new timeslot(s).

The process described above regarding synchronization in the upstream to the preamble data gives upstream carrier recovery synchronization. Frame synchronization and chip clock synchronization are done in the CU for the upstream data by the frame detector 882 using the coarse and fine tuning circuitry of FIG. 38. The CU receiver knows when the gap is, so the frame detector 882 in the CU does chip clock synchronization and looks for ranging barker codes and supports the process of instructing the RUs on how to alter their transmit frame timing delay values $T_d$ so that their barker codes hit the gap.

After synchronization to the preamble in the upstream data, the CU receiver control loop 781 uses the information received on bus 792 regarding which timeslot's data is currently being received to generate an address pointer to that timeslot's amplitude (1/a) and phase error ($e^{-j\phi}$) correction coeficients in memory 796. The control loop 781 then sends the address pointer to memory 796 via bidirectional bus 794 along with suitable read/write control signals and receives from the memory the amplitude and phase error correction coeficients for the particular timeslot being received. The control loop then places the amplitude and phase error correction coeficients on buses 790 and 802, respectively, to control the digital amplification process carried out by the amplifier 788 and the phase error correction process carried out by the rotational amplifier 765.

When the receiver is located in an RU, the multiple timeslots being received from the CU all originate from the same location and the same transmitter so they all need to be amplified by the same gain. Therefore, in an RU receiver, memory 796 need only be a register that stores one amplitude and phase error correction value used by that particular RU to receive CU data in all timeslots.

The slicer 800 is of conventional design, and includes circuitry to measure both gain and phase error for each channel's data. These errors are measured by circuitry in the slicer which compares the amplitude and phase of a received chip to the amplitude and phase of the legitimate constellation point in the constellation of FIG. 21 which the received chip is supposed to represent. Recall that the constellation of FIG. 21 represents all the permissible 4 bit chips that can be part of a symbol. Each chip is comprised of 2 bits plus a sign bit which define the real or I axis coordinate and 2 bits plus a sign bit which define the imaginary or quadrature Q axis component. Therefore, in polar coordinates, each constellation point has an amplitude and phase the combination of which defines the constellation point. For example, in FIG. 21, chip 0010 has a magnitude and phase represented by vector 801. Assume that chip 0011, after transmission losses, crosstalk etc. get demodulated and the I and Q components after demodulation map to point 803 in the constellation having a magnitude and phase represented by vector 805. The circuitry in slicer 800 responsible for quantifying the magnitude and phase errors compares the magnitude and phase of vector 805 to the magnitude and phase of vector 801 and generates amplitude error and phase error signals on bus 798 from the differences.

The phase rotation circuit adjusts the amplified data on bus 789 representing each received chip so as to rotate the phase thereof to correct the phase error for that received chip. This is done by a matrix multiplication of the complex number representing each chip by cosine (ø)+j sine (ø) where ø is the amount of desired phase correction.

The control loop 781 also uses the phase error data on bus 798 to generate a local oscillator steering voltage on line 806 to alter the phase and/or frequency of a 3.584 MHz reference clock output on line 810 by a voltage controlled crystal oscillator 808 (vcxo). The clock steering signal on line 806 is a carrier tracking error derived from the pilot channel signal. The pilot channel signal carries the time synchronization sequence mapped onto a qpsk constellation. The carrier tracking error is extracted based upon a decision directed discriminator. Carrier recovery is started immediatly after the AGC gain is set and ranging has achieved frame synchronization. The carrier recovery circuitry just described is monitored by the modem software to insure that it remains in synchronization, and if lock is lost, an interrupt occurs which causes re-initialization of the modem to be started and the modem transmitter to be disabled. The same is true if clock synchronization is lost, i.e., the RU local clock is locked to the CU clock and the clock recovery circuitry is monitored to make sure clock synch is not lost.

Once carrier recovery has been achieved, the kiloframe data encoded in the pilot channel is recovered to achieve kiloframe synchronization so that the RU modem registers and software can be initialized to beginning counting CU frames so as to be able to keep straight which assigned codes from CU messages are to be used during which frames. The RU receiver decodes the synchronization sequence data on the pilot channel using a bpsk constellation. The CU transmitter generates the pilot channel signal as pseudorandom synchronization sequence of bits which are taken one at a time, bpsk modulated and transmitted on channel 1, one bit per symbol or 3 bits per frame. The RU generates its own matching pseudorandom sequence locally in a manner to be described below. The RU frame detector 882 in FIG. 34 and 513 in FIG. 19 demodulates and decodes the incoming bits and compares them to its own matching pseudorandom sequence. Each bit has only 2 possible digital values which defines 2 points in the bpsk constellation. If the incoming points are rotated in phase from one of these 2 points, the rotation is a carrier phase error and is used to generate a carrier phase steering signal which is transmitted to the control loop 781 and vcxo 808 via buses 900 and 806, respectively. A kiloframe is 1024 frames long. As the bit are received, they are compared to the local pseudorandomly generated sequence. If communications were perfect, and frame synchronization is perfect, the incoming bits of the synchronization sequence would match the locally generated sequence exactly. A state machine counts the number of mismatches, and, if it is less than a threshold, frame synchronization is assumed, and the errors attributed to noise on the channel. If the number of errors exceeds the threshold, an interrupt signalling loss of frame synchronization is generated, and re-initialization is started. The kiloframe marker is detected in the synchronization sequence when a 16 bit feedback shift register which is loaded with 16 bits of the incoming bit stream of the synchronization sequence reaches a state which it only reaches after 1024 frames of bits of the synchronization sequence have arrived.

Figure 52:
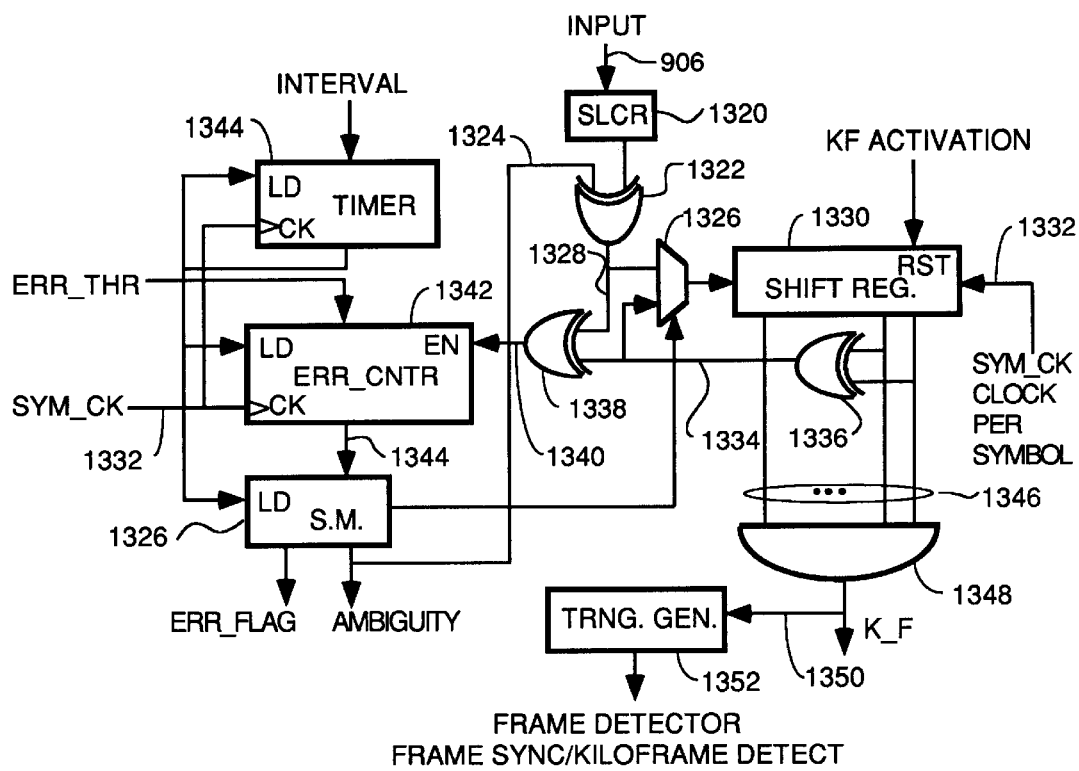
FIG. 52 is a diagram of the frame detector circuitry that detects kiloframe boundaries and monitors the state of frame synchronization using the pilot channel synchronization sequence.

Specifically, referring to FIG. 52, the circuitry of the frame detector which monitors frame synchronization and detects the kiloframe marker in the pilot channel synchronization sequence is shown. The bpsk pilot channel data enters on line 906 and is detected in a slicer 1320. The slicer output is coupled to a first input of an exclusive-OR (xor) gate which inverts the data selectively to correct phase ambiguity (the carrier may accidently lock in 180 degrees out of phase which causes every bit in the locally generated pseudorandom sequence to be the opposite of the incoming sequence bit) in accordance with a ambiguity signal on line 1324 from state machine 1326. A switch 1326 under control of the state machine selects the data on line 1328 for input to the 16 bit feedback shift register (FSR) 1330 for the first 16 clock cycles. The FSR is clocked once per symbol by a clock signal on line 1332 from time base 886 in FIG. 34. After the first 16 incoming bits are loaded, the multiplexer is switched by the state machine to select the feedback data on line 1334 from the output of xor gate 1336 which has its inputs coupled to the two MSB outputs of the FSR. The FSR acts as the local pseudorandom number generator to generate a sequence of bits that is supposed to match the incoming synchronization sequence. The feedback data on line 1334 serves as a predictor of the next incoming bits in the sequence, and is fed to one input of an xor gate 1338. The other input of this gate receives the actual incoming bits of the synchronization sequence. The feedback bits are also fed back into the FSR through switch 1326 to further alter the state thereof. The xor gate 1338 outputs a zero on line 1340 when the predicted bit on line 1334 matches the actual incoming bit. The zero on line 1340 does not enable error counter 1342, so no error count incrementation occurs. If the predicted bit disagrees with the actual bit, the error counter 1342 is enabled and incremented on the next symbol clock. Timer 1334 controls the interval over which the error count is taken. The error count on bus 1334 is read by state machine 1326 and used to detect loss of frame synchronization and automatically signal this event and attempt to reacquire the pilot channel and frame synchronization. Re-initialization is initiated by the software upon receipt of a loss of frame synchronization signal from the state machine. Reacquisition is continually retried until kiloframe synchronization is again achieved.

Figure 53:
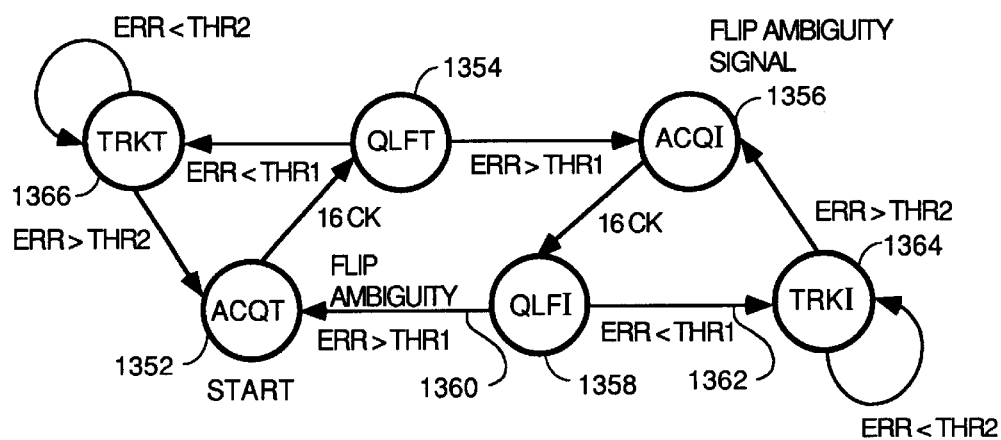
FIG. 53 is a state diagram for the state machine 1326 that monitors frame synchronization.

FIG. 53 is a state diagram for the state machine 1326 that monitors frame synchronization. The state machine starts in acquisition true state 1352 by controlling switch 1326 to allow sixteen synchronization sequence bits enter the FSR 1330 without inverting them via the ambiguity signal on line 1324. Transition to qualification true state 1354 then occurs where the error count on line 1334 is monitored and switch 1326 is controlled to select the feedback bits on line 1334 for input to the FSR 1330. State 1354 determines if for each count interval, the error count exceeds or is less than threshold 1. If the count exceeds threshold 1, the possible problem is that the carrier has locked on 180 degrees out of phase. Transition to acquisition invert state 1356 then occurs where the ambiguity signal is driven so as to invert the next 16 incoming pilot channel bits, and switch 1326 is controlled to load these inverted bits into the FSR. Next, the state machine transitions to qualification invert state 1358 where the incoming pilot channel bits are inverted and switch 1326 is switched to select the feedback bits on line 1334, and the error count is again monitored. If the error count exceeds threshold 1 again, the problem is not a phase ambiguity, so path 1360 is taken to state 1352 to start over and the ambiguity signal is set to not invert the incoming bits. If the error count is less than threshold 1, the phase ambiguity was the problem, and path 1362 is taken to tracking invert state 1364. The state machine stays in state 1364 with incoming pilot channel bits being inverted and compared to the predicted bits generated by the FSR as long as the error count remains below a second threshold. As soon as the error rate exceeds threshold 2, transition to acquisition invert state 1356 occurs and a new 16 inverted pilot channel synchronization sequence bits are loaded through switch 1326 into the FSR, and the process starts over. A tracking true state 1366 works the same way as state 1364 except where lock on was reached without inverting the incoming pilot channel bits.

After 1024 frames of the foregoing activity, the state of the output lines 1346 will be all 1's. This is the kiloframe marker. This state causes AND gate 1348 to sent a K_F kiloframe marker 1to training generator 1352. This circuit is used to coordinate frame tag number counting in the RU receiver. The RU counts incoming CU frames by virtue of a counter which counts the occurrences of the GAP_a signal from the CPU 405. In the preferred embodiment, this counter is located in the time base 886 in FIGS. 34 and 19 which communicates with the CPU via bus 1350 or frame detector 882 in FIG. 34 and frame detector 513 in FIG. 19 which communicate with the CPU via buses 755 and 902, respectively.

Returning to the discussion of FIG. 34, the carrier reference frequency on line 810 is used by frequency synthesizer 760 to generate local sine and cosine carrier signals on line 762 that match the frequency and phase of the local oscillator carrier signals used in the QAM modulators in the transmitters (corresponding to carrier on line 427 in FIG. 24). The control loop 781, vcxo 808 and the frequency synthesizer 760 combine in the embodiment of FIG. 34 to perform the function of the carrier recovery circuit 515 in FIG. 19. The local carrier(s) on line 762 are coupled to the RF demodulator section 750 and are used there in a demodulator like that shown in FIG. 26 as the sine and cosine local carriers on lines 480 and 482, respectively.

The receiver of FIG. 34 uses two feed forward equalizers (FFE) and two decision feedback equalizers (DFE). The first FFE and DFE are shown combined as circuit 764 just after the matched filter 761 and just before the orthogonal code demultiplexer. The second FFE is combined with a rotational amplifier in circuit 765 after the orthogonal code demultiplexing operation and before the slicer. The second DFE is circuit 820. The equalization process involves some interplay between these FFEs and DFE as will be described below in the section on equalization. Both of the FFEs function to eliminate or substantially reduce precursor intersymbol interference, and both DFEs function to reduce or eliminate post cursor intersymbol interference.

Precursor and postcursor ISI can be understood as follows. If a transmitter were to send an impulse signal on one symbol with adjacent symbols empty, the receivers in an ideal system would receive the impulse with zeroes on either side of it. However, because of channel impairments, the receivers will receive an impulse and there will be some nonzero data in symbols on either side of the impulse. The nonzero data in symbols that precede the impulse symbol in time are precursor intersymbol interference. The FFE circuits removes this interference. The nonzero data in symbols that follow the impulse symbol in time is postcursor interference which is removed by the DFE circuits. The DFE circuit 820 receives as one of its inputs the decision data output by slicer 800 on bus 836 and processes these signals in accordance with the filter transfer function established by the tap weight coefficients received on bus 842 from a least means square calculation circuit. The resulting signals are output on bus 846 to the subtraction input of difference calculation circuit 767. The DFE and difference calculation circuit combine to subtract out that portion of the intersymbol interference produced by previously detected symbols from the estimates of future samples.

All the DFE and FFE circuits are FIR filters with adaptive tap coefficients. The DFE circuit 820 and the FFE circuit 765 (circuit 765 is an FFE only during the equalization training period and is a rotational amplifier during payload data reception after training) recieve their adaptive tap coefficients on buses 842 and 838, respectively, from the least mean square calculation circuit 830. The FFE/DFE circuit 764 receives its tap coefficients via bus 844 from the least mean square calculation circuit 830. The FFE and DFE FIR filters are given initial values for their adaptive tap coefficients that are close enough to allow the adaptation process to proceed. These preset coefficients are supplied from the CPU 405 via buses 824, 821 and 822. Thereafter, the coefficients are adaptively altered by signals on buses 842, 838 and 844 by the least mean squared circuit 830 using a conventional precursor and post cursor ISI elimination tap coefficient calculation algorithm.

The least mean square (LMS) circuit 830 iteratively calculates the new tap coefficients in a conventional manner and interacts with the FFEs and DFEs in the manner described below in the equalization section. The LMS starts with the initial tap weights and iteratively calculates the convolution sum between the tap input signals (input signals to each stage of the tapped delay lines) within the FFE 765 and the DFE 820 and the tap coefficients of the FFE 765 and DFE 820, all of which are obtained via bidirectional buses 842 and 838. The LMS then receives error signals on bus 831 calculated by difference calculation circuit 832 defined as the differences between the desired data points on bus 836 and the received data points on bus 834. The LMS then calculates new tap weights by multiplying the error signals times the corresponding tap input signals used to calculate the convolution sum times a predetermined step size which sets the rate of convergence to a stable value, and the result is added to the old tap weights to arrive at the new tap weights. These new tap weights are then sent to the FFE 765 and DFE 820 for use during the next iteration.

The LMS circuit implements a calculation which is based upon the fact that the needed change in the adaptive coefficients to the adaptive FIR filters 764 and 820 is proportional to the error on bus 831 times the conjugate of the data being input to the filters. In other words, the error is multiplied by complex numbers representing the received chips which have had the signs of their Q or imaginary components inverted.

The DFE filter eliminates or reduces post cursor interference by supplying a subtraction value on bus 846 to subtractor 767. The data sent by the DFE filter on bus 846 is subtracted from the data on bus 769 output by the FFE filter 765 during the equalization training interval. Eliminating the precursor interference and post cursor interference from the data on the bus 834 allows the slicer 800 and a Viterbi Decoder 850 to make better decisions about what chips were actually sent despite the channel impairments. The LMS, DFE and FFE circuits can be eliminated in some simple embodiments with, for example, only 4 points in their constellations. But to get more data throughput, more complex constellations are needed, and in such a situation, the points are closer together and ISI interference makes decisional discrimination between the constellation points more difficult. This creates a need for the above described ISI elimination circuitry.

After correction for ISI interference, the corrected data is passed via bus 834 to slicer 800. The purpose of the slicer is to make instantaneous decisions regarding which point in the constellation each chip represents for purposes of generating the gain and phase errors needed by the control loop and for purposes of generating the desired data on bus 836. The slicer does not make use of the 4th redundant bit in each chip for this purpose, and, as a result, makes errors in interpreting chips. It is up to the Viterbi Decoder 850 to correct these errors of interpretation.

Viterbi Decoders are well known in the art, and any Viterbi decoder algorithm will suffice for purposes of practicing the invention. The particular Viterbi algorithm used in the preferred embodiment is given below. Basically, Viterbi Decoder 850 and memory 852 keep track of the present and last state for each timeslot for purposes of tracing a path through a three dimensional space defined by the constellation of permissible input points stretched out over a third axis representing time which is orthogonal to the I and Q axes. There is one of these three dimensional spaces for each timeslot. By making use of the redundant bit or bits in each chip, and examining the path the states of each timeslot take through the appropriate 3-D space over time, the Viterbi Decoder makes a better informed decision as to which legitimate point in the constellation of permissible points each received code represents. The information on bus 792 to the Viterbi Decoder from the deshuffler tells the Viterbi Decoder which timeslot during which each code received on bus 836 was transmitted. The Viterbi Decoder uses this information to generate an address pointer to memory 852 pointing to the state information for that timeslot. This allows memory 852 to output the state information which is used by the Viterbi Decoder to make its analysis.

Although any conventional Viterbi decoder algorithm will suffice to practice the invention, in the preferred embodiment, the following Viterbi algorithm is used.

```
N = 16;              % number of states
C = 2; (C = 2 + 3;)  % for trace back in one symbol time.
                     % (if trace back is 1/3 in a symbol time C = 2 + 3)
Dd = 12              % Decision Delay
for every input_symbol
    for present_state = 0:N-1
        for i = 0:7              % loop on previous states
            previous_state = f(present_state, i);
            tx = f(previous_state, present_state); % possible transmitted signal
            bm = f(tx, r);            % branch metric
            pm_tmp(i) = pm(previous_state) + bm; % ADD, find path metric
                     % ADD with limiter (no overflow)
                     % pm_new(present_state) can be computed here by minimum of
2 values
                     % previous_state_min can be computed here with pm_new(present_state)
        end
        [pm_new(present_state), previous_state_min] = min(pm_tmp);   % Compare &
                % Select (find min & index), (can be computed in loop of i)
        survivor(present_state, survivor_pointer) = previous_state_min;  % update survivor,
                % i (3 bits) can be saved instead of previous_state_min (4 bits).
    end
    pm = pm_new;    % update path metric, or switch path metric memory
    if mod(symbol, 3) = 0, do:   % begin trace back when 1'st symbol of frame is received.
        surv_rd_add_l = min(pm); % survivor RD address
            surv_rd_add_h = survivor_pointer;
        start TRACE_BACK;  % While trace back is employed continue the process.
    end
    inc(survivor_pointer);        % circular increment survivor_pointer
end
        % TRACE_BACK (Two options:
    % a. Trace back all the survivor memory and output 3 symbols in one symbol time.
    % b. For each symbol trace back 1/3 of the survivor memory.
        % the trace back is employed while the ACS is employed too.
surv_rd_add = [surv_rd_add_h, surv_rd_add_l];          % RD ADD of survivor memory
for k = 1:Dd + 2                          % trace back loop,
        surv_rd_add_l_old = surv_rd_add_l;   % save old address
            surv_rd_add_l = survivor(surv_rd_add);    % read survivor memory
        surv_rd_add_h = dec(surv_rd_add_h);           % circular decrement
    if k >= Dd,                      % Get 3 output symbols
            out(0:2) = f(surv_rd_add_l, surv_rd_add_l_old)  % output 3 bit symbols
    end
end
```

The branch metrics are calculated after one symbol in normal mode and after two symbols in fallback mode, and then are stored in memory. The precomputed branch metrics are then used to calculate the path metrics. In fallback mode, the branch metrics of the two symbols are computed by summing the two square distances to each QPSK symbol. The branch metrics of the decoded symbols are summed to obtain one branch metric as in normal mode.

The particular trellis code selected for implementation in the invention is rotational invariant with no parallel paths and 16 states.

After the Viterbi Decoder 850 outputs the correct data for each timeslot on bus 854, deframer 856 reassembles the data into the time division multiplexed timeslots in which these same data originally arrived at the framer circuit of the transmitter for encoding and CDMA spreading. The deframer 856 also descrambles the data to undo the effects of the scrambling carried out by the scrambler 524. The resulting TDMA stream of 9-bit bytes is output on serial data format bus 858. Each 9-bit byte in this data stream is comprised of the deshuffled, descrambled three tribits into which it was originally broken in the framer of the transmitter to form the three symbols of the frame during which this 9-bit byte was transmitted.

The output bus 854 from the Viterbi Decoder 854 is also coupled to a command and control channel circuit 860 which stores and/or processes codes sent on the command and control channels in the downstream data. Some switching or multiplexing function to select the command and control codes out of the stream of data on bus 854 is provided but is not shown. Codes sent on the access channel in the upsteam or downstream data are stored and/or processed by an access channel circuit 862 which receives these codes from the output of the Viterbi Decoder 850 via bus 854. The command control code data is input to C3 circuit 860 from the Viterbi Decoder via bus 854. The CPU 405 accesses the command and control data and access channel communications from the C3 circuit 860 and the access channel circuit 862 via bus 1096. The processing of the command and control channel codes and access channel codes may also occur in circuits 860 and 862, respectively, in alternative embodiments without interaction with the CPU, or the codes may simply be buffered in circuits 860 and 862 until they can be read by a management and control process performed in the CPU 405.

The ranging process in its various embodiments described earlier herein is aided by the R/Tng circuit 763, This circuit receives an RU/CU signal on line 759 from the CPU 405 which tells the circuit whether it is performing its function in an RU or a CU. In the preferred embodiment, circuit 763 is simply a DMA FIFO which stores status information regarding positioning of the barker codes in the guardbands during the ranging and initial frame synchronization process. This status information is received from the frame detector 882 via bus 883. This data is relayed to the CPU 405 via DMA transfers over bus 755 to a memory (not shown) coupled to the CPU 405. If it is performing its function in an RU, circuit 763 stores status data generated by the frame detector circuitry in implementing any of the functions indicated for any selected one of the embodiments of the RU in the ranging, contention resolution and authentication flow charts of FIGS. 7A–7C, 8, 9 and 29–33. This data may include data as to how many ranging pulses appeared in the gap and data to be sent to the ranging circuit 510 in the transmitter via bus 757 for purposes of setting transmit frame timing delay. These messages to the transmitter on bus 757 include data telling the transmitter ranging circuit 510 when the barker code or other signal from the CU has been received in each frame (transmission 80 in FIG. 4B) thereby establishing the receive frame timing reference, whether to transmit another ranging pulse after contention resolution, and how to adjust the delay factor that establishes the transmit frame timing reference before sending each ranging pulse or barker code, and, in some embodiments, what barker code to transmit.

In the preferred embodiment, command, communication and control (C3) circuit 860 receives message traffic involved in the ranging, authentication and media access control processes as detailed in the flow charts of FIGS. 7–9 and FIGS. 29–33 and transmits this data to CPU 405 via bus 1096. Such data includes data from the CU indicating when authentication is desired and data regarding when to start sending that particular RUs authentication code. Circuit 860 also receives the authentication code broadcast by the CU after an authentication interval to determine if it is the RU that hit the gap. If so, circuit 860 sends a message to the transmitter via CPU 405 to freeze its current value for the transmit frame timing reference delay at the value last used for transmission of the ranging pulses in the authentication code sequence. The circuit 763 also monitors the control channel for instructions from the CU on how to adjust its transmit frame timing reference delay to exactly center the ranging pulse in the center of the gap.

If the signal on line 759 indicates the receiver of FIG. 34 is operating in a CU, the circuit 763 carries out those functions indicated for any selected one of the embodiments of the CU in the ranging, contention resolution and authentication flow charts of FIGS. 7A–7C, 8, 9 and 29–33. Circuit 763 stores data received on bus 883 regarding how many barker codes have appeared in the gap during ranging and authentication and data regarding how many RUs have hit the gap, data determining the position of the barker code(s) in the gap, and data ordering changes of position of the barker code in the gap, data resulting from scanning the gap for additional unwanted pulses at the edges of the gap. This data is read by the CPU and used to compose messages for transmission by the transmitter on the control channel such as "no codes in gap-adjust your delays and try again", "one code in gap", "multiple codes in gap-enter contention resolution", "move barker codes x chips left or right", "saw sequence xxxxxxx in gaps during authentication frames", "no activity in gap during authentication interval-reexecute your contention resolution protocols" etc.

Clock Recovery

The RUs cannot begin the process of ranging until they have synchronized to the master clock of the system. The master clock runs in the CU and is encoded into the downstream data sent from the CU to the RUs during the gaps. The downstream data is comprised of the barker codes sent every frame by the CU to the RUs during the gaps between frames. All the RUs synchronize to this downstream data by extracting the master clock signal therefrom thereby achieving clock synchronization and frame synchronization. Frame synchronization, as that term is used in the clock recovery context, only means the RUs know when the CUs frames start. Frame synchronization, as the term is used for ranging or training purposes, refers to the establishment of the proper transmit frame timing reference delays in each RU such that each RU hits the middle of the gap with its ranging pulses such that all symbols transmitted by each RU, regardless of differences in location and propagation delay arrive simultaneously at the CU for despreading. Clock recovery from the barker codes transmitted during the gaps is done using phase lock loop 880, voltage controlled oscillator 784, phase detector 778, control loop 781 and loop filter in frame detector 882 in FIG. 34. The phase detector 778 determines the phase error by comparing the phase of the clock signal derived from the barker code received from the CU to the phase of the local oscillator clock generated by the PLL 880 and generates a phase error signal on bus 780. This phase error signal is passed by control loop 781 to the voltage controlled oscillator 784 which changes its frequency in a direction to eliminate the phase error. The phase of the local oscillator clock is derived from a signal on bus 884 from time base generator 886. The time base generator generates the needed bit clock, byte clock, chip clock and other timing signals from the local oscillator signal received on line 888.

Equalization Training Process

Referring to FIG. 45, there is shown a flow chart for the process carried out by the RUs to carry out "training" Training determines channel impairments and set coefficients into precode filters to predistort their transmissions such that their data transmissions arrive at the CU undistorted. Training, in the preferred embodiment, also causes the modem to set the optimum transmitter power level and perform fine timing alignment. Training is performed immediately after ranging and periodically thereafter. If the insertion loss, phase response and group delay were known for the channel and the effects of dispersion on the pulse shapes were known, intersymbol interference could be effectively controlled by the matched filters 761 in the receiver of FIG. 34 and 570 in the transmitter of FIG. 28A. However, even if these characteristics were known in advance, they tend to vary over time. Hence, in the preferred embodiment, an adaptive equalization process is performed to set variable coefficients in tapped delay line equalization filters to correct for the combined effects of residual distortion and noise caused by a dispersive and noisy channel. Prechannel equalization is performed in each RU and CU transmitter, and post channel equalization is performed in each RU and CU receiver. This allows the equalized system to approach the ideal condition specified by the Nyquist criteria for distortionless transmission free of intersymbol interference so as to realize the full data carrying capacity of the channel. The adaptive equalization filters are tapped delay line filters in some embodiments with the tap delays equal to one chip time. In the preferred embodiment, the post channel filters are decision feedback equalizers. The equalization filters on both the transmit and receive side are embodied in precode equalization filter 563 in the transmitter of FIG. 28A and the FFE (feed forward) filter 764 and DFE (decision feedback) filter 820 along with least mean square calculation circuit 830 and difference calculating circuit 832 in the receiver of FIG. 34.

Figure 45A:
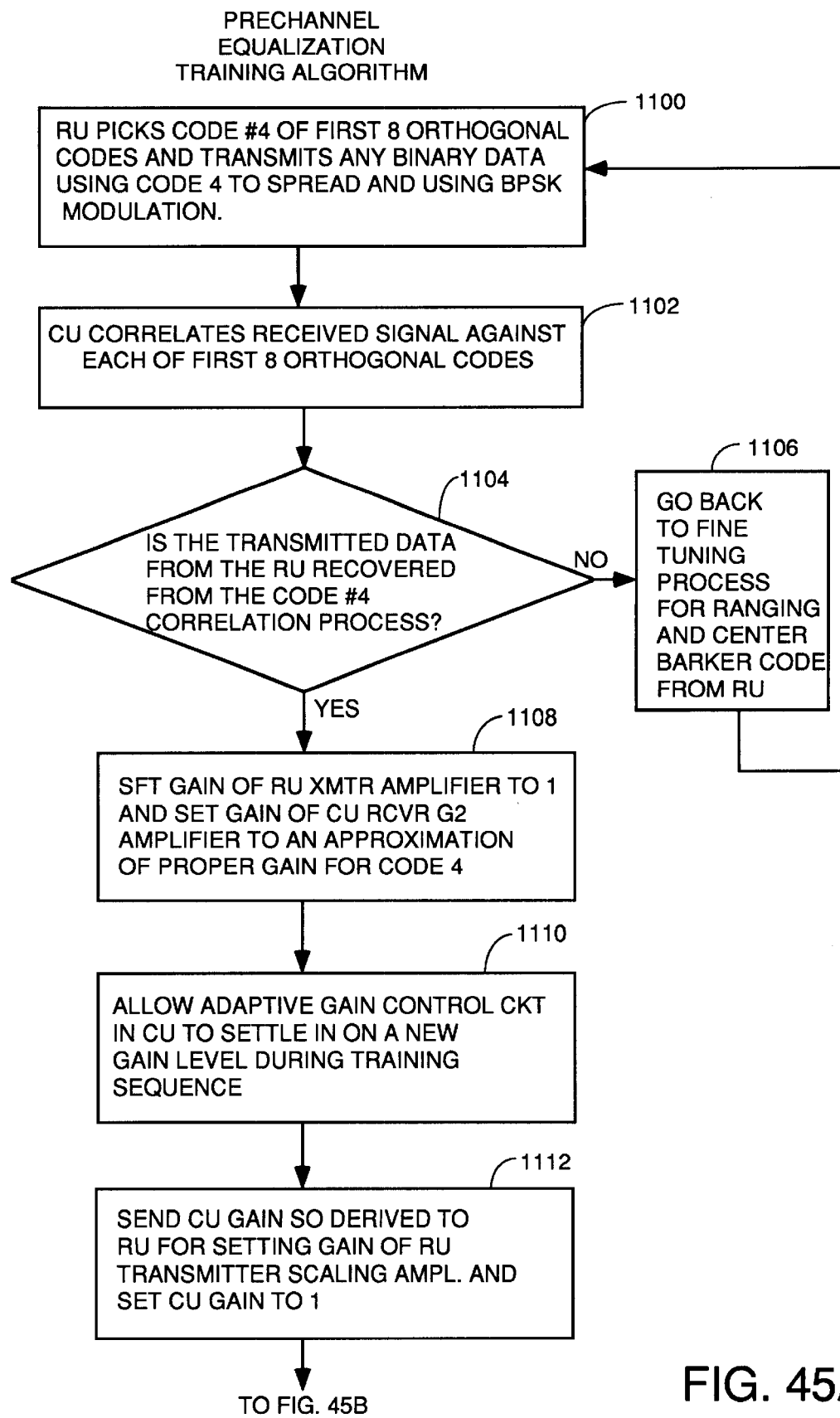
FIG. 45 is a flow chart showing the equalization training algorithm for both the upstream and downstream directions.
Figure 45B:
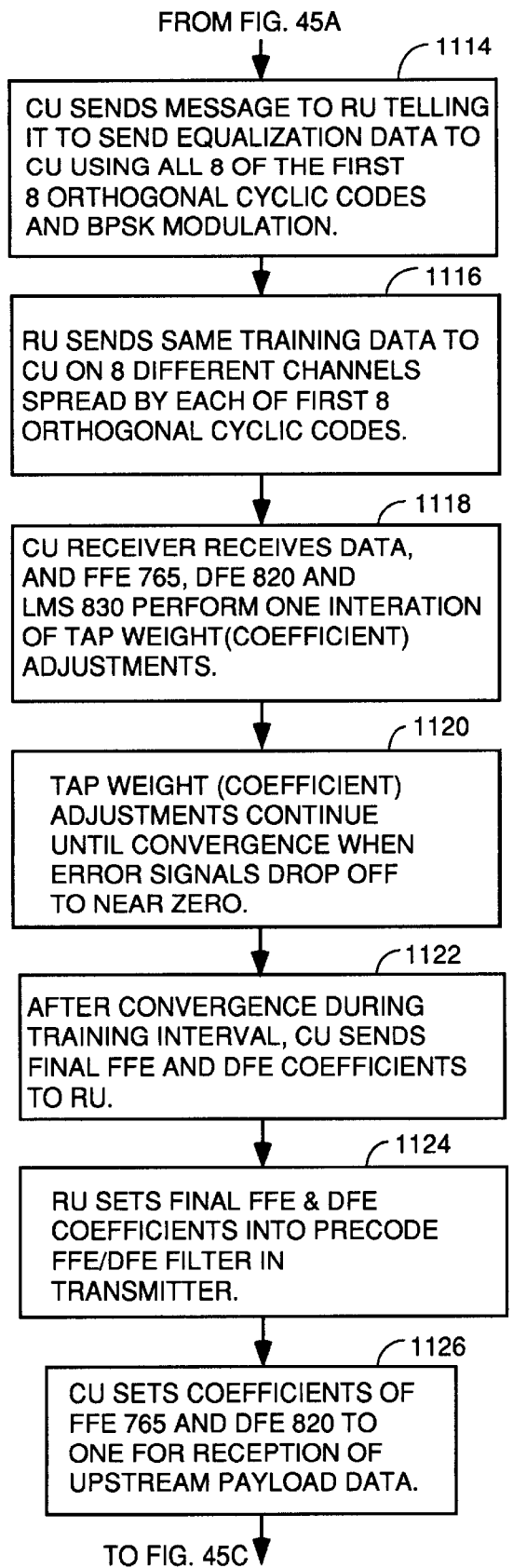
Figure 45C:
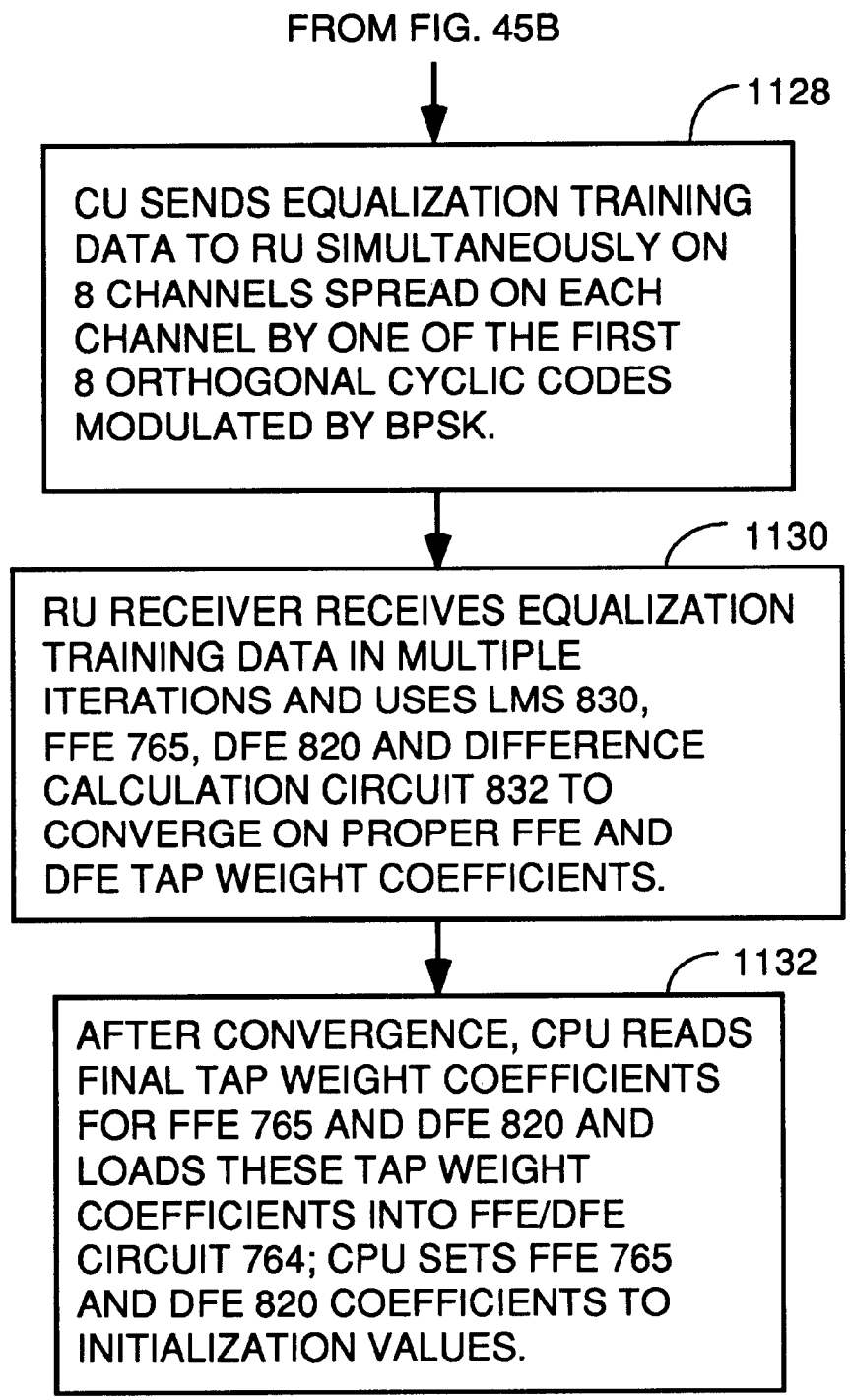

The equalization training process occurs in every RU as part of its startup sequence. The prechannel equalization process starts with establishment by the RU controller of default precoder coefficients, a default transmit power level (input on line 566 to the scaler amplifier 564 in FIG. 28A)

and a default fine timing alignment value in the preferred embodiment. Next, step 1100 in FIG. 45 is performed to transmit data on code #4. The RU uses only the first 8 CDMA codes during the equalization process. Step 1100 represents the process of transmitting any binary data bit sequence (preferably a pseudorandom sequence) to the CU using code #4 of the first 7 or 8 orthogonal spreading codes (the first 8 codes will be assumed for this example but it could be other numbers of sequential cyclic codes as well) to spread the data and using bipolar phase shift keying (BPSK). In step 1102, the CU correlates the received data signal, after BPSK synchronous demodulation, against each of the first 8 orthogonal, cyclic spreading codes. BPSK has only a two point constellation, so the CU is expecting to receive either of these two points from the correlation done between code #4 and the received signal if the ranging process has been done correctly. If the ranging process has not been properly fine tuned to put the RU's barker code in the center of the gap, then the output data sent by the RU will be output from one of the other correlation processes which use one of the other 8 orthogonal, cyclic spreading codes. Each of the orthogonal, cyclic spreading codes is generated by shifting the code used during the previous chip time by one bit position. Therefore, each of the first 8 orthogonal, cyclic spreading codes is effectively different from its neighboring codes by one bit position and one chip time. If during the ranging fine tuning process, the barker code was not exactly centered, the data transmitted by the RU will not be output by the correlation against code 4 but will be output by the correlation against one of the other codes depending upon how many chips away from the center of the gap the RU barker code is found. Step 1104 is a test to determine if the data transmitted by the RU is output by the correlation against code #4. Step 1104 is preferably performed by checking the amount of code crosstalk by monitoring the demultiplexer memory. The CU also monitors the power level of the RU transmission by adapting the 4th tap of the FFE. If the training data did not come through purely on code #4 and crosstalk exists, it means the frame alignment is not perfect so step 1106 is performed to go back to the fine tuning process for ranging and center the RU barker code in the gap. Step 1106 also symbolizes the process, in some embodiments, of computing a new power level and fine alignment value based upon measurements and sending them downstream to the RU in training. This process is repeated until the power level and frame alignment are within predetermined acceptable values of precision. The foregoing process of sending the proper power level to the RU from the CU may take the form of steps 1108, 1110 and 1112 in FIG. 45A. Step 1106 represents the process of telling the RU to go back to ranging and doing a fine alignment process in some embodiments, but in the preferred embodiment, it is not necessary to do the full fine tuning process detailed above for ranging since the CU knows exactly how far away from the center of the gap the data landed by virtue of which correlation computation put out the correct transmitted data. Therefore, if the code 3 correlation put out the transmitted training data, the transmit frame timing delay for this RU is off by one chip, and the CU sends a message to that RU telling it to move one chip toward the center.

Therefore, the equalization training algorithm acts as a cross check on the quality of the ranging fine tuning process. In the preferred embodiment, the CU has an array of 8 correlators each of which correlates the received data using one of the first 8 orthogonal cyclic spreading codes. This arrangement is used for maximum speed. In other embodiments, a single correlator can be used on the buffered received data with the first 8 orthogonal cyclic codes being supplied during successive correlation intervals. In other alternative embodiments, the correlation can be done in serial or parallel in software.

The equalization process also is used for power alignment. Power alignment of all the RUs is the process of setting their transmit powers so that their transmissions all arrive at the CU at approximately the same power level. This is important in preventing interference between the signals from different RUs as well as in allowing the CU receiver's detectors to properly interpret the QAM 16 constellation points which are distinguished from each other in part by their amplitude levels. This process is started with step 1108 in which the RU transmitter causes the gain of scaling amplifier 564 to be set to one. The CU receiver control circuitry then causes the initial gain level for code 4 to be retrieved from memory 796 and transmitted through control loop 781 to the gain control input 790 of G2 amplifier 788. This initial gain level set into G2 amplifier 788 is an approximation of the proper gain level needed for this amplifier to allow slicer 800 to make proper decisions. Next, in step 1110, the CU waits for its adaptive gain control circuitry to settle in at a gain level needed for low or no error interpretation of the BPSK modulated data being sent during the training interval. The adaptive gain control circuit is comprised of slicer 800 which outputs amplitude error numbers on bus 798 in FIG. 34 to control loop 781. The control loop compares the amplitude error numbers to the current gain set on bus 790 and tries to adjust the gain number on bus 790 to minimize the slicer amplitude error between the actual received amplitude of the training data BPSK constellation points and the desired amplitude for them. This process continues for a number of iterations by the end of which the gain of amplifier G2 will have been set at a value which reduces the slicer amplitude error by as much as possible. Finally, in step 1112, the CU takes this gain number on bus 790 (by reading the gain level on bus 790 from memory 796 via bus 797) and transmits it to the RU telling the RU to set that gain level as the gain of scaler amplifier 564 in FIG. 28A. The CU then sets the gain of G2 amplifier 788 in FIG. 34 to one by writing a one into memory 796 as the gain level for code 4. Since the overall gain of the system for code 4 is the gain of the RU transmitter amplifier times the gain of the CU receiver amplifier, the overall gain of the system does not change by swapping the gains. This power alignment process happens only for the RUs. Each RU when it powers up has its gain level aligned in this manner and will use that gain level for subsequent operation sending payload data until the power alignment is subsequently performed again.

Processing now moves on to the process of equalization process for both the upstream and downstream data path equalizers. The idea in downstream equalization is to set the tap coefficients of the FFE equalization filters in the RU receiver to values which equalize for channel impairments based upon errors observed in training data sent via the 8 training codes by the CU to the RU. The idea in upstream equalization is to set the tap coefficients of the precode filter in the RU transmitter to values which equalize channel impairments based upon information received from the CU receiver after training data is sent by the RU to the CU using the 8 training codes. The 8 training codes are the first 8 orthogonal, cyclic codes. They can and are used simultaneously in both the upstream and downstream directions (as are the rest of the codes) because the upstream transmissions are on a different frequency from the downstream transmissions. Although the flow chart of FIG. 45 (comprised of FIGS. 45A through 45C) shows the upstream equalization process first, starting with step 1114, both the upstream and downstream equalization processes are occurring simultaneously.

The first steps in the upstream equalization process are symbolized by steps 1114 and 1116 wherein, in step 1114, the CU sends a message to the RU telling it to send some equalization training data (any data but preferably a pseudorandom PN sequence) to the CU using all 8 of the first 8 orthogonal, cyclic codes. In the preferred embodiment, the CU requests that the RU send the training data using only one of the codes as a first transmission and then asks that the same data be sent using the other codes one code at a time or in small groups. This is the preferred method because if the RU's equalization filter coefficients are very far off the correct values, the transmissions by the RU in training will cause less intersymbol interference with payload data transmissions by other RUs that have already trained. However, in alternative embodiments, the training data may be spread by all 8 of the first 8 codes and the results simultaneously transmitted. Step 1116 represents the process of sending the training data as spread by the first 8 codes to the CU either seriatem or all at once.

Step 1118 represents the process performed in the CU of receiving the equalization training data and using FFE equalizer 765, DFE equalizer 820 and LMS circuit 830 to perform one iteration of tap weight (adaptive coefficient) adjustment for the tap weights of the FFE and DFE. Step 1120 represents the process of continuing to make tap weight adjustments on subsequent transmissions of equalization training data using the same first 8 orthogonal spreading codes until convergence is achieved when the error signals computed by difference calculation circuit 832 in FIG. 34 drop to near zero.

Figure 37:
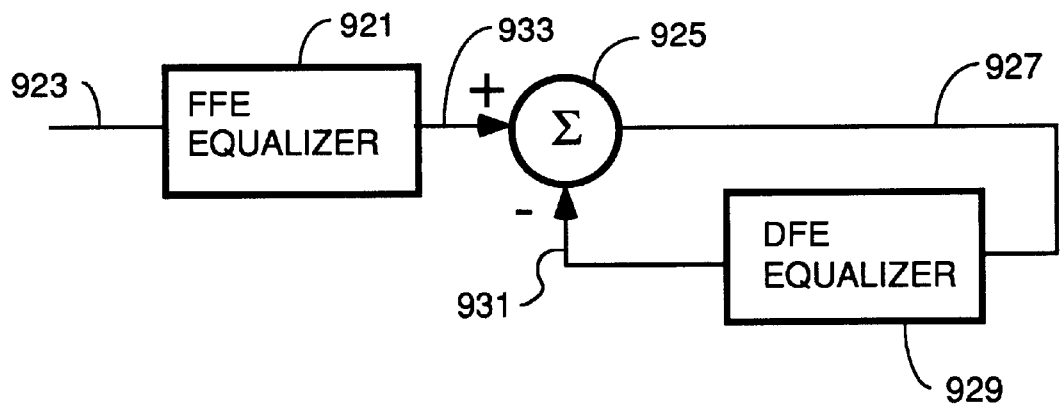
FIG. 37 shows a diagram of the FFE/DFE equalization circuits that are used for the precode equalization filter 563 in the transmitter of FIG. 28A and the FFE/DFE circuit 764 in the receiver of FIG. 34.

After convergence, step 1122 is performed wherein the CU sends the final tap weight coefficients from FFE 765 and DFE 820 to the RU. This can be done by the CPU 405 reading the tap weights from shared memory in which LMS stores them via bus 833 and transmitting them to the RU on the command and control channels. The RU then sets these final tap weight coefficients into FFE and DFE equalizers within the precode equalization filter 563 in the transmitter of FIG. 28A, as symbolized by step 1124. A block diagram of the structure of the precode equalization filter 563 in transmitter of FIG. 28A and the FFE/DFE equalizer 764 in FIG. 34 is shown in FIG. 37. The FFE/DFE circuits are comprised of a conventional FFE equalizer which receives the input data on bus 923 and outputs its results on bus 933 which is coupled to the + input of a difference calculating circuit 925. The − input of the difference calculating circuit receives the output of a conventional DFE equalizer 929 via bus 931. The output of the difference calculating circuit 925 on bus 927 is coupled to the input of the DFE equalizer 929.

Finally, the CU, in step 1126, sets the tap weight coefficients of FFE and DFE equalizers 765 and 820, respectively to one, for reception of upstream payload data.

In some embodiments, after the CU sends its tap weight coefficients to the RU in step 1122, the process of steps 1114, 1116, 1118 are performed again for several interations. The coefficients extracted from the CU adaptive equalizer on the second and subsequent iterations cannot be used directly in the precoder, since they were not produced from default precoder values. Instead, the new coefficients for use by the RU are computed as the convolution of the old precoder coefficients with the new adaptive equalizer coefficients. At each iteration, the CU evaluates the coefficients extracted from the adaptive equalizer, and when the errors have dropped below a predetermined threshold indicating that the RU is transmitting with adequate quality, then the training process is completed except for downstream training.

Regardless of which upstream training embodiment is used, processing proceeds to the downstream equalization training process after completion of the upstream equalization process. This downstream equalization process starts with step 1128 wherein the CU send equalization training data to the RU using all 8 training codes. Specifically, the CU sends a PN sequence simultaneously on 8 channels, each channel spread by one of the first 8 orthogonal, cyclic codes modulated using BPSK. Step 1130 symbolizes the process of the RU receiver receiving the equalization training data in multiple iterations and using the LMS circuit 830, the FFE equalizer 765, the DFE equalizer 820 and the difference calculating circuit 832 to converge on the proper FFE and DFE tap weight coefficients for the FFE equalizer 765 and the DFE equalizer 820. After convergence, the CPU reads the final tap weight coefficients for the FFE equalizer 765 and the DFE equalizer 820 via bus 833 and sends these tap weight coefficients to the FFE/DFE circuit 764 via bus 822 to use as the FFE and DFE tap weight coefficients there, as symbolized by step 1132. The CPU 405 then sets the tap weight coefficients of the FFE 765 and DFE 820 to initialization values so that they can reconverge as payload data is sent. In some embodiments, step 1132 also involves sending a training status message indicating the success or failure of training, an indication of success being an implicit request to the RU to disable training transmissions on all channels. In some embodiments, the RUs run a command timer during training, and if the RU fails to get or fails to properly decode a new training command within the specified interval, it discontinues training transmissions. Since the training channel is a single access shared resource, any RU to continues to transmit on this channel will block all other RUs from training.

The iterations of the processes symbolized by FIG. 45 occur every few milliseconds, and convergence occurs within a fixed amount of time. The processes are repeated every 2 minutes in some embodiments, and in other embodiments, retraining occurs both periodically and immediatly upon activation of its first and any subsequent timeslot assignments. In some embodiments, retraining occurs periodically as some lesser interval when an RU has not active timeslots and when a link quality monitoring process reports poor quality transmission. Retraining usually only takes 2 iterations for power and time alignment and one iteration for filter adaptation. In one embodiment, the CU does correlation between the coefficients currently being used by the RU and extracted coefficents on subsequent iterations. This means that the CU must know what coefficients the RU is currently using either by keeping a mapping of those coefficients in CU memory or by requesting them from the RU via upstream message.

After equalization training, the RU link to the CU is active, and the RU can begin receiving messages after receiving a hello message from the CU. The hello message gives the RU the CU's software revision number and the superframe offset number. The revision number allows the RU to check its software revision number for compatibility, and the superframe offset number is set into a SFDOR register in the RU receiver time base for use in correctly reproducing an external time division multiplex stream superframe signal at the appropriate spot in the data stream so that external devices that depend upon the superframe signal can correctly interpret the TDM data.

Figure 46:
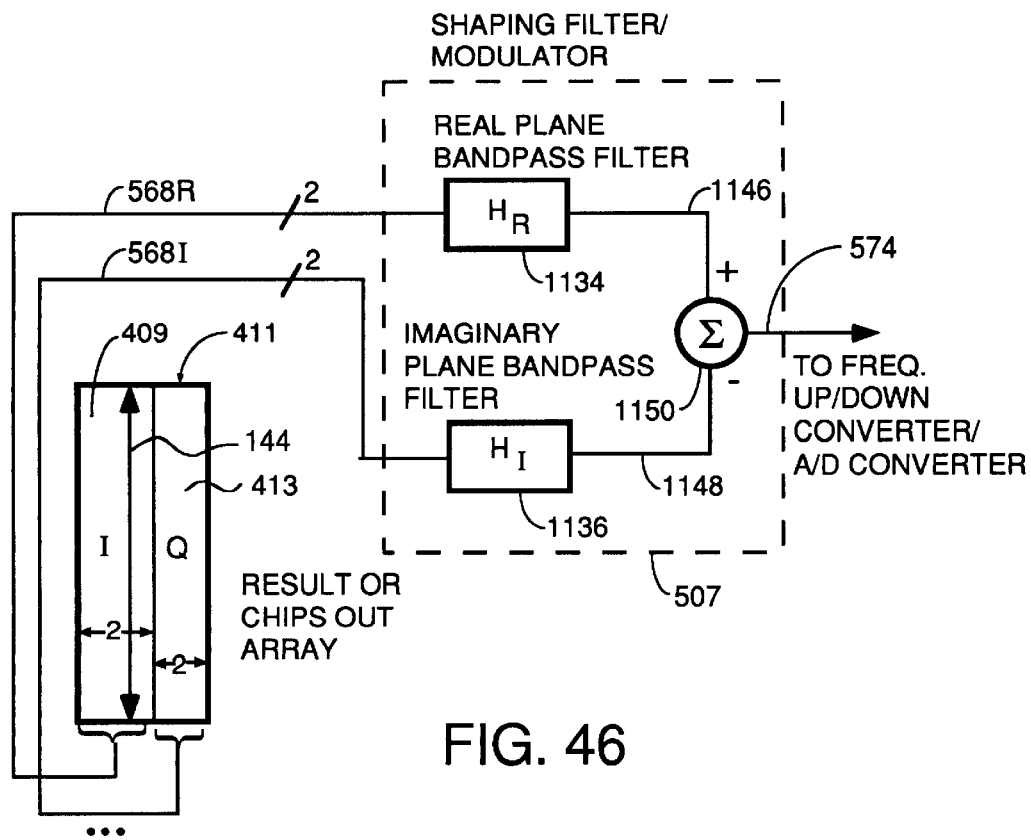
FIG. 46 is a block diagram of the preferred form of modulator using raised cosine shaping filters whose transfer functions are Hilbert transforms of each other.

Referring to FIG. 46, there is shown the preferred form of the modulators used in the RU and CU transmitters. In the modulator of FIG. 24, multipliers are used to multiply the incoming data times the local carrier signals. The local carriers are sine and cosine signals of the same frequency which are separated from each other by 90 degrees of phase so as to be orthogonal. The result is two orthogonal RF signals bearing the inphase and quadrature information.

This same result can be achieved in a substantially different way by using Hilbert transform filters and Carrierless Amplitude and Phase Modulation. In the preferred form of modulator 507 shown in FIG. 46, the multipliers 429 and 435 and local oscillator 425 and phase shift circuit 439 in FIG. 24 are completely eliminated thereby resulting in a less expensive, less complex modulator that achieves the same result as the modulator of FIG. 24. Specifically, shaping filter/modulator 507 of FIG. 46 receives inphase (real) and quadrature (imaginary) digital inputs (or analog) on buses 568$r$ and 568$i$. Although, buses 568$r$ and 568$i$ are shown in FIG. 46 as originating at the results array for clarity of illustration, in the preferred transmitter of FIG. 28A, they actually originate from the output of the scaling circuit 564. In some embodiments, the scaling circuit 564 and the precode equalization filter 563 can be eliminated where higher error rates or less payload capacity can be tolerated.

Figure 47:
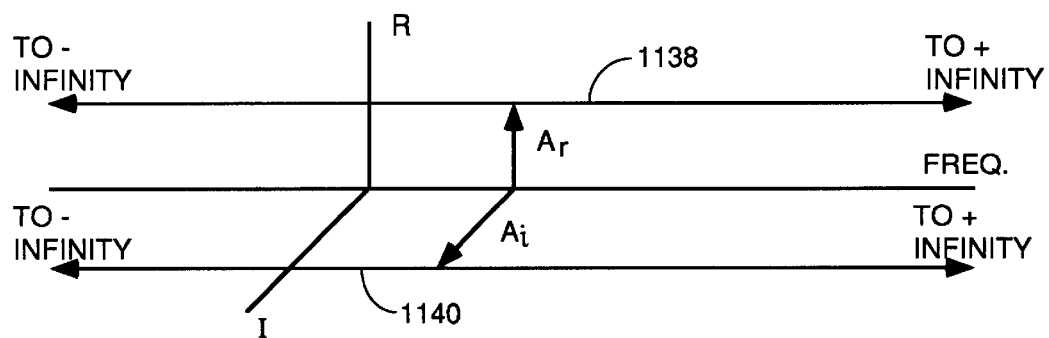
FIG. 47 is a frequency domain diagram of the spectra of the real and imaginary baseband data signals after direct sequence spreading.

The Fourier spectrum of the baseband, orthogonally code division multiplexed data on bus 568$r$ is shown as a constant amplitude spectrum 1138 of amplitude A$_r$ on the real axis in FIG. 47. The Fourier spectrum of the baseband, orthogonally code division multiplexed data on bus 568$i$ is shown as a constant amplitude spectrum 1140 of amplitude A$_i$ on the imaginary axis in FIG. 47 The direct sequence spread spectrum techniques employed in the transmitters according to the teachings of the invention has the effect of spreading the energy of the signals represented by the information vectors from minus infinity to plus infinity at a constant amplitude. Because any 6 mHz wide section of the spectrum of FIG. 47 can be selected with a passband filter and all the channel data therein recovered, this fact is employed to simultaneously carry out carrierless amplitude and phase modulation as well as filtering to satisfy the Nyquist criteria in shaping filter/modulator 507. To do this, two shaping filters 1134 and 1136 in modulator 507 are coupled to receive the signals on buses 568$r$ and 568$i$, respectively. Filter 1134 has its filter characteristics set (programmably by CPU 405 in some embodiments) to establish a squared raised cosine passband filter characteristic 1142 in the real plane of the frequency domain shown in FIG. 48. The passband filter characteristic has a bandwidth of 6 mHz and is centered on an intermediate frequency Fc which is established at a frequency which can be easily and conveniently achieved in a digital filter. The output signals of the filter are ultimately sent to digital-to-analog converter 576 in FIG. 28A and from there to an up/down converter 577. The function of the up/down converter 577 is to raise the frequency to a frequency in the middle of the band devoted to digital data communication to implement the CATV or cellular system supplemental services on the shared transmission media 24. The frequency is altered by the converter 577 to a frequency appropriate to the upstream or downstream direction in which the transmitter is sending data at a frequency which is located so as to not interfere with, for example, cable television programming also carried on the same media.

Figure 48:
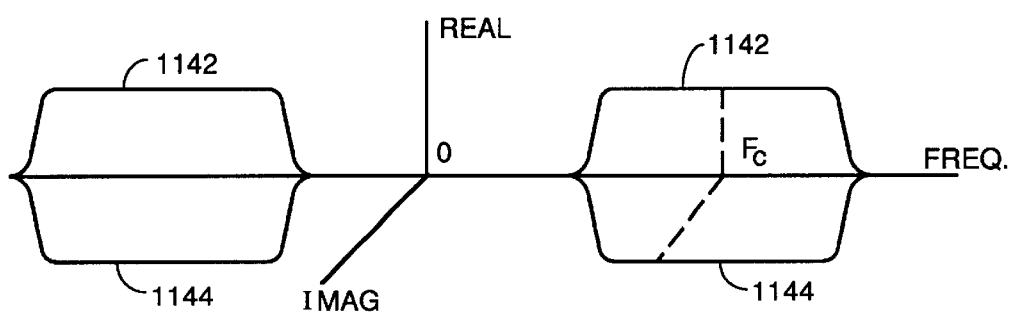
FIG. 48 is a frequency domain diagram illustrating the orthogonality in the frequency domain of the passband filter characteristics of the two shaping filters used in the modulator of FIG. 46.

Filter 1136 also has a squared raised cosine passband filter characteristic 1144, but its filter characteristic is located in the imaginary plane of the frequency domain shown in FIG. 48. The passband filter characteristic has a bandwidth of 6 mHz and is centered on an intermediate frequency Fc which is easy to attain in digital filter design. To insure orthogonality between the real and imaginary data output signals on buses 1146 and 1148, the transfer function of filter 1136 is the Hilbert transform of the transfer function of filter 1134.

When the baseband spectra of FIG. 47 for the real and imaginary signal components are passed through filters 1134 and 1136, the resulting Fourier spectra of the digital data on buses 1146 and 1148 are as shown in FIG. 48. These spectra contain all the encoded information from the real and imaginary information vectors encoded by the orthogonal code multiplexer 527 for reasons which will be understood by those skilled in the art of spread spectrum systems. These digital signals on buses 1146 and 1148 are summed in summing circuit 1150. The result is output on bus 574 to the analog-to-digital converter 576 in FIG. 28A for conversion to analog signals which are then raised in frequency by frequency converter 577.

Demodulation of these spread spectrum signals is accomplished in a known manner.

Figure 49:
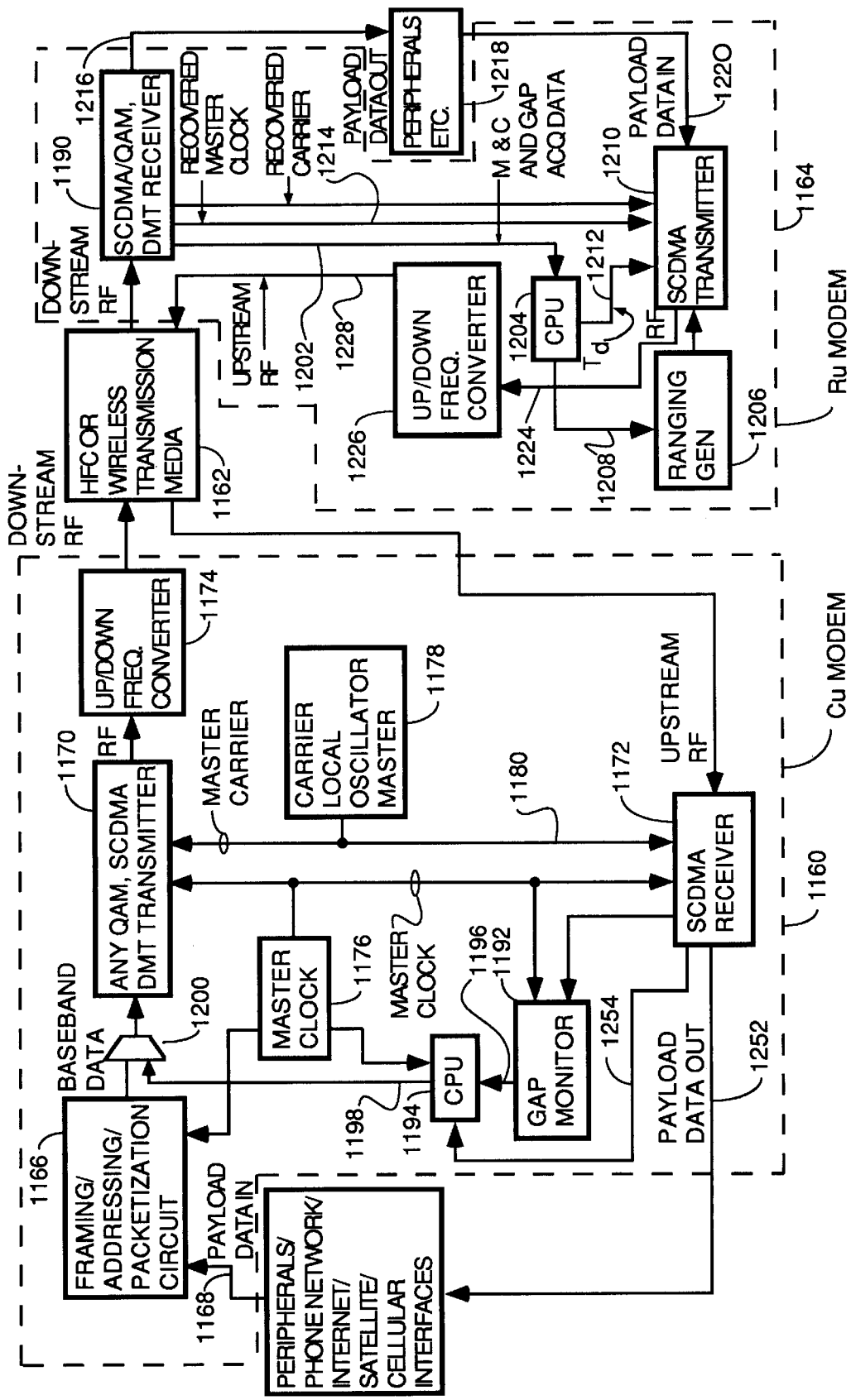
FIG. 49 is a block diagram of a system according to a broad teaching of the genus of the invention.

Referring to FIG. 49, there is shown a block diagram of an alternative embodiment of a system employing CU and RU modems according to the genus of the invention. The system comprises a CU modem 1160 coupled by an HFC (hybrid fiber coax) or wireless transmission media such as a cellular or satellite radio transmission system 1162 to one or more RU modems 1164. The purpose of the CU modem is to provide a multiple-user and/or multiple-source simultaneous digital data communication facility over a limited bandwidth channel such as 6 megahertz to one or more remote unit modems coupled to the CU modem by a shared RF transmission media.

The CU modem transmits data in the downstream direction toward the RU modems using a transmitter 1170 that uses digital data to modulate one or more radio frequency carriers that are transmitted over the media 1162 after frequency conversion by up/down frequency converter 1174 to the proper assigned downstream channel frequency. The transmitter can use any modulation scheme which can transmit a master clock reference and a carrier reference signal to the RU modems for clock and carrier synchronization purposes there, said clock and carrier references being transmitted either in-band or out-of-band. Data is transmitted in frames which the RU receiver detects. The RU transmitter achieves frame synchronization by the ranging processes described elsewhere herein. Examples of modulation schemes that will work for the downstream direction CU transmitter are QAM, SCDMA or DMT (digital multitone transmitter). Any of the conventional transmitters described in the books incorporated by reference herein will suffice for the CU transmitter, but an SCDMA transmitter is preferred. Non-SCDMA modulation schemes can be used in the downstream direction because the noise and interference problems are less severe than in the upstream direction.

The definition of "in-band" transmission of the clock and carrier is that one or more channels which would otherwise be used to transmit payload data are dedicated to transmitting the clock and carrier signals. The definition of "out-of-band transmission is that a separate carrier or some other subchannel/sideband etc. modulation scheme is used to transmit the clock and carrier information so that no timeslot or packets that could be used to send payload data is used to send clock and carrier information. The master clock signal is generated by master clock 1176 and the carrier reference signal which is modulated by transmitter 1170 is generated by master carrier local oscillator 1178.

The CU modem transmitter has a framing/addressing/ packetization circuit 1166 which functions to receive payload data at an input 1168 and organizes said data into frames and addresses the data to the proper destination RU modem and the proper peripheral device coupled to that modem. The manner in which this is done is not critical to the invention so long for the downstream data as the data is organized into frames since the upstream data is transmitted by SCDMA (synchronous code division multiple access). SCDMA is defined as transmission of frames of spread spectrum signals with data from different channels spread using orthogonal pseudorandom spreading codes, said frames being synchronously transmitted from different RUs located at diverse locations such that all frames of corresponding frame number from all RUs arrive at the CU modem at the same time for despreading and decoding by the inverse code transformation that was used in the RU transmitter to spread the spectrum of the data using the orthogonal, pseudorandom spreading codes. The CU transmitter's framing addressing circuit 1166 can have the structure and operation of the framing circuit 400 in FIG. 19 if the transmitter 1170 is an SCDMA or DMT transmitter. If the transmitter 1170 is, for example, a QAM transmitter, the framing/addressing circuit 1166 organizes the data into frames and places data bound for specific RU modems into timeslots assigned to those modems. The data in these timeslots of each frame assigned to a particular RU modem will includes header bits which tell the RU modem to which particular peripheral or other destination the data in these timeslots is addressed and may include other information such as packet delimiters which define the start and stop timeslots of each packet destined to a particular peripheral or byte counts etc. which tell the RU how many timeslots of data to collect for a complete packet destined for a particular destination coupled to that RU. Basically, the function of the framing/addressing/packetizing circuit includes organizing the payload data such that information as to which remote unit modem and peripheral each payload data byte is directed to can be determined.

The CU modem receives upstream radio frequency signals modulated with digital data by the RU modems using an SCDMA receiver 1172. The function of the SCDMA receiver is to synchronously extract the payload data from the upstream RF signals. This upstream payload data was synchronously modulated onto the upstream RF carrier by an SCDMA transmitter in the RU modem using orthogonal, pseudorandom spreading codes to spread the spectrum of the payload data received by the RU modem followed by a suitable modulation scheme such as QAM to use the data resulting from the code transformation spreading process to control some one or more characteristics of one or more RF carriers. The CU receiver 1172 can have the structure of the receivers of FIG. 19 or 34 or the more basic, but lower performance structure of FIG. 50.

The RU modem 1164 has the following structure. A receiver 1190 having a demodulator and detector compatible with the type of modulation performed in the CU transmitter is coupled to the transmission media. The function of the RU receiver is to receive downstream RF signals transmitted in frames by the CU transmitter and sychronously extract payload data transmitted by the CU and any management and control data transmitted by the CU to coordinate the process of achieving frame synchronization. The RU receiver also functions to recover the master clock and to recover the carrier used by the CU transmitter. The recovered master clock signal is distributed on bus 1214 to all RU circuits that need it including the SCDMA transmitter 1210. The recovered carrier signal is distributed by receiver 1190 on bus 1216 to all circuits that need it including the SCDMA transmitter 1210. Recovery of the clock and carrier signals can be performed as described elsewhere herein or in any other conventional manner described in the references incorporated by reference herein. The preferred method of recovering the clock is by encoding the clock into barker codes sent during every gap by the CU and using a gap monitor/ frame detector circuit like that shown in FIG. 38 to generate clock steering signals from the CU transmitter barker codes and then using the steering signals to keep a local clock oscillator in synchronization with the master clock 1176. The preferred method of recovering the carrier is by dedicating one channel or timeslot to a pilot tone that defines the phase and frequency of the carrier generated by the master carrier local oscillator 1178 in the CU and monitoring that channel to generate steering signals to keep a local oscillator in the RU synchronized.

The RU receiver 1190 can have the structure of the receivers described in FIGS. 19 and 34 as well as described alternatives and functional equivalents thereof or it can have the structure of conventional receivers described in the treatises incorporated by reference herein, so long as whatever structure it has is capable of decoding and extracting the payload and management and control data transmitted downstream by the CU transmitter. The extracted payload data is output on bus 1216 for use by peripherals and interfaces to other networks or processes represented by block 1218.

An RU transmitter 1210 receives payload data on bus 1220 from the peripheral devices or processes and organizes that data into frames of the same size as the CU frames. The data so framed then has its Fourier spectrum spread by the transmitter over a bandwidth much larger than said data originally had usually by orthogonal code division multiple access encoding or by performing an inverse Fourier transform operation. If code division multiple access is used, the spread spectrum data is then modulated onto one or more radio frequency carrier signals using a suitable modulation scheme such as QAM16 as described elsewhere herein. This process of organizing into frames, spreading the spectrum of each frame of data and using the spread spectrum data to modulate one or more RF carriers is done synchronously using the master clock and carrier signals recovered by receiver 1190 and output on buses 1202 and 1214. The resulting RF signals are output on line 1224 to an up/down frequency converter 1226 where the frequency is converted to the designated frequency of a frequency band, usually 6 Mhz in width, dedicated for upstream traffic and are then output on line 1228 to the transmission media 1162. Therefore, frequency division multiplexing for the upstream and downstream traffic is achieved. Those skilled in the art will appreciate that the system of the invention uses a combination of time division multiplexing, frequency division multiplexing and code division multiplexing to achieve high-performance, multiple-user, multiple-source bidirectional digital data traffic in a distributed communication system.

Frame synchronization is achieved by the trial and error process of adjusting the transmit frame timing delay described elsewhere herein and then transmitting a unique code such as a barker code which the CU receiver can detect. The CU modem includes a gap monitor circuit 1192 that functions to monitor the guardband or other interval included in each frame to which the RU transmitters are trying to synchronize to determine if one or more barker codes have been received. The gap monitor circuit can have the structure shown in FIG. 38 or any other structure that can determine when the unique code of an RU has been received, can determine if more than one code from an RU has been received in the gap, can detect how far away from the center of the gap the received barker code is and can provide status information on bus 1196 to a computer 1194 regarding whether a barker code has been received, if more than one has been received, and, if only one has been received, how far away from the center of the gap the received barker code is. Although a computer is preferred for circuit 1194, other circuits to perform this function such as gate arrays, state machines etc. may be used to generate the management and control data on bus 1198 which informs the RUs of information they need to achieve frame synchronization. Hereafter, circuit 1194 will be referred to as a computer. The same is true of computer 1204 in the RU. It does not have to be a computer per se but can be any other type circuit that can fulfill the function. The computer 1194 then generates management and control message data on bus 1198 which are presented at one input of a switch 1200 the switching state of which is controlled by computer 1194 to select the data on bus 1198 during the interval for encoding and transmitting data from timeslots devoted to management and control messages. Those skilled in the art will appreciate that a switching multiplexer like MUX 1200 need not be used and any other known data transfer circuit or process, referred to in the claims as a data transfer circuit, to get data from one process to another such as shared memory etc. may be used to get the management and control data transmitted by transmitter 1170 at the proper time. For example, the management and control data may be stored in specific locations of a shared address space of a memory which also stores the output data from the framing circuit 1166, and the transmitter may have a computer or state machine which accesses the memory at the proper times to sent the data assigned to various timeslots including the management and control data.

The RU receiver 1190 receives these management and control messages and passes them on bus 1202 to a computer 1204 which uses the management and control data to control the ranging process carried out by said SCDMA transmitter 1210 and for other purposes. The receiver 1190 also includes a gap monitor circuit that supports a gap acquisition process to locate the time of each CU frame gap. This gap monitor circuit listens for barker code data transmitted by the CU during every gap, usually by correlating received energy against the known barker code data pattern and sends gap acquisition data detailing the receipt of correlation pulses and the relative times of their occurrence to computer 1204 via bus 1202. A preferred gap monitor receives a signal from a matched filter which is then differentially decoded, sliced and sent to a correlator which receives the known barker code as another input. The correlator output is compared against a threshold, and the comparator output is counted by a false alarm counter. The windowing circuit described elsewhere herein narrows down the output pulses until the actual gap is found.

Computer 1204 or other control circuitry uses this gap acquisition data to determine the time of receipt of the barker code thereby establishing a frame boundary reference for the receiver to aid it in demodulating, decoding and deframing the received data. The computer 1204 uses the receive frame timing reference during the ranging process to establish a trial and error value for the transmit frame timing delay value $T_d$, and sends this transmit frame timing delay value $T_d$ on bus 1212 to the transmitter to control the delay between the time when a frame arrives from the CU transmitter, and the time the RU transmitter 1210 sends the same frame back to the CU receiver with new data therein. During the ranging process, the value of $T_d$ is varied experimentally during successive barker code transmissions until management and control data is received by the RU modem indicating that the barker code has been centered in the CU frame gap thereby achieving frame synchronization. Once frame synchronization has been achieved, the computer freezes the value for $T_d$ thereby causing the SCDMA transmitter to send its frames in frame synchronization with the CU frames and frames transmitted by all other RUs.

The frames all have numbers and can be visualized in the following manner. A downstream frame travelling from the CU transmitter to the RU receiver is like a bus with a load of particular people, the people being the payload and management and control data in the frame. When that bus arrives at the RU, the people are unloaded, and a new set of people get on representing the payload and management and control data the RU wants to sent to the CU. After delay $T_d$, the bus leaves the RU and travels back to the CU. The different channels of data can be visualized as different buses each destined for a different RU although in reality, they are data from different timeslots in the same frame which is received by all RUs. Frame synchronization is the process of setting the value of $T_d$ properly in each RU after a trial and error process so that the buses from each RU travelling toward the CU all arrive at the same time. As a further operation in achieving frame synchronization, the computer 1204 also enables a ranging generator circuit 1206 via signals on a bus 1208 and passes messages to the ranging generator to control its operation. The ranging generator 1206 functions to generate and send to said SCDMA transmitter data defining a barker code for transmission during a ranging process to establish frame synchronization and the unique on-off morse code signature sequence of barker codes transmitted during a signature sequence of gaps that is used to achieve identification/authentication of each particular RU during the ranging process. Typically, these messages on bus 1208 are the data sent on bus 512 in FIG. 28A, but other structures and interaction between the computer 1204 and ranging generator 106 are possible, so long as the end result can cause the RU SCDMA transmitter to achieve frame synchronization.

Computer 1204 also generates and sends management and control data to the RU SCDMA transmitter 1210 via bus 1212. This management and control data can include requests to start ranging, requests for more bandwidth, messages relinquishing bandwidth etc for various species within the broad genus of the invention.

Figure 50:
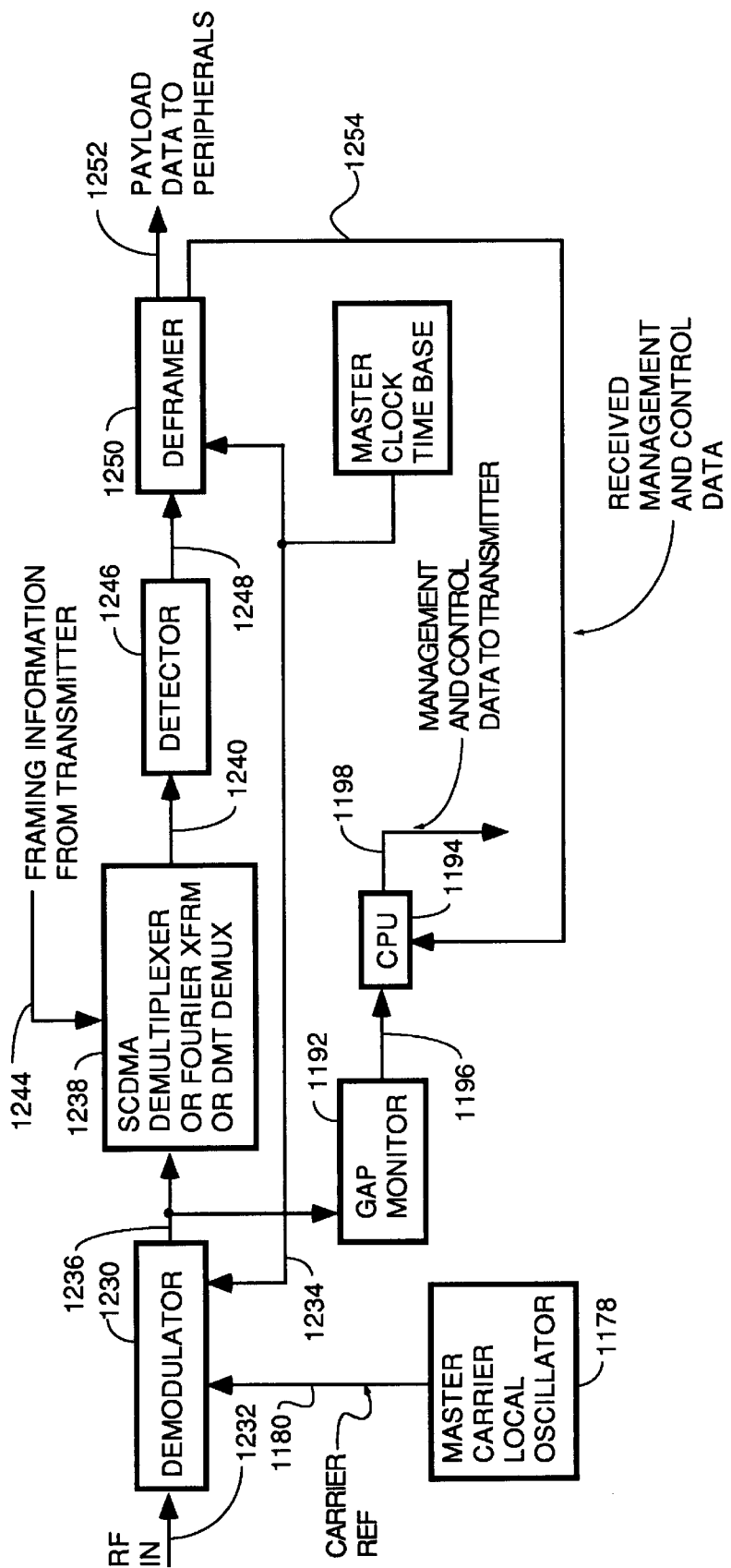
FIG. 50 is a block diagram of simple CU spread spectrum receiver.

Referring to FIG. 50, there is shown a block diagram of a simple form for the SCDMA receiver in the CU of block 1172. This embodiment has a synchronous demodulator 1230 which receives the modulated RF signals on line 1232 and the master carrier reference signal on line 1180 from the master carrier local oscillator 1178. The demodulator also may receive the master clock signal on line 1234 in some embodiments where the output signal is converted to digital samples for output as a series of results vectors comprised of digital data that have the same spread power spectrum of the results vectors which were input to the CU transmitter modulator. These results vectors are coupled via bus 1236 to the SCDMA demultiplexer 1238. The SCDMA demultiplexer 1238 multiplies the results vectors times the transpose of the code matrix that the information vectors were multipled by in the SCDMA multiplexer of the RU transmitter. This despreads the Fourier component power spectrum and results in information vectors output on bus 1240 in frame format in accordance with framing information received on bus 1244 from the CU transmitter. This framing information defines the CU frame times, but the RU data frames are arriving synchronously with this frame timing since the RU ranging process adjusts the transmit frame timing delay so that the RU frames arrive precisely aligned with the CU frames.

The information vectors on bus 1240 are corrupted by noise and impairments that degrade the upstream channel. These corrupted information vectors can then processed by a conventional detector 1246 to determine the actual information vectors that were sent. In the preferred embodiment, the detector is a Viterbi decoder and FFE and DFE equalization is used along with Trellis modulation to improve throughput, decrease error rate and improve signal to noise performance.

The actual information vectors are then output on bus 1248 to a deframer circuit 1250 which functions to reassemble the original payload data streams and management and control messages from the information vectors. The payload data is output on bus 1252 to the peripherals and interfaces to the phone network, internet etc. The management and control data are output on bus 1254 to the CPU 1194 for use in doing such processing as assigning channels and dynamic bandwidth management in species that implement these functions as opposed to fixed channel assignments.

An RU SCDMA receiver could be structured like the receiver of FIG. 50, but instead of using the master clock and master carrier reference signals of the CU, recovered clock and recovered carrier signals would be used. These recovered clock and recovered carrier signals could be generated by the circuitry in FIG. 19 that perform these functions.

Figure 51:
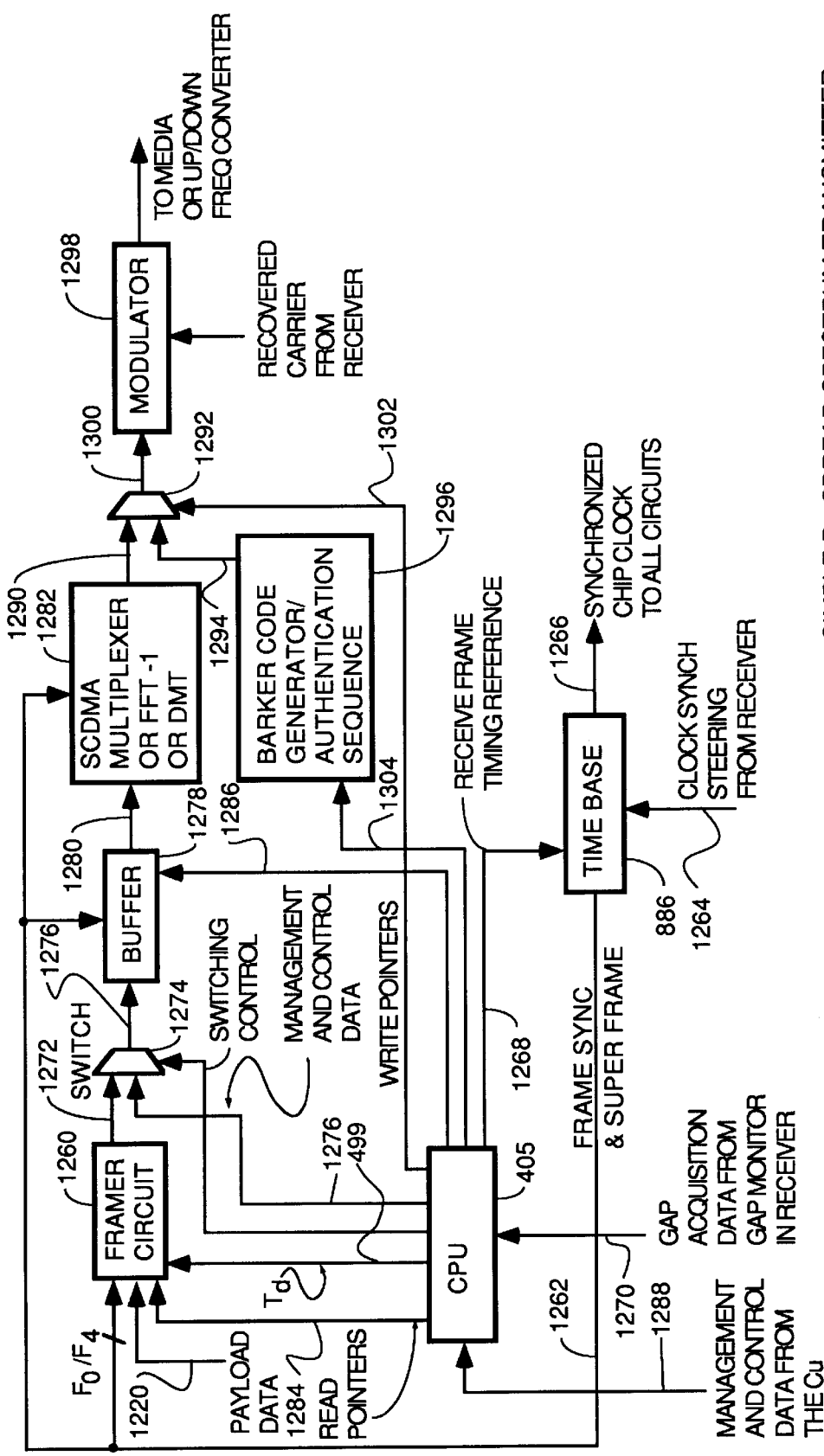
FIG. 51 is a block diagram of a simple RU spread spectrum transmitter.

Referring to FIG. 51, there is shown a block diagram of a simple RU spread spectrum transmitter which could be used to implement block 1210 in FIG. 49. A framer circuit 1260 receives payload data on bus 1220 from the peripherals and organizes it into frames of the same size as the CU frames. The framer can have the structure of framer in FIG. 12 or some other structure that organizes the frames of information vectors differently. The framer receives frame timing information in the form of frame sync and super frame signals on bus 1262 from time base 886. Time base 886 receives a clock synchronization steering signal on bus 1264 from the RU receiver gap detector, and uses this signal to keep its local clock in synchronization with the corresponding clock in the CU. A synchronized chip clock reference signal is distributed on bus 1266 to all circuits in the transmitter that need it. The time base also receives a receive frame timing reference on bus 1268 from the computer/control circuit 405. The control circuit 405 receives gap acquisition data on bus 1270 from the gap monitor circuit in the RU receiver and uses this gap acquisition data to determine when the CU frames arrive. This information is used to generate the receive frame timing reference.

The framer circuit 1260 outputs information vectors on bus 1272 to one input of a switch 1274. The other input bus 1276 of this switch is coupled to the computer 405 and carries management and control data. The switch 1274 has a single output bus 1276 which is coupled to the data bus input of a buffer memory 1278. The buffer memory serves to store the final information vectors which will be input on bus 1280 to the spectrum spreading multiplexer 1282. This machine functions to spread the Fourier spectrum of the data on bus 1280 over a much larger bandwidth than the data originally had. In the preferred embodiment, the spectrum spreading multiplexer is a direct sequencey code division multiplexer like those described elsewhere herein which carries out matrix multiplication of the information vectors times a plurality of pseudorandom orthogonal codes, which are preferably cyclic codes. At least one code is assigned to each RU, and in the preferred embodiment, multiple codes may be assigned when more bandwidth is needed, and the number of codes assigned can be dynamically varied by exchanges of messages between the RU and CU via channels dedicated to management and control traffic. The computer 405 receives code assignment messages from the CU as well as other management and control data which supports, for example, the ranging process, via bus 1288 from the RU receiver.

The computer 405 carries out the assignment of codes (or frequency components in FFT and DMT embodiments) by controlling read pointer addresses onb bus 1284 and write pointers on bus 1286. The read pointers control the address sequence in the framer circuit from which data is read for output on bus 1272. The write pointers control the address sequence into which data on bus 1276 is written in buffer 1278. Since the contents of any particular address in buffer 1278 always get multiplied by the same code, by controlling these write pointers, the computer can implement the code assignments and put management and control data in the correct channels if specific channels are assigned for management and control data. The embodiment of FIG. 51 includes the capability to shuffle codes or pseudorandomly (or frequency components in DMT embodiments) by pseudorandomly altering the write pointers to place data from specific channels into psuedorandomly assigned locations that will get multiplied by different codes.

The transmitter of FIG. 51 can also implement FFT and DMT embodiments by altering the process that is carried out in the spectrum spreading circuit 1282. To implement FFT embodiments, block 1282 represents a process to calculate the inverse Fast Fourier Transform using the different frequency component magnitudes represented by individual information vector elements on bus 1280. The FFT embodiment uses the same information vector elements to define the magnitude of the same frequency components during each frame. A DMT system alters (either pseudorandomly or sequentially) the frequency components assigned to each vector element from time to time. To implement a DMT embodiment, block 1282 performs the inverse Fast Fourier Transform, and computer 405 controls the read and write pointers to alter the frequency components assigned to each information vector element.

Whatever the spectrum spreading process carried out by block 1282, the resulting data is output on bus 1290 to one input of a switch 1292. The other input bus to this switch is coupled to receive barker code data on bus 1294 from a barker code generator/authentication sequence generator 1296. The switch functions to selectively couple the data on one or the other of these buses to the input of a modulator 1298 via bus 1300. The state of the switch 1292 is controlled by computer 405 via a switching control signal on line 1302. The switch is controlled to send the barker code data on bus 1294 to the modulator 1298 during the ranging process and to send payload data on bus 1290 to the modulator during normal operation after frame synchronization has been achieved. Computer 405 controls the barker code generator 1296 via data on bus 1304.

The payload data extraction process is done synchronously in the CU and RU modem receivers. "Synchronously" as that word is used in the claims means the following forms of synchronization are practiced in the RU and CU SCDMA receivers and the RU SCDMA transmitter. The RU transmitter uses the recovered clock and carrier reference signals to drive its digital circuitry and modulator in synchronism with the CU master clock and master carrier. Synchronous or coherent detection is performed in the CU modem receiver using the local carrier signal on line 1180 or a recovered carrier from either an in-band source like the pilot channel described elsewhere herein or some out-of-band source. The CU's SCDMA receiver uses its own master clock and master carrier without recovering either from the signals transmitted by the RU. This provides knowledge in the CU SCDMA receiver of the RU's SCDMA transmitter carrier phase and frequency because the RU transmitter does a carrier recovery or carrier synchronization process to recover the carrier used by the CU transmitter for purposes of synchronizing the RU SCDMA transmitter. An RU SCDMA or other type of receiver recovers the master carrier reference from, for example, the pilot channel transmitted by the CU and recovers the master clock reference from the barker codes sent by the CU during the gaps of every frame. Those recovered clock and carrier signals are used to synchronize the detector in the RU receiver and are used by the RU SCDMA transmitter. Frame synchronization is also part of the synchronization implied by the term "synchronously" in the claims, and is achieved by the trial and error process of adjusting the transmit frame timing delay of the RU SCDMA transmitters as described elsewhere herein but can also be achieved with alternative ranging techniques where the CU instead of the RU does the ranging calculation and instructs the RU what transmit frame timing delay to use. In these embodiments, the RUs transmit a signal which is easily recognizable above the noise by the CU. The CU then determines the identity of the RU in any way, calculates how far off the center of the gap the RU's signal is and instructs it how to adjust its delay to achieve frame boundary alignment of the RU frames with the CU frames.

Figure 54:
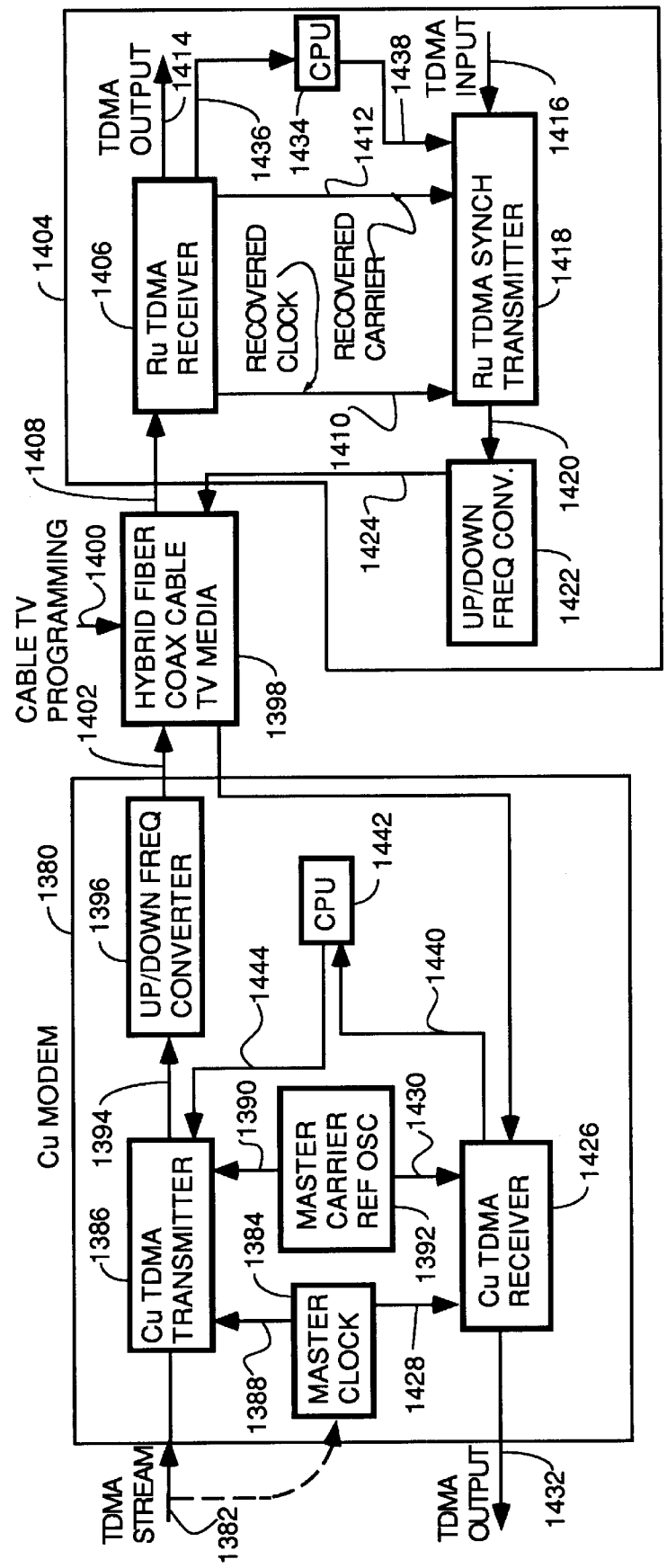
FIG. 54 is a block diagram of a synchronous TDMA system for bidirectionally communicating digital data over any transmission media including hybrid fiber coax using FDMA upstream and downstream channel separation so as to not interfere with other services such as cable television programming sharing the HFC.

Referring to FIG. 54 there is shown a block diagram of a synchronous TDMA system for bidirectionally communicating digital data over any transmission media including hybrid fiber coax using FDMA upstream and downstream channel separation so as to not interfere with other services such as cable television programming sharing the HFC. The CU modem 1380 receives a TDMA stream of data from higher level software layers, peripherals or other interfaces such as a T1/E1 line, and synchronizes its own master clock 1384 from signals on the TDMA bus 1382 that define the frames of timeslots thereon. The TDMA stream on bus 1382 is received by a CU TDMA transmitter 1386 which also receives a master clock signal on bus 1388 and a master carrier reference signal on bus 1390 from a master carrier reference oscillator 1392. The TDMA transmitter receives the frames of data and modulates the data from each timeslot of each frame onto one or more carrier signals supplied by the master carrier oscillator 1392 using any modulation scheme which can transmit the master clock and a carrier reference signal to the RU modem either in-band or out-of-band. Examples of such modulation schemes include QAM, QPSK etc. For example, one or more time slots may be devoted to sending data encoding the master clock signal and master carrier reference. The modulated RF signals are output on line 1394 to an up/down frequency converter 1396 which converts the frequency thereof to a downstream frequency which will not interfere with other services sharing the transmission media 1398 such as cable TV programming fed into the media from bus 1400. The frequency converted signals (frequency conversion is optional if the master carrier in the CU modem can generate a carrier at the desired downstream frequency and the upstream channel can be some frequency which can be synchronized to the downstream frequency such as a harmonic) are output on line 1402. An RU modem 1404 receives the downstream data on line 1408. A TDMA receiver coupled to line 1406 recovers the master clock and master carrier reference signals using any conventional circuitry or the circuitry and methods disclosed herein and outputs the recovered clock signal on line 1410 and outputs the recovered carrier signal on line 1412. The recovered payload data is reassembled into a TDMA data stream and output on bus 1414 to peripherals or other interface processes.

Those peripherals or other interface processes also supply a TDMA input data stream on bus 1416 to and RU synchronous TDMA transmitter 1418. This transmitter receives the recovered clock and recovered carrier signals on lines 1410 and 1412, respectively, and synchronously organizes the TDMA input data on bus 1416 into TDMA frames having the same duration as said CU frames. These frames are then modulated onto one or more carrier signals using the same or a different modulation scheme used by the CU transmitter, and the frames of modulated RF signals are transmitted to the CU in frame synchronization with the CU, i.e., the frames are transmitted from the RU transmitter with a transmit frame timing delay set for this particular RU's position in the system relative to the CU such that the frames transmitted by the RU arrived at the CU aligned with the CU frame boundaries. All RU modems in the system have their transmit frame timing delays set for their particular positions on the network so that all their frames arrive at the CU aligned with the CU frame boundaries. The modulated RF data output by RU TDMA transmitter 1418 is coupled on line 1420 to an up/down frequency converter 1422 that functions to change the frequency of the upstream channel to a frequency that is far enough removed from the downstream channel frequency and from the cable TV programming so as to not interfere therewith. The upstream data is then transmitted via line 1424 and the transmission media to a CU TDMA receiver 1426. This receiver receives a master clock signal on line 1428 from the master clock oscillator 1384 and receives the master carrier signal on line 1430 from the CU's master carrier reference oscillator. The CU TDMA receiver 1426 recovers the payload data from the modulated upstream signals and reassembles the payload data into a TDMA output data stream on bus 1432.

The TDMA transmitters and receivers in this system can be conventional, but the RU TDMA transmitter must be able to delay transmission of its frames by a variable transmit frame timing delay so that its frames arrive in frame synchronization with the frame boundaries of the CU. Any ranging process described herein or any other known ranging process can be used to achieve this frame synchronization. If any of the trial and error class of processes described herein is used, a computer 1434 in the RU modem sets an initial transmit frame timing delay either at its own initiative or upon receipt of a ranging solicitation message from the CU via a management and control data path 1436 from the receiver 1406. This initial delay value is sent to the RU transmitter via bus 1438. The CU receiver assists in the ranging process by sending data regarding what signals from the RUs it found in the frame gaps if gaps are used or what RU ranging signals were detected over the frame interval via bus 1440 to a computer 1442. The computer sends feedback ranging data to the RU via bus 1444 coupled to the CU transmitter 1386. If the class of ranging embodiments where the CU does the ranging process for the RU by determining how much the RU must move its ranging pulse to achieve frame synchronization and so instructing the RU, bus 1440 still carries data regarding what ranging pulses the CU receiver saw, but computer 1442 then figures out how much the RU needs to add to or subtract from its transmit frame timing delay and sends a message via bus 1444 to the RU so instructing it. This message reache computer 1434 via bus 1436, and the computer sets the instructed delay via bus 1438. Any other ranging process that can achieve frame synchronization other than the ones described herein will also suffice to practice this particular embodiment.

All of the transmitter embodiments disclosed herein can utilize an active bandwidth management process carried out by bidirectional message traffic between the remote units and central unit over the management and control channels. Remote units can request more or less bandwidth or request reserved bandwidth, and the central unit can evaluate remote unit privileges for bandwith reservation, arbitrate conflicting requests for reserved or more bandwidth and then award bandwidth in accordance with the results and send downstream management and control messages telling each remote unit which codes have been assigned to carry its traffic during which frames.

There is included herewith two object code software listing in hexadecimal format. Appendix A is the software for CU modem physical layer control processor, and is ported for a Motorola 68040 microprocessor. Appendix B is the software for RU modem physical layer control processor and is ported for a Motorola 68360 microprocessor.

Although the teachings of the invention have been illustrated herein in terms of a few preferred and alternative embodiments, those skilled in the art will appreciate numerous modifications, improvement and substitutions that will serve the same functions without departing from the true spirit and scope of the appended claims. All such modifications, improvement and substitutions are intended to be included within the scope of the claims appended hereto. embodiment.

All of the transmitter embodiments disclosed herein can utilize an active bandwidth management process carried out by bidirectional message traffic between the remote units and central unit over the management and control channels. Remote units can request more or less bandwidth or request reserved bandwidth in upstream management and control messages which identify the requesting remote unit and state the request. The central unit modem can evaluate remote unit privileges for bandwith reservation, arbitrate conflicting requests for reserved or more bandwidth and then award bandwidth in accordance with the results of the arbitration process and send downstream management and control messages telling each remote unit which codes have been assigned to carry its traffic during which frames.

There is included herewith two object code software listing in hexadecimal format. Appendix A is the software for CU modem physical layer control processor, and is ported for a Motorola 68040 microprocessor. Appendix B is the software for RU modem physical layer control processor and is ported for a Motorola 68360 microprocessor.

Although the teachings of the invention have been illustrated herein in terms of a few preferred and alternative embodiments, those skilled in the art will appreciate numerous modifications, improvement and substitutions that will serve the same functions without departing from the true spirit and scope of the appended claims. All such modifications, improvement and substitutions are intended to be included within the scope of the claims appended hereto.

What is claimed is:

1. A method for transmitting multiple channels of digital data encoding supplemental services from a plurality of remote transceivers to a headend transceiver, said transmission carried out over a transmission media simultaneously with transmissions carrying other services, comprising:

receiving multiple channels of digital data that has been encoded with supplemental services, said channels of digital data organized as a time division multiple access stream with multiple timeslots, each timeslot corresponding to one upstream logical channel, one or more timeslot assigned to carry data from each channel;

selecting portions of said digital data from each channel and organizing said portions as an information vector having n elements and inserting known preamble data into at least some information vectors;

performing code division multiplexing by performing a matrix multiplication of said information vector times a code matrix comprised of n orthogonal, cyclic spreading codes using a chip clock which is synchronized to a chip clock in said headend transceiver, each code assigned to one said channel and comprising one row or one column of said code matrix and having n elements, said matrix multiplication generating a spread spectrum result vector having n elements;

using the n elements of said result vector to create the information content in one or more radio frequency signals each radio frequency signal being synchronized in frequency with a local oscillator signal in said headend transceiver and each radio frequency signal being selected and filtered so as to have a center frequency and bandwidth so as to not interfere with said other services and transmitting said resulting radio frequency signals on said transmission media.

2. The process of claim 1 further comprising a step of Trellis encoding each element of said information vector so as to create real and imaginary information vectors, and wherein said step of code division multiplexing comprises multiplying each of said real and imaginary information vectors times a spreading code from a set of orthogonal spreading codes to generate real and imaginary result vectors, and wherein the step of using the n elements of said result vector to create the information content in one or more radio frequency carriers comprises the steps of using said real and imaginary result vectors to create the information content of first and second radio frequency signals respectively by carrierless modulation using first and second shaping filters wherein the transfer function of one of said shaping filters is the Hilbert transform of the transfer function of the other of said shaping filters such that the Fourier spectrum of the filtered data output from one of said shaping filters is orthogonal in the frequency domain to the Fourier spectrum of the filtered data output from the other shaping filter, and wherein said step of selecting portions includes the steps of selecting portions of the data of each channel for organizing said portions of each said information vector so as to be interleaved in a way to overcome burst noise, and further comprising the step of filtering said result vectors in a precode equalization filter using upstream equalization coefficients received from said headend transceiver.

3. A method for transmitting multiple channels of upstream digital data to a central unit modem from a plurality of remote unit modems, said transmission carried out over a transmission media simultaneously with transmissions carrying other services, comprising:

receiving at each of said remote unit modems multiple input channels of upstream digital data at each remote unit modem generating upstream frames of data from said upstream data received by said remote unit modems by interleaving portions of said upstream digital data from each of said multiple channels and organizing said portions as an information vector having n elements, each element of each said information vector corresponding to one upstream logical channel, and only elements corresponding to an upstream logical channel assigned to said remote unit modem containing data from one or more input channels;

performing code division multiplexing on said information vector using n orthogonal, cyclic spreading codes and a chip clock which is synchronous to a chip clock in said central unit modem to generate a result vector having n elements each containing spread spectrum data resulting from the matrix multiplication partial product sums of said information vector elements that contain data times said n spreading codes;

using the n elements of said result vector to create the information content in one or more radio frequency signals, each said radio frequency signal being synchronized in frequency with a local oscillator signal in said central unit modem and each radio frequency signal being selected and filtered so as to have a center frequency and bandwidth so as to not interfere with said other services, and transmitting the resulting radio frequency signals on said transmission media using a predetermined transmit frame timing delay which will cause frame synchronization to exist;

performing a ranging process in each said remote unit modem so as to establish said transmit frame timing delay at a proper interval for each said remote unit modem such that each frame transmitted from each remote unit modem is staggered in time to compensate for the different propagation delays from said remote unit modem to said central unit modem so that said frame arrives at said central unit modem from each different remote unit modem with their frame boundaries aligned in time with the frame boundaries of frames transmitted by other remote unit modems regardless of differences in propagation time from each remote unit modem to said central unit modem.

4. The method of claim 3 further comprising the step of Trellis code modulating the elements of each said information vector to generate real and imaginary information vectors from each said information vector, and wherein said step of code division multiplexing comprises matrix multiplication of each said real information vector times a code matrix to generate an inphase result vector and matrix multiplication of said imaginary information vector times the same code matrix to generate a quadrature result vector, and wherein the step of using the n elements of said result vector to create the information content of one or more radio frequency carriers comprises the steps of:

filtering said inphase and quadrature result vectors in a precode equalization filter having coefficients derived by said central unit modem so as to predistort the spectrum of said inphase and quadrature result vectors to compensate for channel impairments; and filtering the digital data of said inphase and quadrature result vectors using inphase and quadrature shaping filters each of which has a transfer function that satisfies the Nyquist criteria and which limits the bandwidth of the Fourier spectrum of the resulting filtered data to a predetermined bandwidth selected so as to not interfere with said other services, and wherein the transfer function of one of said shaping filters is the Hilbert transform of the transfer function of the other of said shaping filters such that the Fourier spectrum of the filtered data output from said inphase shaping filter is orthogonal in the frequency domain to the Fourier spectrum of the filtered data output from said quadrature shaping filter.

5. A method for transmitting multiple channels of digital data from a central unit transceiver to a plurality of remote unit transceivers, and transmitting different multiple channels of digital data from at least some of said remote unit transceivers to said central unit transceiver, said transmission carried out over a transmission media simultaneously with transmissions carrying other services, comprising:

receiving at said central unit transceiver multiple channels of digital data encoding downstream data of some or all of said supplemental services served by different sources, said multiple channels organized as a time division multiple access (hereafter TDMA) stream with n timeslots comprising each frame, one or more timeslots assigned to carry data from said server for each different source of a supplemental service but not necessarily carrying data of the assigned supplemental service during each frame;

receiving at each said remote unit transceiver multiple different channels of digital data than are received by said central unit transceiver, said multiple different channels encoding upstream data of some or all of said supplemental services served by different sources, said multiple channels organized as a time division multiple access (hereafter TDMA) stream with n timeslots comprising each frame, one or more timeslots assigned to carry data from said server for each different source of a supplemental service but not necessarily carrying data of the assigned supplemental service during each frame;

establishing CU frame boundary timing reference signals in said central unit transmitter from the frame boundaries of said TDMA stream received at said central unit transceiver and synchronizing downstream frame transmissions from said central unit transceiver to said remote unit transceiver to said CU frame boundary timing reference signals;

at each remote unit transceiver, selecting portions of said digital data from each timeslot of the TDMA stream received by each said remote unit transceiver and organizing said portions as an information vector having n elements, each element having interleaved data, and each element corresponding to one upstream logical channel with at least one information vector generated per frame, each frame in said remote unit having the same duration as any central unit frame, and inserting known preamble data in at least some of said information vectors of each transmission from a remote unit transceiver;

Trellis encoding each said information vector to generate in phase and quadrature information vectors that have been encoded with redundant error correction data;

performing a ranging process in each remote unit transceiver to establish frame synchronization by finding a suitable transmit frame timing delay such that each frame transmitted from each remote unit transceiver will arrive at said central unit transceiver aligned with the CU frame boundaries of said central unit transceiver regardless of differences in propagation time from each remote unit transceiver to said central unit transceiver;

after remote unit transceiver achieves frame synchronization, transmitting data from said central unit transceiver to each said remote unit transceiver which will enable each remote unit transceiver to synchronize a local oscillator used to generate one or more radio frequency carriers to the frequency of a local oscillator in said central unit transceiver used to generate one or more downstream carriers, and which will also enable each remote unit transceiver to synchronize a local chip clock to a chip clock in said central unit transceiver;

transmitting upstream training data from each said remote unit transceiver which has achieved frame synchronization;

in said central unit transceiver, receiving said training data transmission from each said remote unit transceiver and performing an equalization process on each said training data transmission to derive equalization coefficients for use by said remote unit transceiver which sent said training data in filtering its upstream transmissions so as to predistort the spectrum thereof to compensate for channel impairments, and sending each set of equalization coefficients downstream to the appropriate remote unit transceiver;

transmitting downstream data from said central unit transceiver to said remote unit transceivers that is payload data and also includes spreading code allocations to remote unit transceivers which have requested bandwidth, and recovering said downstream data and spreading code allocations in some or all of said remote unit transceivers;

in at least each remote unit transceiver which has received a spreading code allocation, performing code division multiplexing of upstream data by performing a matrix multiplication of each said in phase and quadrature information vector times a code matrix comprised of n orthogonal spreading codes using said chip clock of said remote unit transceiver that has been synchronized to said chip clock of said central unit transceiver, each spreading code permanently or temporarily assigned to one said logical channel and having n elements, said matrix multiplication generating an in phase and quadrature result vector for each in phase and quadrature information vector, each said result vector having n elements, each element of said result vector containing spread spectrum data resulting from said matrix multiplication of the corresponding information vector times the spreading codes in said code matrix;

filtering each said in phase and quadrature result vector using an equalization filter having said equalization filter coefficients received from said central unit transceiver derived from said equalization training process performed on said training data transmitted by said remote unit transceiver;

in at least the remote unit transceivers that have generated result vectors, using the n elements of each said in phase and quadrature result vectors to create the information content in two quadrature radio frequency signals that are frequency synchronized with a local oscillator in said central unit transceiver by carrierless modulation, or by using two quadrature radio frequency carriers which have been generated from said remote unit transceiver local oscillator that has been synchronized in frequency with a local oscillator in said central unit transceiver and each said quadrature radio frequency carrier having the same frequency but one being an integer multiple of 90 degrees out of phase with the other and each quadrature radio frequency carrier having a center frequency selected so as to not interfere with other transmissions of other services simultaneously transmitted on said media, and transmitting the resulting radio frequency carriers on said transmission media using said predetermined transmit frame timing delay established for the remote unit transceiver making the transmission during said ranging process while limiting the overall bandwidth of the resulting radio frequency signals so as to not interfere with said other services being simultaneously transmitted on said transmission media;

in said central unit transceiver, using said known preamble data in each transmission from each said remote unit transceiver to generate phase and amplitude error correction factors for use in receiving transmissions from said remote unit transceiver and using said phase and amplitude error correction factors calculated for each remote unit transceiver to recover the data transmitted by that remote unit transceiver.

6. A method for transmitting to a central unit multiple channels of digital data generated by a plurality of sources coupled to a plurality of physically distributed remote units which are coupled to said central unit via a cable television medium designed to carry radio frequency signals, said multiple channels of digital data being transmitted simultaneously over said cable television medium as a plurality of frames of digital data, said cable television medium also carrying frequency division multiplexed cable television programming, comprising:

establishing frame synchronization at each remote unit by determining a transmit frame timing delay for each said remote unit such that, when each remote unit transmits a numbered upstream frame of data using that remote unit's transmit frame timing delay, said frame will arrive at said central unit simultaneously with like numbered frames transmitted by other remote units;

in each remote unit, after achieving initial frame synchronization, setting default values for initial transmit power, upstream equalization coefficients and fine timing alignment values;

in each remote unit after achieving initial frame synchronization, periodically adjusting said fine timing alignment value by sending training data spread by a predetermined one of a plurality of orthogonal, cyclic spreading codes and determining from feedback messages from said central unit if the value of said transmit frame timing delay is still correct, and, if not, performing a fine tuning process to adjust the value of said fine timing alignment value so as to achieve a transmit frame timing delay which achieves precise frame synchronization;

in each remote unit after achieving initial frame synchronization, periodically performing a power alignment process by transmitting training data to said central unit using said initial transmit power level and monitoring one or more feedback messages from said central unit until a message is received which instructs said remote unit what transmit power level to use which will cause errors in receiving data transmitted by this remote unit to be minimized and adjusting said transmit power level to the value received from said central unit;

in each remote unit after achieving initial frame synchronization, periodically transmitting training data spread by a plurality of predetermined orthogonal, cyclic spreading codes and monitoring feedback messages received from said central unit until one or more messages is received which include upstream equalization coefficients for use by this remote unit to derive new upstream equalization coefficients to use in subsequent upstream transmissions, and using said upstream equalization coefficients received from said central unit to derive new upstream equalization coefficients and using said new upstream equalization coefficients for subsequent upstream transmissions;

receiving one or more channels of digital data at each remote unit;

at each remote unit, constructing an information vector by selecting portions of said digital data from each channel of digital data received at said remote unit and interleaving said portions as selected elements of said information vector having n elements where each element of said information vector corresponds to a single upstream logical channel but wherein any element of said information vector corresponding to a logical channel which is not assigned to said remote unit has no upstream payload data therein, and inserting known preamble data in at least some of said information vectors of each transmission from a remote unit;

Trellis encoding each element of each said information vector to add a selectable number of redundant bits and mapping the resulting bits of each element of each information vector into a constellation point of a quadrature amplitude modulation constellation so as to generate an inphase and quadrature information vector from each information vector;

at each remote unit, performing code division multiplexing by performing a matrix multiplication of each inphase and quadrature information vector times a code matrix comprised of n orthogonal, cyclic spreading codes, said matrix multiplication being performed using a chip clock which has been synchronized with a chip clock in said central unit generating inphase and quadrature result vectors corresponding to said inphase and quadrature information vectors, each inphase and quadrature result vector having n elements;

at each remote unit, after frame synchronization has been achieved by that remote unit, modulating the n elements of each said inphase and quadrature result vectors onto two radio frequency carriers of the same frequency but offset in phase by 90 degrees using QAM modulation, said radio frequency carriers being synchronized in frequency to a master carrier in said central unit.

7. The process of claim wherein said channels of digital data received by each remote unit are received in the form of a time division multiplexed data stream comprised of a plurality of timeslots wherein each timeslot contains one or more data bits from a source, and wherein the step of performing power alignment comprises the steps of initially setting the gain level of a scaler amplifier in each remote unit to one and repetitively sending training data having its spectrum spread by one of said orthogonal, cyclic spreading codes which is known to said central unit until an automatic gain control circuit in said central unit converges on a gain level which minimizes reception errors and said remote unit receives a message from said central unit including a gain level which said remote unit should use for subsequent upstream transmissions.

8. The process of claim 7 wherein said step of constructing said information vector comprises the steps of storing a portion of the bits from each timeslot in elements of one or more information vectors that correspond to logical channels and spreading codes that have been assigned at least temporarily to said remote unit for upstream transmissions, and further comprising the steps of recovering a master chip clock from a barker code transmitted from said central unit to each remote unit and synchronizing a local chip clock to said recovered master chip clock, and recovering from a pilot channel signal transmitted to all remote units from said central unit a master carrier signal and a kiloframe marker marking every 1000th upstream frame as counted by said central unit, and synchronizing a local carrier signal to said recovered master carrier signal and using said recovered kiloframe marker to construct said information vectors into numbered upstream frames transmitted from each remote unit so that spreading code assignments valid only for specifically numbered upstream frames can be successfully implemented in each remote unit so as to use spreading codes assigned by downstream messages from said central unit to spread the spectrum of only those information vectors which correspond to upstream frame numbers corresponding to the code assignment.

9. The process of claim 8 wherein each timeslot contains 9 bits, 8 of which are data from any source external to said remote unit and the 9th bit of which is available to send miscellaneous command and control information from the remote unit to said central unit, and wherein data from three information vectors are code division multiplexed from each remote unit to said central unit during each upstream frame, and wherein each information vector is constructed at a remote unit by placing three bits of a timeslot into an element of an information vector that corresponds to a logical channel assigned by said central unit for upstream transmissions by said remote unit and further including in said element a selected number of redundant bits generated by said Trellis encoding of said three bits, and repeating this process for each element of each information vector corresponding to an assigned upstream channel for three information vectors constructed during each frame so as to transmit all nine bits from a timeslot containing data during one frame in three elements of three different information vectors, all corresponding to the same assigned upstream channel, and further comprising the step of filtering said inphase and quadrature result vectors in a precode filter having filter coefficients derived from upstream equalization coefficients sent to said remote unit by said central unit, and wherein said step of modulating comprises the step of using said filtered inphase and quadrature result vectors to quadrature amplitude modulate said two radio frequency carriers, and wherein the step of establishing frame synchronization includes performing a boundless ranging process in each remote unit comprising the steps of receiving a frame from said central unit having any frame number and responding by sending back a response frame which includes a total turnaround time service request and the frame number of the downstream frame just received, and receiving back from said central unit a frame which includes the total turnaround time for said remote unit in the form of the difference between a downstream frame count in said central unit at the time said response frame was received and the downstream frame number included in the response frame received from said remote unit, and using said total turnaround time value received from said central unit along with spreading code assignments transmitted to said remote unit from said central unit so as to use the proper spreading codes assigned by said central unit for use by said remote unit to spread the spectra of its result vectors during certain, specifically numbered assigned upstream frames to spread the spectrum of data during specifically numbered, assigned upstream frames.

10. A process carried out in each of a plurality of physically dispersed remote transceivers for simultaneously transmitting multiple channels of digital data which has been encoded with supplemental services data and other services over the same transmission medium to a headend transceiver while substantially reducing interference, comprising:

receiving said one or more time division multiplexed data streams at one or more remote units and Trellis encoding the data bits from each timeslot into real and imaginary components and using said real and imaginary components to fill elements of inphase and quadrature information vectors that correspond to assigned logical channels characterized by the use of specified spreading codes used during specified upstream frames, each said inphase and quadrature information vector having N elements, the first element of each inphase and quadrature information vector corresponding to a first logical channel and the second element of each inphase and quadrature information vector corresponding to a second logical channel and so on for all elements, each of said upstream logical channels being one of a plurality of logical channels that are shared by a plurality of remote transceivers according to spreading code assignments from a said headend transceiver, the elements of said inphase and quadrature information vectors which are filled with data corresponding to one or more logical channels assigned to said remote transceiver by downstream code assignment messages from said central transceiver with all other elements containing no data, and inserting known preamble data into at least some of said information vectors;

recovering any modulated waveform encoding the central transceiver master carrier frequency and phase information in any way, and generating a synchronized local upstream carrier from said recovered waveform;

recovering in any way a master clock signal transmitted by said central transceiver and synchronizing a local chip clock to said recovered master clock signal;

recovering a downstream kiloframe signal transmitted by said central transceiver and using said kiloframe signal to synchronize an upstream frame counter in each remote transceiver to an upstream frame counter in said central transceiver;

performing any ranging process at each said remote transceiver to establish a transmit frame timing delay for said remote transceiver which will cause numbered frames of data transmitted from said remote transceiver to arrive aligned in time with the frame boundaries of like-numbered frames transmitted by others of said remote transceivers;

performing a training process initially after achieving frame synchronization and from time to time thereafter by transmitting training data spread by predetermined spreading codes to said central transceiver and receiving messages from said central transceiver addressed to specific remote transceivers containing instructions on how to fine tune said transmit frame timing delay to maintain precise frame synchronization and containing instructions on how to adjust the transmit power of subsequent transmissions and containing upstream equalization coefficient data to use in deriving new upstream equalization coefficients for use in filtering subsequent upstream data transmissions;

individually spreading the energy of said inphase and quadrature information vector having data therein which is to be transmitted on one or more of said logical channels assigne to said remote transceiver using one or more of N orthogonal codes and said local chip clock to spread the spectrum of each inphase and quadrature information vector to generate an inphase and quadrature spread spectrum result vector for each corresponding pair of inphase and quadrature information vectors;

filtering said inphase and quadrature result vectors in a filter having equalization coefficients derived from said equalization coefficients transmitted from said central transceiver in response to transmission of said training data;

filtering each said inphase result vector using a real component shaping filter having a squared raised cosine transfer function in a real plane of the frequency domain and centered on a predetermined intermediate frequency synchronized to the frequency of said recovered master carrier and with a bandwidth selected to limit the bandwidth of the Fourier components of output signals from said real component shaping filter in said real plane of said frequency domain to a predetermined bandwidth selected so as to not interfere with other signals being transmitted on said transmission medium;

filtering each said quadrature result vector using an imaginary component shaping filter having a squared raised cosine transfer function in an imaginary plane of the frequency domain, the Fourier spectrum of the signals output by said imaginary component shaping filter being centered on said predetermined intermediate frequency synchronized to the frequency of said recovered master carrier and with a bandwidth selected to limit the bandwidth of the Fourier components of output signals from said imaginary component shaping filter in said imaginary plane of said frequency domain to a predetermined bandwidth selected so as to not interfere with other signals being transmitted on said transmission medium, and wherein the transfer function of said imaginary component shaping filter is the Hilbert transform of the transfer function of said real component shaping filter;

summing the output data from said real and imaginery component shaping filters;

converting said digital data output from said summing step to an analog radio frequency signal at an intermediate frequency; and altering the frequency of said intermediate frequency analog signal to a frequency that will not interfere with other services carried on said shared transmission medium such that said supplemental services are frequency division multiplexed with said other services and time division multiplexed between supplemental service data from different sources connected to the same remote transceiver and code division multiplexed between upstream transmissions from different remote transceivers.

11. The process of claim 10 wherein said step of performing training after frame synchronization has been achieved comprises the steps of:

in each remote unit, setting default values for initial transmit power, upstream equalization coefficients and a fine timing alignment value;

in each remote unit, periodically adjusting said fine timing alignment value by sending training data spread by a predetermined one of a plurality of adjacent orthogonal, cyclic spreading codes and determining from feedback messages from said central transceiver if the value of said transmit frame timing delay is still correct, and, if not, adjusting the value of said fine timing alignment value by an amount instructed in a message received from said central transceiver so as to achieve a transmit frame timing delay which achieves precise frame synchronization;

in each remote unit, performing a power alignment process by transmitting training data to said central unit using said initial transmit power level and incrementally increasing power on subsequent training data transmissions and monitoring one or more feedback messages from said central unit to determine if a message has been received indicating a transmission from the remote transciever has been received, and when a message is received which instructs said remote unit what transmit power level to use which will cause errors in receiving data transmitted by this remote unit to be minimized, adjusting said transmit power level to the value received from said central unit;

in each remote unit, periodically transmitting training data spread by a plurality of predetermined orthogonal, cyclic spreading codes and monitoring feedback messages received from said central unit until one or more messages is received which include upstream equalization coefficients for use by this remote unit to derive new upstream equalization coefficients to use in subsequent upstream transmissions, and using said upstream equalization coefficients received from said central unit to derive new upstream equalization coefficients and using said new upstream equalization coefficients for subsequent upstream transmissions.

12. The process of claim 11 further comprising the steps of:

during one or more frames of a second set of upstream frames, pseudorandomly assigning one or more new direct sequence spreading codes to one or more upstream logical channels for use by one or more of said remote transceivers in transmitting upstream data during said second set of upstream frames.

13. An apparatus for transmitting multiple channels of digital data encoded with supplemental services from a remote unit to a central unit over a shared transmission medium using synchronous code division multiple access transmission, comprising:

first means for accepting incoming data of a time division multiple access stream comprised of N time slots or channels each of which contains one or more bits of digital data encoding said supplemental services and organizing and interleaving and Trellis encoding the data of said N channels into a frame comprised of M contiguous inphase and quadrature information vectors a plurality of which comprise each upstream frame for transmission plus a guardband during which no data from said time division multiple access stream is transmitted, said reorganizing carried out by reorganizing and interleaving a portion of the data from each of said N channels into specific assigned elements of each of said M inphase and quadrature information vectors for each upstream frame, each information vector comprised of N elements, said specific assigned elements corresponding to logical upstream channels assigned to said remote unit, said elements comprising a subgroup of bits from one or more channels or timeslots of said time division multiple access stream plus a predetermined number of error detection and correction bits generated by a Trellis encoder, each inphase and quadrature information vector containing data only in elements that correspond to logical channels assigned to said remote unit, said Trellis encoder mapping each element of each said information vector into a real and imaginary components in said inphase and quadrature information vectors such that M inphase and quadrature information vectors are generated in each frame, said first means also for inserting known preamble bits in at least some of said information vectors;

means for synchronizing a local chip clock with a master chip clock in said central unit and for synchronizing a local carrier with a master carrier oscillator in said central unit;

second means for using said synchronized local chip clock to direct sequence spread spectrum encode each of said M inphase and quadrature information vectors using N orthogonal, cyclic spreading codes to generate M inphase and quadrature result vectors, said second means also for passing the data of said real and imaginary result vectors for each frame through an equalizating filter having filter coefficients received in a message from said central unit and through shaping passband filters having transfer functions which satisfy the Nyquist criteria and which are orthogonal to each other in the frequency domain by a Hilbert transform relationship and which have bandwidths which limit the resulting intermediate frequency signals represented by data exiting said shaping, passband filters to a predetermined bandwidth which will not interfere with other transmissions on said shared transmission medium and for summing the resulting data encoding intermediate frequency signals to generate M upstream frames of spread spectrum data for transmission, and converting the data encoding said M upstream frames into an analog signal of said intermediate frequency, and for converting said intermediate frequency signal encoding said M upstream frames to a radio frequency signal synchronized to said local carrier synchronized to said master carrier oscillator in said central unit, and which will not interfere with other services being carried on said transmission medium, the resulting radio frequency signal being M-ary QAM modulated, and for transmitting said modulated radio frequency carrier signals over said shared transmission medium; and third means for adjusting the timing of said transmission of each frame from said remote unit to said central unit such that each transmitted frame arrives at said central unit aligned in time with frames transmitted by other remote units.

14. An apparatus in each remote unit of a system comprised of a plurality of physically dispersed remote units transmitting multiple channels of digital data from said plurality of remote units to a central unit over a cable television transmission medium using synchronous code division multiple access, comprising:

framer means in each remote unit for accepting incoming data of a time division multiple access stream comprised of N timeslots and for interleaving the data of said N channels over a frame comprised of M contiguous information vectors and a guardband, said interleaving being carried out by reorganizing said data from said N channels into one or more of N elements said M information vectors corresponding to N upstream logical channels assigned to said remote unit;

code division multiplexing means in each remote unit for providing code division multiple access spreading by encoding said M information vectors using a plurality of orthogonal, cyclic codes to generate M result vectors, and for using said M result vectors to modulate one or more radio frequency carrier signals to generate modulated RF signals, and for transmitting said modulated RF signals over said cable television transmission medium; and ranging means in each said remote unit for adjusting the timing of transmissions to said central unit from said remote unit of each frame such that each transmitted frame from said remote unit arrives at said central unit simultaneously with frames transmitted from other remote units.

15. A transmitter apparatus for simultaneously transmitting to a receiver multiple channels of digital data over a cable television medium carrying cable television programming, comprising:

a framer circuit including interleaving circuitry to generate information vectors and to insert known preamble data;

a convolutional encoder to add error correction bits to each information vector to generate an inphase and quadrature information vectors from each information vector;

a carrier recovery circuit to synchronize a local carrier signal to a master carrier signal;

a clock recovery circuit for synchronizing a local chip clock to a master chip clock;

a code division multiplexer circuit coupled to said chip clock recovery circuit for spreading the spectrum of said inphase and quadrature information vectors using said synchronized local chip clock to generate inphase and quadrature result vectors;

an upstream equalization filter having coefficients received from a central transceiver to which said multiple channels of digital data are being transmitted which will equalize the channel between said transmitter and said central transceiver and coupled to filter said inphase and quadrature result vectors;

a scaling circuit for selectively altering the amplitude of the transmitted signal by said transmitter apparatus;

a modulator coupled to said carrier recovery circuit for using said inphase and quadrature result vectors to create the information content in one or more radio frequency signals which are synchronized in frequency to said local carrier signal and said master carrier signal; and a ranging circuit to carry out one or more processes to determine the proper transmit frame timing delay to achieve frame synchronization such that frames transmitted to said central transceiver arrive there with their frame boundaries aligned in time with frames transmitted to said central transceiver from other transmitter apparatus.

16. The apparatus of claim 15 further comprising a scrambler circuit coupled to receive elements of said information vector from said framer circuit, pseudorandomly scramble the bits of each element thereof to generate a scrambled information vector, and transmit said scrambled information vector to said convolutional encoder and wherein said convolutional encoder functions to encode the elements of said scrambled information vector with redundant error correction bits.

17. The apparatus of claim 16 wherein said convolutional encoder is a Trellis encoder which has an idle mode wherein only zeroes are added as redundant bits, a normal mode wherein a first selected number of redundant bits are added to each element of the information vector based upon the data selected from an appropriate earlier time to generate the same element of a previous information vector, and a fallback mode wherein a number of redundant bits larger than said first selected number of redundant bits are added to each element of said information vector to generate said new information vector, the mode in which said convolutional encoder operates being selectable by manipulation of a mode control signal transmitted to a mode control input of said convolutional encoder.

18. The apparatus of claim 16 further comprising code diversity means coupled to said framer circuit for controlling the order in which said information vector elements have their spectra spread, and further comprising a buffer memory for storing said scrambled information vector, said code diversity means controlling the locations in said buffer memory in which is stored each scrambled element of said scrambled information vector.

19. The apparatus of claim 15 further comprising a precode filter coupled to receive at least said elements of said result vector and to perform equalization filtering thereon to predistort said result vector elements prior to transmission to generate predistorted result vector elements which compensate for channel impairments and wherein said modulator uses said predistorted result vector elements to generate inphase and quadrature RF signals, said precode filter having an input for receiving coefficients which control the filter characteristics of the precode filter.

20. The apparatus of claim 19 wherein said coefficients are set from time to time so as to establish said filter characteristics of said precode filter based upon the position of the transmitter on said cable television media and the impairments then existing which will affect signals transmitted from a transmitter at that position.

21. The apparatus of claim 15 further comprising a digital to analog converter circuit for converting result vector elements to analog values somewhere within the dynamic range of said analog to digital converter and to supply said analog values to said modulator for use in generation of said inphase and quadrature radio frequency signals, and further comprising a scaler circuit coupled to receive said result vector elements from said code division multiplexer and scale the amplitude of each one in accordance with a control signal the value of which is set in accordance with the number of said logical channels currently assigned to said remote unit so as to generate scaled result vector elements and to supply said scaled result vector elements to said digital to analog converter, said control signal set so as to cause scaling to a value which is effective to make full use of the dynamic range of said digital to analog converter.

22. The apparatus of claim 21 further comprising a shaping filter coupled to receive said scaled result vector elements before they are supplied to said analog to digital converter, said shaping filter having a raised cosine transfer function suitable to limit the bandwidth of the combined radio frequency signal generated by summing said inphase and quadrature radio frequency signals and suitable to satisfy the Nyquist criteria so as to optimize signal-to-noise ratio and minimize interference with signals from other transmitters coupled to said cable television media.

23. The apparatus of claim 15 wherein each timeslot contains 8 bits of data to which a 9th bit is added, said 9th bit encoded with predetermined nonpayload information, and wherein said framer circuit stores all 9 bits from each timeslots of upstream input data in locations in a memory in said framer circuit, and wherein said data is read out from said framer circuit in frames in a predetermined way so as to interleave said data, each frame comprised of three symbols, each symbol having N elements corresponding to the N elements of an information vector, and wherein, during each frame, said framer circuit outputs three sequential information vectors from which the three sequential symbols of the frame will be generated, the elements of each of said three sequential information vectors each being filled in with data corresponding to an upstream logical channel currently assigned to said transmitter apparatus, each said element having data containing three of the nine bits from a timeslot, said three bits hereafter called a tribit, and wherein said convolutional encoder has multiple modes one of which causes the addition of a 4th redundant bit to each tribit to generate the elements of said new information vector prior to code division multiplexing.

24. The apparatus of claim 15 wherein said code division multiplexer circuit generates each of said N mathematically orthogonal codes from a cyclic code and is structured to perform said matrix multiplication by generating one orthogonal code, multiply each code element of the code so generated by a corresponding element of said new information vector, and sum the partial products to generate an element of said result vector and then generate the next orthogonal code from the cyclic code and repeat the process to generate the next element of said result vector.

* * * * *